US007050325B2

(12) United States Patent
Iwata et al.

(10) Patent No.: US 7,050,325 B2
(45) Date of Patent: May 23, 2006

(54) MAGNETIC RANDOM ACCESS MEMORY

(75) Inventors: Yoshihisa Iwata, Yokohama (JP); Kentaro Nakajima, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 77 days.

(21) Appl. No.: 10/438,015

(22) Filed: May 15, 2003

(65) Prior Publication Data
US 2004/0027854 A1 Feb. 12, 2004

(30) Foreign Application Priority Data
May 15, 2002 (JP) ............................ 2002-140499

(51) Int. Cl.
*G11C 11/14* (2006.01)
*G11C 11/15* (2006.01)
*G11C 7/00* (2006.01)

(52) U.S. Cl. ...................... 365/158; 365/171; 365/173; 365/225.5

(58) Field of Classification Search ................ 365/158, 365/171, 173, 225.5, 189.11
See application file for complete search history.

(56) References Cited

U.S. PATENT DOCUMENTS

| 6,081,445 | A | 6/2000 | Shi et al. |
| 6,097,626 | A | 8/2000 | Brug et al. |
| 6,163,477 | A | 12/2000 | Tran |
| 6,205,051 | B1 | 3/2001 | Brug et al. |
| 6,324,093 | B1 | 11/2001 | Perner et al. |
| 6,404,671 | B1 | 6/2002 | Reohr et al. |
| 6,545,906 | B1 * | 4/2003 | Savtchenko et al. ........ 365/158 |
| 6,798,691 | B1 * | 9/2004 | Ounadjela et al. .......... 365/171 |

FOREIGN PATENT DOCUMENTS

JP 2004-528665 9/2004

OTHER PUBLICATIONS

P. R. Gray, et al., John Wiley & Sons, Inc., Analysis and Design of Analog Integrated Circuits, Second Edition, pp. 288-299, "Transistor Current Sources and Active Loads", 1984.
Roy Scheuerlein, et al. "A 10ns Read and Write Non-Volatile Memory Array Using a Magnetic Tunnel Junction and FET Switch in Each Cell" ISSCC Digest of Technical Papers, Feb. 2000, pp. 128-129, 94-95, and 409-410.
M. Durlam, et al. "Nonvolatile RAM Based on Magnetic Tunnel Junction Elements" ISSCC Digest of Technical Papers, Feb. 2000, pp. 130-131, 96-97, and 411.
Ricardo C. Sousa, et al. "Dynamic Switching of Tunnel Junction MRAM Cell with Nanosecond Field Pulses" IEEE Transactions on Magnetics, vol. 36, No. 5, Sep. 2000, pp. 2770-2772.

* cited by examiner

*Primary Examiner*—Anh Phung
*Assistant Examiner*—J. H. Hur
(74) *Attorney, Agent, or Firm*—Oblon, Spivak, McClelland, Maier & Neustadt, P.C.

(57) ABSTRACT

In a magnetic random access memory (MRAM), setting data which determines the supply/cutoff timing, magnitude, and temporal change (current waveform) of a write word/bit line current is registered in a setting circuit. A write current waveform control circuit generates a write word line drive signal, write word line sink signal, write bit line drive signal, and write bit line sink signal on the basis of the setting data. The current waveform of the write word/bit line current is controlled for each chip or memory cell array.

49 Claims, 80 Drawing Sheets

Asteroid curve

Asteroid curve

```
┌─────────────────────────────────────────────────────────────┐
│ Supply write current Ip1 to write word line to particularly │
│ generate magnetic field Hx having magnitude enough to align │
│ magnetizing direction of magnetic domain at end portion of  │~ST1
│ storing layer to hard-axis direction (①)                    │
└─────────────────────────────────────────────────────────────┘
                              │
┌─────────────────────────────────────────────────────────────┐
│ Supply write current Ip2 (< Ip1) to write word line and supply │
│ write current Ip3 to write bit line to generate synthesized │~ST2
│ magnetic field Hx + Hy having magnitude enough to reverse   │
│ magnetizing direction of storing layer (②)                  │
└─────────────────────────────────────────────────────────────┘
```

FIG. 3

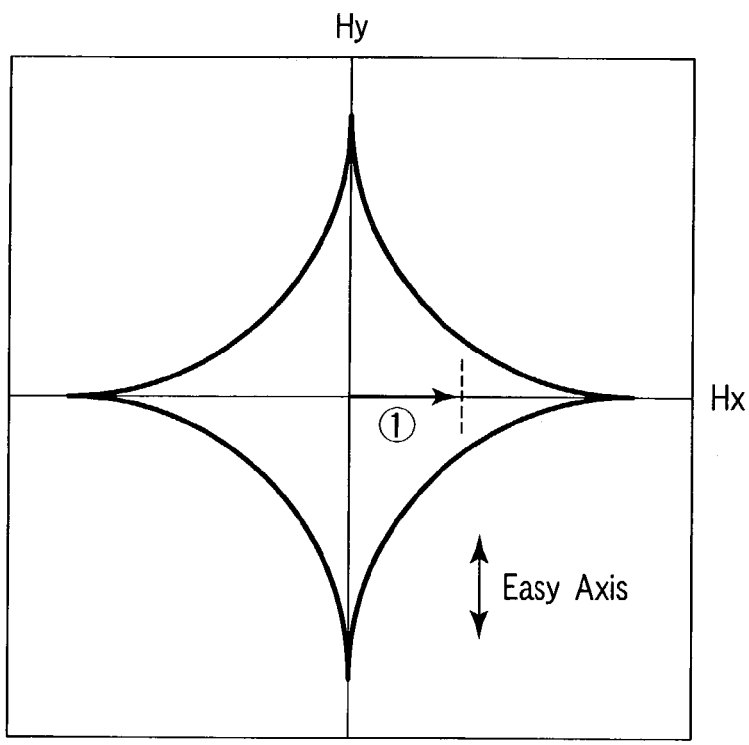

Asteroid curve

FIG. 4

Asteroid curve

Asteroid curve

Asteroid curve

Asteroid curve

Asteroid curve

Asteroid curve

Asteroid curve

Asteroid curve

Asteroid curve

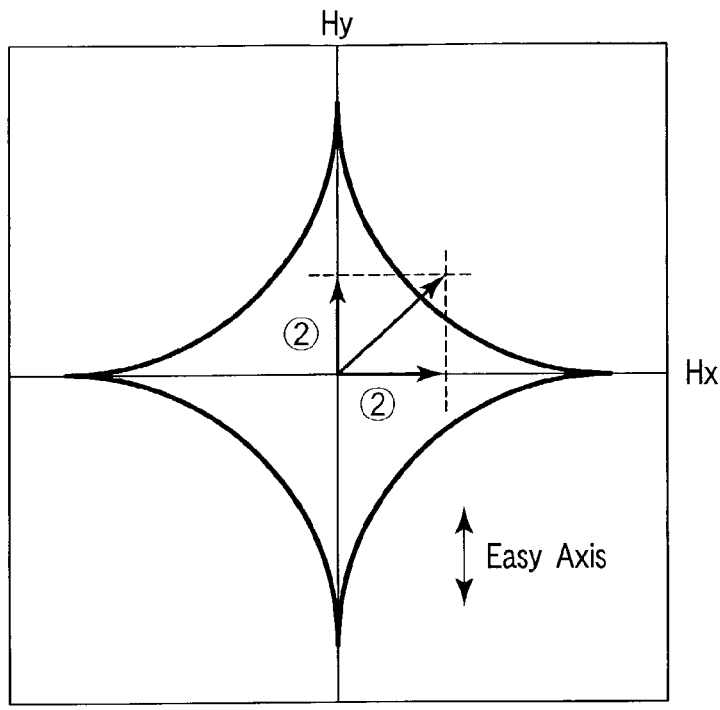

Asteroid curve

FIG. 17

| Supply write current Ip1 to write word line and supply write current Ip2 to write bit line to particularly generate synthesized magnetic field Hx + Hy having magnitude enough to align magnetizing direction of magnetic domain at end portion of storing layer to hard-axis direction (①) | ~ST1 |

| Continuously supply write current Ip1 to write word line and supply write current Ip3 (> Ip2) to write bit line to generate synthesized magnetic field Hx + Hy having magnitude enough to reverse magnetizing direction of storing layer (②) | ~ST2 |

FIG. 18

Asteroid curve

Asteroid curve

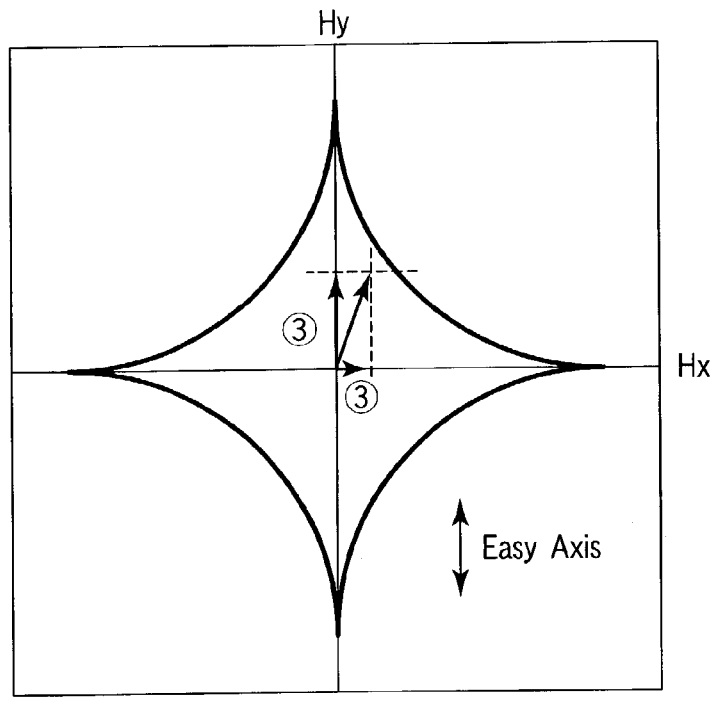

Asteroid curve

FIG. 21

Supply write current Ip1 to write word line and supply write current Ip2 to write bit line to particularly generate synthesized magnetic field Hx + Hy having magnitude enough to align magnetizing direction of magnetic domain at end portion of storing layer to hard-axis direction (①) — ST1

Supply write current Ip1 to write word line and supply write current Ip3 (> Ip2) to write bit line to generate synthesized magnetic field Hx + Hy having magnitude enough to reverse magnetizing direction of storing layer (②) — ST2

Supply write current Ip4 (< Ip1) to write word line and continuously supply write current Ip3 to write bit line to change unreversed spin from hard-axis direction to easy-axis direction (③) — ST3

FIG. 22

Asteroid curve

Asteroid curve

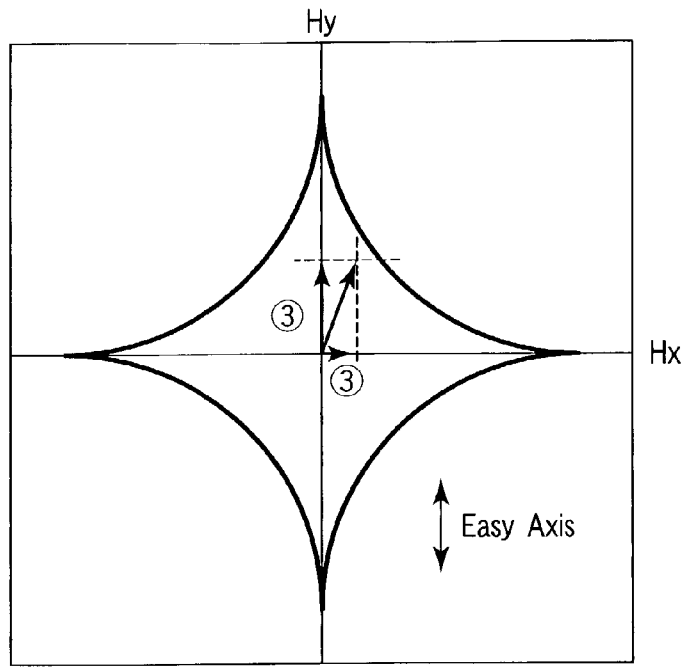

Asteroid curve

FIG. 25

| Supply write current Ip1 to write word line and supply write current Ip2 to write bit line to particularly generate synthesized magnetic field Hx + Hy having magnitude enough to align magnetizing direction of magnetic domain at end portion of storing layer to hard-axis direction (①) | ~ST1 |

| Supply write current Ip3 (< Ip1) to write word line and supply write current Ip4 (> Ip2) to write bit line to generate synthesized magnetic field Hx + Hy having magnitude enough to reverse magnetizing direction of storing layer (②) | ~ST2 |

| Supply write current Ip5 (< Ip3) to write word line and continuously supply write current Ip4 to write bit line to change unreversed spin from hard-axis direction to easy-axis direction (③) | ~ST3 |

FIG. 26

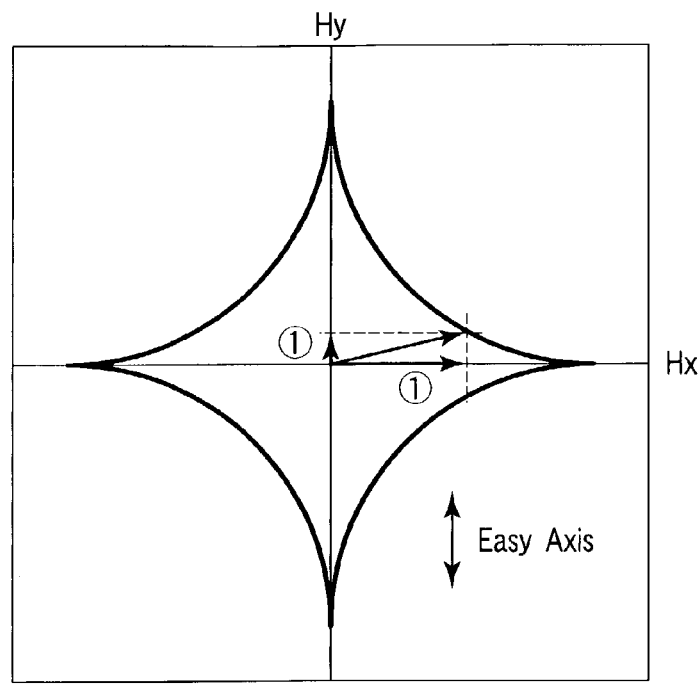
Asteroid curve
F I G. 27
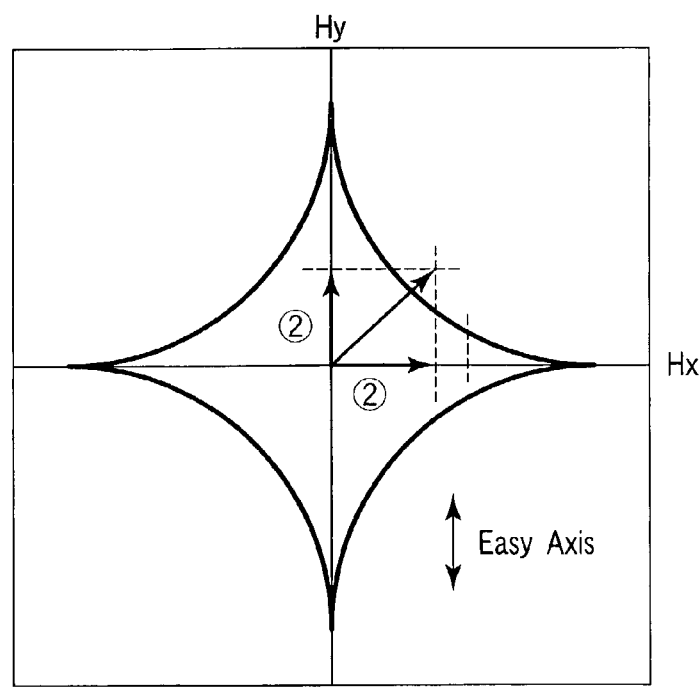
Asteroid curve
F I G. 28

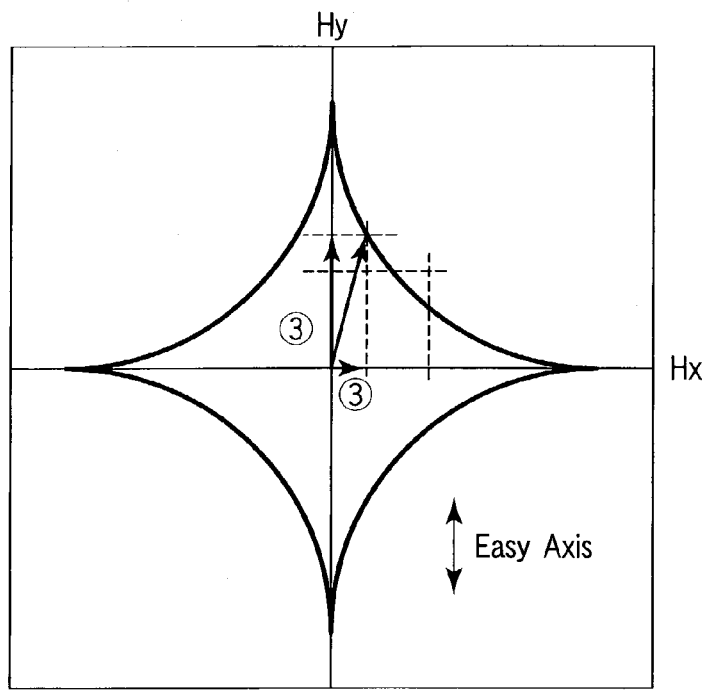

Asteroid curve

FIG. 29

| Supply write current Ip1 to write word line and supply write current Ip2 to write bit line to particularly generate synthesized magnetic field Hx + Hy having magnitude enough to align magnetizing direction of magnetic domain at end portion of storing layer to hard-axis direction (①) | ~ST1 |
|---|---|
| Supply write current Ip3 (< Ip1) to write word line and supply write current Ip4 (> Ip2) to write bit line to generate synthesized magnetic field Hx + Hy having magnitude enough to reverse magnetizing direction of storing layer (②) | ~ST2 |
| Supply write current Ip5 (< Ip3) to write word line and supply write current Ip6 (> Ip4) to write bit line to change unreversed spin from hard-axis direction to easy-axis direction (③) | ~ST3 |

FIG. 30

Asteroid curve

Asteroid curve

Gradually decrease write current Ip1 (intensity of magnetic field Hx) of write word line and gradually increase write current Ip2 (intensity of magnetic field Hy) of write bit line to change intensity of synthesized magnetic field Hx + Hy in analog manner (①→②) ~ST1

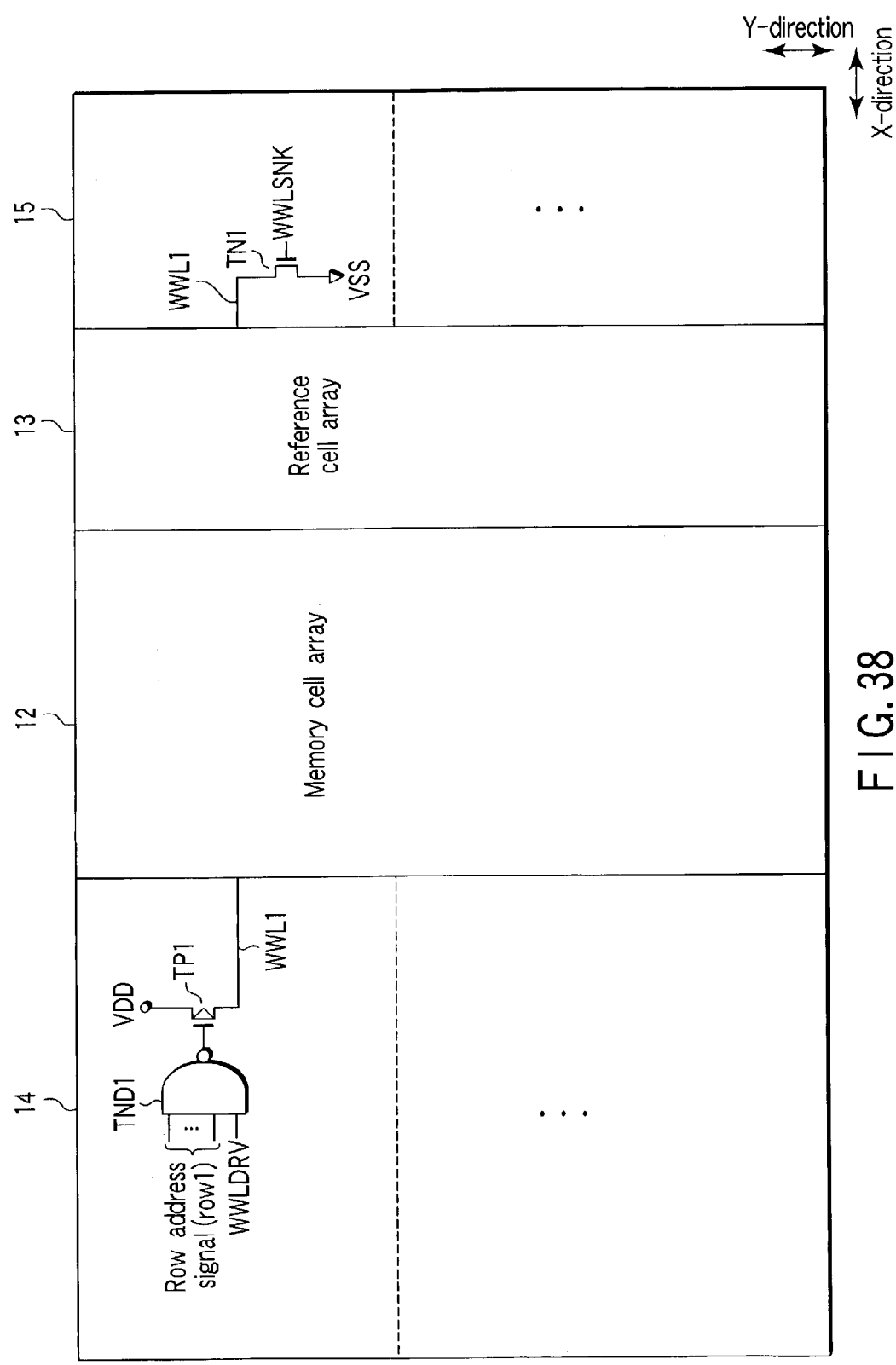
F I G. 38

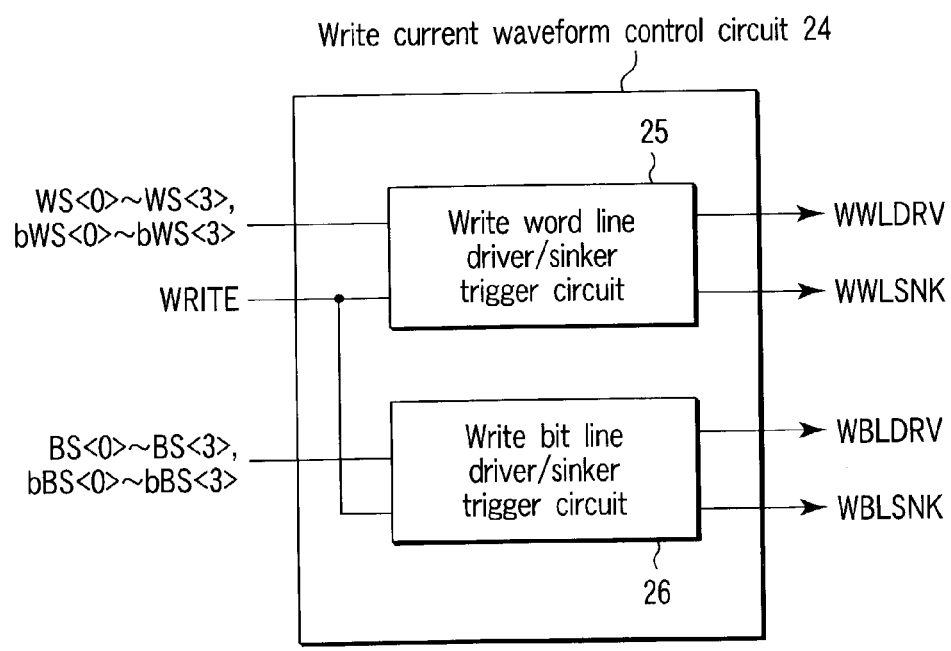
F I G. 40

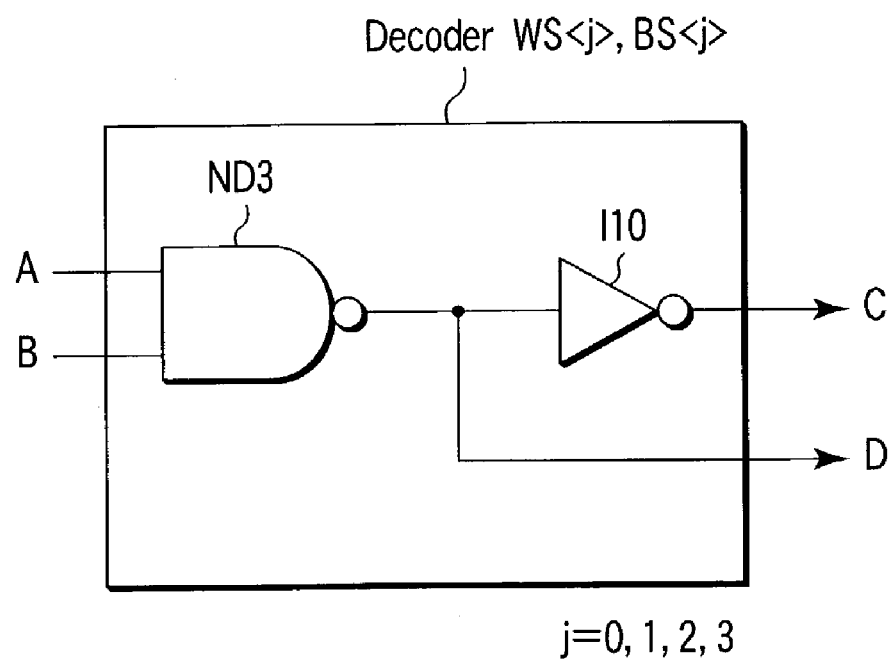
F I G. 47

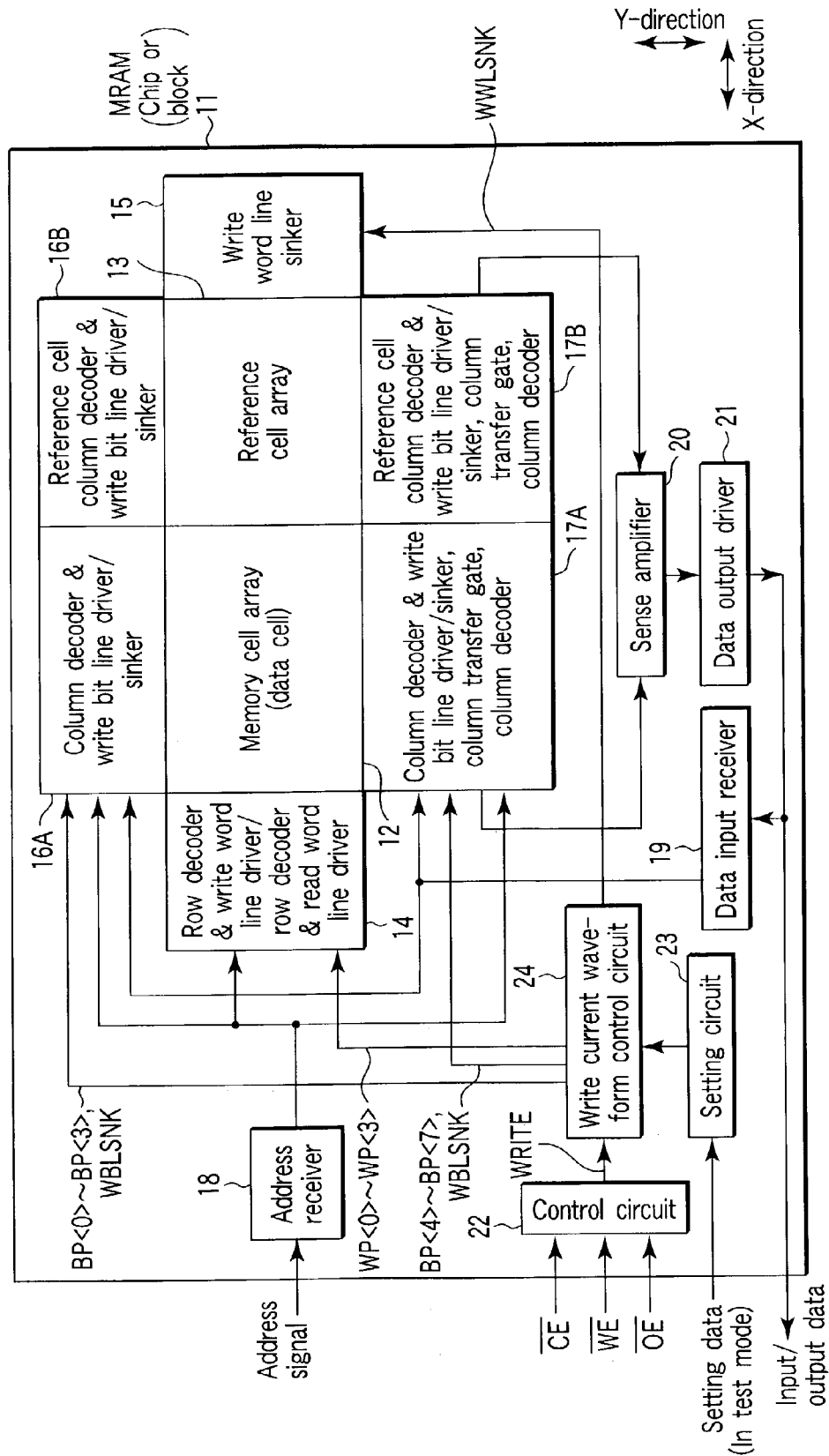
F I G. 48

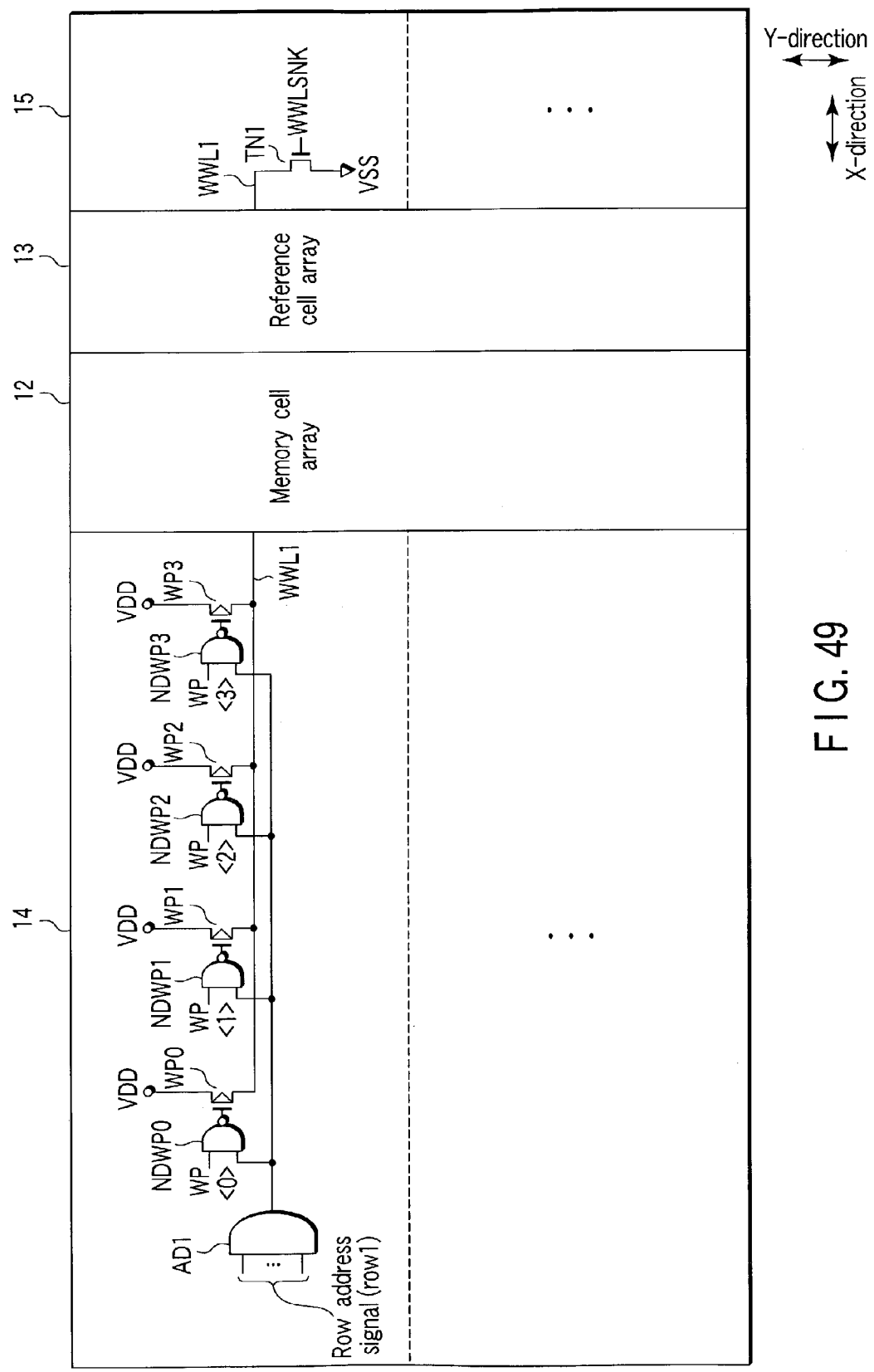
F I G. 49

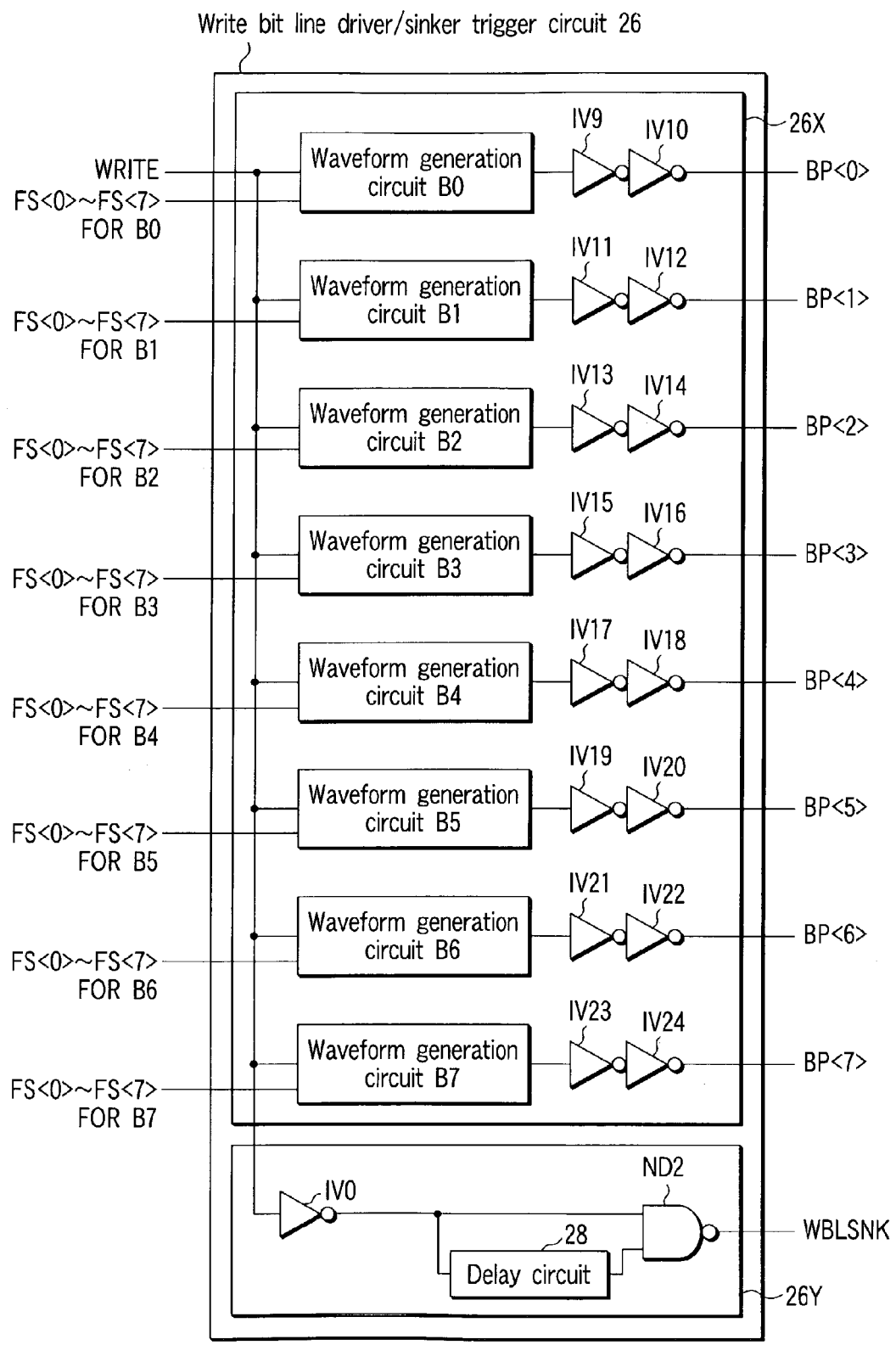
F I G. 53

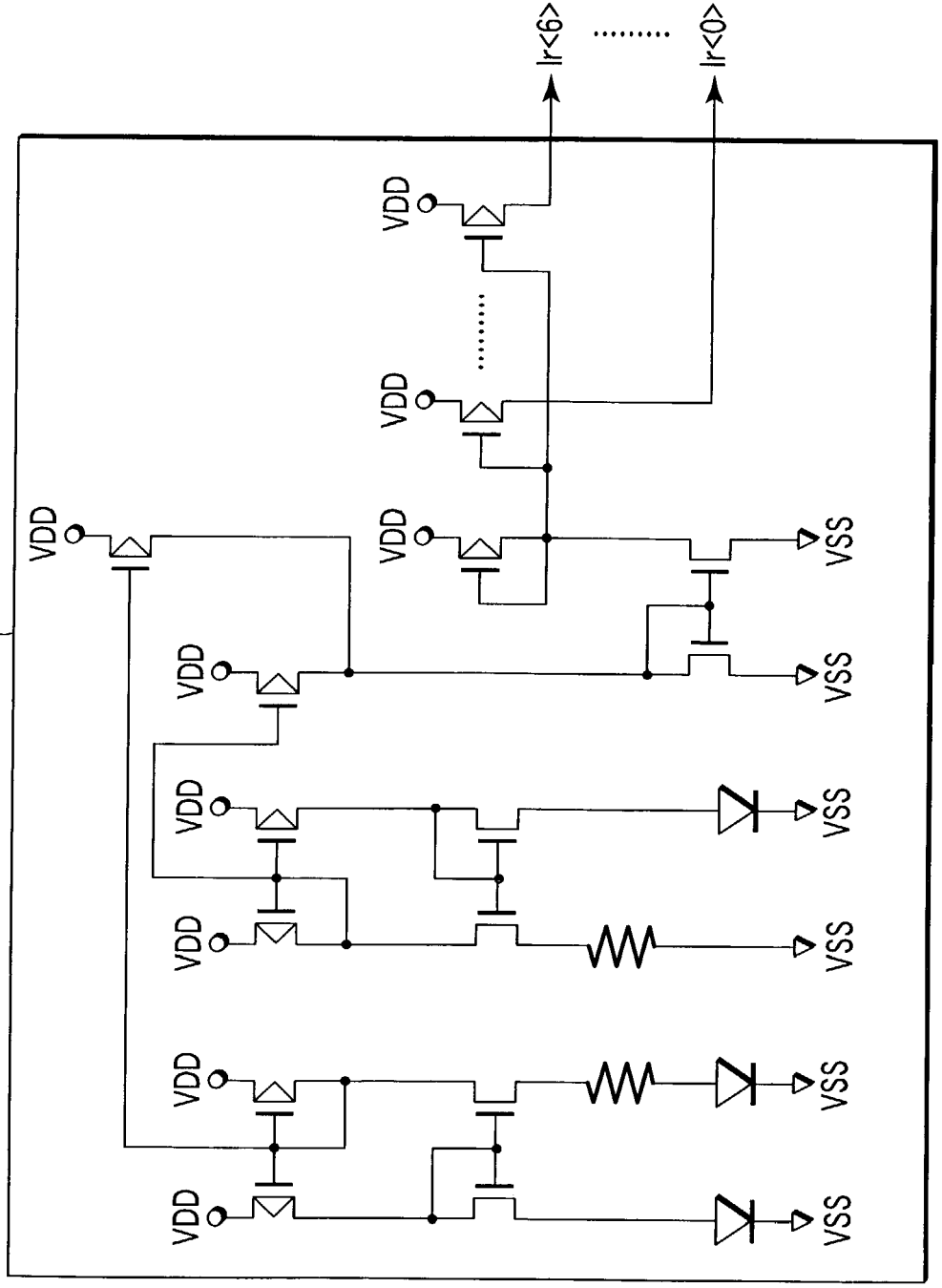
F I G. 56

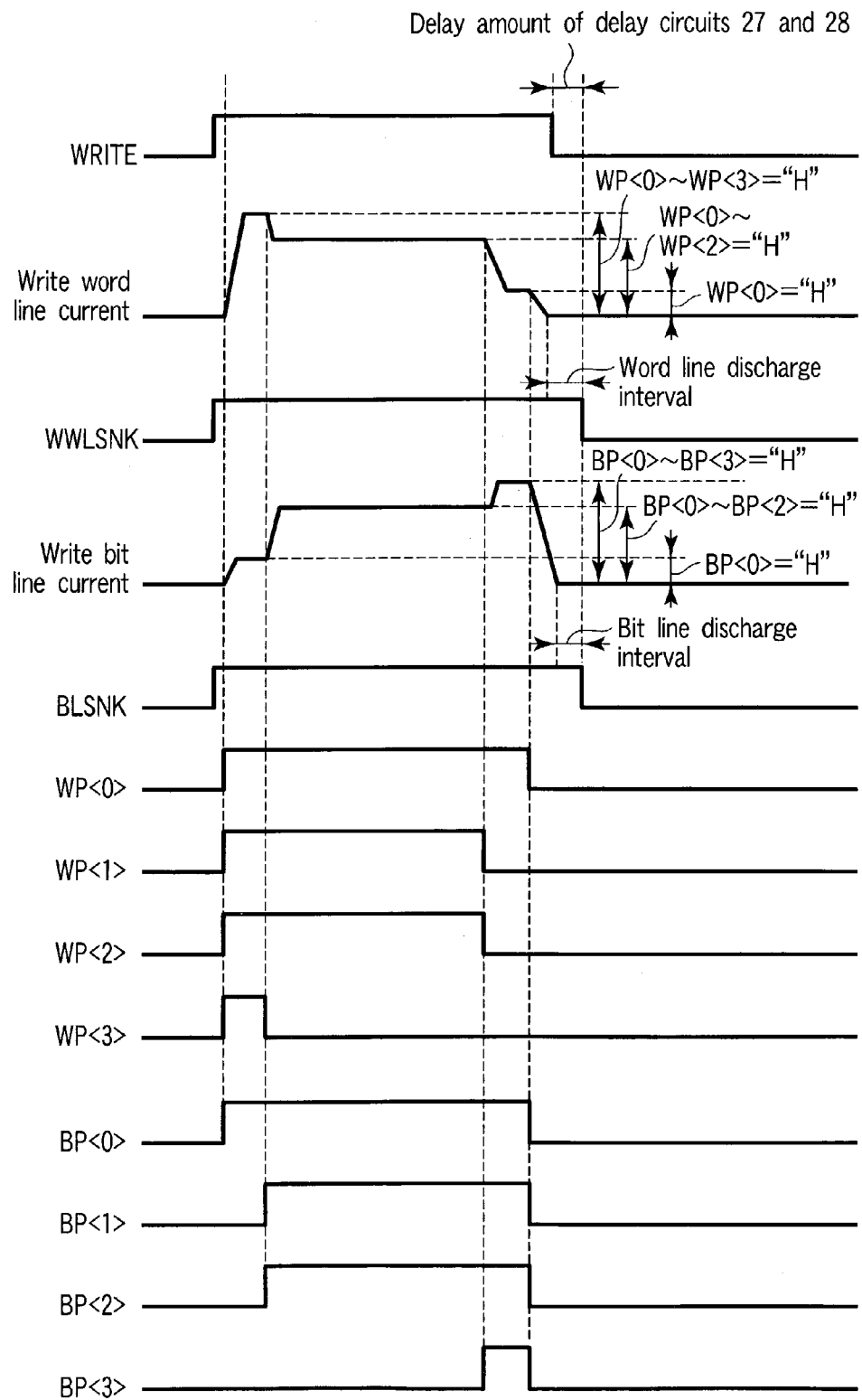
F I G. 57

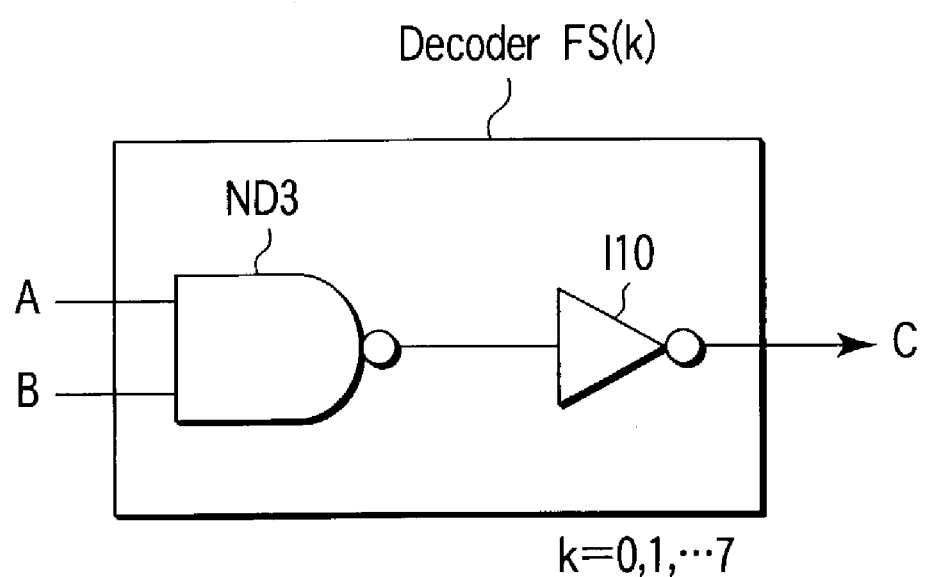
F I G. 60

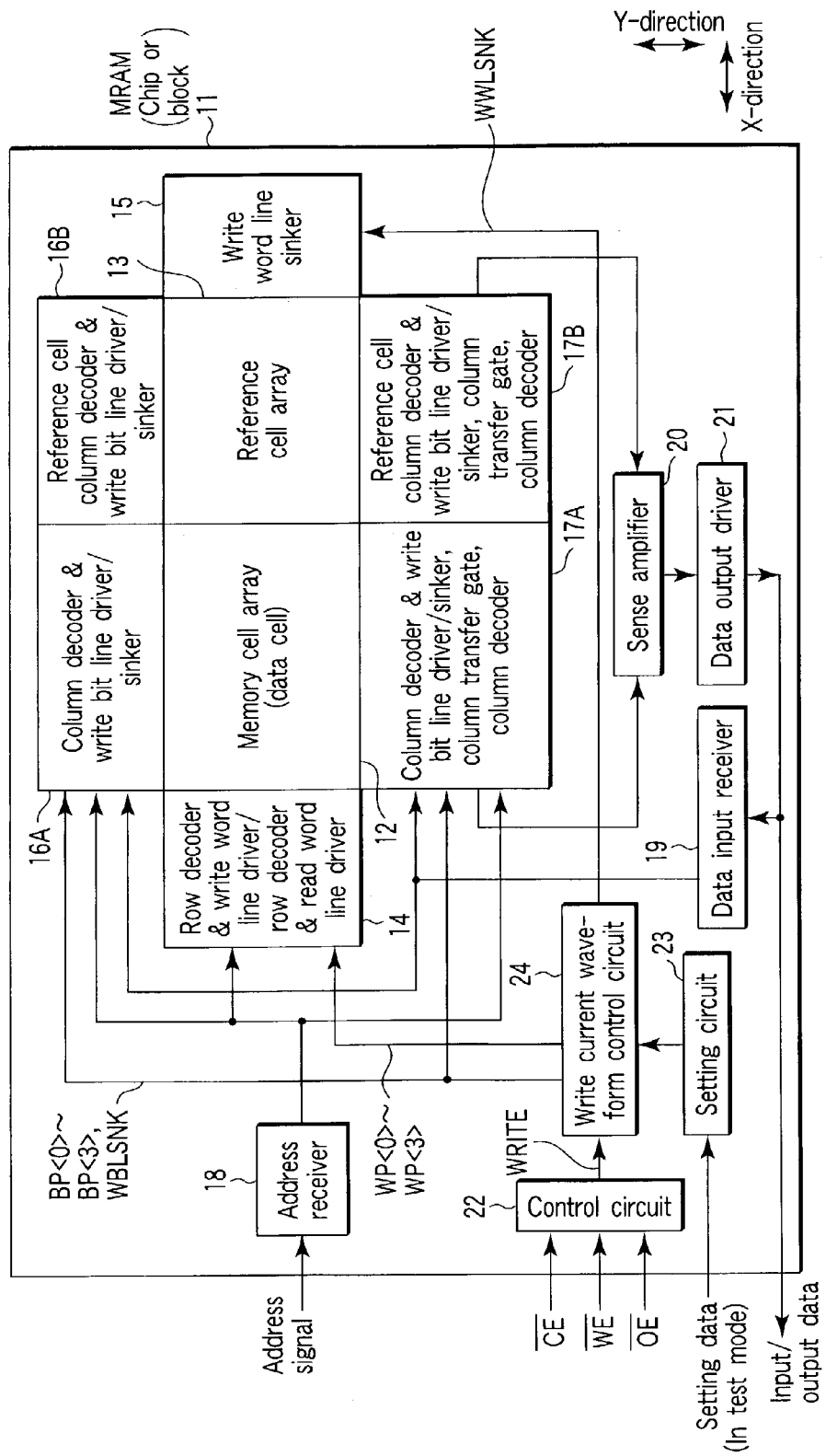
F I G. 61

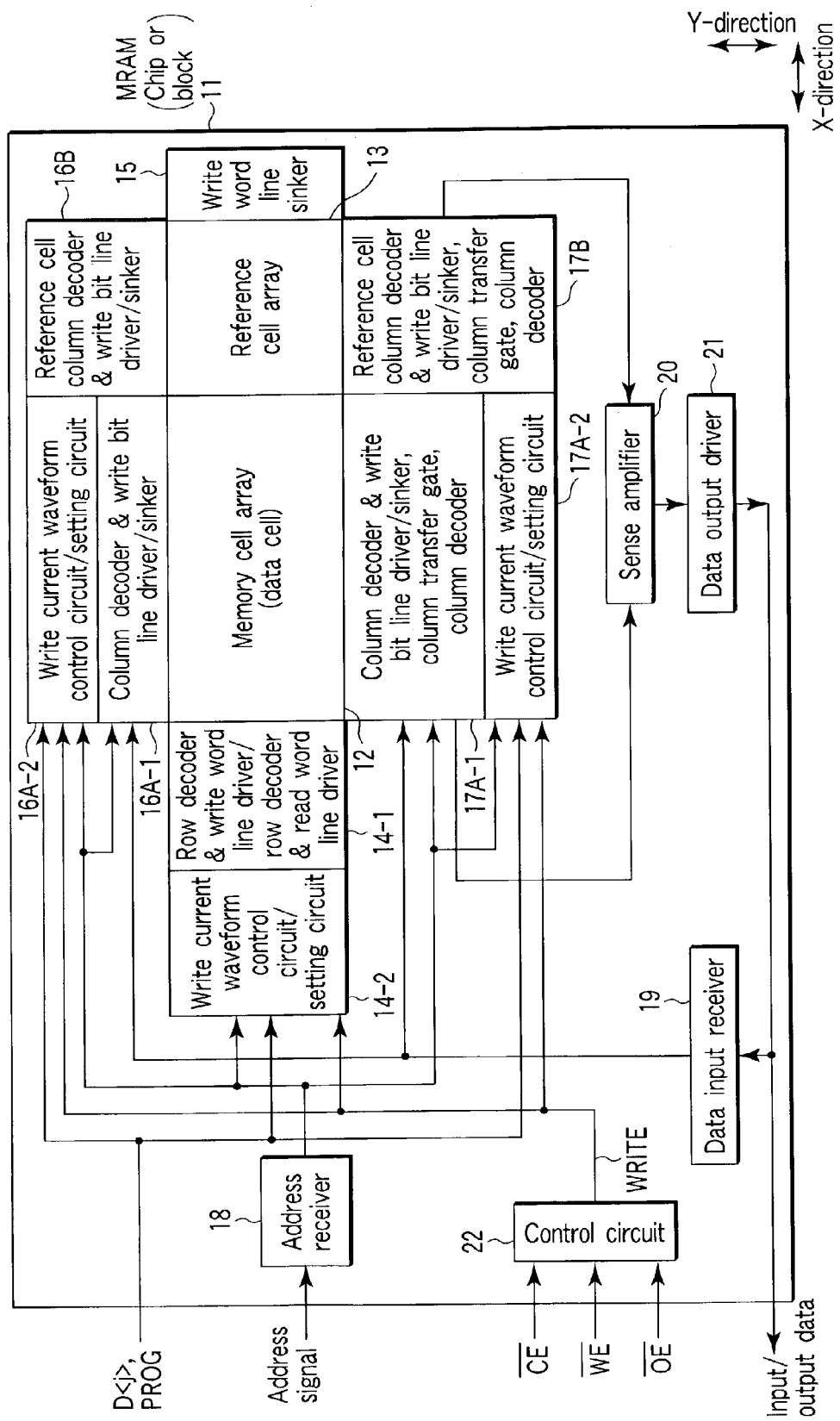
F I G. 65

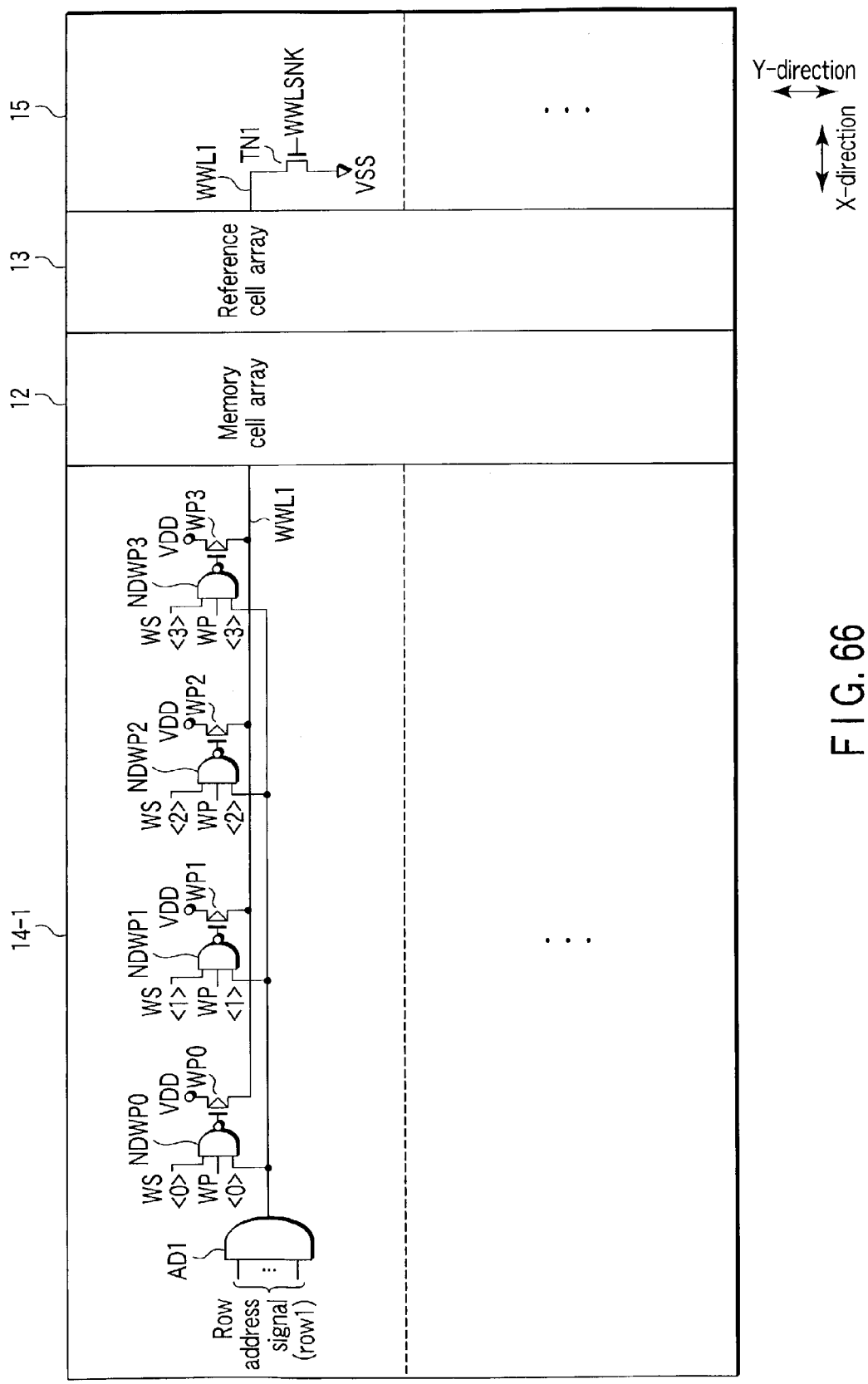
F I G. 66

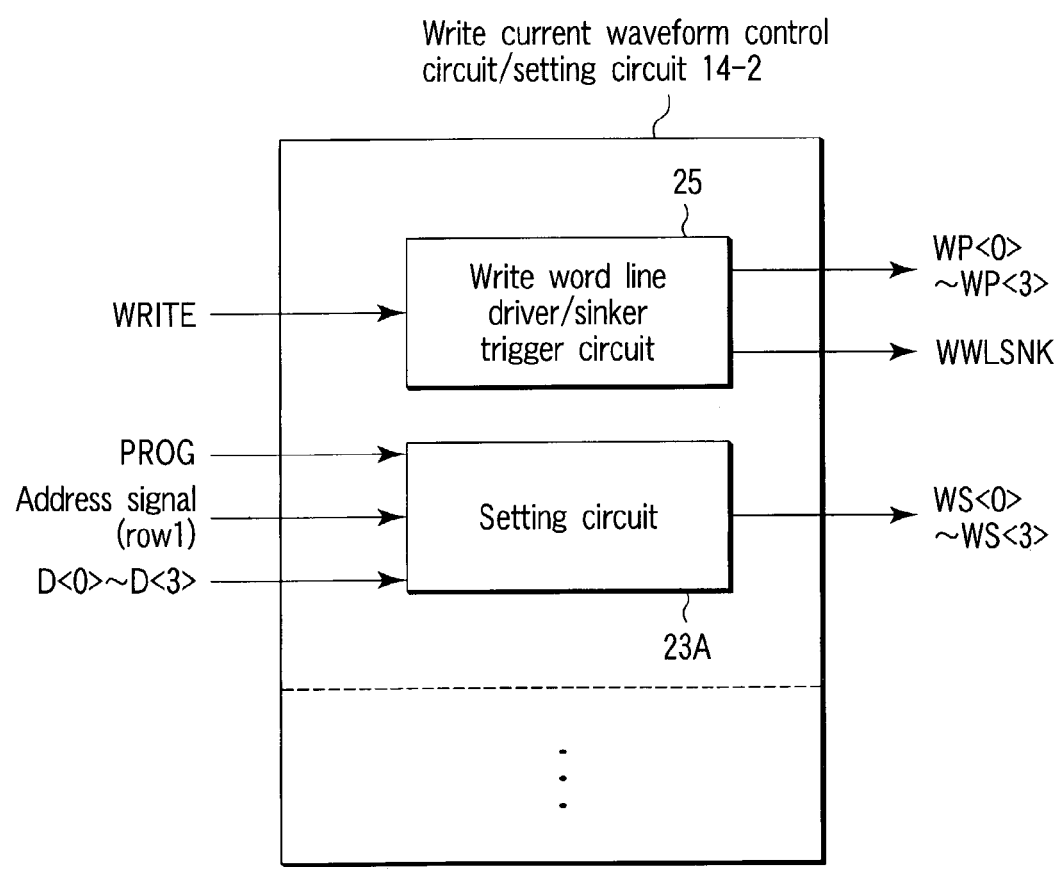
F I G. 68

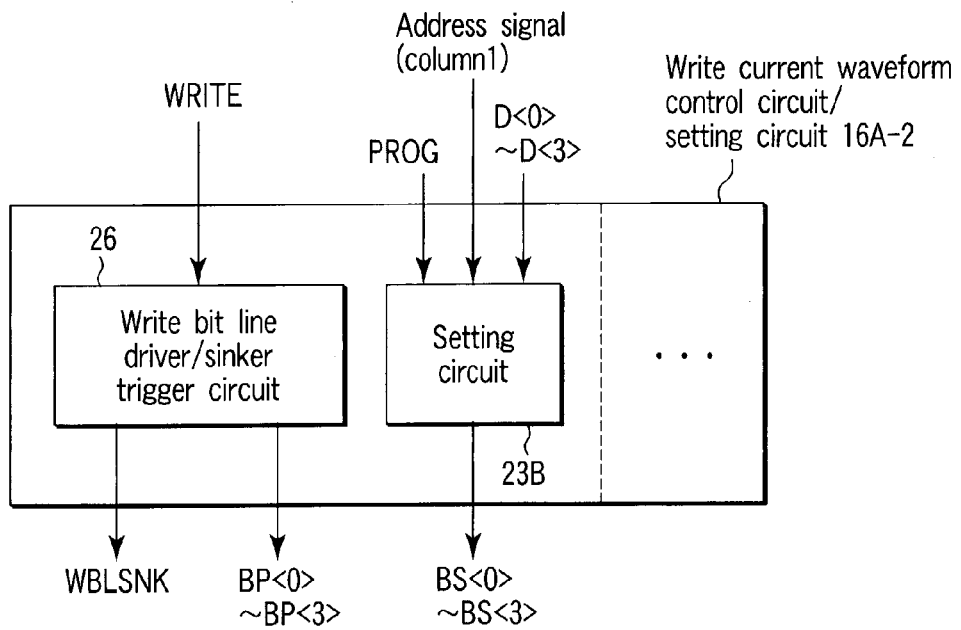
F I G. 69
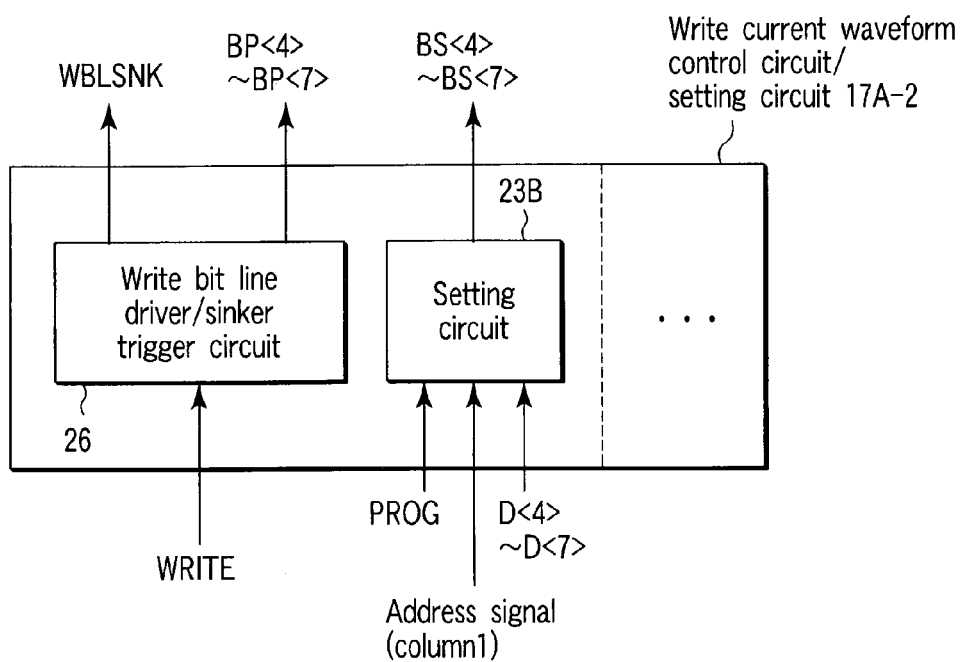
F I G. 70

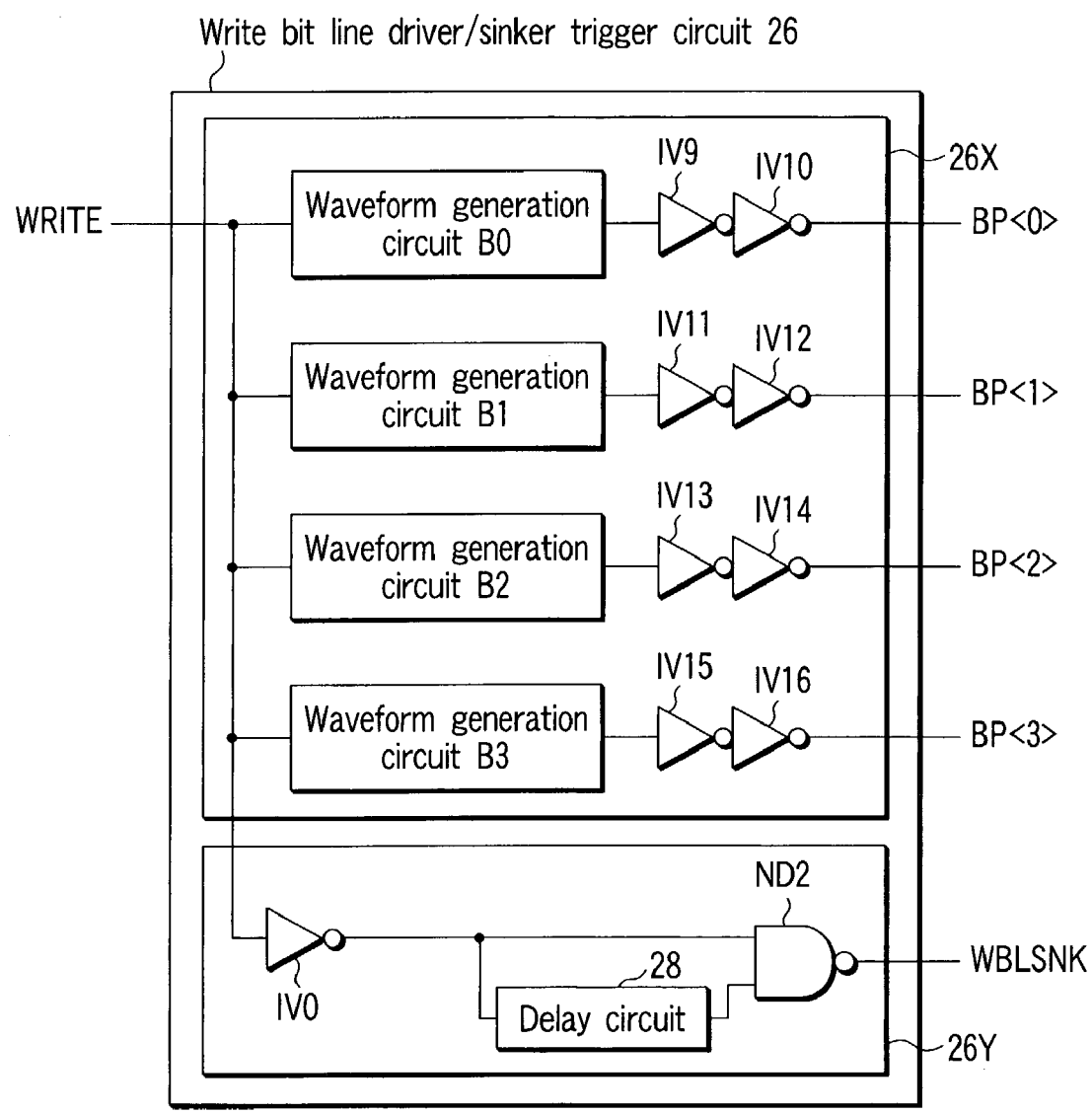
F I G. 72

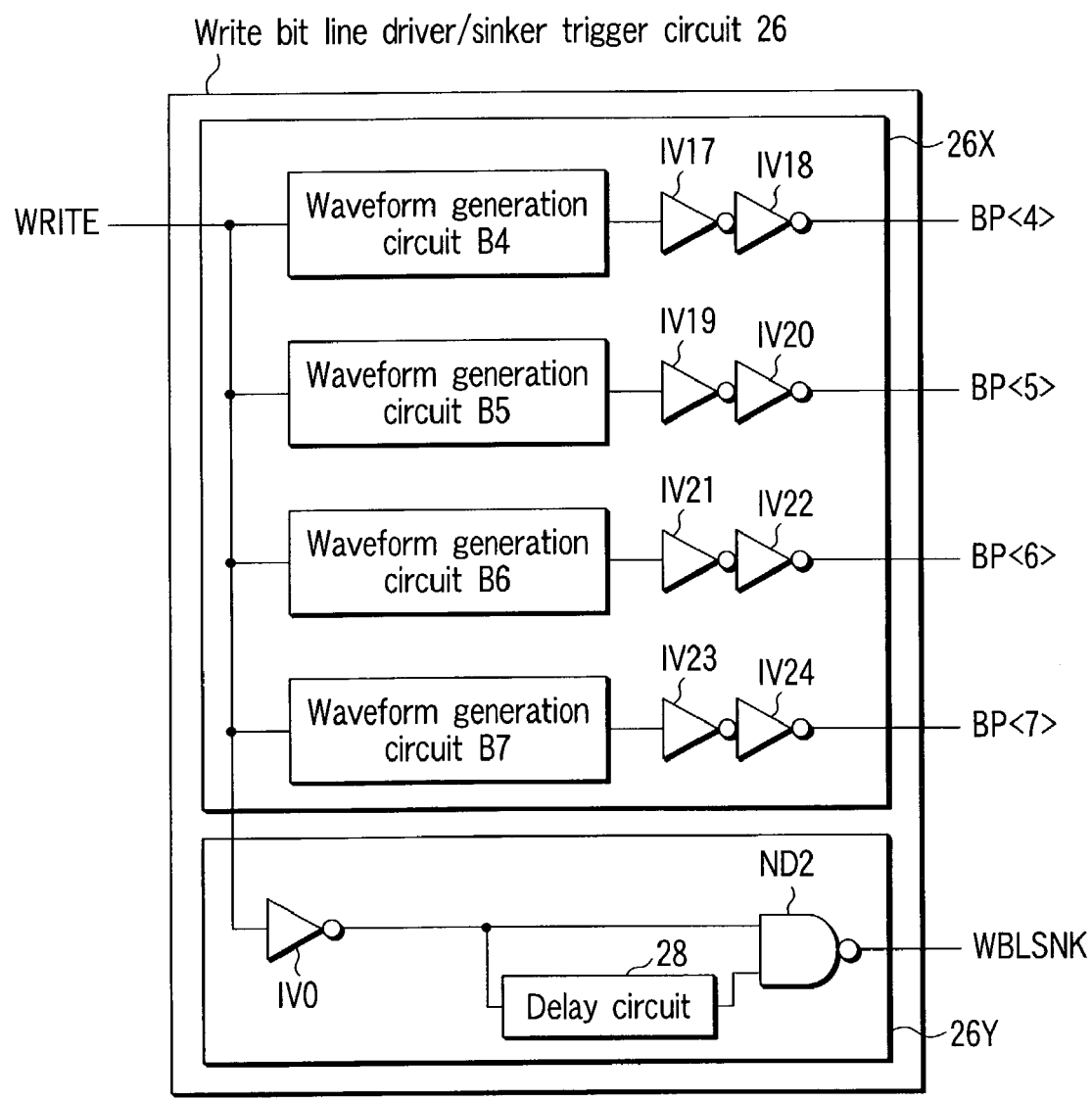
F I G. 73

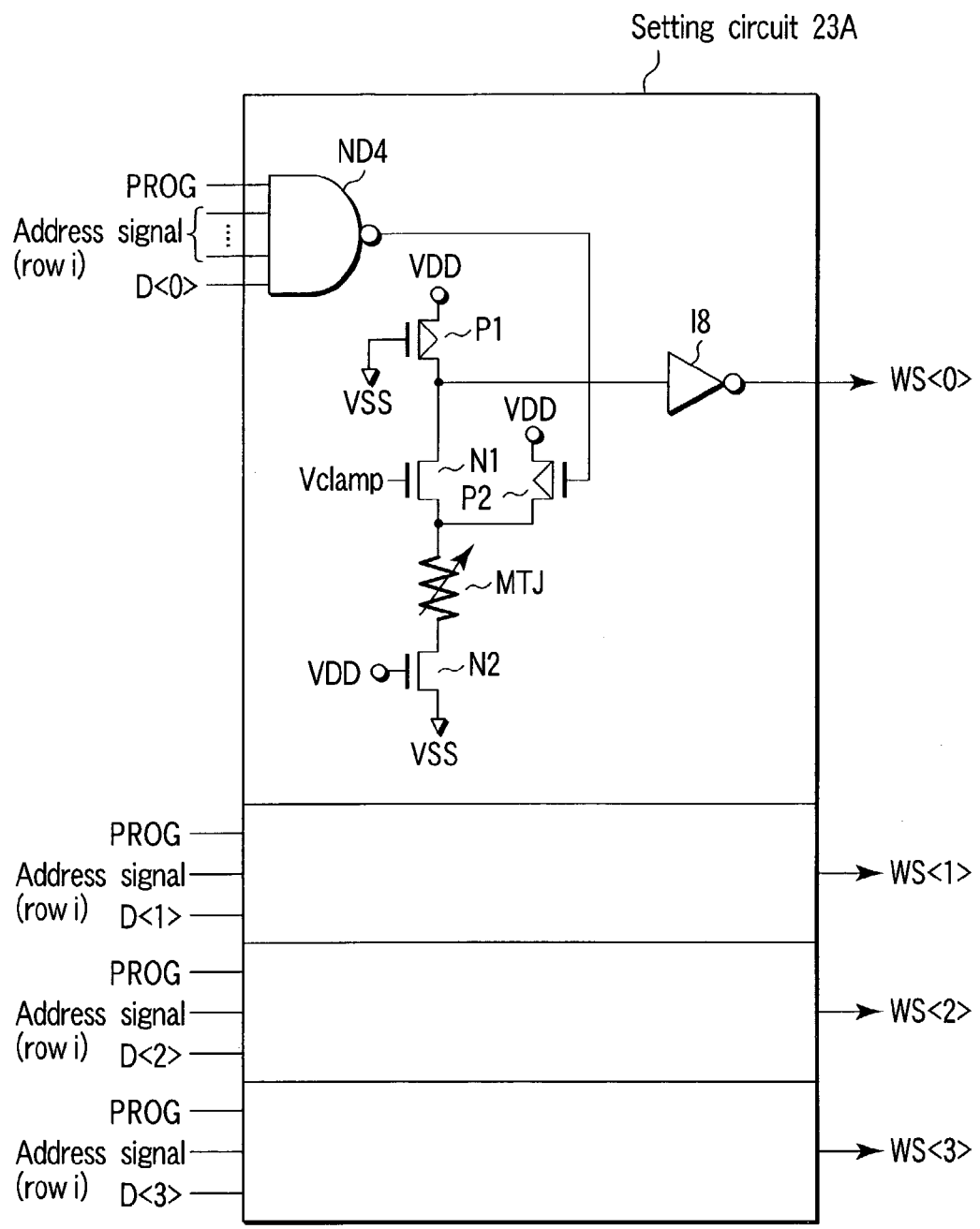
F I G. 74

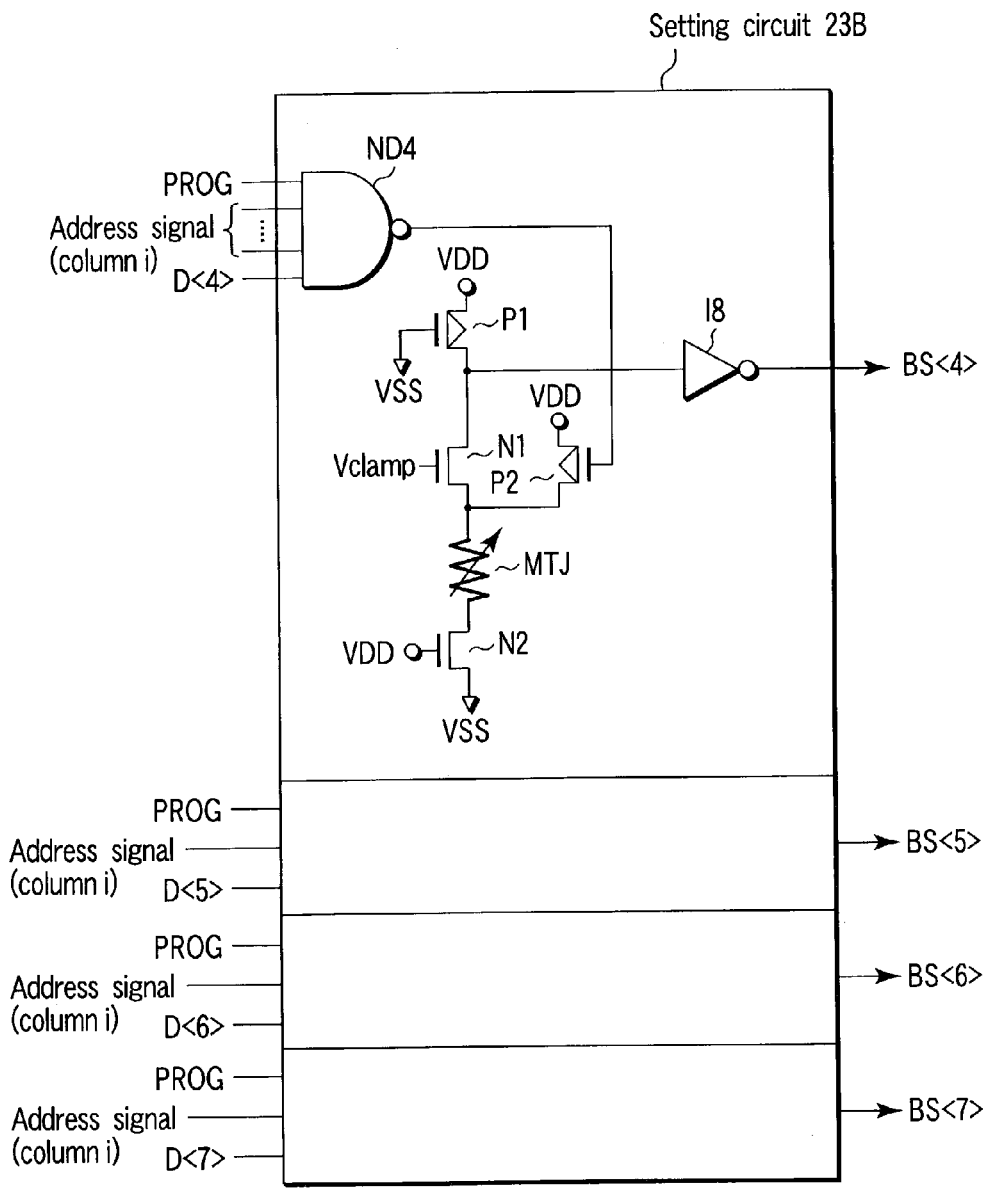
F I G. 76

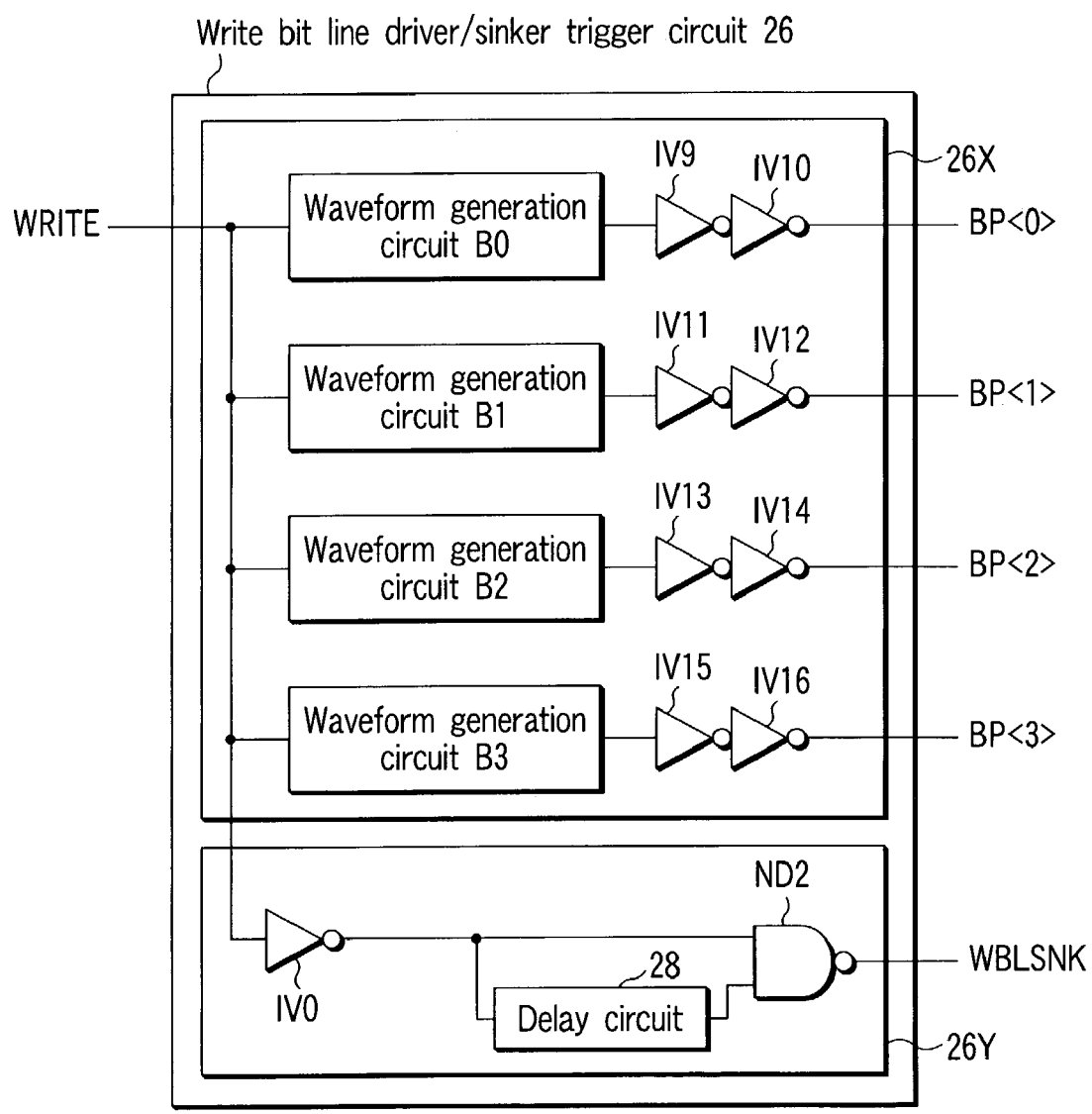
F I G. 80

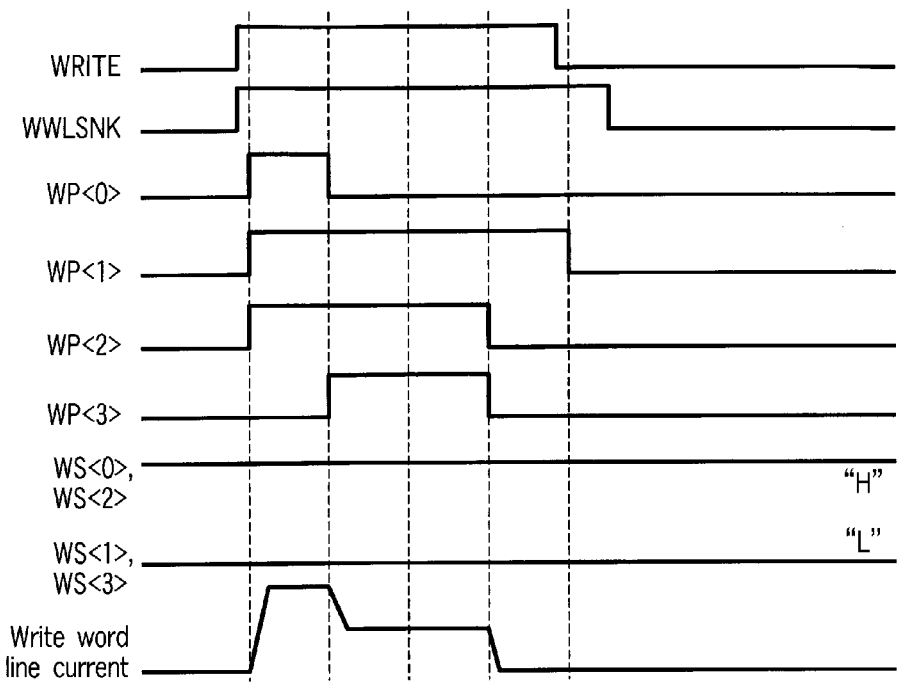
F I G. 90
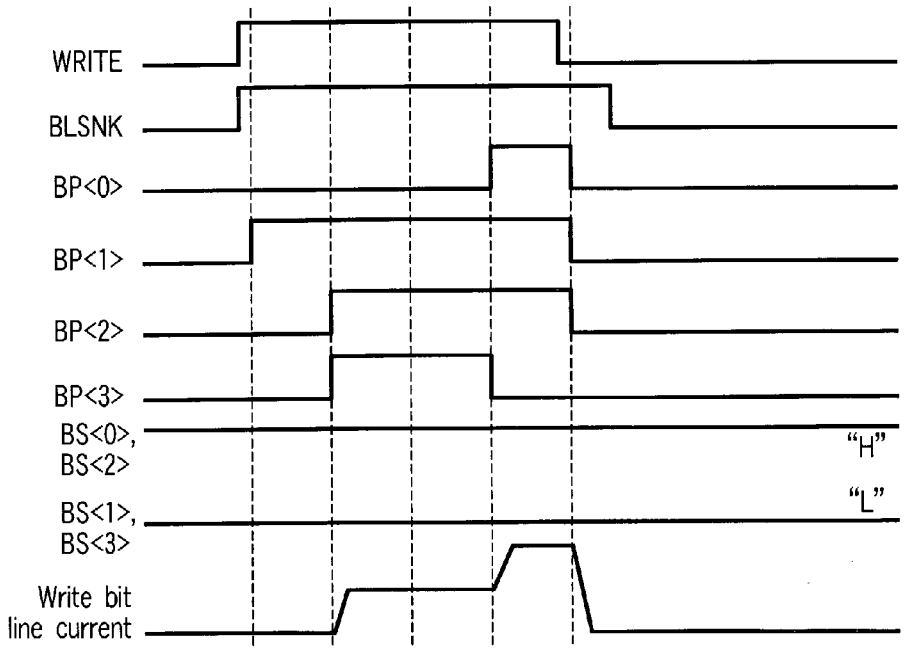
F I G. 91

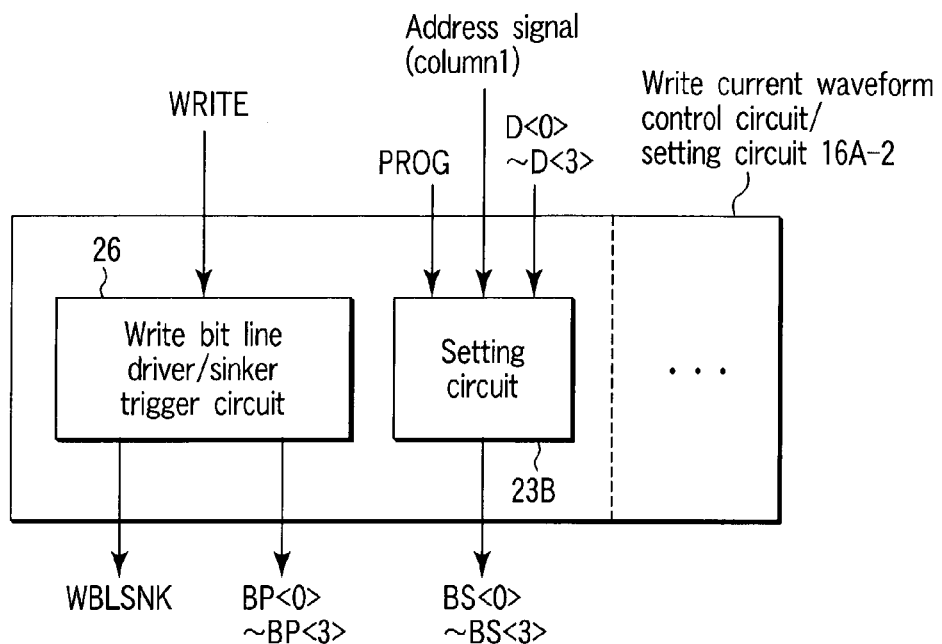
F I G. 96
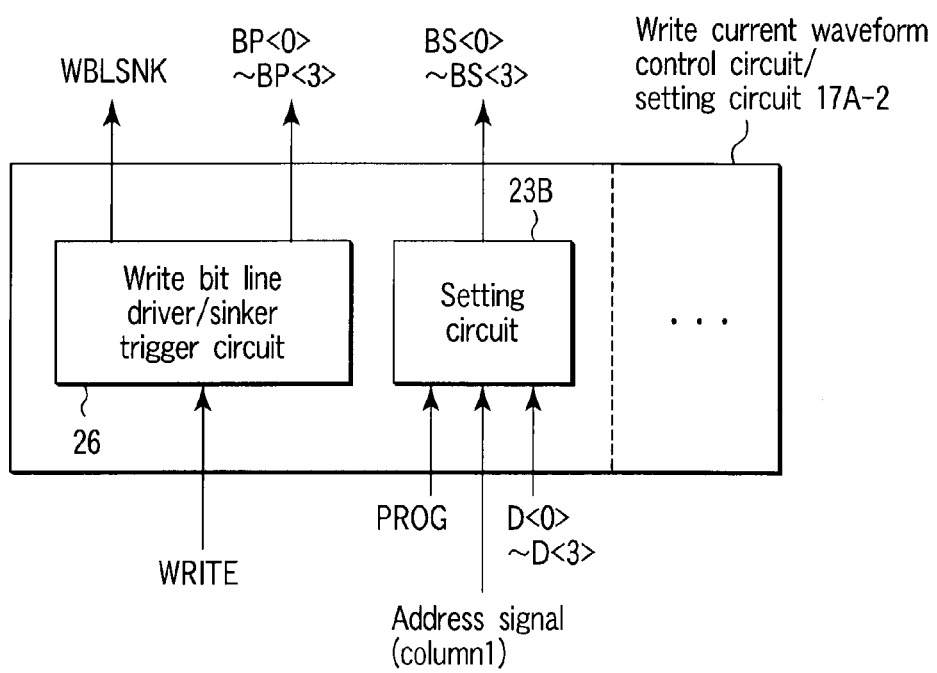
F I G. 97

*PROG is input when circuit in FIG. 39 is used

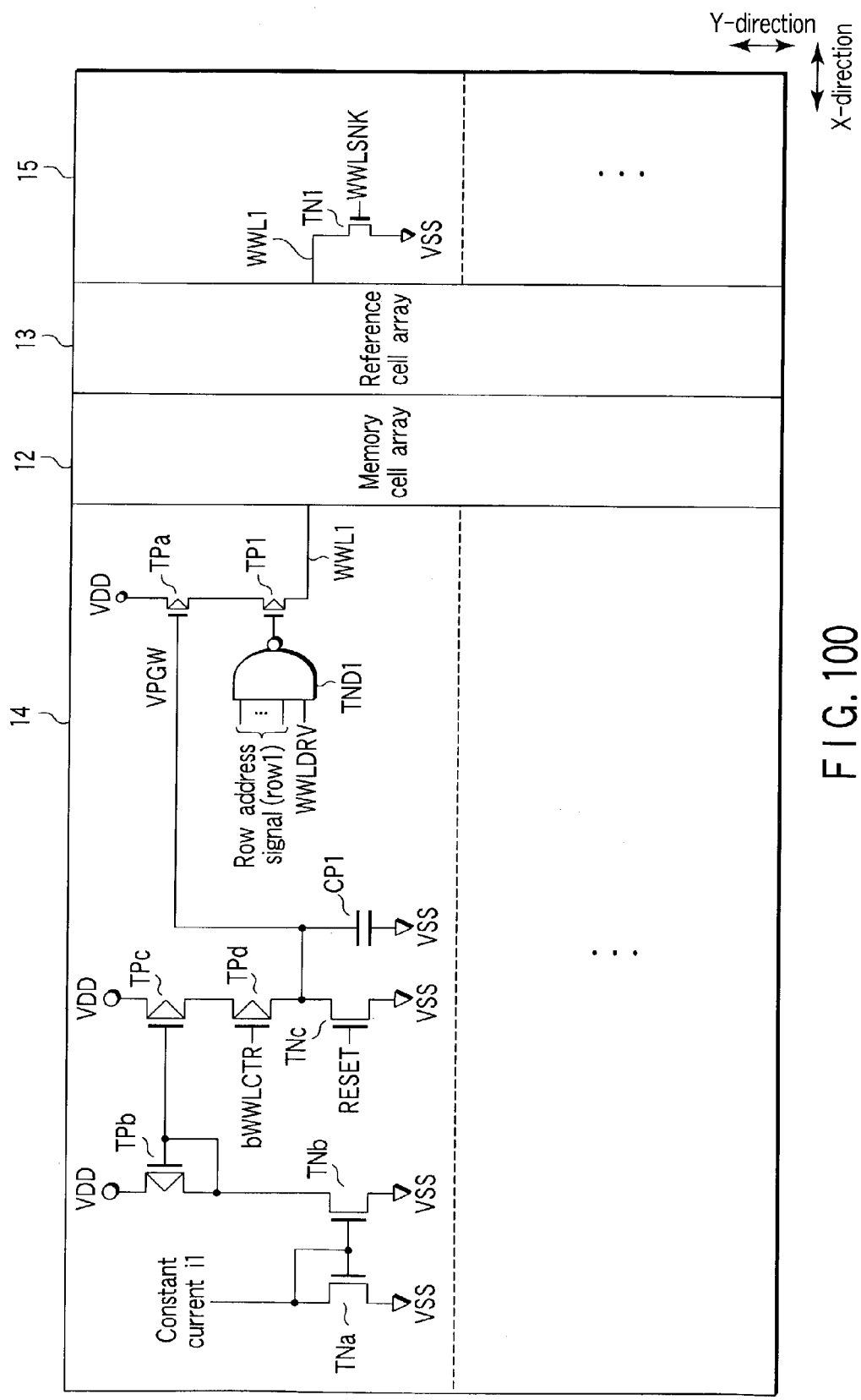
F I G. 100

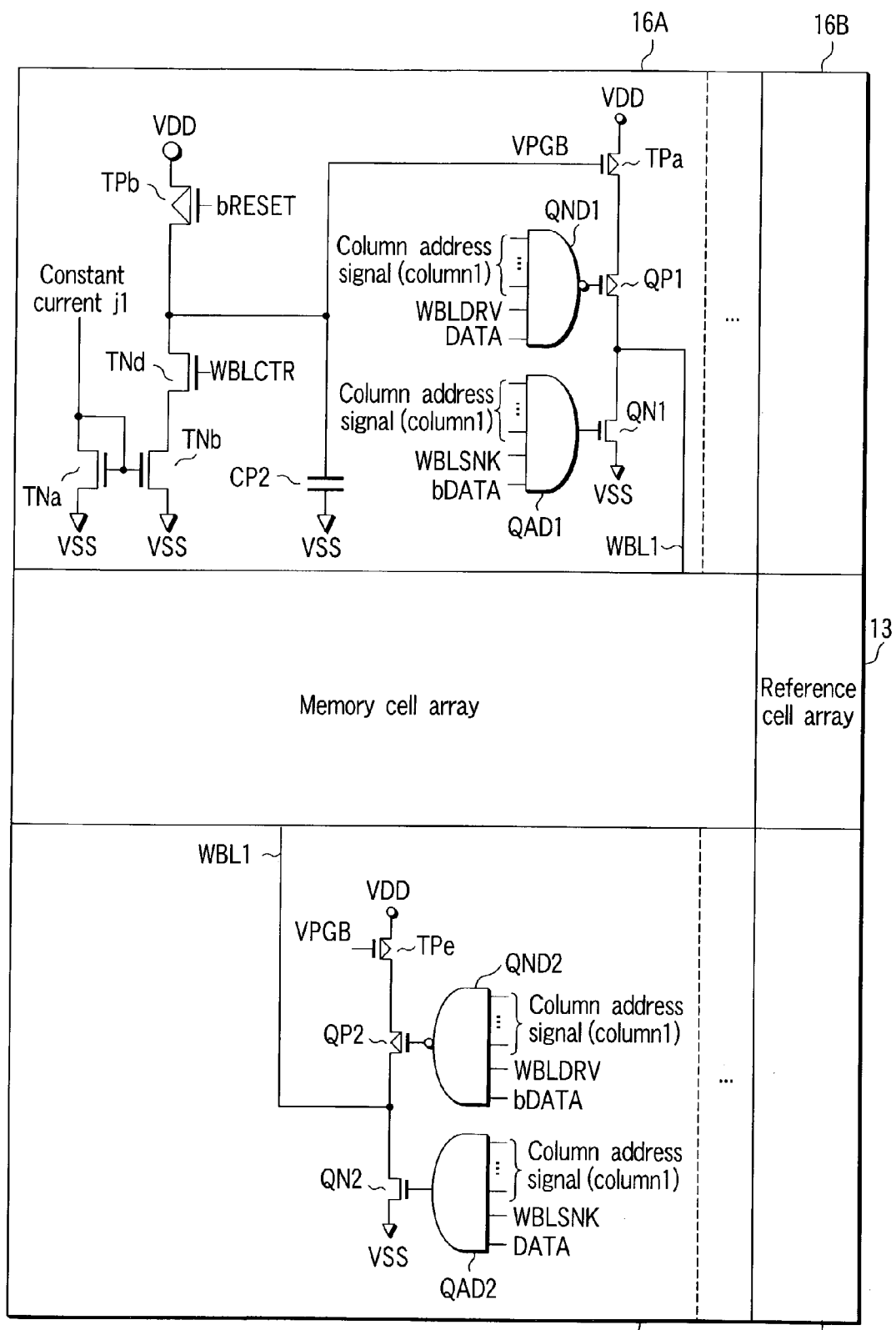
F I G. 101

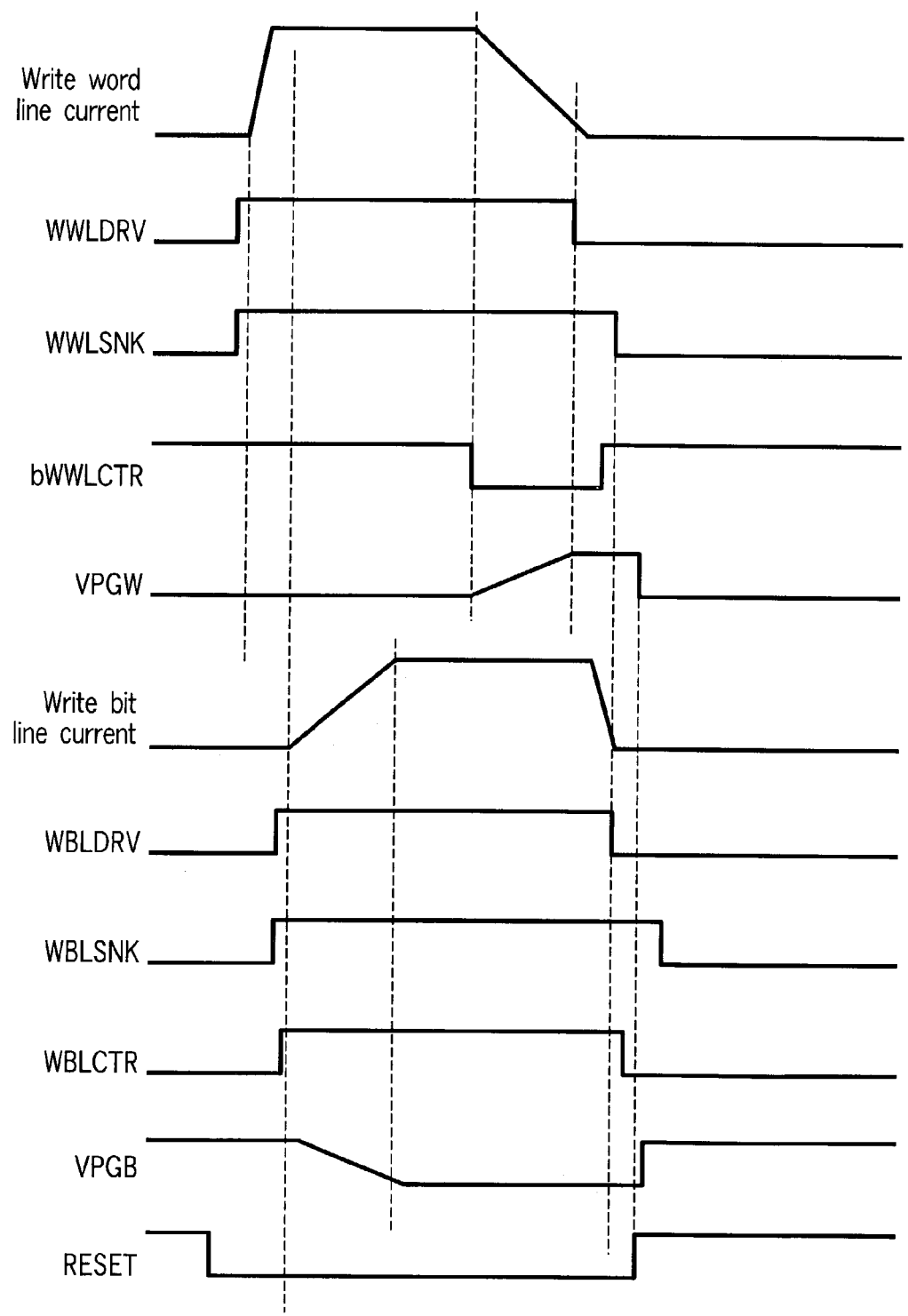
F I G. 103

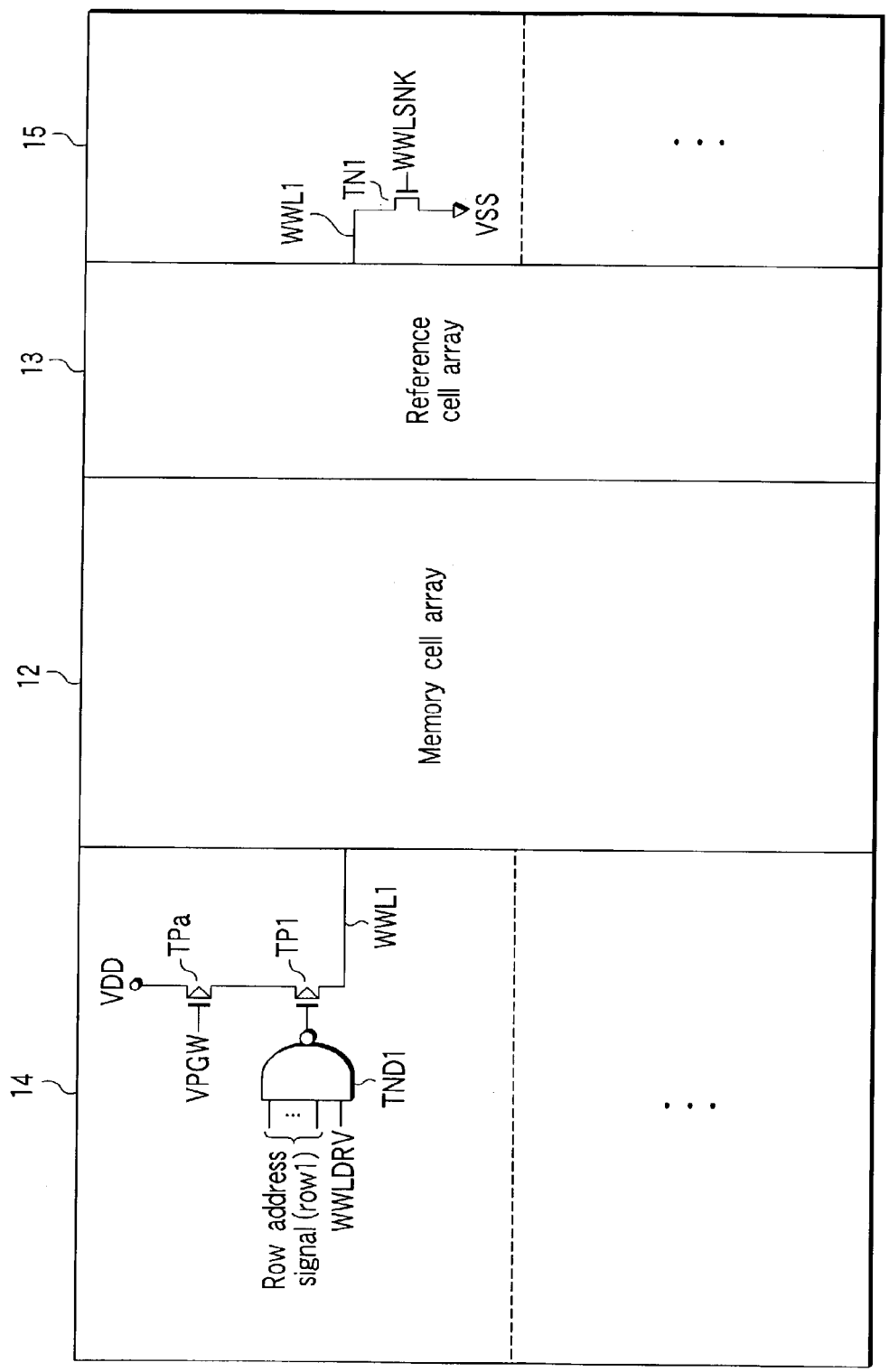
F I G. 104

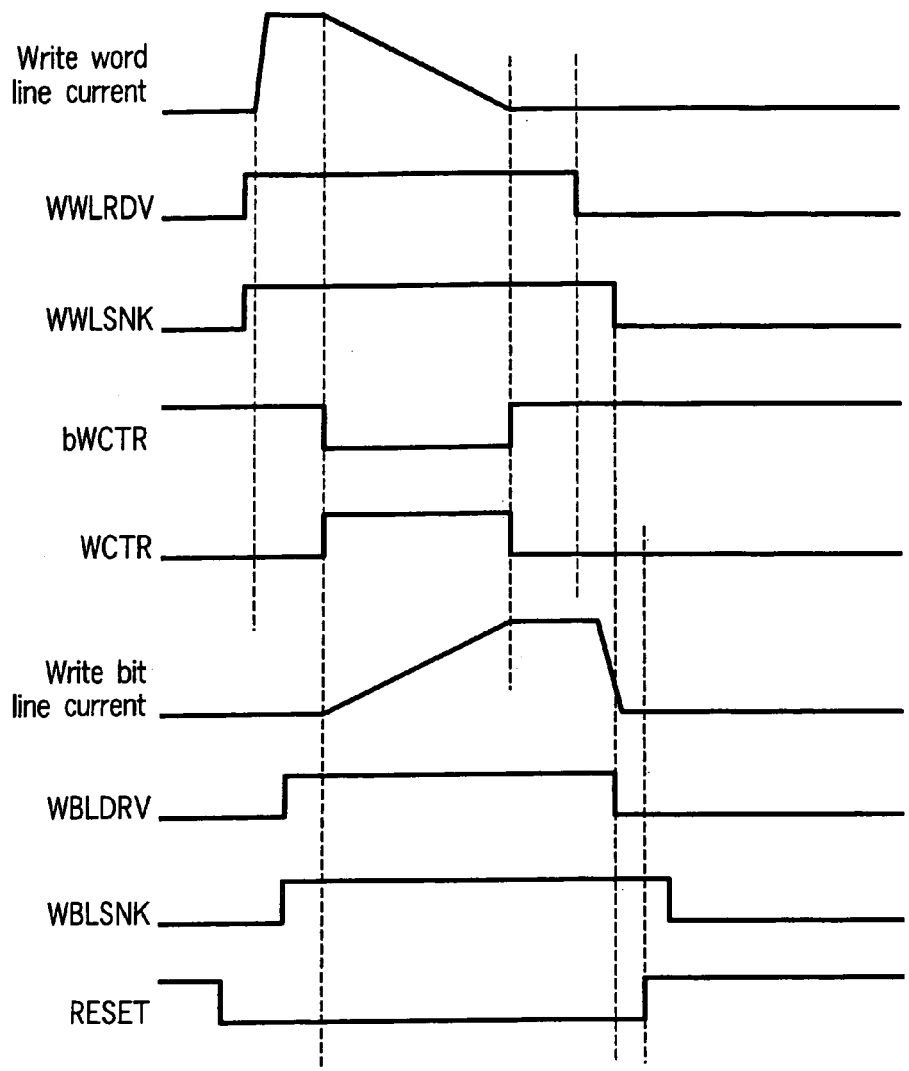
FIG. 108
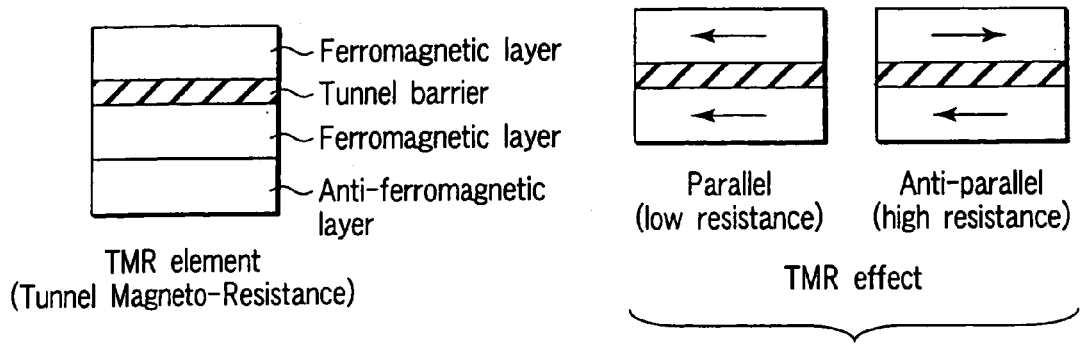
FIG. 109
PRIOR ART
FIG. 110
PRIOR ART

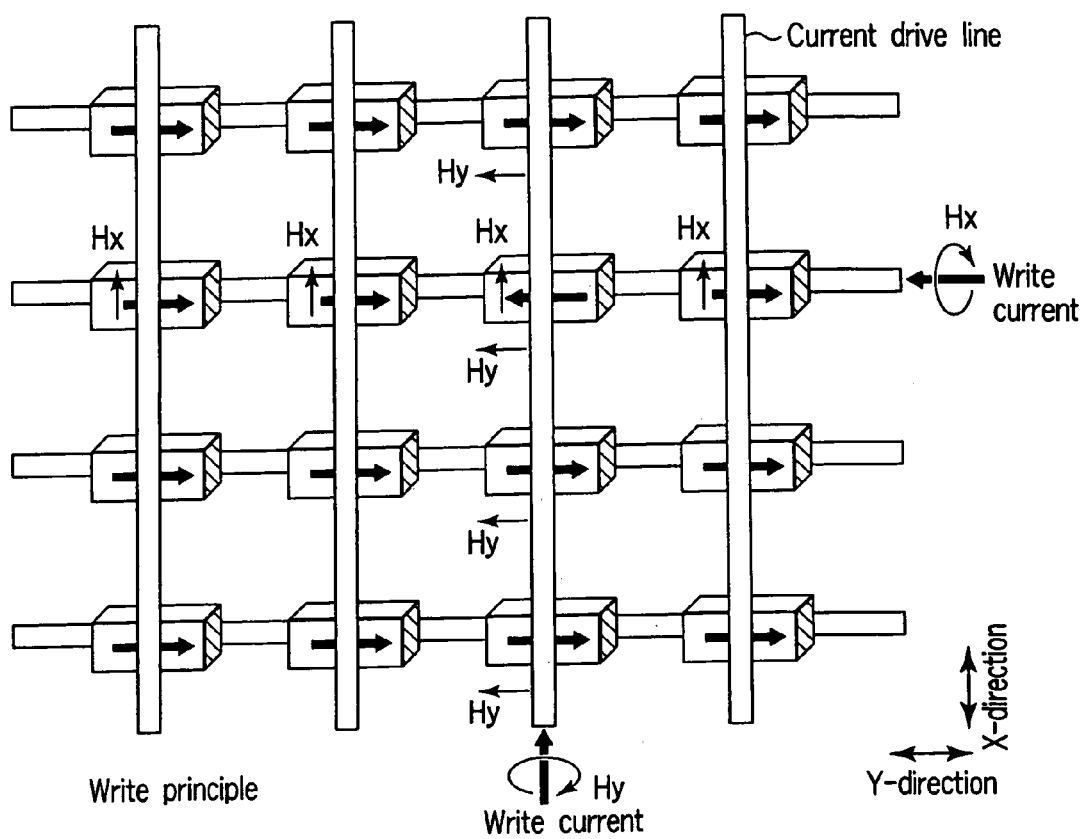
FIG. 111 PRIOR ART
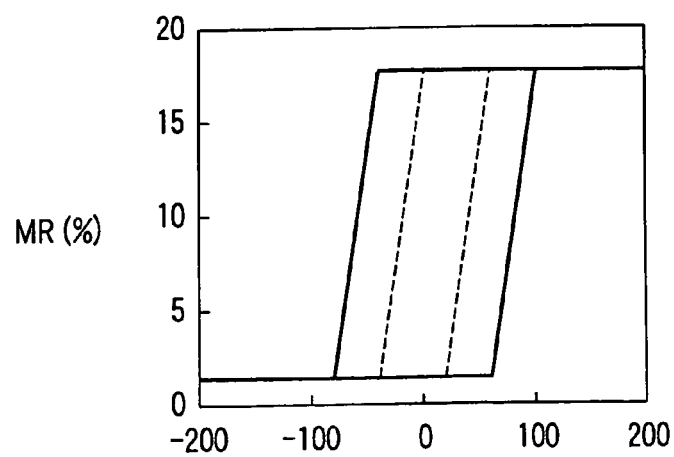
FIG. 112 TMR curve
PRIOR ART

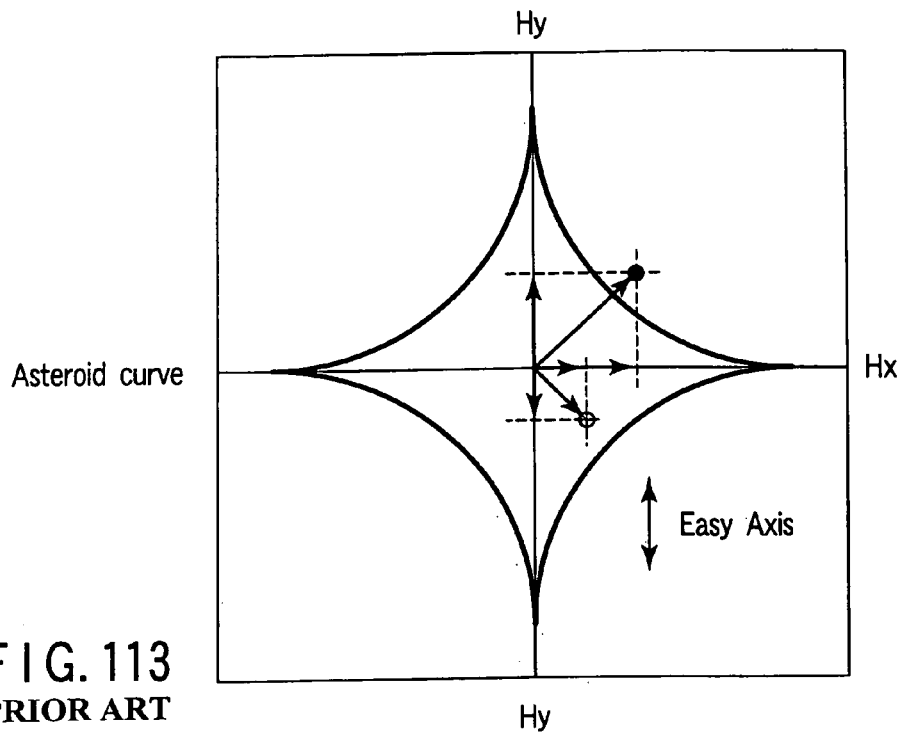
FIG. 113 PRIOR ART
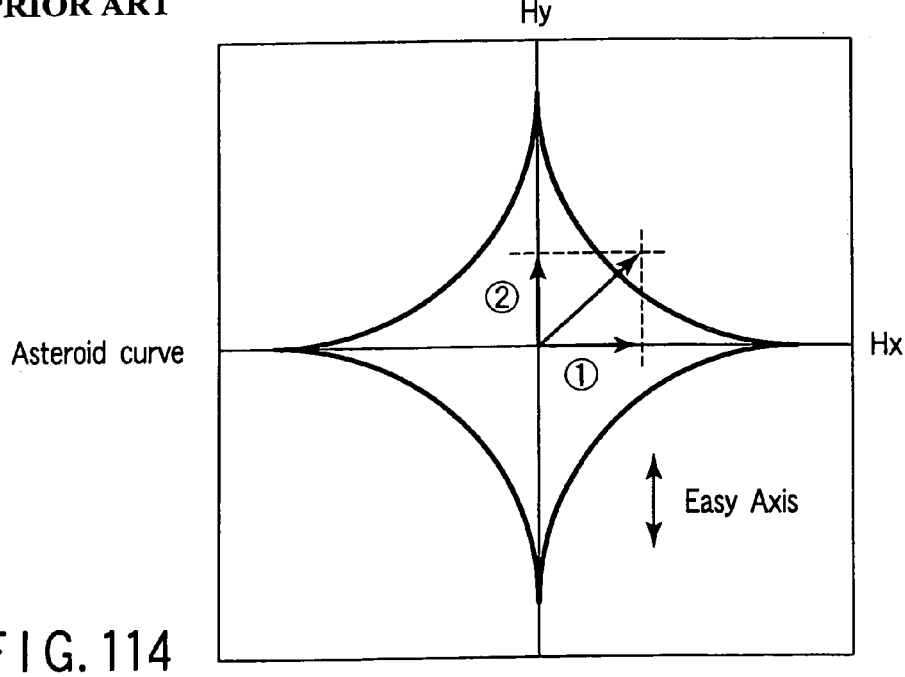
FIG. 114 PRIOR ART
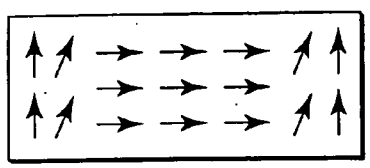
FIG. 115 PRIOR ART   Direction of magnetic pole

MAGNETIC RANDOM ACCESS MEMORY

CROSS-REFERENCE TO RELATED APPLICATIONS

This application is based upon and claims the benefit of priority from the prior Japanese Patent Application No. 2002-140499, filed May 15, 2002, the entire contents of which are incorporated herein by reference.

BACKGROUND OF THE INVENTION

1. Field of the Invention

The present invention relates to a magnetic random access memory (MRAM) which stores "1"- and "0"-information using a tunneling magnetoresistive effect.

2. Description of the Related Art

In recent years, many memories which store information by new principles have been proposed. One of them is a memory using the tunneling magnetoresistive (to be referred to as TMR hereinafter) effect proposed by Roy Scheuerlein et al. (e.g., "A 10 ns Read and Write Non-Volatile Memory Array Using a Magnetic Tunnel Junction and FET Switch in each Cell", ISSCC2000 Technical Digest, p. 128).

A magnetic random access memory stores "1"- and "0"-information using MTJ (Magnetic Tunnel Junction) elements. An MTJ element has a structure in which an insulating layer (tunneling barrier) is sandwiched between two magnetic layers (ferromagnetic layers), as shown in FIG. 109. Information to be stored in the MTJ element is determined on the basis of whether the magnetizing directions of the two magnetic layers are parallel or antiparallel.

As shown in FIG. 110, "parallel" means that the two magnetic layers have the same magnetizing direction (magnetizing direction). "Antiparallel" means that the two magnetic layers have opposite magnetizing directions (the arrows indicate the magnetizing directions).

Normally, an antiferromagnetic layer is arranged on the side of one of the two magnetic layers. The antiferromagnetic layer serves as a member which fixes the magnetizing direction of one magnetic layer and changes only the magnetizing direction of the other magnetic layer, thereby easily rewriting information.

The magnetic layer whose magnetizing direction is fixed is called a fixed layer or pinning layer. The magnetic layer whose magnetizing direction can freely be changed is called a free layer or storing layer.

As shown in FIG. 110, when the magnetizing directions of the two magnetic layers are parallel, the tunneling resistance of the insulating layer (tunneling barrier) sandwiched between the two magnetic layers is minimized. This state is a "1"-state. When the magnetizing directions of the two magnetic layers are antiparallel, the tunneling resistance of the insulating layer (tunneling barrier) sandwiched between the two magnetic layers of the MTJ element is maximized. This state is a "0"-state.

The write operation principle for an MTJ element will be briefly described next with reference to FIG. 111.

MTJ elements are arranged at the intersections between write word lines and data lines (read/write bit lines) which cross each other. A write is done by supplying a current to each of a write word line and a data line and setting the magnetizing direction of an MTJ element in the parallel or antiparallel state using a magnetic field generated by the currents flowing through the two lines.

For example, assume that the easy-axis (axis of easy magnetization or easy magnetization axis) of an MTJ element corresponds to the X-direction, a write word line runs in the X-direction, and a data line runs in the Y-direction perpendicular to the X-direction. In the write mode, a current that flows in one direction is supplied to the write word line, and a current that flows in one or the other direction is supplied to the data line in accordance with write data.

When a current that flows in one direction is supplied to the data line, the magnetizing direction of the MTJ element is set in the parallel state ("1"-state). On the other hand, when a current that flows in the other direction is supplied to the data line, the magnetizing direction of the MTJ element is set in the antiparallel state ("0"-state).

The magnetizing direction of the MTJ element changes in accordance with the following mechanism.

As is indicated by the TMR curve in FIG. 112, when a magnetic field Hy is applied in the longitudinal (easy-axis) direction of an MTJ element, the resistance value of the MTJ element changes by, e.g., about 17%. The change ratio, i.e., the ratio of the resistance difference between the antiparallel state and the parallel state and the resistance of the parallel state is called "MR ratio".

Note that the MR ratio changes depending on the structure, composition and morphology of the MTJ element. Currently, even an MTJ element with an MR ratio of about 50% is available.

The synthesized magnetic field of the magnetic field Hy in the easy-axis direction and a magnetic field Hx in the hard-axis (axis of hard magnetization or hard magnetization axis) direction is applied to the MTJ element. As indicated by the solid line in FIG. 113, the intensity of the magnetic field Hy in the easy-axis direction, which is necessary for changing the resistance value of the MTJ element, changes depending on the intensity of the magnetic field Hx in the hard-axis direction. When this phenomenon is used, data can be written in only an MTJ element that is present at the intersection between a selected write word line and a selected data line in memory cells arranged in an array.

This mechanism will be described in more detail using the asteroid curve shown in FIG. 113.

An MTJ element has an asteroid curve indicated by, e.g., the solid line in FIG. 113. More specifically, when the intensity of the synthesized magnetic field of the magnetic field Hy in the easy-axis direction and the magnetic field Hx in the hard-axis direction is outside (e.g., at the position indicated by the filled circle) the asteroid curve (solid line), the magnetizing direction of the magnetic layer can be reversed.

To the contrast, when the intensity of the synthesized magnetic field of the magnetic field Hy in the easy-axis direction and the magnetic field Hx in the hard-axis direction is inside (e.g., at the position indicated by the open circle) the asteroid curve (solid line), the magnetizing direction of the magnetic layer cannot be reversed.

Hence, when the intensity of the magnetic field Hy in the easy-axis direction and that of the magnetic field Hx in the hard-axis direction are changed to change the position of the intensity of the synthesized magnetic field in the Hx-Hy plane, the data write for the MTJ element can be controlled.

A read can easily be performed by supplying a current to a selected MTJ element and detecting the resistance value of the MTJ element.

For example, switch elements are connected in series to the MTJ elements. Only the switch element connected to a selected read word line is turned on to form a current path. Consequently, a current flows to only the selected MTJ element. Hence, data of the MTJ element can be read.

In the magnetic random access memory, as described above, the data write is executed by, e.g., supplying write currents to a write word line and a data line (read/write bit line) and causing a thus generated synthesized magnetic field to act on an MTJ element.

In the write operation, it is necessary to always accurately write data in an MTJ element. That is, a stable write characteristics is necessary. Stabilizing the write characteristics is especially important when data (the state of an MTJ element) stored in an MTJ element and write data are different. In such a case, the magnetized state (magnetizing direction) of the storing layer of the MTJ element must be stably inverted.

Conventionally, as a write method invented from the viewpoint of stabilizing the write characteristics, a method described in, e.g., U.S. Pat. No. 6,081,445 "Method to Write/Read MRAM Arrays" is known.

In this method, as shown in FIG. 114, first, the magnetic field Hx in the hard-axis direction is caused to act on the MTJ element to align the magnetizing direction at the end portion of the storing layer of the TMR layer to the hard-axis direction (①). Then, the magnetic field Hy in the easy-axis direction is caused to act on the MTJ element (②).

In this method, after a write current flows to the write word line, a write current having a direction corresponding to write data flows to the write bit line. The easy-axis of the MTJ element is set along the direction in which the write word line runs.

As described above, the magnetic field Hx extending in the hard-axis direction is made to act on the MTJ element before the magnetic field Hy in the easy-axis direction acts on the MTJ element. As a result, the magnetizing direction at the end portion of the storing layer of the MTJ element is aligned to the hard-axis direction (the magnetizing direction is made unstable). This alignment is performed to prevent changes in the direction of magnetization in the end portion of the storing layer of the MTJ element every time data is written. Hence, the data written is not influenced by the data that has been written before. This helps to enhance the reliability of data-writing.

The inversion of magnetization of the storing layer of the MTJ element starts from the end portion of the storing layer, as shown in FIG. 115. Hence, the intensity of the synthesized magnetic field required and the time of applying the magnetic field may change every time data is written, unless the end portion of the storing layer is magnetized in the same direction every time the data-writing starts. The magnetic field Hx extending in the hard-axis direction is made to act on the MTJ element before the magnetic field Hy in the easy-axis direction acts on the MTJ element. In this method, the field Hx is more intense than a magnetic field that should be applied to change the direction of magnetization in the main portion of the storing layer to the hard-axis direction. Thus, the intensity of the field Hx remains unchanged, not influenced by the data that is being written. That is, the field Hx is intense enough to change the direction of magnetization in the end portion of the storing layer, which is more changeable than the direction of magnetization in the main portion. This data-writing method is advantageous in terms of the reproducibility of data, because the magnetic field Hx, which is not influenced by the data being written, can alone determine the direction of magnetization in the end portion.

U.S. Pat. No. 6,081,445 discloses only that the magnetic field Hx in the hard-axis direction is caused to act on the MTJ element, and then, the magnetic field Hy in the easy-axis direction is caused to act on the MTJ element. In this case, it may be impossible to sufficiently invert the magnetization of the storing layer of the MTJ element. In addition, the magnetizing direction at the end portion of the storing layer of the MTJ element is kept aligned to the hard-axis direction even after the write operation.

BRIEF SUMMARY OF THE INVENTION (1) ① A writing method of a magnetic random access memory according to a first aspect of the present invention comprises steps of causing a first magnetic field parallel to a hard-axis to act on a magnetoresistive element having an easy-axis and the hard-axis, and causing a second magnetic field which is weaker than the first magnetic field and parallel to the hard-axis and a third magnetic field parallel to the easy-axis to simultaneously act on the magnetoresistive element.

② A writing method of a magnetic random access memory according to a second aspect of the present invention comprises steps of causing a first magnetic field parallel to a hard-axis and a second magnetic field parallel to an easy-axis to simultaneously act on a magnetoresistive element having the easy-axis and hard-axis, and causing a third magnetic field which is stronger than the second magnetic field and parallel to the easy-axis to act on the magnetoresistive element.

③ A writing method of a magnetic random access memory according to a third aspect of the present invention comprises steps of causing a first magnetic field parallel to a hard-axis to act on a magnetoresistive element having an easy-axis and the hard-axis, causing a second magnetic field parallel to the hard-axis and a third magnetic field parallel to the easy-axis to simultaneously act on the magnetoresistive element, and causing a fourth magnetic field parallel to the easy-axis to act on the magnetoresistive element.

④ A writing method of a magnetic random access memory according to a fourth aspect of the present invention comprises steps of causing a first magnetic field parallel to a hard-axis and a second magnetic field parallel to an easy-axis to simultaneously act on a magnetoresistive element having the easy-axis and hard-axis, causing a third magnetic field parallel to the hard-axis and a fourth magnetic field which is stronger than the second magnetic field and parallel to the easy-axis to simultaneously act on the magnetoresistive element, and causing a fifth magnetic field which is weaker than the third magnetic field and parallel to the hard-axis and a sixth magnetic field parallel to the easy-axis to simultaneously act on the magnetoresistive element.

(2) ① A magnetic random access memory according to a first aspect of the present invention comprises first and second write lines which cross each other, a magnetoresistive element arranged at an intersection between the first and second write lines, a first driver to supply a first write current to the first write line, a second driver to supply a second write current to the second write line, a setting circuit in which first setting data to control the first write current and second setting data to control the second write current are registered, and a current waveform control circuit which controls operation of the first driver depending on the first setting data and controls operation of the second driver depending on the second setting data.

② A magnetic random access memory according to a second aspect of the present invention comprises a plurality of first write lines, a plurality of second write lines which cross the plurality of first write lines, a plurality of magnetoresistive elements arranged at intersections between the plurality of first write lines and the plurality of second write lines, a plurality of first drivers corresponding to the plurality of first write lines, a plurality of second drivers corresponding to the plurality of second write lines, a setting circuit in which first setting data to control a first write current flowing to the plurality of first write lines and second setting data to control a second write current flowing to the plurality of second write lines are registered, and a current waveform control circuit which controls operations of the plurality of first drivers depending on the first setting data and controls operations of the plurality of second drivers depending on the second setting data.

BRIEF DESCRIPTION OF THE SEVERAL VIEWS OF THE DRAWING

FIG. 3 is a flow chart showing all steps of the write principle according to the first embodiment of the present invention;

FIG. 4 is a view showing one step of a write principle according to the second embodiment of the present invention;

FIG. 17 is a view showing one step of the write principle according to the fifth embodiment of the present invention;

FIG. 18 is a flow chart showing all steps of the write principle according to the fifth embodiment of the present invention;

FIG. 21 is a view showing one step of the write principle according to the sixth embodiment of the present invention;

FIG. 22 is a flow chart showing all steps of the write principle according to the sixth embodiment of the present invention;

FIG. 25 is a view showing one step of the write principle according to the seventh embodiment of the present invention;

FIG. 26 is a flow chart showing all steps of the write principle according to the seventh embodiment of the present invention;

FIG. 27 is a view showing one step of a write principle according to the eighth embodiment of the present invention;

FIG. 28 is a view showing one step of the write principle according to the eighth embodiment of the present invention;

FIG. 29 is a view showing one step of the write principle according to the eighth embodiment of the present invention;

FIG. 30 is a flow chart showing all steps of the write principle according to the eighth embodiment of the present invention;

FIG. 38 is a view showing an example of a write word line driver/sinker according to Circuit Example 1;

FIG. 40 is a view showing an example of a write current waveform control circuit according to Circuit Example 1;

FIG. 47 is a view showing an example of a decoder in the setting circuit according to Circuit Example 1;

FIG. 48 is a view showing the overall arrangement of an MRAM according to Circuit Example 2 which implements the first to 10th embodiments for each chip or each cell array;

FIG. 49 is a view showing an example of a write word line driver/sinker according to Circuit Example 2;

FIG. 53 is a view showing an example of a write bit line driver/sinker trigger circuit according to Circuit Example 2;

FIG. 56 is a view showing an example of a constant current source circuit used in Circuit Example 2;

FIG. 57 is a waveform chart showing an example of MRAM operation according to Circuit Example 2;

FIG. 60 is a view showing an example of a decoder in the setting circuit according to Circuit Example 2;

FIG. 61 is a view showing the overall arrangement of an MRAM according to Circuit Example 3 which implements the first to 10th embodiments for each chip or each cell array;

FIG. 65 is a view showing the overall arrangement of the MRAM according to Circuit Example 1 which implements the first to 10th embodiments for each write word/bit line;

FIG. 66 is a view showing an example of a write word line driver/sinker according to Circuit Example 1;

FIG. 68 is a view showing an example of a write current waveform control circuit/setting circuit according to Circuit Example 1;

FIG. 69 is a view showing an example of the write current waveform control circuit/setting circuit according to Circuit Example 1;

FIG. 70 is a view showing an example of the write current waveform control circuit/setting circuit according to Circuit Example 1;

FIG. 72 is a view showing an example of a write bit line driver/sinker trigger circuit according to Circuit Example 1;

FIG. 73 is a view showing an example of the write bit line driver/sinker trigger circuit according to Circuit Example 1;

FIG. 74 is a view showing an example of a setting circuit according to Circuit Example 1;

FIG. 76 is a view showing an example of the setting circuit according to Circuit Example 1;

FIG. 80 is a view showing an example of a write bit line driver/sinker trigger circuit according to Circuit Example 2;

FIG. 90 is a waveform chart showing an example of MRAM operation according to Circuit Example 2;

FIG. 91 is a waveform chart showing an example of MRAM operation according to Circuit Example 2;

FIG. 96 is a view showing an example of a write current waveform control circuit/setting circuit according to Circuit Example 4;

FIG. 97 is a view showing an example of the write current waveform control circuit/setting circuit according to Circuit Example 4;

FIG. 100 is a view showing an example of a write word line driver/sinker applied to the ninth embodiment;

FIG. 101 is a view showing an example of a write bit line driver/sinker applied to the ninth embodiment;

FIG. 103 is a waveform chart showing the operation waveforms of the circuits shown in FIGS. 100 and 101;

FIG. 104 is a view showing an example of a write word line driver/sinker applied to the 10th embodiment;

FIG. 108 is a waveform chart showing the operation waveforms of the circuits shown in FIGS. 104 and 105;

FIG. 109 is a view showing a structural example of an MTJ element;

FIG. 110 is a view showing two states of the MTJ element;

FIG. 111 is a view showing the write operation principle of a magnetic random access memory;

FIG. 112 is a graph showing a TRM curve;

FIG. 113 is a view showing an asteroid curve;

FIG. 114 is a view showing the magnetizing direction of the storing layer of the MTJ element; and FIG. 115 is a view showing an example of a conventional write principle.

DETAILED DESCRIPTION OF THE INVENTION

Magnetic random access memories according to the embodiments of the present invention will be described below in detail with reference to the accompanying drawing.

1. Write Principle (Method of Applying Magnetic Field to MTJ Element)

The write principle for the magnetic random access memories according to the embodiments of the present invention, i.e., a method of applying magnetic fields Hx and Hy to an MTJ element will be described first.

In the write principle according to the present invention, timings to supply write currents, i.e., timings to apply the magnetic fields Hx and Hy and temporal changes in current values of write currents, i.e., temporal changes in intensities of the magnetic fields Hx and Hy will be examined.

(1) First Embodiment

In the write principle of this embodiment, a method of aligning the magnetizing direction of the magnetic domain at the end portion of the storing layer of an MTJ element to the hard-axis direction before causing a magnetic field Hy in the easy-axis direction to act on the MTJ element, and a method of, after the magnetic field Hy in the easy-axis direction acts on the MTJ element, stabilizing the magnetic direction at the end portion and the interior of the storing layer of the MTJ element will be proposed.

A point common to these methods is that the intensity of a magnetic field Hx in the hard-axis direction is temporally changed.

Figure 1:
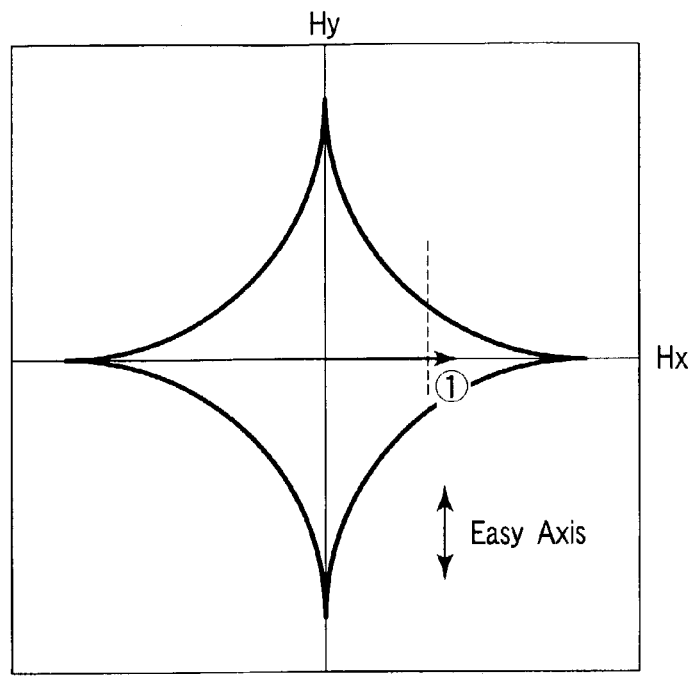
FIG. 1 is a view showing one step of a write principle according to the first embodiment of the present invention.

More specifically, as shown in FIG. 1, before the magnetic field Hy in the easy-axis direction is caused to act on the MTJ element, the magnetic field Hx having an intensity enough to align the magnetizing direction of the magnetic domain at the end portion of the storing layer of the MTJ element to the hard-axis direction is caused to act on the MTJ element to align the magnetizing direction of the magnetic domain at the end portion of the storing layer of the TMR layer to the hard-axis direction (①).

Figure 2:
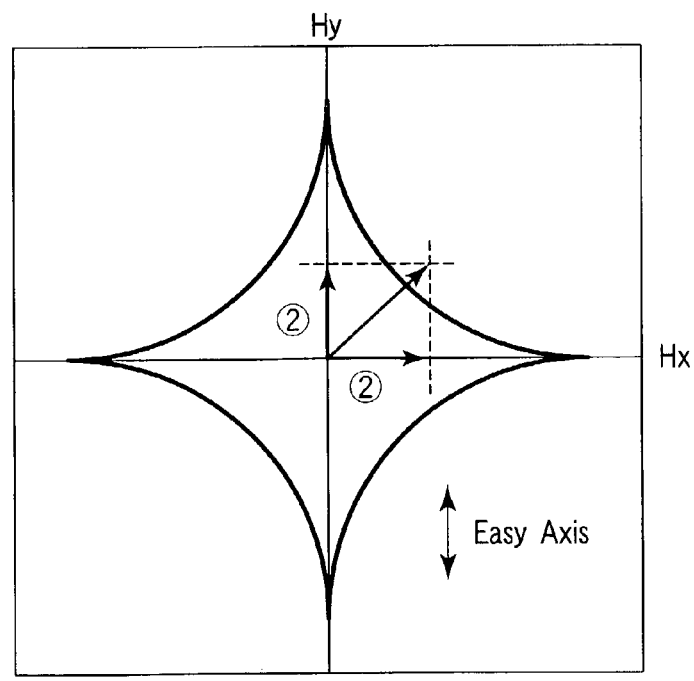
FIG. 2 is a view showing one step of the write principle according to the first embodiment of the present invention.

Then, as shown in FIG. 2, the magnetic field Hy in the easy-axis direction, which has a direction corresponding to write data, is caused to act on the MTJ element to align the magnetizing direction of the MTJ element to the easy-axis direction. At this time, to completely align the magnetizing direction of the magnetic domain at the end portion of the storing layer of the MTJ element to the easy-axis direction, the magnetic field Hx in the hard-axis direction is set to be weaker than that before the magnetic field Hy acts on the MTJ element (②).

FIG. 3 simply shows the operation principle of the magnetic random access memory which implements the write principle of the first embodiment.

The generation timings and intensities of the magnetic fields Hx and Hy are determined on the basis of the current supply timings and magnitudes of write currents to be supplied to a write word line and write bit line, which cross each other. For example, to temporally change the intensity of the magnetic field Hx in the hard-axis direction, the magnitude of the write current to be supplied to the write word line is temporally changed. At this time, assume that the easy-axis of the MTJ element is set along the direction in which the write word line runs.

First, a write current Ip1 having a predetermined direction is supplied to the write word line. The magnetic field Hx in the hard-axis direction is generated by the write current Ip1, and the magnetizing direction of the magnetic domain at the end portion of the storing layer of the TMR layer aligns to the hard-axis direction (step ST1).

Then, a write current Ip2 (<Ip1) having a predetermined direction is supplied to the write word line. A write current Ip3 having a direction corresponding to write data is supplied to the write bit line. A synthesized magnetic field Hx+Hy is generated by the write currents Ip2 and Ip3, and the magnetizing direction of the storing layer of the TMR layer is reversed (step ST2).

The change from the write current Ip1 to the write current Ip2 (change of the magnetic field Hx: ①→②) can be achieved by changing the intensity of the magnetic field in an analog or digital manner.

The circuit scheme to be used to execute this operation principle, i.e., the circuit which determines the timings to supply the write currents to the write word line and write bit line and the magnitudes (waveforms) of the write currents will be described later in detail.

As described above, in the write principle of this embodiment, before the magnetic field Hy in the easy-axis direction is caused to act on the MTJ element, the magnetic field Hx having an intensity enough to align the magnetizing direction of the magnetic field at the end portion of the storing layer of the MTJ element to the hard-axis direction is caused to act on the MTJ element. In addition, when the magnetic field Hy in the easy-axis direction is to be caused to act on the MTJ element, the magnetic field Hx in the hard-axis direction is set to be weaker than that before the magnetic field Hy is generated.

Hence, the magnetizing direction of the storing layer of the MTJ element can reliably be reversed, and the write characteristics can improve.

(2) Second Embodiment

Figure 95:
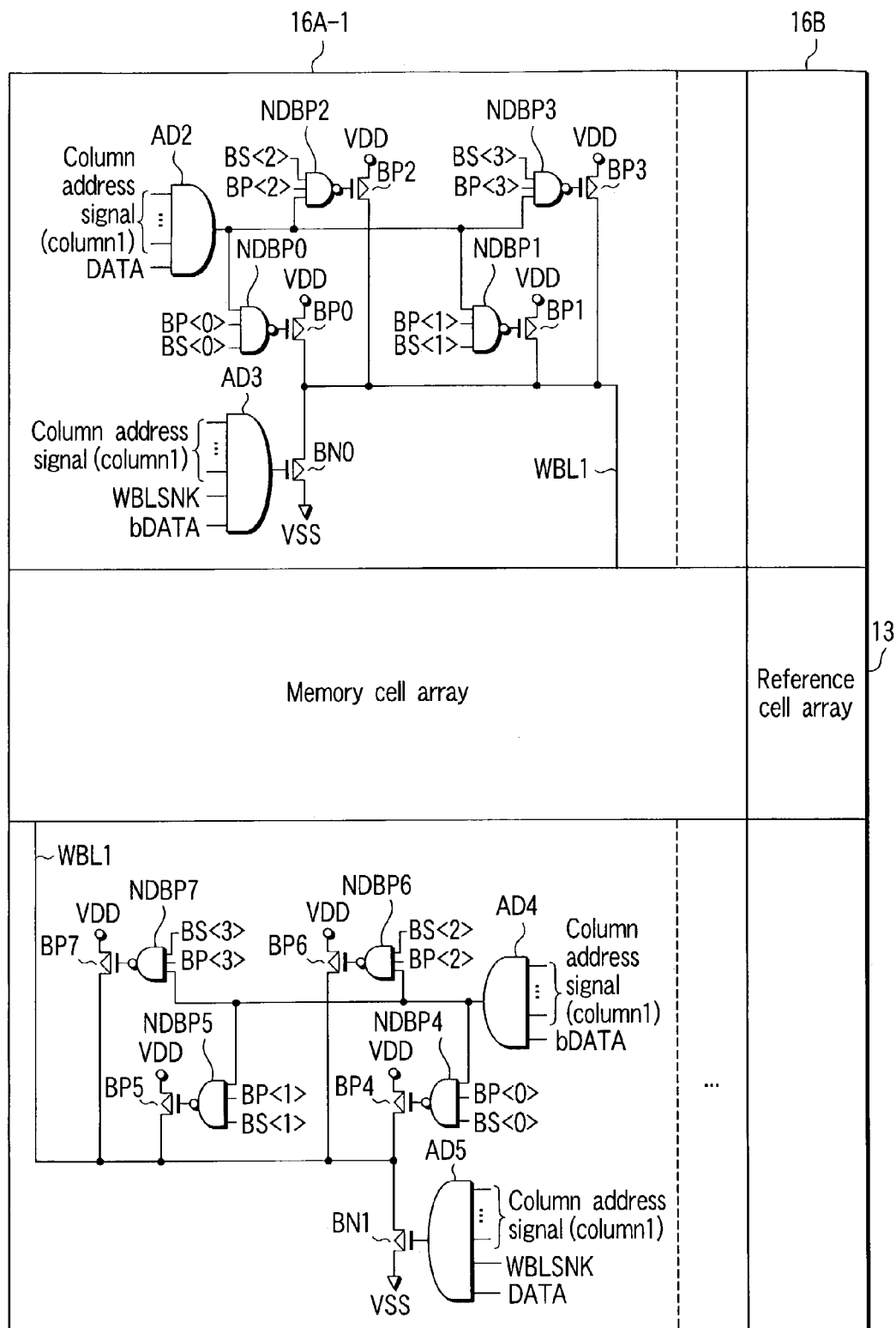
FIG. 95 is a view showing an example of a write bit line driver/sinker according to Circuit Example 4.

If the magnetizing direction of the magnetic domains at the end portion of the storing layer of the MTJ element is aligned to the hard-axis direction even after the write operation, as shown in FIG. 95, the magnetizing direction of the magnetic domain at the end portion is perpendicular to the magnetizing direction of the fixed layer of the MTJ element. The MR ratio at this portion is about ½ that when the magnetized state (the relationship between the magnetizing direction of the fixed layer and that of the storing layer) of the MTJ element is parallel or antiparallel. As a result, the MR ratio of the MTJ element degrades.

In the write principle of this embodiment, assuming that the magnetizing direction of the magnetic domain at the end portion of the storing layer of an MTJ element is aligned to the hard-axis direction by a magnetic field Hx in the hard-axis direction, a method of completely aligning the magnetizing direction of the larger interior portion of the storing layer of the MTJ element to the easy-axis direction by a magnetic field Hy in the easy-axis direction will be proposed.

The point of this method is that even after the magnetic field Hx in the hard-axis direction is extinguished, the magnetic field Hy in the easy-axis direction is continuously caused to act on the MTJ element.

More specifically, as shown in FIG. 4, the magnetic field Hx in the hard-axis direction is caused to act on the MTJ element to align the magnetizing direction of the magnetic domain at the end portion of the storing layer of the MTJ element to the hard-axis direction (①).

Figure 5:
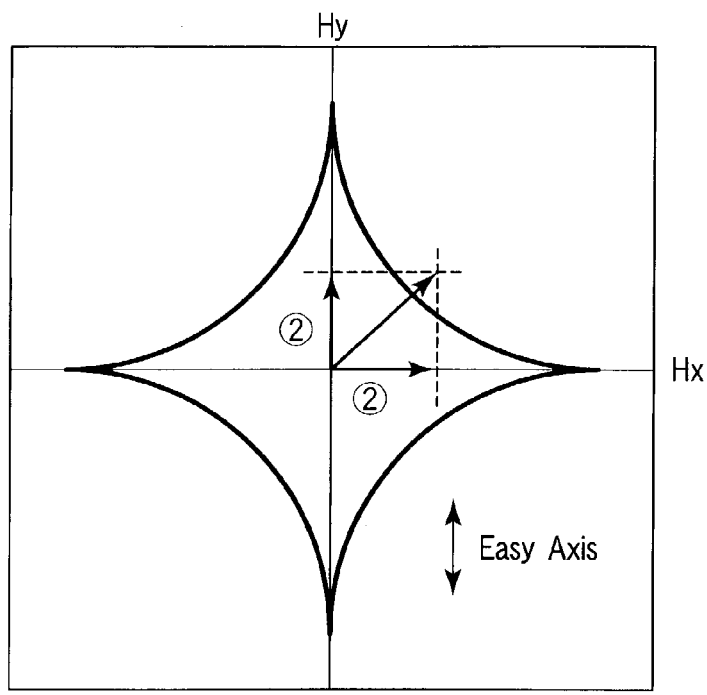
FIG. 5 is a view showing one step of the write principle according to the second embodiment of the present invention.

Next, as shown in FIG. 5, the magnetic field Hy in the easy-axis direction, which has a direction corresponding to write data, is caused to act on the MTJ element. At this time, since the magnetic field Hx in the hard-axis direction is continuously generated, a synthesized magnetic field Hx+Hy acts on the MTJ element (②).

Figure 6:
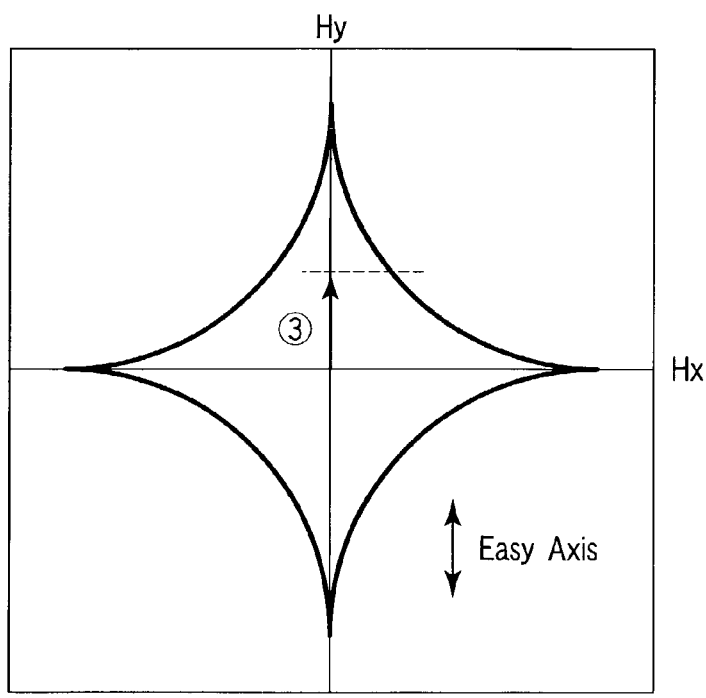
FIG. 6 is a view showing one step of the write principle according to the second embodiment of the present invention.

After that, as shown in FIG. 6, only the magnetic field Hx in the hard-axis direction is extinguished. That is, since only the magnetic field Hy in the easy-axis direction acts on the MTJ element, the magnetizing direction of the most of the storing layer of the MTJ element completely aligns to the easy-axis direction (③).

Figure 7:
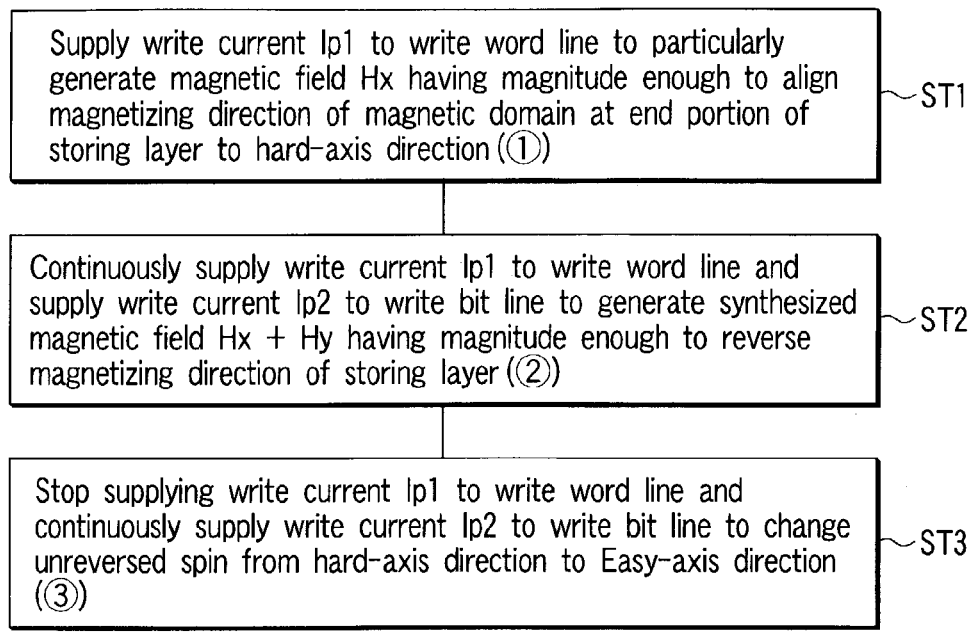
FIG. 7 is a flow chart showing all steps of the write principle according to the second embodiment of the present invention.

FIG. 7 simply shows the operation principle of the magnetic random access memory which implements the write principle of the second embodiment.

The generation/extinction timings of the magnetic fields Hx and Hy are determined on the basis of the supply/cutoff timings of write currents to be supplied to a write word line and write bit line, which cross each other.

First, a write current Ip1 having a predetermined direction is supplied to the write word line. The magnetic field Hx in the hard-axis direction is generated by the write current Ip1, and the magnetizing direction of the magnetic domain at the end portion of the storing layer of the TMR layer aligns to the hard-axis direction (step ST1).

Then, while continuously supplying the write current Ip1 to the write word line, a write current Ip2 having a direction corresponding to write data is supplied to the write bit line. The synthesized magnetic field Hx and Hy is generated by the write currents Ip1 and Ip2 (step ST2).

After that, the write current Ip1 to the write word line is stopped. Only the write current Ip2 to the write bit line is continuously supplied. As a result, the magnetizing direction of the most of the storing layer of the MTJ element is completely aligned to the easy-axis direction by the magnetic field Hy, and the magnetizing direction of the storing layer of the TMR layer is reversed (step ST3).

The circuit scheme to be used to execute this operation principle, i.e., the circuit which determines the timings to supply the write currents to the write word line and write bit line and the magnitudes (waveforms) of the write currents will be described later in detail.

As described above, in the write principle of this embodiment, even after the magnetic field Hx in the hard-axis direction is extinguished, the magnetic field Hy in the easy-axis direction is continuously caused to act on the MTJ element. Hence, the problem that the magnetizing direction of the interior portion of the storing layer is made unstable is extinguished and prevented, and the most of the storing layer align to the easy-axis direction. Additionally, the magnetizing direction of the storing layer of the MTJ element can reliably be reversed, and the write characteristics can improve.

(3) Third Embodiment

In the write principle of this embodiment, assuming that the magnetizing direction of the magnetic domain at the end portion of the storing layer of an MTJ element is aligned to the hard-axis direction by a magnetic field Hx in the hard-axis direction, a method of completely aligning the magnetizing direction of the most of the storing layer of the MTJ element to the easy-axis direction by a magnetic field Hy in the easy-axis direction will be proposed.

The point of this method is that after the magnetic field Hx in the hard-axis direction is extinguished, the magnetic field Hy in the easy-axis direction is continuously caused to act on the MTJ element, and simultaneously, the magnetic field Hy is made stronger than that before the magnetic field Hx is extinguished.

Figure 8:
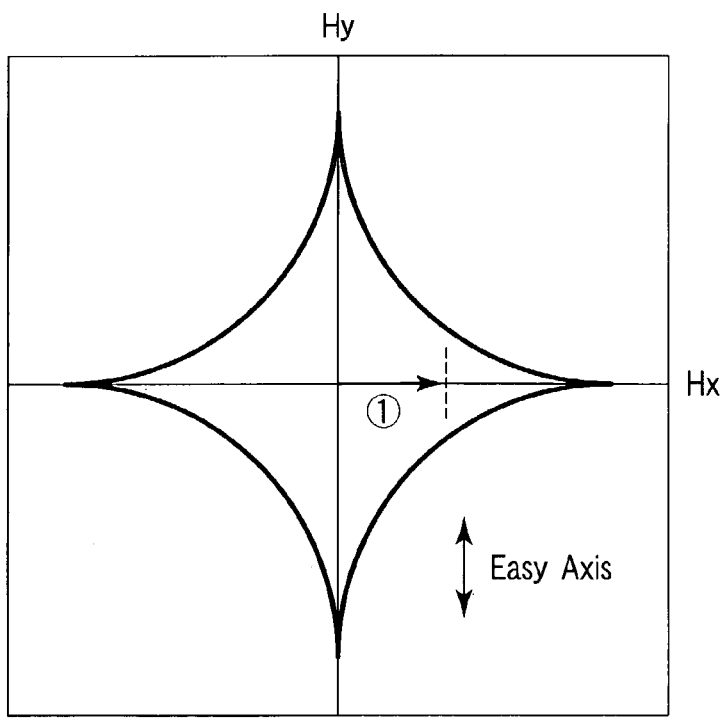
FIG. 8 is a view showing one step of a write principle according to the third embodiment of the present invention.

More specifically, as shown in FIG. 8, the magnetic field Hx in the hard-axis direction is caused to act on the MTJ element to align the magnetizing direction of the magnetic domain at the end portion of the storing layer of the MTJ element to the hard-axis direction (①).

Figure 9:
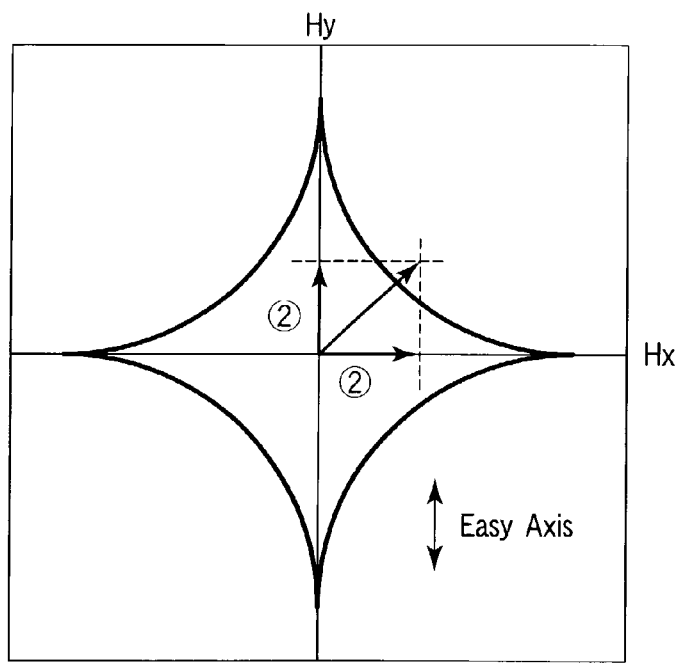
FIG. 9 is a view showing one step of the write principle according to the third embodiment of the present invention.

Next, as shown in FIG. 9, the magnetic field Hy in the easy-axis direction, which has a direction corresponding to write data, is caused to act on the MTJ element. At this time, since the magnetic field Hx in the hard-axis direction is continuously generated, a synthesized magnetic field Hx+Hy acts on the MTJ element (②).

Figure 10:
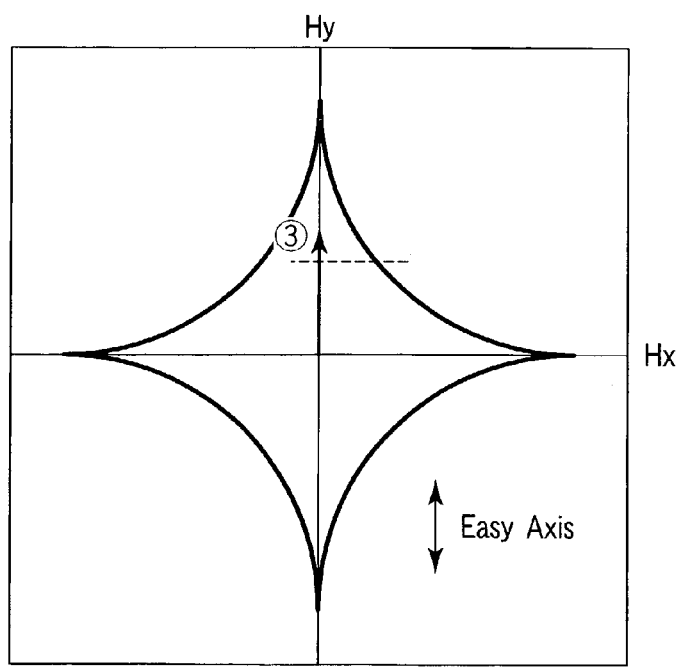
FIG. 10 is a view showing one step of the write principle according to the third embodiment of the present invention.

After that, as shown in FIG. 10, only the magnetic field Hx in the hard-axis direction is extinguished. Only the magnetic field Hy in the easy-axis direction is caused to act on the MTJ element. At this time, the magnetic field Hy is made stronger than that before the magnetic field Hy is extinguished. The magnetizing direction of the most of the storing layer of the MTJ element is completely aligned to the easy-axis direction by the magnetic field Hy (③).

Figure 11:
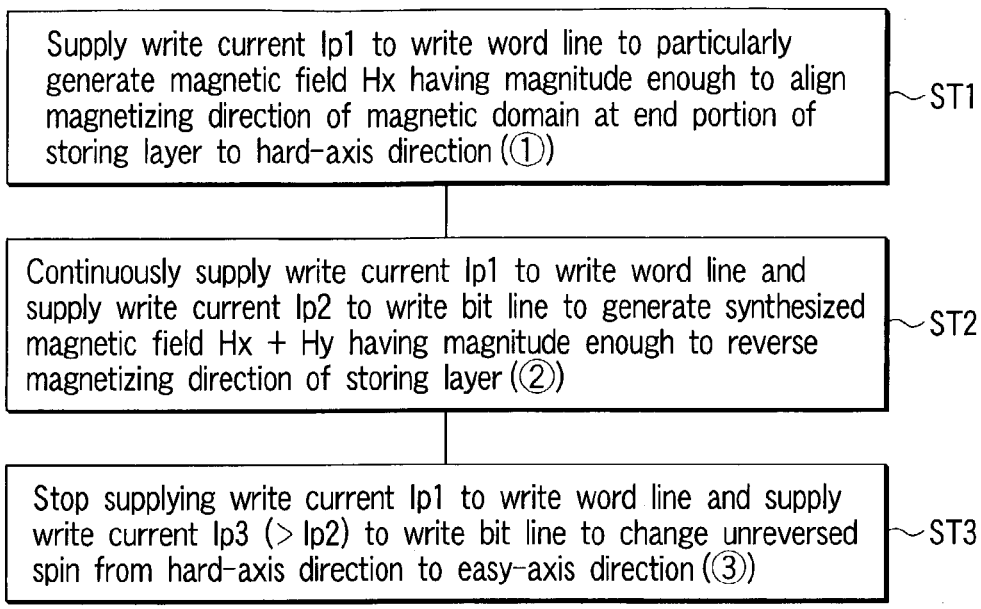
FIG. 11 is a flow chart showing all steps of the write principle according to the third embodiment of the present invention.

FIG. 11 simply shows the operation principle of the magnetic random access memory which implements the write principle of the third embodiment.

The generation/extinction timings and intensities of the magnetic fields Hx and Hy are determined on the basis of the supply/cutoff timings of write currents to be supplied to a write word line and write bit line, which cross each other.

First, a write current Ip1 having a predetermined direction is supplied to the write word line. The magnetic field Hx in the hard-axis direction is generated by the write current Ip1, and the magnetizing direction of the magnetic domain at the end portion of the storing layer of the TMR layer aligns to the hard-axis direction (step ST1).

Then, while continuously supplying the write current Ip1 to the write word line, a write current Ip2 having a direction corresponding to write data is supplied to the write bit line. The synthesized magnetic field Hx and Hy is generated by the write currents Ip1 and Ip2 (step ST2).

After that, the write current Ip1 to the write word line is stopped. A write current Ip3 (>Ip2) is supplied to the write bit line. As a result, the magnetizing direction of the most of the storing layer of the MTJ element is completely aligned to the easy-axis direction by the magnetic field Hy, and the magnetizing direction of the storing layer of the TMR layer is reversed (step ST3).

The change from the write current Ip2 to the write current Ip3 (change of the magnetic field Hy: ②→③) can be achieved by changing the intensity of the magnetic field in an analog or digital manner.

The circuit scheme to be used to execute this operation principle, i.e., the circuit which determines the timings to supply the write currents to the write word line and write bit line and the magnitudes (waveforms) of the write currents will be described later in detail.

As described above, in the write principle of this embodiment, even after the magnetic field Hx in the hard-axis direction is extinguished, the magnetic field Hy in the easy-axis direction is continuously caused to act on the MTJ element. In addition, the magnetic field Hy after the magnetic field Hx in the hard-axis direction is extinguished is stronger than that before the magnetic field Hx is extinguished.

Hence, the problem that the magnetizing direction of the interior portion of the storing layer is made unstable is extinguished and prevented, and the most of the storing layer align to the easy-axis direction. Additionally, the magnetizing direction of the storing layer of the MTJ element can reliably be reversed, and the write characteristics can improve.

(4) Fourth Embodiment

In the write principle of this embodiment, a method of aligning the magnetizing direction of the magnetic domain at the end portion of the storing layer of an MTJ element to the hard-axis direction before causing a magnetic field Hy in the easy-axis direction to act on the MTJ element, and a method of, after the magnetic field Hy in the easy-axis direction acts on the MTJ element, completely aligning the magnetizing direction of the most of the storing layer of the MTJ element to the easy-axis direction will be proposed.

The write principle of this embodiment of a combination of the write principle of the first embodiment and that of the third embodiment. The point is that the intensity of a magnetic field Hx in the hard-axis direction and the intensity of the magnetic field Hy in the easy-axis direction are temporally changed, and after the magnetic field Hx in the hard-axis direction is extinguished, the magnetic field Hy in the easy-axis direction is continuously caused to act on the MTJ element.

Figure 12:
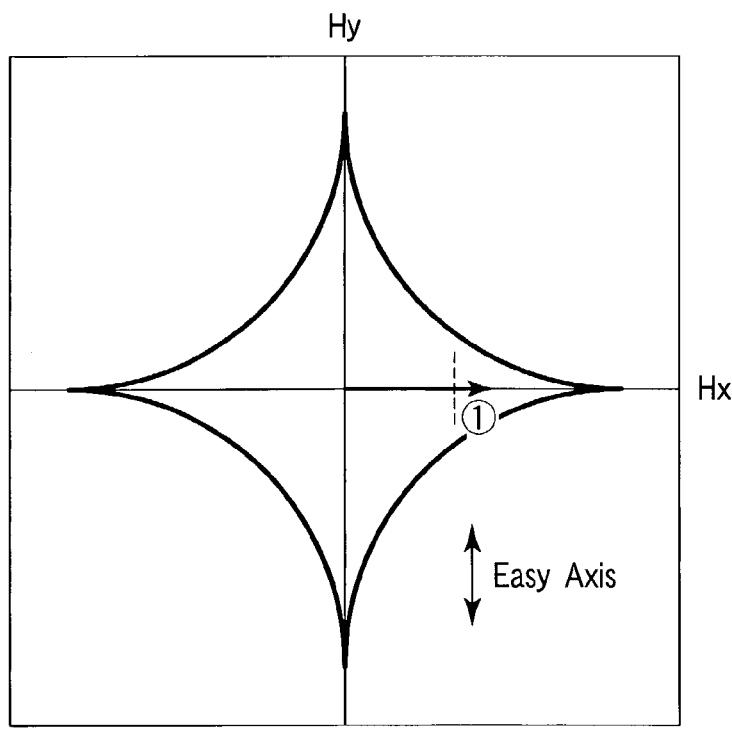
FIG. 12 is a view showing one step of a write principle according to the fourth embodiment of the present invention.

More specifically, as shown in FIG. 12, before the magnetic field Hy in the easy-axis direction is caused to act on the MTJ element, the magnetic field Hx having an intensity enough to align the magnetizing direction of the magnetic domain at the end portion of the storing layer of the MTJ element to the hard-axis direction is caused to act on the MTJ element to align the magnetizing direction of the magnetic domain at the end portion of the storing layer of the TMR layer to the hard-axis direction (①).

Figure 13:
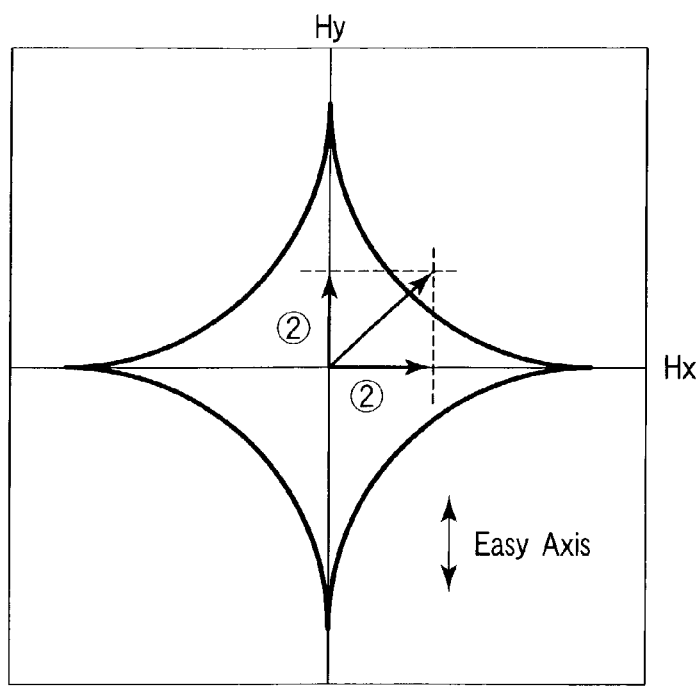
FIG. 13 is a view showing one step of the write principle according to the fourth embodiment of the present invention.

Next, as shown in FIG. 13, the magnetic field Hy in the easy-axis direction, which has a direction corresponding to write data, is caused to act on the MTJ element to align the magnetizing direction of the MTJ element to the easy-axis direction. At this time, to completely align the magnetizing direction of the magnetic domain at the end portion of the storing layer of the MTJ element to the easy-axis direction, the magnetic field Hx in the hard-axis direction is set to be weaker than that before the magnetic field Hy acts on the MTJ element (②).

Figure 14:
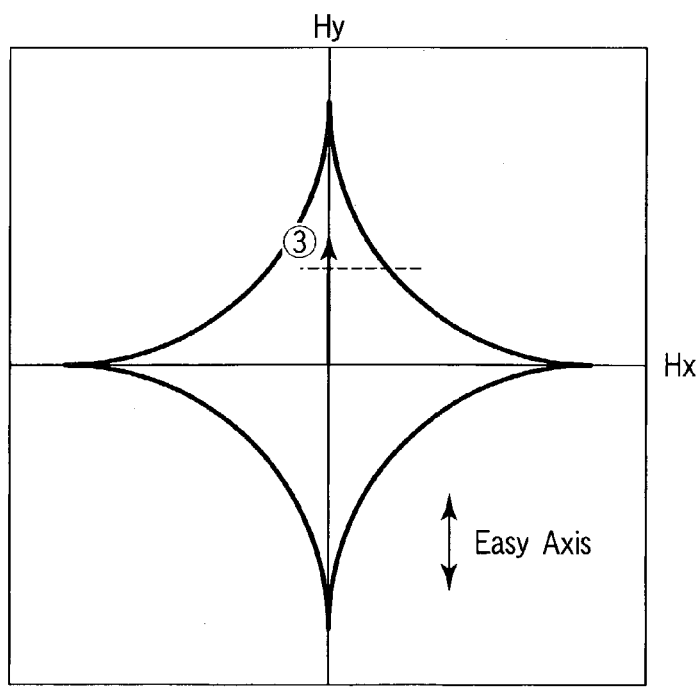
FIG. 14 is a view showing one step of the write principle according to the fourth embodiment of the present invention.

After that, as shown in FIG. 14, only the magnetic field Hx in the hard-axis direction is extinguished. Only the magnetic field Hy in the easy-axis direction is caused to act on the MTJ element. At this time, the magnetic field Hy is made stronger than that before the magnetic field Hy is extinguished such that the magnetizing direction of the most of the storing layer of the MTJ element completely aligns to the easy-axis direction (③).

Figure 15:
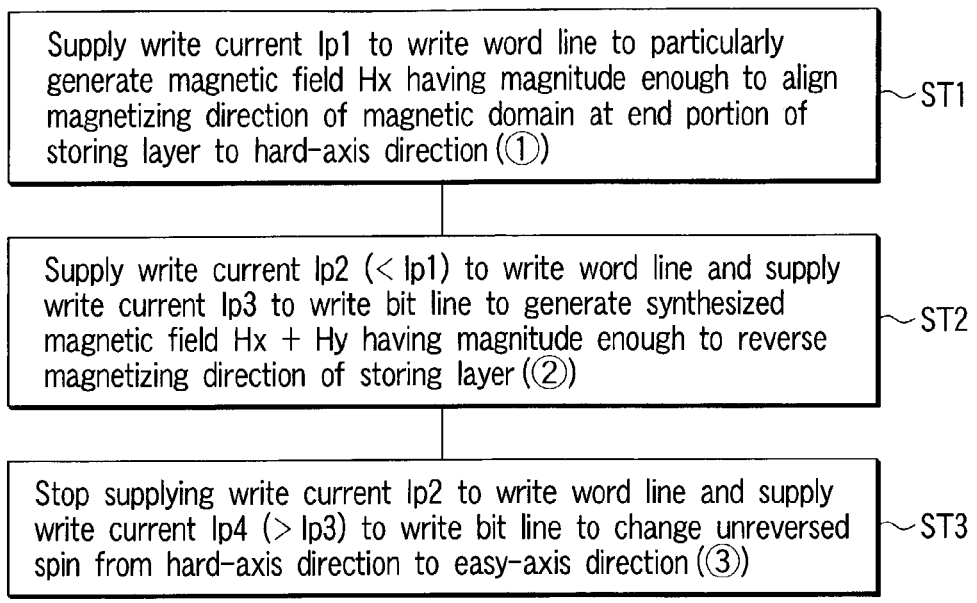
FIG. 15 is a flow chart showing all steps of the write principle according to the fourth embodiment of the present invention.

FIG. 15 simply shows the operation principle of the magnetic random access memory which implements the write principle of the fourth embodiment.

First, a write current Ip1 having a predetermined direction is supplied to the write word line. The magnetic field Hx in the hard-axis direction is generated by the write current Ip1, and the magnetizing direction of the magnetic domain at the end portion of the storing layer of the TMR layer aligns to the hard-axis direction (step ST1).

Then, a write current Ip2 (<Ip1) having a predetermined direction is supplied to the write word line. A write current Ip3 having a direction corresponding to write data is supplied to the write bit line. A synthesized magnetic field Hx+Hy is generated by the write currents Ip2 and Ip3 (step ST2).

After that, the write current Ip2 to the write word line is stopped. A write current Ip4 (>Ip3) is supplied to the write bit line. As a result, the magnetizing direction of the most of the storing layer of the MTJ element is completely aligned to the easy-axis direction by the magnetic field Hy, and the magnetizing direction of the storing layer of the TMR layer is reversed (step ST3).

The change from the write current Ip1 to the write current Ip2 (change of the magnetic field Hx: ①→②) can be achieved by changing the intensity of the magnetic field in an analog or digital manner.

The change from the write current Ip3 to the write current Ip4 (change of the magnetic field Hy: ②→③) can also be achieved by changing the intensity of the magnetic field in an analog or digital manner.

The circuit scheme to be used to execute this operation principle, i.e., the circuit which determines the timings to supply the write currents to the write word line and write bit line and the magnitudes (waveforms) of the write currents will be described later in detail.

As described above, in the write principle of this embodiment, before the magnetic field Hy in the easy-axis direction is caused to act on the MTJ element, the magnetic field Hx having an intensity enough to align the magnetizing direction of the magnetic field at the end portion of the storing layer of the MTJ element to the hard-axis direction is caused to act on the MTJ element. In addition, when the magnetic field Hy in the easy-axis direction is to be caused to act on the MTJ element, the magnetic field Hx in the hard-axis direction is set to be weaker than that before the magnetic field Hy is generated.

In addition, in the write principle of this embodiment, even after the magnetic field Hx in the hard-axis direction is extinguished, the magnetic field Hy in the easy-axis direction is continuously caused to act on the MTJ element. Furthermore, the magnetic field Hy after the magnetic field Hx in the hard-axis direction is extinguished is larger than that before the magnetic field Hx is extinguished.

Hence, the problem that the magnetizing direction of the interior portion of the storing layer is made unstable is extinguished and prevented, and the most of the storing layer align to the easy-axis direction. Additionally, the magnetizing direction of the storing layer of the MTJ element can reliably be reversed, and the write characteristics can improve.

(5) Fifth Embodiment

In the write principle of this embodiment, a method of simultaneously generating/extinguishing a magnetic field Hx in the hard-axis direction and a magnetic field Hy in the easy-axis direction and also temporally changing the intensity of the magnetic field Hy in the easy-axis direction will be proposed.

The point of the method of this embodiment is that the magnetic field Hx in the hard-axis direction always has a constant intensity, the magnetic field Hy in the easy-axis direction is set to a small value at the early stage of generation of the magnetic fields Hx and Hy, and then, the magnetic field Hy in the easy-axis direction is changed to a large value.

Figure 16:
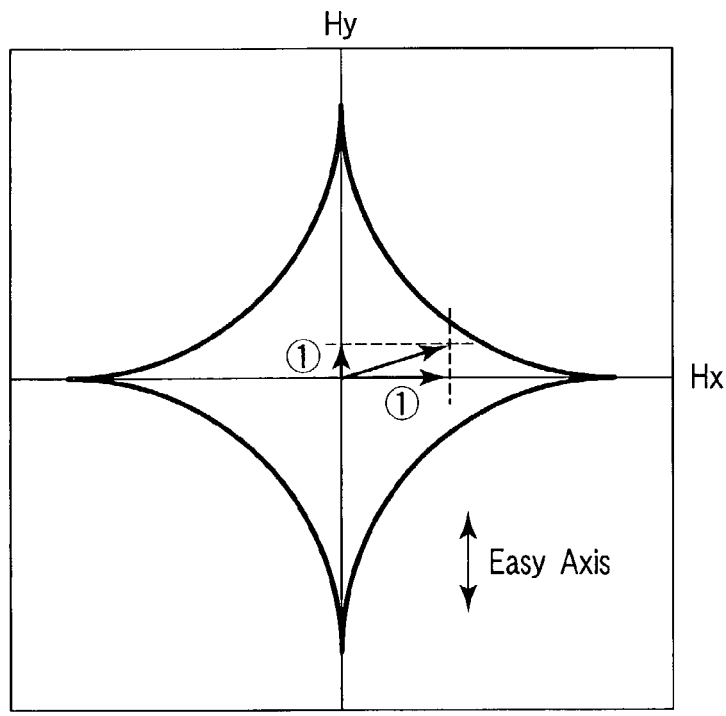
FIG. 16 is a view showing one step of a write principle according to the fifth embodiment of the present invention.

More specifically, as shown in FIG. 16, the magnetic field Hx having an intensity enough to align the magnetizing direction of the magnetic domain at the end portion of the storing layer of an MTJ element to the hard-axis direction is caused to act on the MTJ element. Simultaneously, the small magnetic field Hy in the easy-axis direction, which has a direction corresponding to write data, is caused to act on the MTJ element. At this stage, since the MTJ element is largely influenced by the magnetic field Hx, the magnetizing direction of the magnetic domain at the end portion of the storing layer of the TMR layer aligns to the hard-axis direction (①).

After that, as shown in FIG. 17, the magnetic field Hy in the easy-axis direction is changed to a sufficiently large value to reverse the magnetizing direction of the storing layer of the MTJ element by a synthesized magnetic field Hx+Hy. At this time, the magnetic fields Hx and Hy may have either the same intensity or different intensities (②).

FIG. 18 simply shows the operation principle of the magnetic random access memory which implements the write principle of the fifth embodiment.

First, a write current Ip1 having a predetermined direction is supplied to a write word line. A write current Ip2 having a direction corresponding to write data is supplied to a write bit line. The write current Ip2 has a value much smaller than that of the write current Ip1. The magnetic field Hx in the hard-axis direction is generated by the write current Ip1 having the large value, and the magnetizing direction of the magnetic domain at the end portion of the storing layer of the TMR layer aligns to the hard-axis direction (step ST1).

After that, a write current Ip3 (>Ip2) having a sufficiently large value is supplied to the write bit line. The synthesized magnetic field Hx+Hy is generated by the write currents Ip1 and Ip3. Consequently, the magnetizing direction of the most of the storing layer of the MTJ element is completely aligned to the easy-axis direction by the magnetic field Hy, and the magnetizing direction of the storing layer of the TMR layer is reversed (step ST2).

The change from the write current Ip2 to the write current Ip3 (change of the magnetic field Hy: ①→②) can be achieved by changing the intensity of the magnetic field in an analog or digital manner.

The circuit scheme to be used to execute this operation principle, i.e., the circuit which determines the timings to supply the write currents to the write word line and write bit line and the magnitudes (waveforms) of the write currents will be described later in detail.

As described above, in the write principle of this embodiment, since the magnetic field Hy in the easy-axis direction is changed stepwise, no large write current need be abruptly supplied to the write bit line to generate the large magnetic field Hy. That is, since the write current (the magnitude of the write current) supplied to the write bit line does not abruptly change, noise due to an inductance component can be reduced.

(6) Sixth Embodiment

In the write principle of this embodiment, a method of simultaneously generating/extinguishing a magnetic field Hx in the hard-axis direction and a magnetic field Hy in the easy-axis direction and also temporally changing both the intensities of the magnetic field Hx in the hard-axis direction and the magnetic field Hy in the easy-axis direction will be proposed.

The point of the method of this embodiment is that at the early stage of generation of the magnetic fields Hx and Hy, the magnetic field Hx in the hard-axis direction is set to a large value while the magnetic field Hy in the easy-axis direction is set to a small value, and then, the magnetic field Hy in the easy-axis direction is changed to a large value while the magnetic field Hx in the hard-axis direction is changed to a small value.

Figure 19:
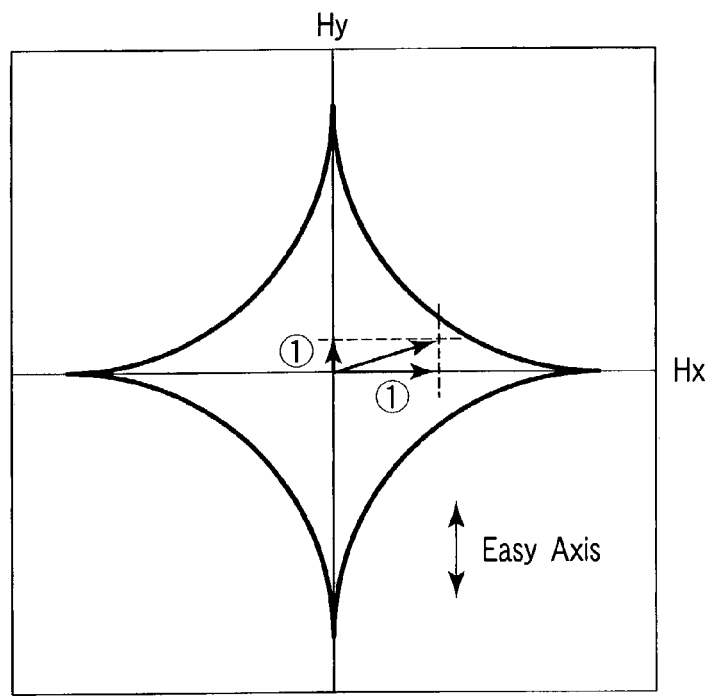
FIG. 19 is a view showing one step of a write principle according to the sixth embodiment of the present invention.

More specifically, as shown in FIG. 19, the magnetic field Hx having an intensity enough to align the magnetizing direction of the magnetic domain at the end portion of the storing layer of an MTJ element to the hard-axis direction is caused to act on the MTJ element. Simultaneously, the small magnetic field Hy in the easy-axis direction, which has a direction corresponding to write data, is caused to act on the MTJ element. At this stage, since the MTJ element is largely influenced by the magnetic field Hx, the magnetizing direction of the magnetic domain at the end portion of the storing layer of the TMR layer aligns to the hard-axis direction (①).

Figure 20:
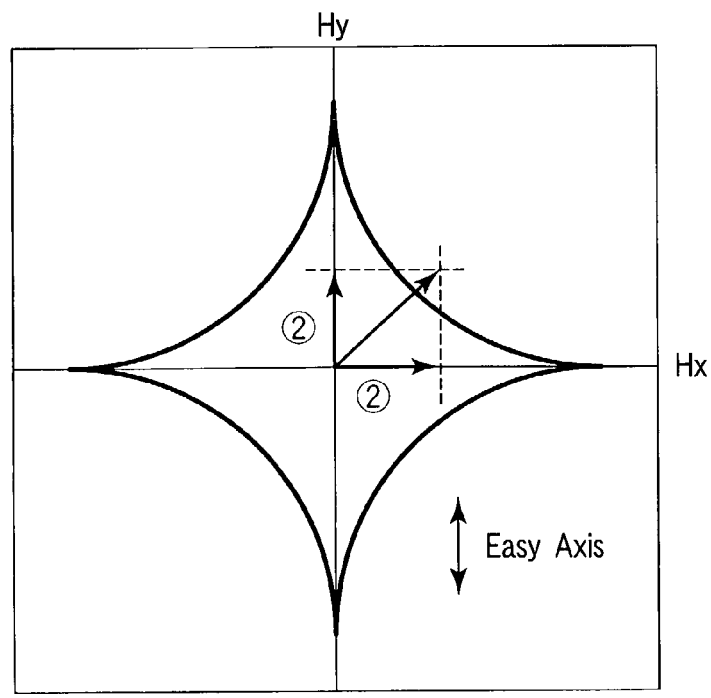
FIG. 20 is a view showing one step of the write principle according to the sixth embodiment of the present invention.

After that, as shown in FIG. 20, the magnetic field Hy in the easy-axis direction is changed to a sufficiently large value to reverse the magnetizing direction of the storing layer of the MTJ element by a synthesized magnetic field Hx+Hy. At this time, the magnetic fields Hx and Hy may have either the same intensity or different intensities (②).

After that, as shown in FIG. 21, the magnetic field Hx in the hard-axis direction is changed to a sufficiently small value to align the magnetizing direction of the most of the storing layer of the TMR layer to the easy-axis direction by the synthesized magnetic field Hx+Hy (③).

FIG. 22 simply shows the operation principle of the magnetic random access memory which implements the write principle of the sixth embodiment.

First, a write current Ip1 having a predetermined direction is supplied to a write word line. A write current Ip2 having a direction corresponding to write data is supplied to a write bit line. The write current Ip2 has a value much smaller than that of the write current Ip1. The magnetic field Hx in the hard-axis direction is generated by the write current Ip1 having the large value, and the magnetizing direction of the magnetic domain at the end portion of the storing layer of the TMR layer aligns to the hard-axis direction (step ST1).

Next, when a write current Ip3 (>Ip2) having a sufficiently large value is supplied to the write bit line, the synthesized magnetic field Hx+Hy is generated by the write currents Ip1 and Ip3 (step ST2).

After that, when a write current Ip4 (<Ip1) having a sufficiently small value is supplied to the write word line, the synthesized magnetic field Hx+Hy is generated by the write currents Ip3 and Ip4 (step ST2). Consequently, the magnetizing direction of the most of the storing layer of the MTJ element completely is aligned to the easy-axis direction by the magnetic field Hy, and the magnetizing direction of the storing layer of the TMR layer is reversed (step ST3).

The change from the write current Ip2 to the write current Ip3 (change of the magnetic field Hy: ①→②) can be achieved by changing the intensity of the magnetic field in an analog or digital manner.

The change from the write current Ip1 to the write current Ip4 (change of the magnetic field Hx: ②→③) can also be achieved by changing the intensity of the magnetic field in an analog or digital manner.

The circuit scheme to be used to execute this operation principle, i.e., the circuit which determines the timings to supply the write currents to the write word line and write bit line and the magnitudes (waveforms) of the write currents will be described later in detail.

As described above, in the write principle of this embodiment, the magnetic field Hx in the hard-axis direction is weakened stepwise, and the magnetic field Hy in the easy-axis direction is strengthened stepwise. For this reason, no large write current need be abruptly supplied to the write word/bit line to generate/extinguish the large magnetic fields Hx and Hy. That is, since the write current (the magnitude of the write current) supplied to the write word/bit line does not abruptly change, noise due to an inductance component can be reduced.

(7) Seventh Embodiment

In the write principle of this embodiment, a method of simultaneously generating/extinguishing a magnetic field Hx in the hard-axis direction and a magnetic field Hy in the easy-axis direction and also temporally changing both the intensities of the magnetic field Hx in the hard-axis direction and the magnetic field Hy in the easy-axis direction will be proposed.

The point of the method of this embodiment is that at the early stage of generation of the magnetic fields Hx and Hy, the magnetic field Hx in the hard-axis direction is set to a sufficiently large value while the magnetic field Hy in the easy-axis direction is set to a small value, then, the magnetic field Hx in the hard-axis direction is changed from the sufficiently large value to a large value while the magnetic field Hy in the easy-axis direction is changed to a large value, and then, the magnetic field Hx in the hard-axis direction is changed to a small value.

That is, in the write principle of this embodiment, the magnetic field Hx in the hard-axis direction weakens in three steps, and the magnetic field Hy in the easy-axis direction strengthens in two steps.

Figure 23:
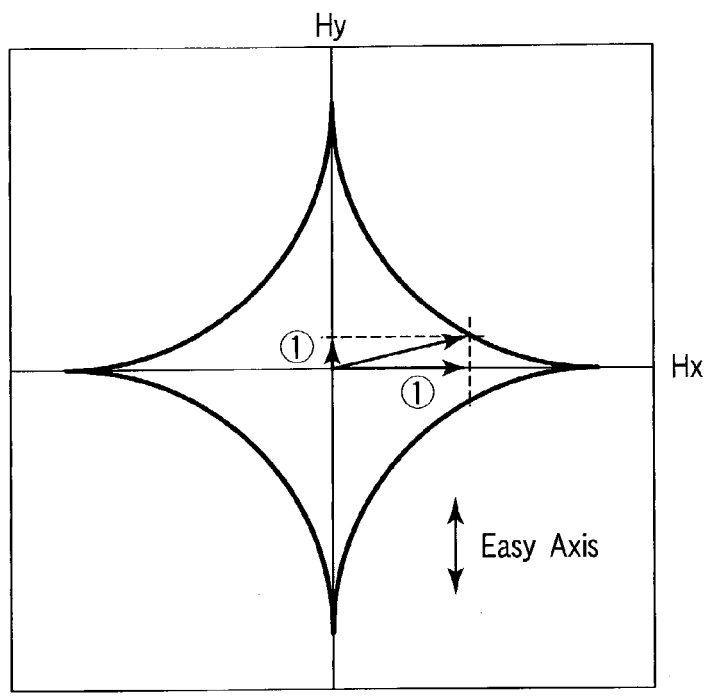
FIG. 23 is a view showing one step of a write principle according to the seventh embodiment of the present invention.

More specifically, as shown in FIG. 23, the magnetic field Hx having an intensity enough to align the magnetizing direction of the magnetic domain at the end portion of the storing layer of an MTJ element to the hard-axis direction is caused to act on the MTJ element. Simultaneously, the small magnetic field Hy in the easy-axis direction, which has a direction corresponding to write data, is caused to act on the MTJ element. At this stage, since the MTJ element is largely influenced by the magnetic field Hx, the magnetizing direction of the magnetic domain at the end portion of the storing layer of the TMR layer aligns to the hard-axis direction (①).

Figure 24:
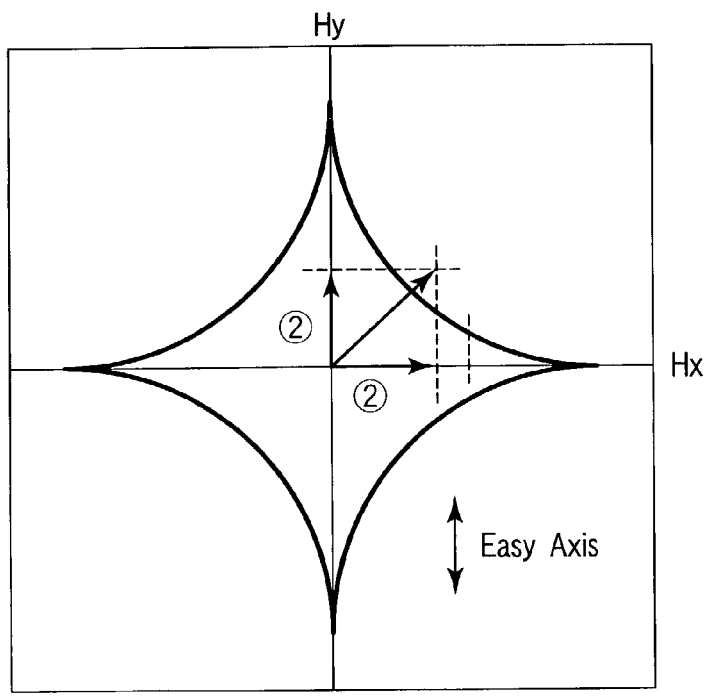
FIG. 24 is a view showing one step of the write principle according to the seventh embodiment of the present invention.

Next, as shown in FIG. 24, the magnetic field Hx in the hard-axis direction is changed from the sufficiently large value to a large value (the magnetic field Hx is slightly weakened). Simultaneously, the magnetic field Hy in the easy-axis direction is changed to a large value. At this time, the magnetic fields Hx and Hy may have either the same intensity or different intensities (②).

After that, as shown in FIG. 25, the magnetic field Hx in the hard-axis direction is changed to a sufficiently small value. The magnetizing direction of the most of the storing layer of the TMR layer is completely aligned to the easy-axis direction by a synthesized magnetic field Hx+Hy (③).

FIG. 26 simply shows the operation principle of the magnetic random access memory which implements the write principle of the seventh embodiment.

First, a write current Ip1 having a predetermined direction is supplied to a write word line. A write current Ip2 having a direction corresponding to write data is supplied to a write bit line. The write current Ip2 has a value much smaller than that of the write current Ip1. The magnetic field Hx in the hard-axis direction is generated by the write current Ip1 having the large value, and the magnetizing direction of the magnetic domain at the end portion of the storing layer of the TMR layer aligns to the hard-axis direction (step ST1).

Next, when a write current Ip3 (<Ip1) is supplied to the write word line, and a write current Ip4 (>Ip2) is supplied to the write bit line, the synthesized magnetic field Hx+Hy is generated by the write currents Ip3 and Ip4 (step ST2).

After that, when a write current Ip5 (<Ip3) is supplied to the write word line, the synthesized magnetic field Hx+Hy is generated by the write currents Ip4 and Ip5. Consequently, the magnetizing direction of the most of the storing layer of the MTJ element is aligned to the easy-axis direction by the magnetic field Hy, and the magnetizing direction of the storing layer of the TMR layer is reversed (step ST3).

The change from the write current Ip1 to the write current Ip3 and the change from the write current Ip3 to the write current Ip5 (change of the magnetic field Hx: ①→②→③) can be achieved by changing the intensity of the magnetic field in an analog or digital manner.

The change from the write current Ip2 to the write current Ip4 (change of the magnetic field Hy: ①→②) can also be achieved by changing the intensity of the magnetic field in an analog or digital manner.

The circuit scheme to be used to execute this operation principle, i.e., the circuit which determines the timings to supply the write currents to the write word line and write bit line and the magnitudes (waveforms) of the write currents will be described later in detail.

As described above, in the write principle of this embodiment, the magnetic field Hx in the hard-axis direction is weakened in three steps, and the magnetic field Hy in the easy-axis direction is strengthened in two steps. For this reason, no large write current need be abruptly supplied to or cut off from the write word/bit line to generate/extinguish the large magnetic fields Hx and Hy. That is, since the write current (the magnitude of the write current) supplied to the write word/bit line does not abruptly change, noise due to an inductance component can be reduced.

(8) Eighth Embodiment

In the write principle of this embodiment, a method of simultaneously generating/extinguishing a magnetic field Hx in the hard-axis direction and a magnetic field Hy in the easy-axis direction and also temporally changing both the intensities of the magnetic field Hx in the hard-axis direction and the magnetic field Hy in the easy-axis direction will be proposed.

The point of the method of this embodiment is that at the early stage of generation of the magnetic fields Hx and Hy, the magnetic field Hx in the hard-axis direction is set to a sufficiently large value while the magnetic field Hy in the easy-axis direction is set to a small value, then, the magnetic field Hx in the hard-axis direction is changed from the sufficiently large value to a large value while the magnetic field Hy in the easy-axis direction is changed to a large value, and then, the magnetic field Hx in the hard-axis direction is changed to a small value while the magnetic field Hy in the easy-axis direction is changed to a sufficiently large value.

That is, in the write principle of this embodiment, the magnetic field Hx in the hard-axis direction weakens in three steps, and the magnetic field Hy in the easy-axis direction strengthens in three steps.

More specifically, as shown in FIG. 27, the magnetic field Hx having an intensity enough to align the magnetizing direction of the magnetic domain at the end portion of the storing layer of an MTJ element to the hard-axis direction is caused to act on the MTJ element. Simultaneously, the small magnetic field Hy in the easy-axis direction, which has a direction corresponding to write data, is caused to act on the MTJ element. At this stage, since the MTJ element is largely influenced by the magnetic field Hx, the magnetizing direction of the magnetic domain at the end portion of the storing layer of the TMR layer aligns to the hard-axis direction (①).

Next, as shown in FIG. 28, the magnetic field Hx in the hard-axis direction is changed from the sufficiently large value to a large value (the magnetic field Hx is slightly weakened). Simultaneously, the magnetic field Hy in the easy-axis direction is changed to a large value. At this time, the magnetic fields Hx and Hy may have either the same intensity or different intensities (②).

After that, as shown in FIG. 29, the magnetic field Hx in the hard-axis direction is changed to a sufficiently small value, and the magnetic field Hy in the easy-axis direction is changed from the large value to a sufficiently large value (the magnetic field Hy is further strengthened). Consequently, the magnetizing direction of the most of the storing layer of the TMR layer is aligned to the easy-axis direction by a synthesized magnetic field Hx+Hy (③).

FIG. 30 simply shows the operation principle of the magnetic random access memory which implements the write principle of the eighth embodiment.

First, a write current Ip1 having a predetermined direction is supplied to a write word line. A write current Ip2 having a direction corresponding to write data is supplied to a write bit line. The write current Ip2 has a value much smaller than that of the write current Ip1. The magnetic field Hx in the hard-axis direction is generated by the write current Ip1 having the large value, and the magnetizing direction of the magnetic domain at the end portion of the storing layer of the TMR layer aligns to the hard-axis direction (step ST1).

Next, when a write current Ip3 (<Ip1) is supplied to the write word line, and a write current Ip4 (>Ip2) is supplied to the write bit line, the synthesized magnetic field Hx+Hy is generated by the write currents Tp3 and Ip4 (step ST2).

After that, when a write current Ip5 (<Ip3) is supplied to the write word line, and a write current Ip6 (>Ip4) is supplied to the write bit line, the synthesized magnetic field Hx+Hy is generated by the write currents Ip5 and Ip6. Consequently, the magnetizing direction of the most of the storing layer of the MTJ element is aligned to the easy-axis direction by the magnetic field Hy, and the magnetizing direction of the storing layer of the TMR layer is reversed (step ST3).

The change from the write-current Ip1 to the write current Ip3 and the change from the write current Ip3 to the write current Ip5 (change of the magnetic field Hx: ①→②→③) can be achieved by changing the intensity of the magnetic field in an analog or digital manner.

The change from the write current Ip2 to the write current Ip4 and the change from the write current Ip4 to the write current Ip6 (change of the magnetic field Hy: ①→②→③) can also be achieved by changing the intensity of the magnetic field in an analog or digital manner.

The circuit scheme to be used to execute this operation principle, i.e., the circuit which determines the timings to supply the write currents to the write word line and write bit line and the magnitudes (waveforms) of the write currents will be described later in detail.

As described above, in the write principle of this embodiment, the magnetic field Hx in the hard-axis direction is weakened in three steps, and the magnetic field Hy in the easy-axis direction is strengthened in three steps. For this reason, no large write current need be abruptly supplied to or cut off from the write word/bit line to generate/extinguish the large magnetic fields Hx and Hy. That is, since the write current (the magnitude of the write current) supplied to the write word/bit line does not abruptly change, noise due to an inductance component can be reduced.

(9) Ninth Embodiment

In the write principle of this embodiment, a method of changing the direction and intensity of the synthesized magnetic field Hx+Hy in an analog manner will be proposed.

The point of the method of this embodiment is that a magnetic field Hx in the hard-axis direction is gradually decreased from a sufficiently large value in an analog manner, and a magnetic field Hy in the easy-axis direction is gradually increased to a sufficiently large value in an analog manner.

That is, in the write principle of this embodiment, the direction and intensity of the synthesized magnetic field Hx+Hy change in an analog manner.

Figure 31:
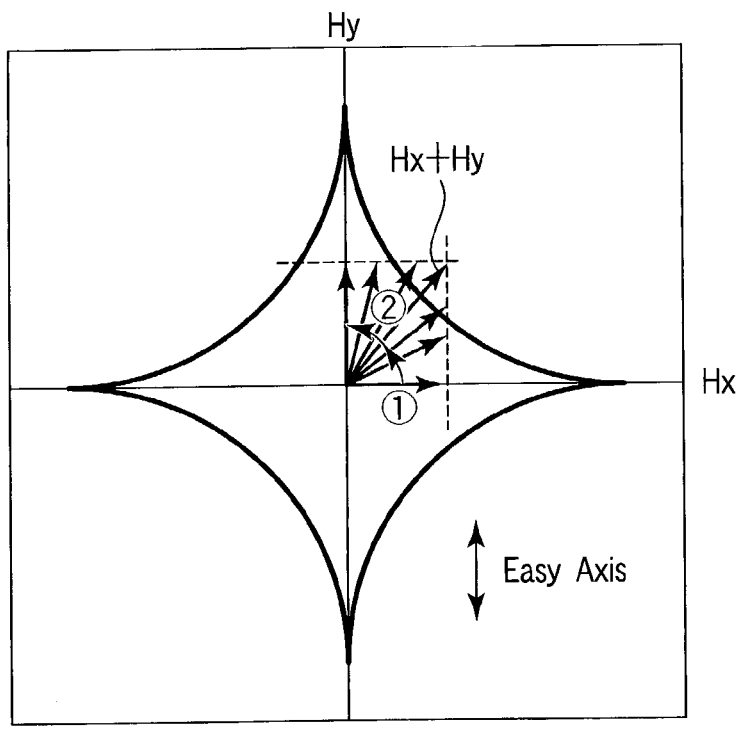
FIG. 31 is a view showing a write principle according to the ninth embodiment of the present invention.
Figure 32:
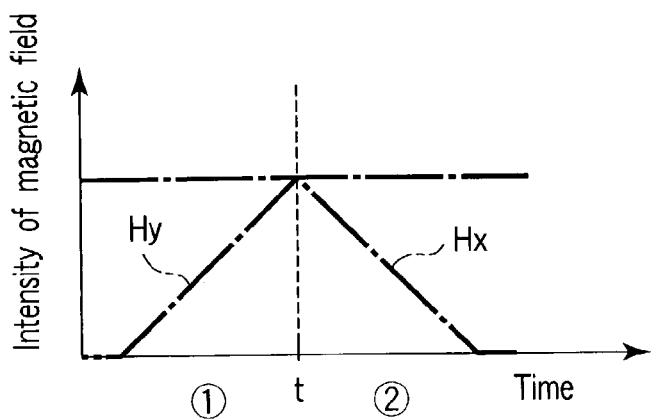
FIG. 32 is a graph showing a change in intensity of a magnetic field in the ninth embodiment.

More specifically, as shown in FIGS. 31 and 32, the magnetic field Hx having an intensity enough to align the magnetizing direction of the magnetic domain at the end portion of the storing layer of an MTJ element to the hard-axis direction is caused to act on the MTJ element. While keeping the intensity of the magnetic field Hx at a predetermined level, the magnetic field Hy in the easy-axis direction is caused to act on the MTJ element. The magnetic field Hy gradually increases in an analog manner while the magnetic field Hx has a constant intensity (until time t) (①).

At time t, the intensity of the synthesized magnetic field Hx+Hy is maximized. Since the value falls outside the asteroid curve, the magnetizing direction of the storing layer of the MTJ element is reversed.

After that, as shown in FIGS. 31 and 32, the magnetic field Hx is gradually decreased in an analog manner while keeping the intensity of the magnetic field Hy at a predetermined level (②).

A data write is executed by such an analog change in synthesized magnetic field Hx+Hy.

Figure 33:
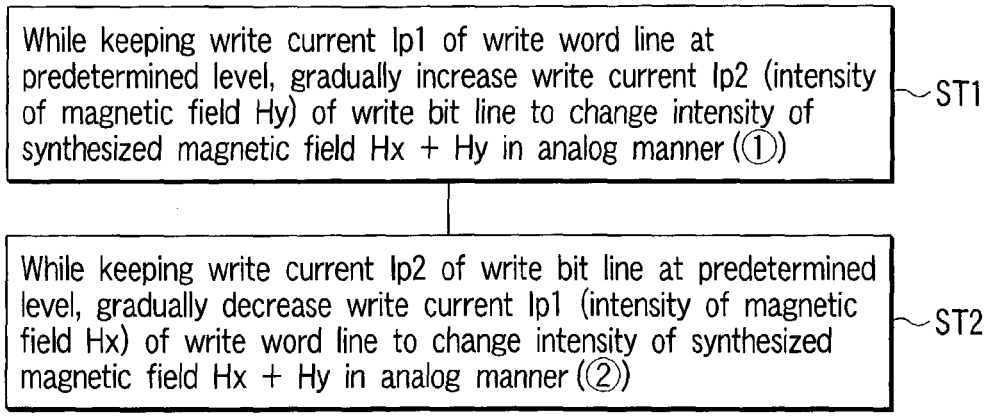
FIG. 33 is a flow chart showing all steps of the write principle according to the ninth embodiment of the present invention.

FIG. 33 simply shows the operation principle of the magnetic random access memory which implements the write principle of the ninth embodiment.

First, a write current Ip1 having a predetermined direction is supplied to the write word line, and a write current Ip2 having a direction corresponding to write data is supplied to the write bit line. The write current Ip1 maintains a predetermined value. The value of the write current Ip2 gradually increases in an analog manner (step ST1).

Next, while keeping the value of the write current Ip2 at a predetermined level, the value of the write current Ip1 is gradually decreased in an analog manner (step ST2).

Since the direction and intensity of the synthesized magnetic field Hx+Hy change in an analog manner, the write can reliably be done.

The circuit scheme to be used to execute this operation principle, i.e., the circuit which determines the timings to supply the write currents to the write word line and write bit line and the magnitudes (waveforms) of the write currents will be described later in detail.

(10) 10th Embodiment

In the write principle of this embodiment, a method of changing the direction and intensity of the synthesized magnetic field Hx+Hy in an analog manner will be proposed, as in the ninth embodiment.

The point of the method of this embodiment is that a magnetic field Hx in the hard-axis direction and a magnetic field Hy in the easy-axis direction are changed under a condition that substantially makes the synthesized magnetic field Hx+Hy have a predetermined magnitude, and the direction of the synthesized magnetic field Hx+Hy is changed in an analog manner.

Figure 34:
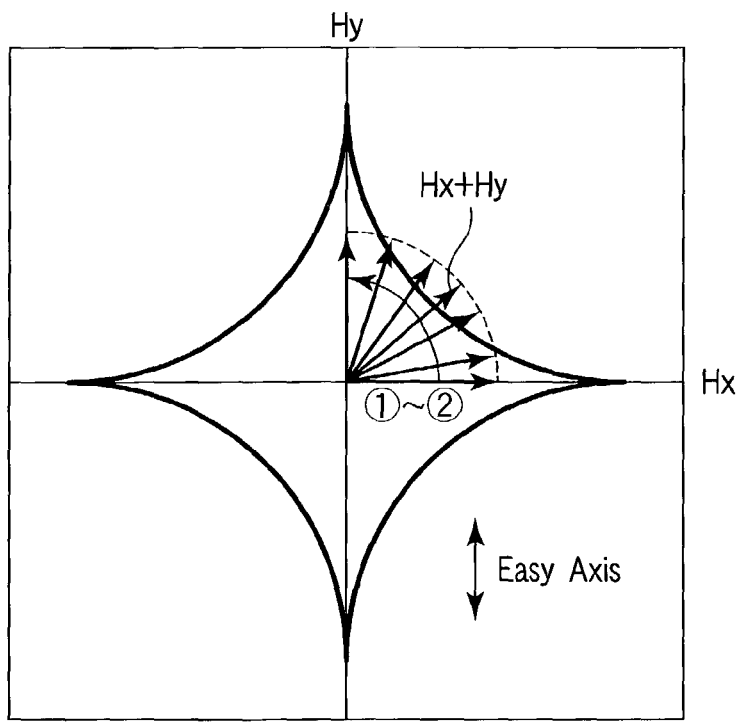
FIG. 34 is a view showing a write principle according to the 10th embodiment of the present invention.
Figures 35, 36:
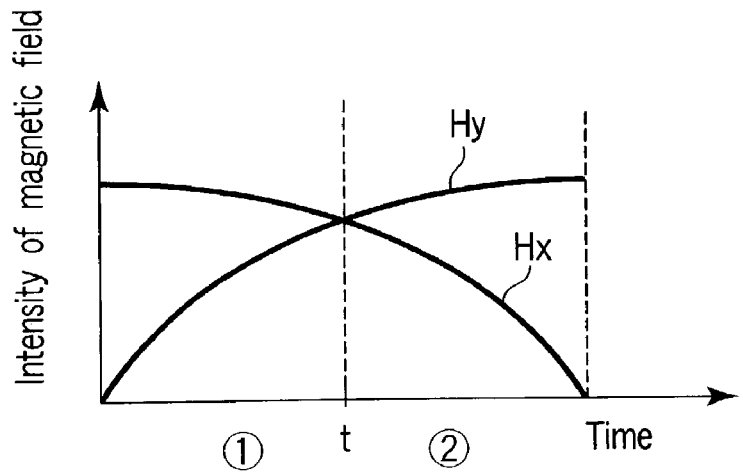
FIG. 35 is a graph showing a change in intensity of a magnetic field in the 10th embodiment.
FIG. 36 is a flow chart showing all steps of the write principle according to the 10th embodiment of the present invention.

More specifically, as shown in FIGS. 34 and 35, the magnetic field Hx having an intensity enough to align the magnetizing direction of the magnetic domain at the end portion of the storing layer of an MTJ element to the hard-axis direction is caused to act on the MTJ element. The intensity of the magnetic field Hx is gradually decreased in an analog manner. Simultaneously, the magnetic field Hy in the easy-axis direction, which has a direction corresponding to write data, is gradually increased in an analog manner (①).

After that, as shown in FIGS. 34 and 35, the intensity of the magnetic field Hx is further gradually decreased in an analog manner. Simultaneously, the magnetic field Hy in the easy-axis direction is gradually increased in an analog manner (②).

A data write is executed by such an analog change in synthesized magnetic field Hx+Hy.

FIG. 36 simply shows the operation principle of the magnetic random access memory which implements the write principle of the 10th embodiment.

First, a write current Ip1 having a predetermined direction is supplied to the write word line, and a write current Ip2 having a direction corresponding to write data is supplied to the write bit line. The value of the write current Ip1 is gradually decreased in an analog manner. Simultaneously, the value of the write current Ip2 is gradually increased (step ST1).

During the write operation, the values of the write current Ip1 and Ip2 may be changed such that, e.g., the intensity of the synthesized magnetic field x+H always substantially keeps a predetermined value. For example, the value of the write current Ip1 (magnetic field Hx) may be set such that it changes by $\alpha \cdot \cos t$ with respect to time t, and the value of the write current Ip2 (magnetic field Hy) may be set such that it changes by $\beta \cdot \sin t$ with respect to time t ($\alpha$ and $\beta$ are constants).

Since the direction of the synthesized magnetic field Hx+Hy changes in an analog manner, the write can reliably be done.

The circuit scheme to be used to execute this operation principle, i.e., the circuit which determines the timings to supply the write currents to the write word line and write bit line and the magnitudes (waveforms) of the write currents will be described later in detail.

(11) Others

The write principle described in each of the first to 10th embodiments is implemented by hardware in the magnetic random access memory (chip or block). A specific write principle may be set for each magnetic random access memory. Alternatively, the write principle and the supply/cutoff timings and magnitudes of the write currents may be set by programming.

When the write principle and the like are to be set by programming, for example, a laser blow fuse, an MTJ element (MTJ), or an antifuse which breaks the tunneling barrier of an MTJ element can be used as a programming element. The test mode of the magnetic random access memory may include a function of testing the write principle of the synthesized magnetic field.

A write current is supplied from a driver connected to one end of a write word/bit line and absorbed by a sinker connected to the other end. In cutting off the write current, when the driver function is stopped, and then, the sinker function is stopped after a predetermined time, the potential of the write word/bit line can be completely set to 0V.

The programming, test mode, and the operation stop timing of the driver/sinker will be described in detail in the following circuit scheme section.

2. Circuit Scheme

Examples of the circuit scheme of a magnetic random access memory which implements the write principle according each of the above-described first to 10th embodiments will be described below.

(1) Setting for Each Chip or Cell Array

A circuit which sets the write principle or the supply/cutoff timings and magnitudes of the write currents for each chip or cell array of the magnetic random access memory will be described.

① CIRCUIT EXAMPLE 1

Circuit Example 1 is related to a magnetic random access memory which has a function capable of setting the supply/cutoff timing of a write current for a write word/bit line by programming.

i. Overall Arrangement

Figure 37:
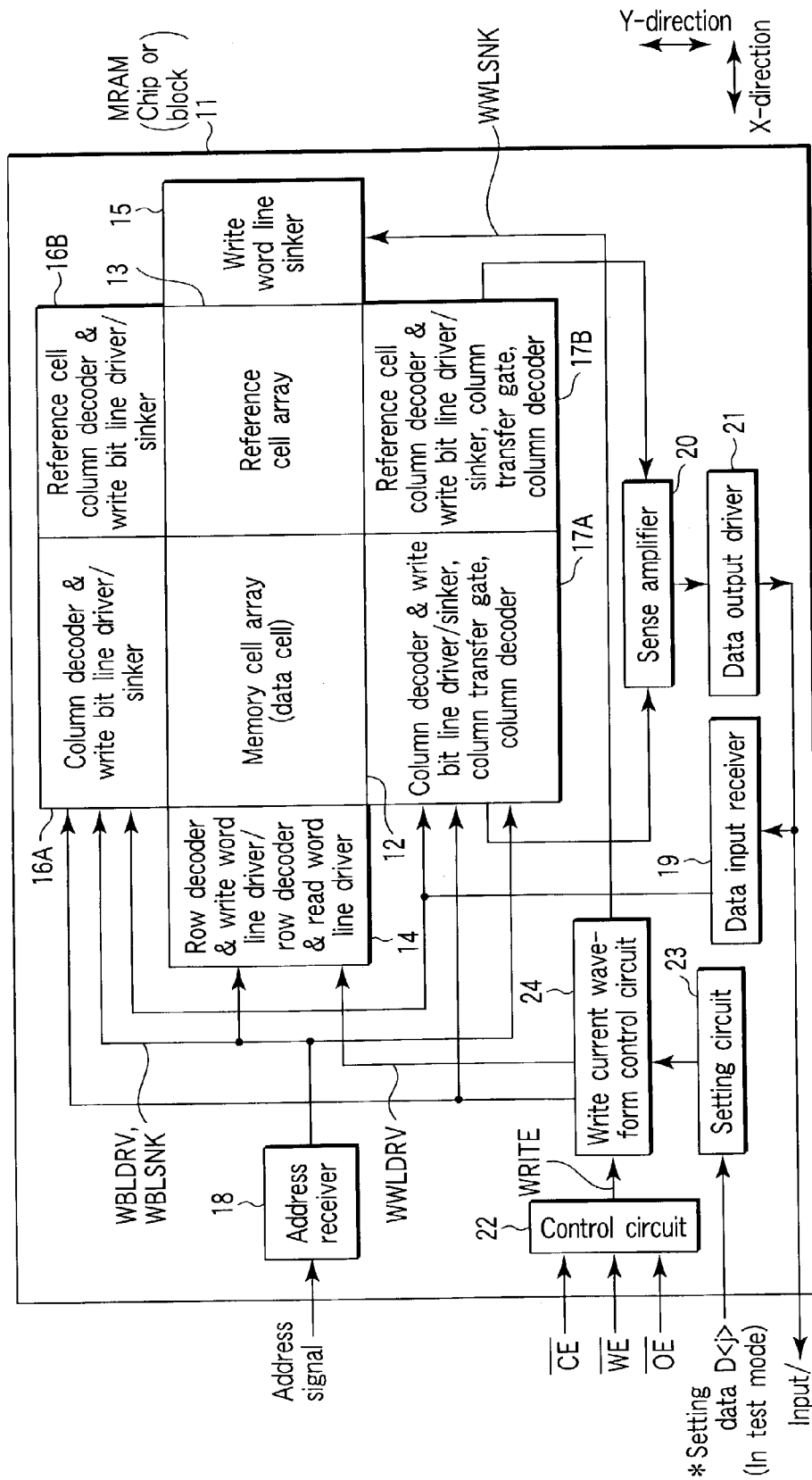
FIG. 37 is a view showing the overall arrangement of an MRAM according to Circuit Example 1 which implements the first to 10th embodiments for each chip or each cell array.

FIG. 37 shows the arrangement of main part of a magnetic random access memory according to Circuit Example 1.

A magnetic random access memory (MRAM) 11 may construct one memory chip by itself or one block in a chip having a specific function. A memory cell array (data cell) 12 has a function of actually storing data. A reference cell array 13 has a function of setting a criterion to be used to determine the value of read data in read operation.

A row decoder & driver (row decoder & write word line driver and row decoder & read word line driver) 14 is arranged at one of two X-direction ends of a cell array formed from the memory cell array 12 and reference cell array 13. A write word line sinker 15 is arranged at the other end.

The row decoder & driver 14 has a function of, e.g., selecting one of a plurality of write word lines on the basis of a row address signal and supplying a write current to the selected write word line in the write operation. The write word line sinker 15 has a function of, e.g., absorbing the write current supplied to the selected write word line in the write operation.

The row decoder & driver 14 has a function of, e.g., selecting one of a plurality of read word lines (the read word lines may be integrated with the write word lines) on the basis of a row address signal and supplying a read current to the selected read word line in the read operation. A sense amplifier 20 detects, e.g., the read current and determines read data.

A column decoder & write bit line driver/sinker 16A is arranged at one of two Y-direction ends of the memory cell array 12. A column decoder & write bit line driver/sinker (including a column transfer gate and column decoder) 17A is arranged at the other end.

The column decoders & write bit line drivers/sinkers 16A and 17A have a function of, e.g., selecting one of a plurality of write bit lines (or data lines) on the basis of a column address signal and supplying a write current having a direction corresponding to write data to the selected write bit line in the write operation. The column transfer gate and column decoder have a function of electrically connecting the data line selected by the column address signal to the sense amplifier 20 in the read operation.

A reference cell column decoder & write bit line driver/sinker 16B is arranged at one of two Y-direction ends of the reference cell array 13. A reference cell column decoder & write bit line driver/sinker (including a column transfer gate and column decoder)17B is arranged at the other end.

The reference cell column decoders & write bit line drivers/sinkers 16B and 17B have a function of storing reference data in the reference cell array 13. The column transfer gate and column decoder have a function of reading out the reference data and transferring it to the sense amplifier 20 in the read operation.

An address receiver 18 receives an address signal and transfers, e.g., a row address signal to the row decoder & driver 14 and a column address signal to the column decoders & write bit line drivers/sinkers 16A and 17A. A data input receiver 19 transfers the write data to the column decoders & write bit line drivers/sinkers 16A and 17A. An output driver 21 outputs the read data detected by the sense amplifier 20 from the magnetic random access memory 11.

A control circuit 22 receives a /CE (Chip Enable) signal, /WE (Write Enable) signal, and /OE (Output Enable) signal and controls the operation of the magnetic random access memory 11. For example, in the write operation, the control circuit 22 supplies a write signal WRITE to a write current waveform control circuit 24. Upon receiving the write signal WRITE, the write current waveform control circuit 24 determines the supply/cutoff timings and magnitudes (current waveforms) of write currents on the basis of, e.g., setting data that is programmed in a setting circuit 23 in advance.

More specifically, in the write operation, the write current waveform control circuit 24 supplies a write word line drive signal WWLDRV to the row decoder & driver 14, a write word line sink signal WWLSNK to the write word line sinker 15, and a write bit line drive signal WBLDRV and write bit line sink signal WBLSNK to the column decoders & write bit line drivers/sinkers 16A and 17A.

In the write operation, for example, the row decoder & driver 14 is set in the operative state when the write word line drive signal WWLDRV is "H". Similarly, the write word line sinker 15 and the column decoders & write bit line drivers/sinkers 16A and 17A are set in the operative state, respectively, when the write word line sink signal WWLSNK, write bit line drive signal WBLDRV, and write bit line sink signal WBLSNK are "H".

With this arrangement, when the timings to change the write word line drive signal WWLDRV, write word line sink signal WWLSNK, write bit line drive signal WBLDRV, and write bit line sink signal WBLSNK to "H" are controlled by the write current waveform control circuit 24, the supply/cutoff timings of the write currents (application timings of the magnetic fields Hx and Hy) can be determined, and the write principles of the first to 10th embodiments can be implemented.

As for the absorption timings of the write currents, for example, when the timings to change the sink signals WWLSNK and WBLSNK from "H" to "L" are set after the timings to change the drive signals WWLDRV and WBLDRV from "H" to "L", the potential of the write word/bit line can be completely set to 0V.

The timings to change the signals WWLDRV, WWLSNK, WBLDRV, and WBLSNK to "H" are determined on the basis of setting data programmed in the setting circuit 23 in advance. For example, a laser blow fuse, an MTJ element (MTJ), or an antifuse which breaks the tunneling barrier of an MTJ element can be used as a programming element.

In the test mode of the magnetic random access memory, the supply/cutoff timings and magnitudes (current waveforms) of write currents can be determined on the basis of, e.g., setting data input from a data input/output terminal. The setting data may be input from an address terminal.

Circuit Example 1 of the magnetic random access memory has its characteristic feature mainly in the setting circuit 23 and write current waveform control circuit 24.

Circuit examples of the setting circuit 23, write current waveform control circuit 24, and drivers/sinkers 14, 15, 16A, and 17A which receive output signals from the write current waveform control circuit 24 will be described below.

ii. Row Decoder & Write Word Line Driver/Sinker

FIG. 38 shows a circuit example of the row decoder & write word line driver/sinker.

The row decoder & write word line driver (for one row) 14 is formed from a NAND gate circuit TND1 and PMOS transistor TP1. The gate of the PMOS transistor TP1 is connected to the output terminal of the NAND gate circuit TND1, the source is connected to a power supply terminal VDD, and the drain is connected to one end of a write word line WWLi (i=1, . . . .)

The write word line sinker (for one row) 15 is formed from an NMOS transistor TN1. The source of the NMOS transistor TN1 is connected to a ground terminal VSS, and the drain is connected to the other end of the write word line WWLi (i=1, . . . .)

A row address signal (changes for each row i) formed from a plurality of bits and write word line drive signal WWLDRV are input to the NAND gate circuit TND1. The write word line sink signal WWLSNK is input to the gate of the NMOS transistor TN1.

In the selected row i, all bits of the row address signal change to "H". For this reason, in the selected row i, when the write word line drive signal WWLDRV changes to "H", the PMOS transistor TP1 is turned on. When the write word line sink signal WWLSNK changes to "H", the NMOS transistor TN1 is turned on.

When both the PMOS transistor TP1 and the NMOS transistor TN1 are turned on, the write current flows from the row decoder & write word line driver 14 to the write word line sinker 15 through the write word line WWLi.

According to this row decoder & write word line driver/sinker, when the timings to change the write word line drive signal WWLDRV and write word line sink signal WWLSNK to "H" or "L" are controlled, the timing to supply the write current to the write word line WWLi in the selected row i and the timing to cut off the write current flowing to the write word line WWLi can be controlled.

When the write word line drive signal WWLDRV is set to "L", and then, the write word line sink signal WWLSNK is set to "L", the potential of the write word line WWLi after the write operation can be completely set to 0V.

iii. Column Decoder & Write Bit Line Driver/Sinker

Figure 39:
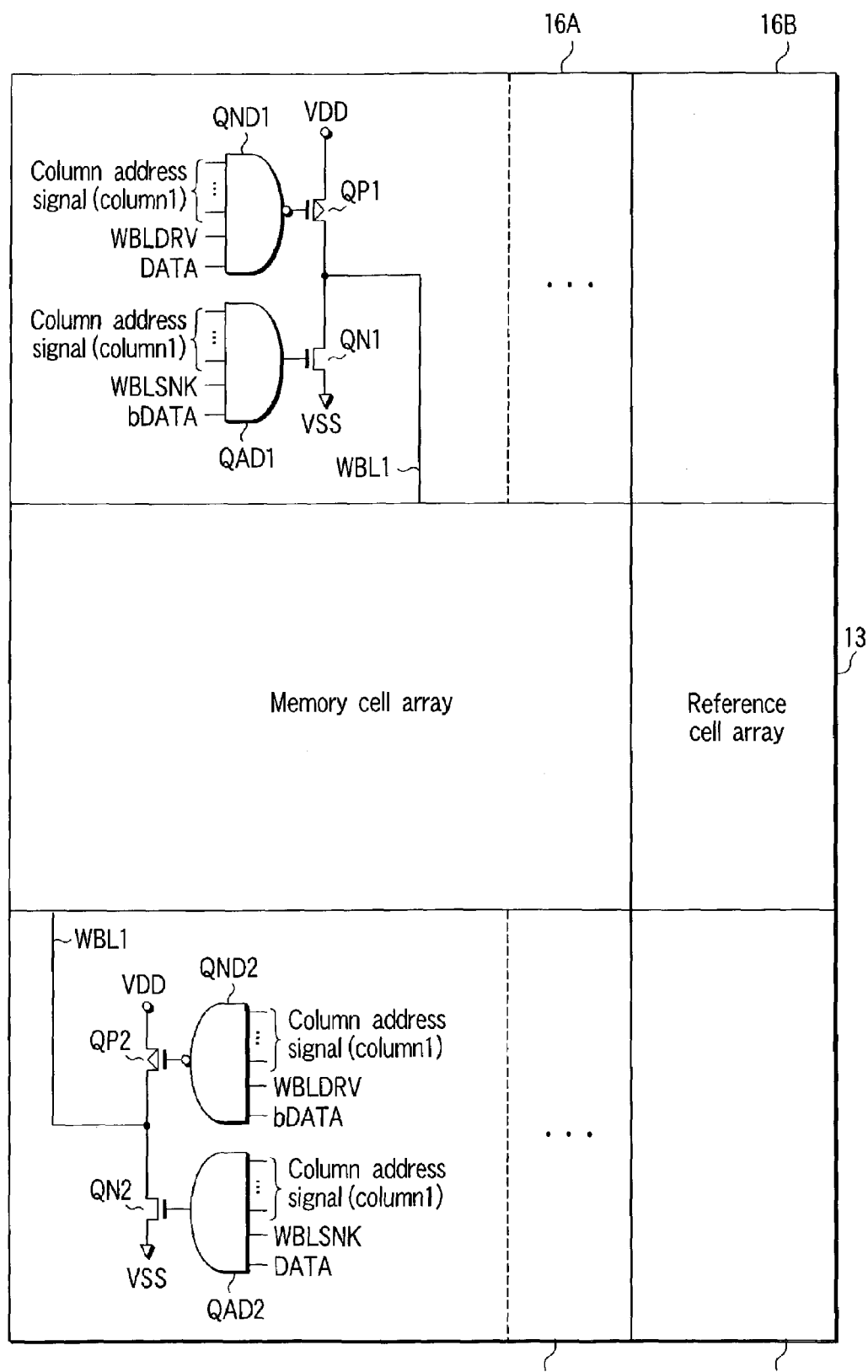
FIG. 39 is a view showing an example of a write bit line driver/sinker according to Circuit Example 1.

FIG. 39 shows a circuit example of the column decoder & write bit line driver/sinker.

The column decoder & write bit line driver/sinker (for one column) 16A is formed from a NAND gate circuit QND1, AND gate circuit QAD1, PMOS transistor QP1, and NMOS transistor QN1.

The gate of the PMOS transistor QP1 is connected to the output terminal of the NAND gate circuit QND1, the source is connected to the power supply terminal VDD, and the drain is connected to one end of a write bit line WBLi (i=1, . . . .) The gate of the NMOS transistor QN1 is connected to the output terminal of the AND gate circuit QAD1, the source is connected to the ground terminal VSS, and the drain is connected to one end of the write bit line WBLi.

The column decoder & write bit line driver/sinker (for one column) 17A is formed from a NAND gate circuit QND2, AND gate circuit QAD2, PMOS transistor QP2, and NMOS transistor QN2.

The gate of the PMOS transistor QP2 is connected to the output terminal of the NAND gate circuit QND2, the source is connected to the power supply terminal VDD, and the drain is connected to the other end of the write bit line WBLi (i=1, . . . .) The gate of the NMOS transistor QN2 is connected to the output terminal of the AND gate circuit QAD2, the source is connected to the ground terminal VSS, and the drain is connected to the other end of the write bit line WBLi.

A column address signal (changes for each column i) formed from a plurality of bits and write bit line drive signal WBLDRV are input to the NAND gate circuits QND1 and QND2. A column address signal (changes for each column i) formed from a plurality of bits and write bit line sink signal WBLSNK are input to the AND gate circuits QAD1 and QAD2.

In addition, write data DATA ("H" or "L") is input to the NAND gate circuit QND1 and AND gate circuit QAD2. An inverted signal bDARA of the write data DATA is input to the NAND gate circuit QND2 and AND gate circuit QAD1.

In a selected column i, all bits of the column address signal change to "H". For this reason, in the selected column i, when the write bit line drive signal WBLDRV and write bit line sink signal WBLSNK change to "H", a write current having a direction corresponding to the value of the write data DATA flows to the write bit line WBLi.

For example, when the write data DATA is "1" (="H"), the PMOS transistor QP1 and NMOS transistor QN2 are turned on. Hence, the write current flows from the column decoder & write bit line driver/sinker 16A to the column decoder & write bit line driver/sinker 17A.

When the write data DATA is "0" (="L"), the PMOS transistor QP2 and NMOS transistor QN1 are turned on. Hence, the write current flows from the column decoder & write bit line driver/sinker 17A to the column decoder & write bit line driver/sinker 16A.

According to this column decoder & write bit line driver/sinker, when the timings to change the write bit line drive signal WBLDRV and write bit line sink signal WBLSNK to "H" or "L" are controlled, the timing to supply the write current to the write bit line WBLi in the selected column i and the timing to cut off the write current flowing to write bit line WBLi can be controlled.

When the write bit line drive signal WBLDRV is set to "L", and then, the write bit line sink signal WBLSNK is set to "L", the potential of the write bit line WBLi after the write operation can be completely set to 0V.

iv. Write Current Waveform Control Circuit

An example of the write current waveform control circuit which generates the write word line drive signal WWLDRV, write word line sink signal WWLSNK, write bit line drive signal WBLDRV, and write bit line sink signal WBLSNK will be described next.

FIG. 40 shows an example of the write current waveform control circuit.

The write current waveform control circuit 24 is formed from a write word line driver/sinker trigger circuit 25 and write bit line driver/sinker trigger circuit 26.

The write word line driver/sinker trigger circuit 25 generates the write word line drive signal WWLDRV and write word line sink signal WWLSNK on the basis of the write signal WRITE and timing control signals WS<0> to WS<3> and bWS<0> to bWS<3>.

The write bit line driver/sinker trigger circuit 26 generates the write bit line drive signal WBLDRV and write bit line sink signal WBLSNK on the basis of the write signal WRITE and timing control signals BS<0> to BS<3> and bBS<0> to bBS<3>.

The write signal WRITE changes to "H" in the write operation.

The supply/cutoff timing of the write current for the write word line WWLi, i.e., the timing to change the write word line drive signal WWLDRV and write word line sink signal WWLSNK to "H" or "L" is determined on the basis of the timing control signals WS<0> to WS<3> and bWS<0> to bWS<3>.

The supply/cutoff timing of the write current for the write bit line WBLi, i.e., the timing to change the write bit line drive signal WBLDRV and write bit line sink signal WBLSNK to "H" or "L" is determined on the basis of the timing control signals BS<0> to BS<3> and bBS<0> to bBS<3>.

The timing control signals WS<0> to WS<3>, bWS<0> to bWS<3>, BS<0> to BS<3>, and bBS<0> to bBS<3> are generated by a setting circuit (to be described later).

v. Write Word Line Driver/Sinker Trigger Circuit

Figure 41:
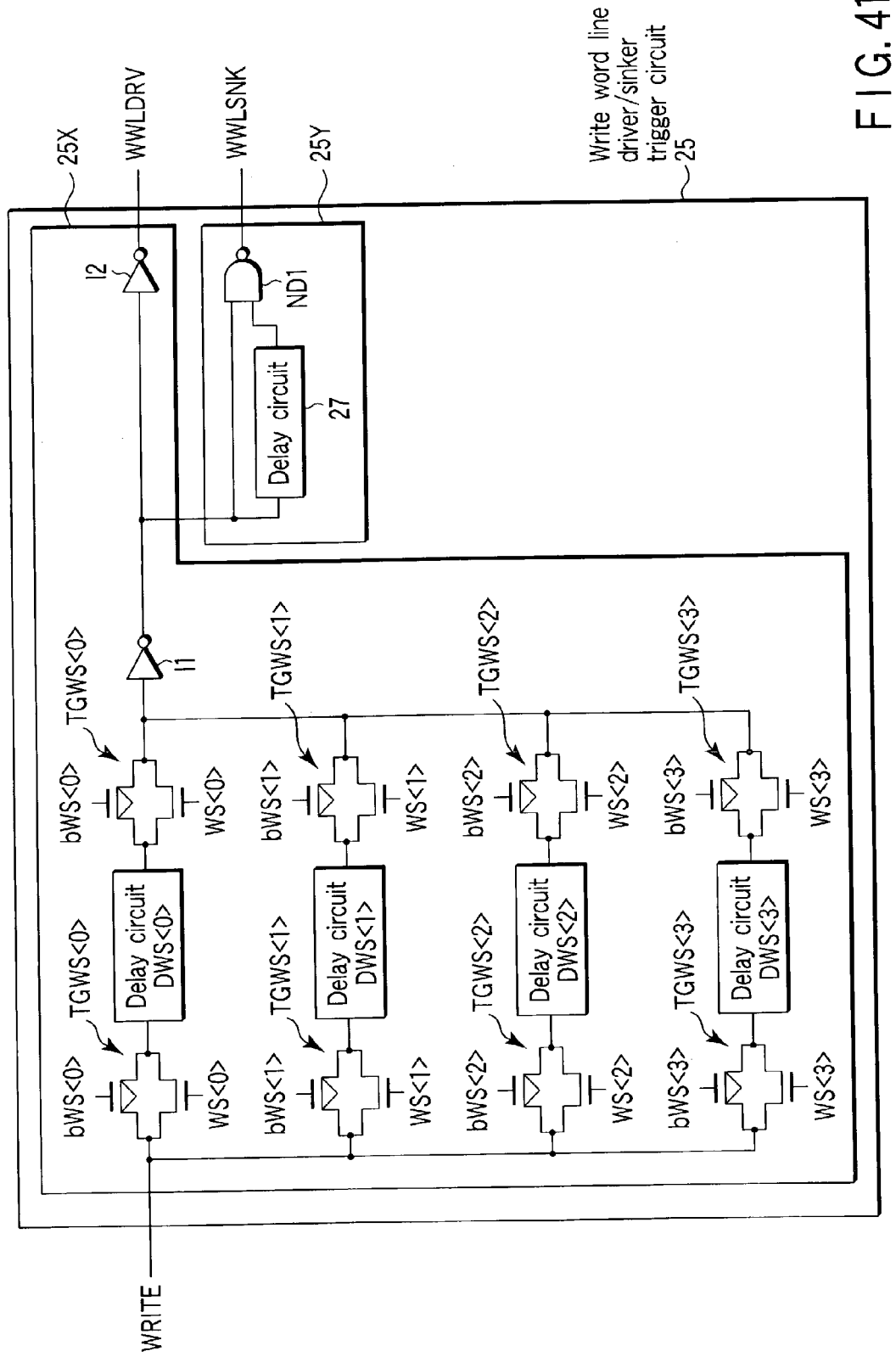
FIG. 41 is a view showing an example of a write word line driver/sinker trigger circuit according to Circuit Example 1.

FIG. 41 shows an example of the write word line driver/sinker trigger circuit.

The write word line driver/sinker trigger circuit 25 is formed from a current supply/cutoff timing determining circuit 25X which determines the current supply/cutoff timing of the write current, and a current absorption timing determining circuit 25Y which determines the current absorption timing of the write current.

After the write signal WRITE changes to "H", the current supply/cutoff timing determining circuit 25X determines the timing to change the write word line drive signal WWLDRV to "H". After the write signal WRITE changes to "L", the current supply/cutoff timing determining circuit 25X determines the timing to change the write word line drive signal WWLDRV to "L".

The current supply/cutoff timing determining circuit 25X is formed from a plurality of (in this example, four) delay circuits DWS<0> to DWS<3>, transfer gates TGWS<0> to TGWS<3>, and inverters I1 and I2.

The delay circuits DWS<0> to DWS<3> have different delay amounts for the input signal (write signal WRITE). The delay amounts of the delay circuits DWS<0> to DWS<3> may change at a predetermined interval, periodically, or at random.

The transfer gates TGWS<0> to TGWS<3> are arranged in the current supply/cutoff timing determining circuit 25X to select one of the plurality of delay circuits DWS<0> to DWS<3>. More specifically, in the write operation, one of a plurality of complementary signal pairs WS<j> and bWS<j> (j=0, 1, 2, 3) of the timing control signals is selected.

The selected complementary signal pair has WS<j>="H" and bWS<j>="L", and other complementary signal pairs have WS<j>="L" and bWS<j>="H". For this reason, the write signal WRITE passes through only the selected delay circuit DWS<j> and is output from the write word line driver/sinker trigger circuit 25 as the write word line drive signal WWLDRV.

When the timing to change the write signal WRITE to "H" or "L" is delayed by a predetermined time by one of the delay circuits DWS<0> to DWS<3>, the timing to change the write word line drive signal WWLDRV to "H" or "L", i.e., the supply/cutoff timing of the write current can be controlled.

In this example, the four delay circuits DWS<0> to DWS<3> are used. However, as the number of delay circuits increases, the number of selectable delay amounts also increases, as a matter of course. Hence, the write current supply/cutoff timing can finely be controlled. In this case, the number of timing control signals to be used to select the delay circuit also increases.

The current absorption timing determining circuit 25Y is formed from a NAND gate circuit ND1 and delay circuit 27.

When the write word line drive signal WWLDRV changes to "H", the current absorption timing determining circuit 25Y almost simultaneously changes the write word line sink signal WWLSNK to "H". After the write word line drive signal WWLDRV changes to "L", and a delay time which is determined by the delay circuit 27 elapses, the current absorption timing determining circuit 25Y changes the write word line sink signal WWLSNK to "L".

When the write word line drive signal WWLDRV is changed to "L", and then the write word line sink signal WWLSNK is changed to "L" after a predetermined interval, the potential of the write word line WWLi can be completely set to 0V after the write operation.

vi. Write Bit Line Driver/Sinker Trigger Circuit

Figure 42:
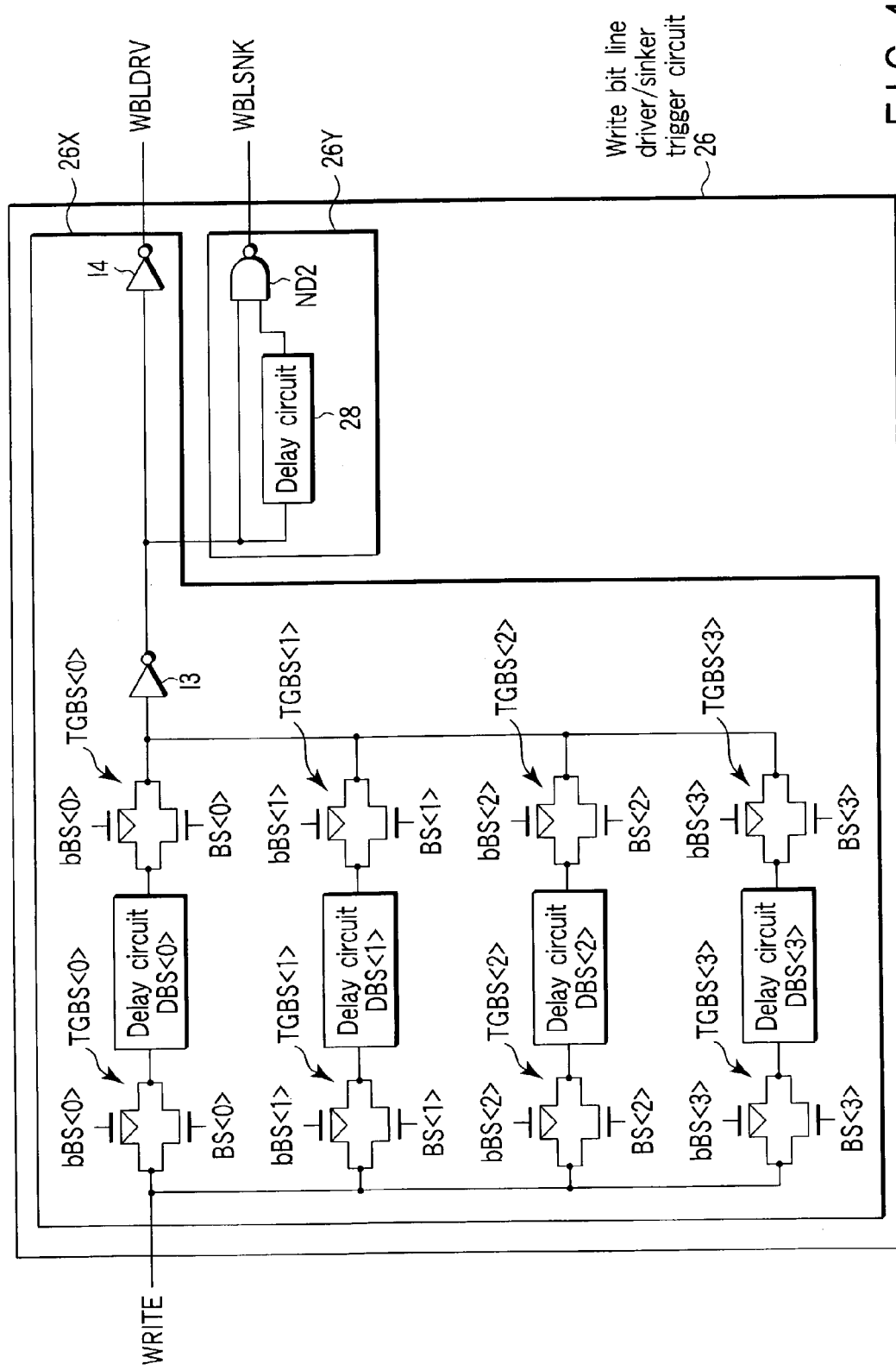
FIG. 42 is a view showing an example of a write bit line driver/sinker trigger circuit according to Circuit Example 1.

FIG. 42 shows an example of the write bit line driver/sinker trigger circuit.

The write bit line driver/sinker trigger circuit 26 is formed from a current supply/cutoff timing determining circuit 26X which determines the current supply/cutoff timing of the write current, and a current absorption timing determining circuit 26Y which determines the current absorption timing of the write current.

After the write signal WRITE changes to "H", the current supply/cutoff timing determining circuit 26X determines the timing to change the write bit line drive signal WBLDRV to "H". After the write signal WRITE changes to "L", the current supply/cutoff timing determining circuit 26X determines the timing to change the write bit line drive signal WBLDRV to "L".

The current supply/cutoff timing determining circuit 26X is formed from a plurality of (in this example, four) delay circuits DBS<0> to DBS<3>, transfer gates TGBS<0> to TGBS<3>, and inverters I3 and I4.

The delay circuits DBS<0> to DBS<3> have different delay amounts for the input signal (write signal WRITE). The delay amounts of the delay circuits DBS<0> to DBS<3> may change at a predetermined interval, periodically, or at random.

The transfer gates TGBS<0> to TGBS<3> are arranged in the current supply/cutoff timing determining circuit 26X to select one of the plurality of delay circuits DBS<0> to DBS<3>. More specifically, in the write operation, one of a plurality of complementary signal pairs BS<j> and bBS<j> (j=0, 1, 2, 3) of the timing control signals is selected.

The selected complementary signal pair has BS<j>="H" and bBS<j>="L", and other complementary signal pairs have BS<j>="L" and bBS<j>="H". For this reason, the write signal WRITE passes through only the selected delay circuit DBS<j> and is output from the write bit line driver/sinker trigger circuit 26 as the write bit line drive signal WBLDRV.

When the timing to change the write signal WRITE to "H" or "L" is delayed by a predetermined time by one of the delay circuits DBS<0> to DBS<3>, the timing to change the write bit line drive signal WBLDRV to "H" or "L", i.e., the supply/cutoff timing of the write current can be controlled.

In this example, the four delay circuits DBS<0> to DBS<3> are used. However, as the number of delay circuits increases, the number of selectable delay amounts also increases, as a matter of course. Hence, the write current supply/cutoff timing can finely be controlled. In this case, the number of timing control signals to be used to select the delay circuit also increases.

The current absorption timing determining circuit 26Y is formed from a NAND gate circuit ND2 and delay circuit 28.

When the write bit line drive signal WBLDRV changes to "H", the current absorption timing determining circuit 26Y almost simultaneously changes the write bit line sink signal WBLSNK to "H". After the write bit line drive signal WBLDRV changes to "L", and a delay time which is determined by the delay circuit 28 elapses, the current absorption timing determining circuit 26Y changes the write bit line sink signal WBLSNK to "L".

When the write bit line drive signal WBLDRV is changed to "L", and then the write bit line sink signal WBLSNK is changed to "L" after a predetermined interval, the potential of the write bit line WBLi can be completely set to 0V after the write operation.

vii. Setting Circuit

The setting circuit which generates the timing control signals WS<0> to WS<3>, bWS<0> to bWS<3>, BS<0> to BS<3>, and bBS<0> to bBS<3> shown in FIGS. 40 to 42 will be described next.

Figure 43:
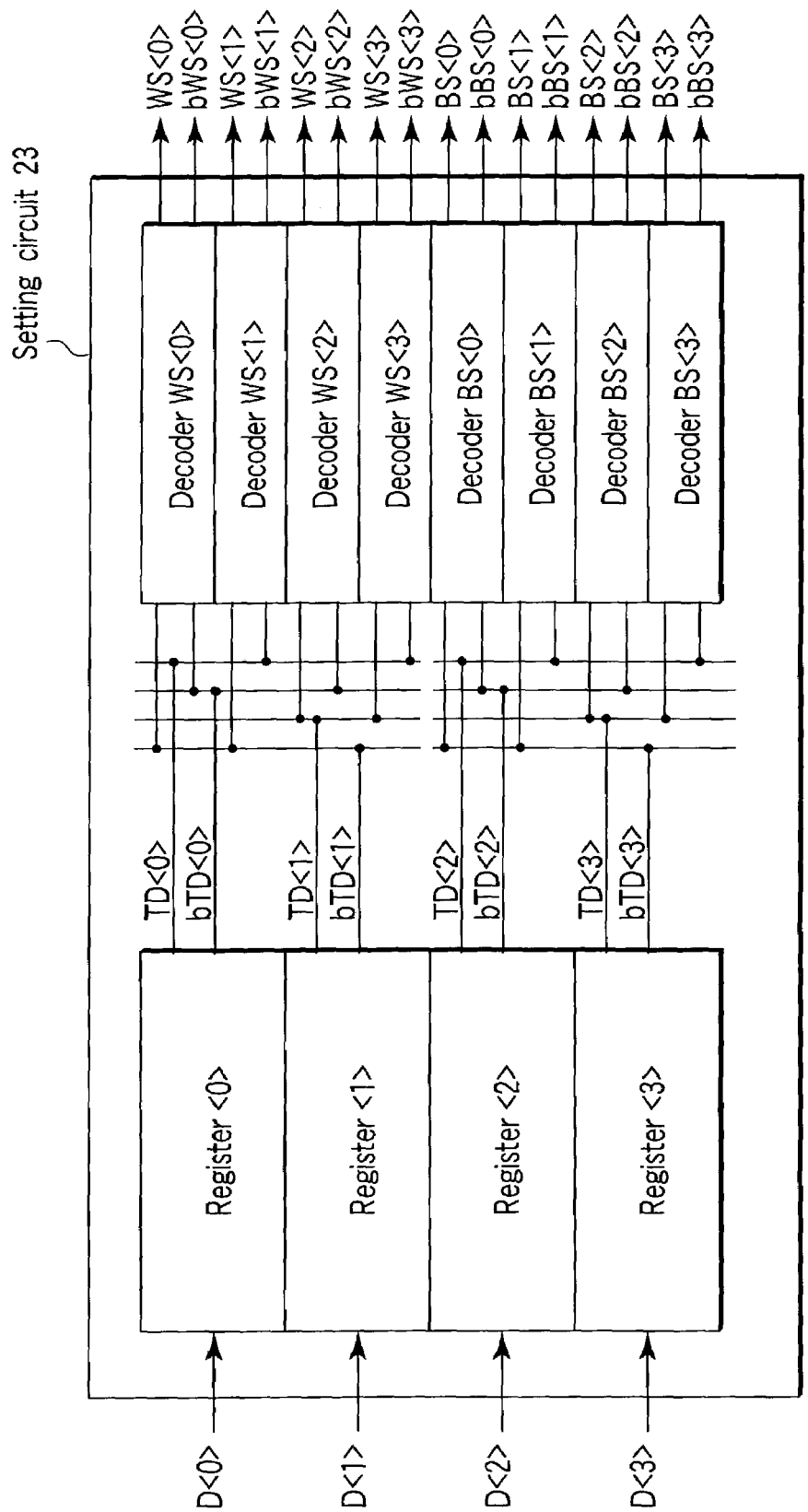
FIG. 43 is a view showing an example of a setting circuit according to Circuit Example 1.

FIG. 43 shows an example of the setting circuit.

The setting circuit 23 is formed from registers <0> to <3> in which setting data that determine the write current supply/cutoff timings are programmed and decoders WS<0> to WS<3> and BS< > to BS<3> which decode output signals TD<0> to TD<3> and bTD<0> to bTD<3> from the registers <0> to <3> and output the timing control signals WS<0> to WS<3>, bWS<0> to bWS<3>, BS<0> to BS<3>, and bBS<0> to bBS<3>, respectively.

Setting data which determine the write current supply/cutoff timing for the write word line WWLi are programmed in the registers <0> and <1>. As shown in FIG. 41, when the four delay circuits (current supply/cutoff timings) DWS<0> to DWS<3> are present in the write word line driver/sinker trigger circuit 25, at least 2-bit setting data is necessary for selecting one delay circuit.

In this example, to determine the write current supply/cutoff timing for the write word line WWLi, the two registers <0> and <1> are prepared, and 1-bit setting data is programmed in each of the registers <0> and <1>.

D<0> and D<1> are setting data which are input from the outside of the magnetic random access memory in the test mode. In the test mode, the write current supply/cutoff timing for the write word line WWLi can be determined on the basis of these setting data.

The register <0> and <1> output the 2-bit complementary signal pairs TD<0> and bTD<0>, and TD<1> and bTD<1>. The decoders WS<0> to WS<3> decode the 2-bit complementary signal pairs TD<0> and bTD<0>, and TD<1> and bTD<1> and output the timing control signals WS<0> to WS<3> and bWS<0> to bWS<3>.

For example, when two input signals are "H", the decoder WS<j> changes the output signal WS<j> to "H" and the output signal bWS<j> to "L" (j=0, 1, 2, 3). That is, in this example, the two input signals are "H" for only one of the four decoders WS<0> to WS<3>. For this reason, one of the four complementary signal pairs WS<j> and bWS<j> of the timing control signals has WS<j>="H" and bWS<j>="L". The remaining three complementary signal pairs have WS<j>="L" and bWS<j>="H".

Setting data which determine the write current supply/cutoff timing for the write bit line WBLi are programmed in the registers <2> and <3>. As shown in FIG. 42, when the four delay circuits (current supply/cutoff timings) DBS<0> to DBS<3> are present in the write bit line driver/sinker trigger circuit 26, at least 2-bit setting data is necessary for selecting one delay circuit.

In this example, to determine the write current supply/cutoff timing for the write bit line WBLi, the two registers <2> and <3> are prepared, and 1-bit setting data is programmed in each of the registers <2> and <3>.

D<2> and D<3> are setting data which are input from the outside of the magnetic random access memory in the test mode. In the test mode, the write current supply/cutoff timing for the write bit line WBLi can be determined on the basis of these setting data.

The register <2> and <3> output the 2-bit complementary signal pairs TD<2> and bTD<2>, and TD<3> and bTD<3>. The decoders BS<0> to BS<3> decode the 2-bit complementary signal pairs TD<2> and bTD<2>, and TD<3> and bTD<3> and output the timing control signals BS<0 > to BS<3> and bBS<0> to bBS<3>.

For example, when two input signals are "H", the decoder BS<j> changes the output signal BS<j> to "H" and the output signal bBS<j> to "L" (j=0, 1, 2, 3). That is, in this example, the two input signals are "H" for only one of the four decoders BS<0> to BS<3>. For this reason, one of the four complementary signal pairs BS<j> and bBS<j> of the timing control signals has BS<j>="H" and bBS<j>="L". The remaining three complementary signal pairs have BS<j>="L" and bBS<j>="H".

viii. Register <j>

A circuit example of the register <j> in the setting circuit 23 shown in FIG. 43 will be described.

Figure 44:
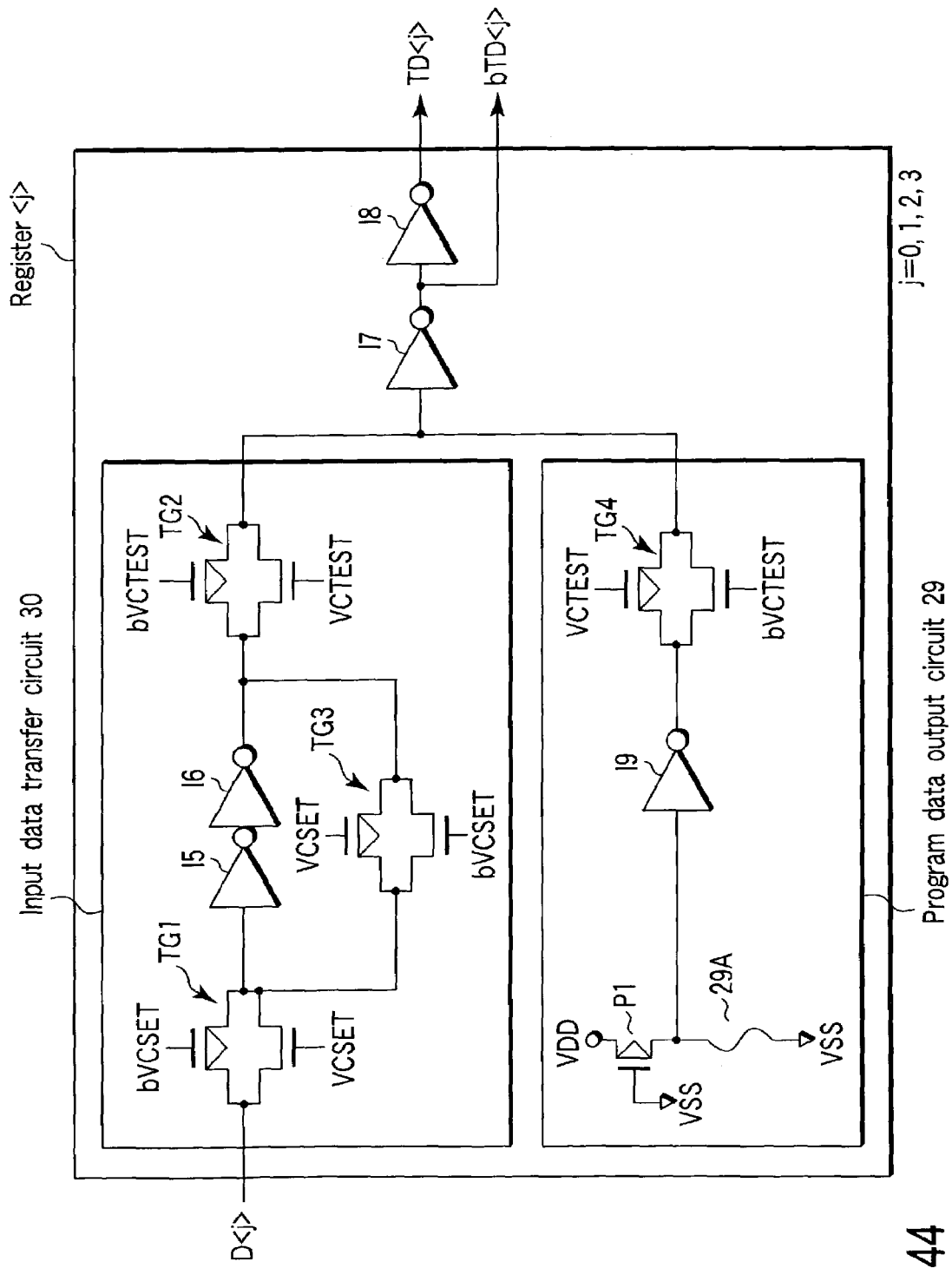
FIG. 44 is a view showing an example of a register in the setting circuit according to Circuit Example 1.

FIG. 44 shows a circuit example of the register.

The register <j> (j=0, 1, 2, 3) is formed from a program data output circuit 29 which outputs programmed setting data as the output signals TD<j> and bTD<j>, and an input data transfer circuit 30 which outputs setting data input from the outside of the magnetic random access memory as the output signals TD<j> and bTD<j>.

The program data output circuit 29 has a laser blow fuse 29A to store setting data. One-bit data is stored in accordance with whether the laser blow fuse 29A is cut. A PMOS transistor P1 and laser blow fuse 29A are connected in series between the power supply terminal VDD and the ground terminal VSS. Since the gate of the PMOS transistor P1 is connected to the ground terminal VSS, the PMOS transistor P1 is always ON.

The connection point between the PMOS transistor P1 and the laser blow fuse 29A is connected to the input terminal of an inverter I7 through an inverter I9 and transfer gate TG4. The output signal from the inverter I7 is bTD<j>, and the output signal from an inverter I8 is TD<j>.

The input data transfer circuit 30 is formed from transfer gates TG1 to TG3 and inverters I5 and I6. The inverters I5 and I6 and transfer gate TG3 constitute a latch circuit.

In the write operation of the normal operation mode, a test signal VCTEST changes to "L", and a test signal bVCTEST changes to "H". For this reason, the transfer gate TG4 is turned on, and the transfer gates TG1 and TG2 are turned off.

Hence, the setting data programmed in the laser blow fuse 29A is output as the output signals TD<j> and bTD<j> through the transfer gate TG4 and inverters I7 to I9.

In the write operation of the test mode, the test signal VCTEST changes to "H", and the test signal bVCTEST changes to "L". For this reason, the transfer gates TG1 and TG2 are turned on, and the transfer gates TG3 and TG4 are turned off.

Hence, the setting data D<j> input from an external terminal (data input terminal, address terminal, or the like) is output as the output signals TD<j> and bTD<j> through the transfer gates TG1 and TG2 and inverters I5 to I8.

In the standby state of the test mode, the test signal VCTEST changes to "L", and the test signal bVCTEST changes to "H". For this reason, the transfer gates TG1 and TG2 are turned off, and the transfer gates TG3 and TG4 are turned on.

Hence, the setting data D<j> input from the external terminal is latched by the latch circuit formed from the transfer gate TG3 and inverters I5 and I6. After that, a write test can be performed on the basis of the setting data latched by the latch circuit.

Figure 45:
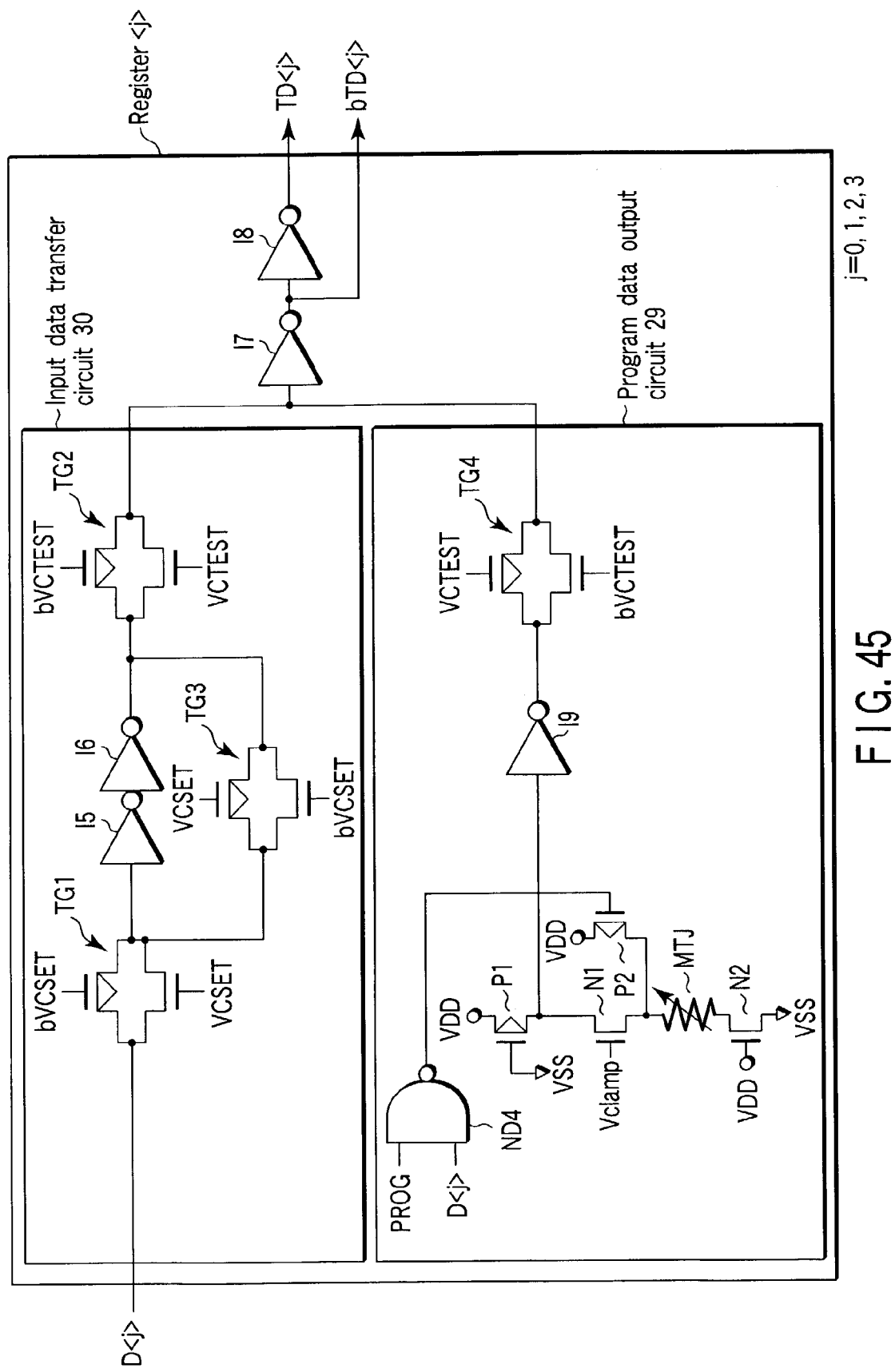
FIG. 45 is a view showing another example of the register in the setting circuit according to Circuit Example 1.

FIG. 45 shows another circuit example of the register.

The register <j> of this example has its characteristic feature in the structure of the program data output circuit 29, as compared to the register <j> shown in FIG. 44. More specifically, the register <j> shown in FIG. 44 uses the laser blow fuse 29A as an element for storing setting data. The register <j> of this example uses an MTJ element (MTJ) as an element for storing setting data.

The program data output circuit 29 has an MTJ element MTJ which stores setting data. Setting data can be stored in the MTJ element MTJ in accordance with the magnetized state of the MTJ element, i.e., the relationship (parallel or antiparallel) between the magnetizing direction of the fixed layer and that of the storing layer. However, this example does not use the above method.

This is because the value of setting data that is written in the MTJ element MTJ once is not rewritten again.

When it is taken into consideration that the MR ratio of the MTJ element MTJ is 20% to 40%, in the setting circuit which outputs the data of the MTJ element MTJ simultaneously with power-on, a high voltage may be applied across the MTJ element MTJ in reading the setting data, and the MTJ element MTJ may break.

Hence, for the MTJ element MTJ which stores setting data, the setting data is programmed on the basis of not the relationship between the magnetizing direction of the fixed layer and that of the storing layer but whether dielectric breakdown occurs in the tunneling barrier.

In the setting data programming method using the breakdown of the MTJ element MTJ, the setting data can be kept stored semipermanently.

One terminal of the MTJ element MTJ is connected to the power supply terminal VDD through the PMOS transistor P1 and an NMOS transistor N1. The other terminal is connected to the ground terminal VSS through an NMOS transistor N2.

The gate of the PMOS transistor P1 is connected to the ground terminal VSS, and the gate of the NMOS transistor N2 is connected to the ground terminal VSS. For this reason, the MOS transistors P1 and N2 are always ON.

A clamp potential Vclamp is input to the gate of the NMOS transistor N1. When the clamp potential Vclamp is set to an appropriate value, any high voltage application between the electrodes of the MTJ element MTJ can be prevented in reading the setting data.

Figure 46:
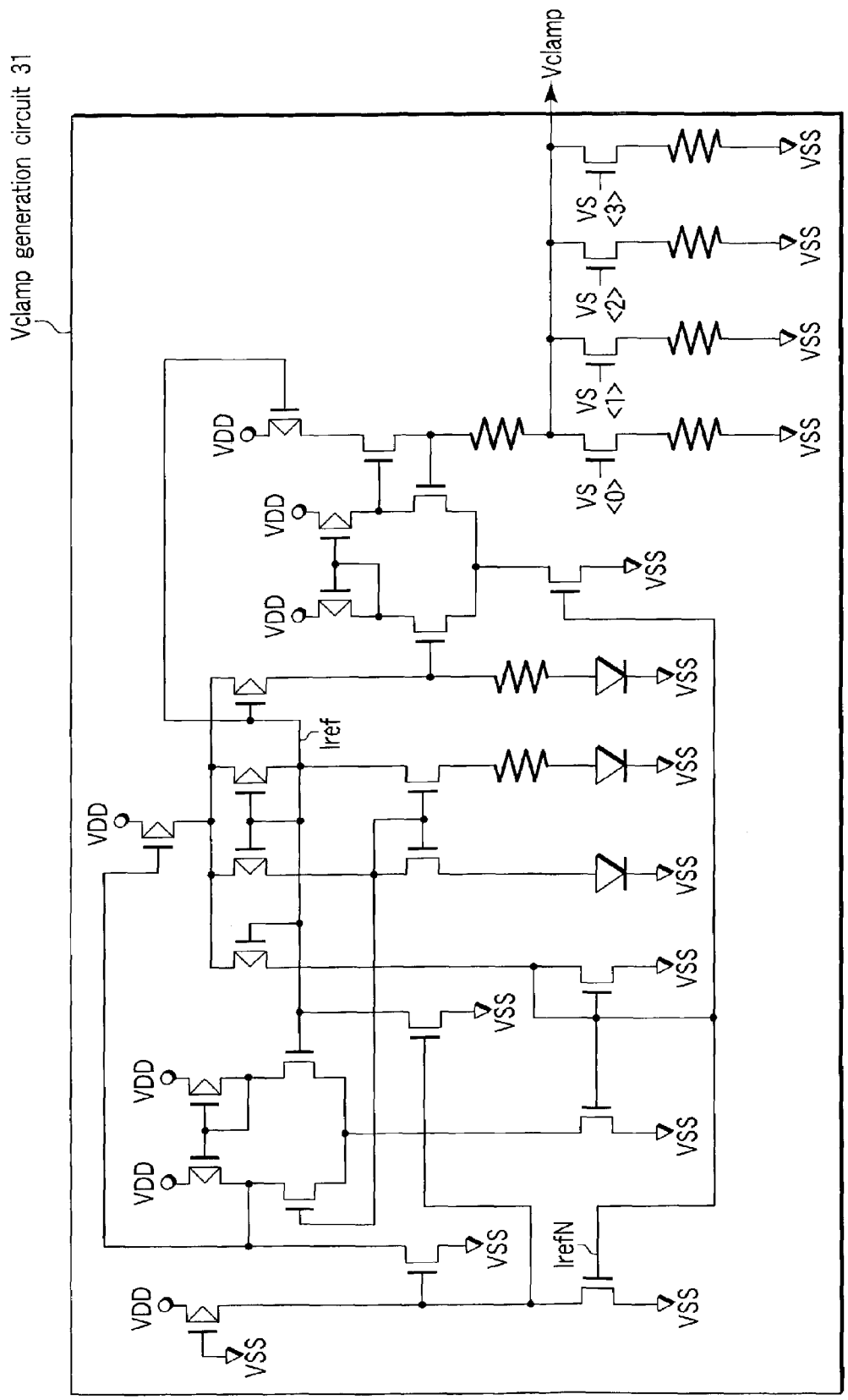
FIG. 46 is a view showing an example of a Vclamp generation circuit used in Circuit Example 1.

FIG. 46 shows an example of a Vclamp generation circuit which generates the clamp potential Vclamp.

A Vclamp generation circuit 31 of this example obtains the clamp potential Vclamp by resistance-dividing the output voltage from a BGR circuit. The clamp potential Vclamp is 0.3 to 0.5V.

A NAND gate circuit ND4 and PMOS transistor P2 are elements which are necessary when the setting data programming method using dielectric breakdown of the MTJ element MTJ should be employed.

In programming setting data, a program signal 20. PROG changes to "H". For example, to write setting data "1" in the MTJ element MTJ, "1" (="H") is input from the external terminal (data input terminal, address terminal, dedicated terminal, or the like) as setting data D<j>.

At this time, the output signal from the NAND gate circuit ND4 changes to "L", and the PMOS transistor P2 is turned on. Hence, a high voltage is applied across the MTJ element MTJ to break the tunneling barrier of the MTJ element MTJ. As a result, the setting data "1" is programmed in the MTJ element MTJ. In this case, TD<j> is "L", and bTD<j> is "H".

On the other hand, to write setting data "0" in the MTJ element MTJ, "0" (="L") is input from the external terminal (data input terminal, address terminal, dedicated terminal, or the like) as setting data D<j>.

At this time, the output signal from the NAND gate circuit ND4 changes to "H", and the PMOS transistor P2 is turned off. Since no high voltage is applied across the MTJ element MTJ, the tunneling barrier of the MTJ element MTJ is not broken. As a result, the setting data "0" is programmed in the MTJ element MTJ. In this case, TD<j> is "H", and bTD<j> is "L".

The connection point between the PMOS transistor P1 and the NMOS transistor N1 is connected to the input terminal of the inverter I7 through the inverter I9 and transfer gate TG4. The output signal from the inverter I7 is bTD<j>, and the output signal from the inverter I8 is TD<j>.

ix. Decoder WS<j> or BS<j>

A circuit example of the decoder WS<j> or BS<j> in the setting circuit 23 shown in FIG. 43 will be described.

FIG. 47 shows a circuit example of a decoder.

The decoder WS<j> or BS<j> (j=0, 1, 2, 3) is formed from a NAND gate circuit ND3 and inverter I10.

Two input signals A and B are input to the NAND gate circuit ND3. An output signal D from the NAND gate circuit ND3 is bWS<j> or bBS<j>. An output signal C from the inverter I10 is WS<j> or BS<j>.

Table 1 is the decoding table (the relationship between the input signals and the output signals) of the decoders WS<j> and BS<j>.

TABLE 1

| INPUT | | OUTPUT | |
|---|---|---|---|
| A | B | C | D |
| bTD<0> | bTD<1> | WS<0> | bWS<0> |
| TD<0> | bTD<1> | WS<1> | bWS<1> |
| bTD<0> | TD<1> | WS<2> | bWS<2> |
| TD<0> | TD<1> | WS<3> | bWS<3> |
| bTD<2> | bTD<3> | BS<0> | bBS<0> |
| TD<2> | bTD<3> | BS<1> | bBS<1> |
| bTD<2> | TD<3> | BS<2> | bBS<2> |
| TD<2> | TD<3> | BS<3> | bBS<3> | x. Conclusion

As described above, according to Circuit Example 1 of the magnetic random access memory, the write current supply/cutoff timing for the write word/bit line can be set for each chip or memory cell array by programming. With this arrangement, for example, the write principles of the first to 10th embodiments can be implemented. The magnetization of the storing layer of an MTJ element can reliably be inverted. The write characteristics can be improved.

② CIRCUIT EXAMPLE 2

Circuit Example 2 is related to a magnetic random access memory which has a function capable of setting the supply/cutoff timing, magnitude, and temporal change (current waveform) of a write current for a write word/bit line by programming.

i. Overall Arrangement

FIG. 48 shows the arrangement of main part of a magnetic random access memory according to Circuit Example 2.

A magnetic random access memory (MRAM) 11 may construct one memory chip by itself or one block in a chip having a specific function. A memory cell array (data cell) 12 has a function of actually storing data. A reference cell array 13 has a function of setting a criterion to be used to determine the value of read data in read operation.

A row decoder & driver (row decoder & write word line driver and row decoder & read word line driver) 14 is arranged at one of two X-direction ends of a cell array formed from the memory cell array 12 and reference cell array 13. A write word line sinker 15 is arranged at the other end.

The row decoder & driver 14 has a function of, e.g., selecting one of a plurality of write word lines on the basis of a row address signal and supplying a write current to the selected write word line in the write operation. The write word line sinker 15 has a function of, e.g., absorbing the write current supplied to the selected write word line in the write operation.

The row decoder & driver 14 has a function of, e.g., selecting one of a plurality of read word lines (the read word lines may be integrated with the write word lines) on the basis of a row address signal and supplying a read current to the selected read word line in the read operation. A sense amplifier 20 detects, e.g., the read current and determines read data.

A column decoder & write bit line driver/sinker 16A is arranged at one of two Y-direction ends of the memory cell array 12. A column decoder & write bit line driver/sinker (including a column transfer gate and column decoder) 17A is arranged at the other end.

The column decoders & write bit line drivers/sinkers 16A and 17A have a function of, e.g., selecting one of a plurality of write bit lines (or data lines) on the basis of a column address signal and supplying a write current having a direction corresponding to write data to the selected write bit line in the write operation. The column transfer gate and column decoder have a function of electrically connecting the data line selected by the column address signal to the sense amplifier 20 in the read operation.

A reference cell column decoder & write bit line driver/sinker 16B is arranged at one of two Y-direction ends of the reference cell array 13. A reference cell column decoder & write bit line driver/sinker (including a column transfer gate and column decoder)17B is arranged at the other end.

The reference cell column decoders & write bit line drivers/sinkers 16B and 17B have a function of storing reference data in the reference cell array 13. The column transfer gate and column decoder have a function of reading out the reference data and transferring it to the sense amplifier 20 in the read operation.

An address receiver 18 receives an address signal and transfers, e.g., a row address signal to the row decoder & driver 14 and a column address signal to the column decoders & write bit line drivers/sinkers 16A and 17A. A data input receiver 19 transfers the write data to the column decoders & write bit line drivers/sinkers 16A and 17A. An output driver 21 outputs the read data detected by the sense amplifier 20 from the magnetic random access memory 11.

A control circuit 22 receives a /CE (Chip Enable) signal, /WE (Write Enable) signal, and /OE (Output Enable) signal and controls the operation of the magnetic random access memory 11. For example, in the write operation, the control circuit 22 supplies a write signal WRITE to a write current waveform control circuit 24. Upon receiving the write signal WRITE, the write current waveform control circuit 24 determines the supply/cutoff timings, magnitudes, and temporal changes (current waveforms) of write currents on the basis of, e.g., setting data that is programmed in a setting circuit 23 in advance.

More specifically, in the write operation, the write current waveform control circuit 24 supplies write word line drive signals (current waveform generation signals) WP<0> to WP<3> to the row decoder & driver 14, a write word line sink signal WWLSNK to the write word line sinker 15, and write bit line drive signals (current waveform generation signals) BP<0> to BP<7> and write bit line sink signal WBLSNK to the column decoders & write bit line drivers/sinkers 16A and 17A.

In the write operation, for example, the row decoder & driver 14 is set in the operative state when at least one of the write word line drive signals WP<0> to WP<3> is "H". Similarly, the write word line sinker 15 and the column decoders & write bit line drivers/sinkers 16A and 17A are set in the operative state, respectively, when the write word line sink signal WWLSNK, at least one of the write bit line drive signals BP<0> to BP<7>, and write bit line sink signal WBLSNK are "H".

With this arrangement, when the timings to change the write word line drive signals WP<0> to WP<3>, write word line sink signal WWLSNK, write bit line drive signals BP<0> to BP<7>, and write bit line sink signal WBLSNK to "H" are controlled by the write current waveform control circuit 24, the supply/cutoff timings of the write currents (application timings of the magnetic fields Hx and Hy), magnitudes, and temporal changes (current waveforms) can be determined, and the write principles of the first to 10th embodiments can be implemented.

As for the absorption timings of the write currents, for example, when the timings to change the sink signals WWLSNK and WBLSNK from "H" to "L" are set after the timings to change the drive signals WP<0> to WP<3> and BP<0> to BP<7> from "H" to "L", the potential of the write word/bit line can be completely set to 0V.

The timings to change the signals WP<0> to WP<3>, WWLSNK, BP<0> to BP<7>, and WBLSNK to "H" are determined on the basis of setting data programmed in the setting circuit 23 in advance. For example, a laser blow fuse, an MTJ element (MTJ), organ antifuse which breaks the tunneling barrier of an MTJ element can be used as a programming element.

In the test mode of the magnetic random access memory, the supply/cutoff timings, magnitudes, and temporal changes (current waveforms) of write currents can be determined on the basis of, e.g., setting data input from a data input/output terminal. The setting data may be input from an address terminal.

Circuit Example 2 of the magnetic random access memory has its characteristic feature mainly in the setting circuit 23 and write current waveform control circuit 24.

Circuit examples of the setting circuit 23, write current waveform control circuit 24, and drivers/sinkers 14, 15, 16A, and 17A which receive output signals from the write current waveform control circuit 24 will be described below.

ii. Row Decoder & Write Word Line Driver/Sinker

FIG. 49 shows a circuit example of the row decoder & write word line driver/sinker.

The row decoder & write word line driver (for one row) 14 is formed from an AND gate circuit AD1, NAND gate circuits NDWP0 to NDWP3, and PMOS transistors WP0 to WP3. The gate of a PMOS transistor WPi (i=0, 1, 2, 3) is connected to the output terminal of a NAND gate circuit NDWPi, the source is connected to a power supply terminal VDD, and the drain is connected to one end of a write word line WWLi (i=1, . . . .)

A write word line drive signal (current waveform generation signal) WP<i> is input to one of the two input terminals of the NAND gate circuit NDWPi. The output signal from the AND gate circuit AD1 is input to the other input terminal. A row address signal (changes for each row i) formed from a plurality of bits is input to the AND gate circuit AD1.

The write word line sinker (for one row) 15 is formed from an NMOS transistor TN1. The source of the NMOS transistor TN1 is connected to a ground terminal VSS, and the drain is connected to the other end of the write word line WWLi. The write word line sink signal WWLSNK is input to the gate of the NMOS transistor TN1.

In the selected row i, all bits of the row address signal change to "H". For this reason, in the selected row i, when at least one of the write word line drive signals WP<0> to WP<3> changes to "H", at least one of the PMOS transistors WP0 to WP3 is turned on. When the write word line sink signal WWLSNK changes to "H", the NMOS transistor TN1 is turned on.

When at least one of the PMOS transistors WP0 to WP3 and the NMOS transistor TN1 are turned on, the write current flows from the row decoder & write word line driver 14 to the write word line sinker 15 through the write word line WWLi.

According to this row decoder & write word line driver/sinker, when the timings to change the write word line drive signals WP<0> to WP<3> and write word line sink signal WWLSNK to "H" or "L" are controlled, the supply/cutoff timing, magnitude, and temporal change (current waveform) of the write current for the write word line WWLi in the selected row i can be determined.

When all the write word line drive signals WP<0> to WP<3> are set to "L", and then, the write word line sink signal WWLSNK is set to "L", the potential of the write word line WWLi after the write operation can be completely set to 0V.

To control the magnitude or temporal change (current waveform) of the write current, the following control methods can be used. As the first method, the sizes (channel widths), i.e., the driving capabilities of the plurality of PMOS transistors WP0 to WP3 are set to the same value. Then, the number of PMOS transistors WP0 to WP3 in the ON state is changed using the write word line drive signals WP<0> to WP<3>.

As the second method, the sizes (channel widths), i.e., the driving capabilities of the plurality of PMOS transistors WP0 to WP3 are set to different values. Then, one of the plurality of PMOS transistors WP0 to WP3 is selectively turned on using the write word line drive signals WP<0> to WP<3>.

The third method is a combination of the first and second methods. That is, the sizes of the PMOS transistors WP0 to WP3 are set to different values, and the number of PMOS transistors WP0 to WP3 in the ON state is changed, thereby controlling the magnitude or temporal change (current waveform) of the write current.

iii. Column Decoder & Write Bit Line Driver/Sinker

Figure 50:
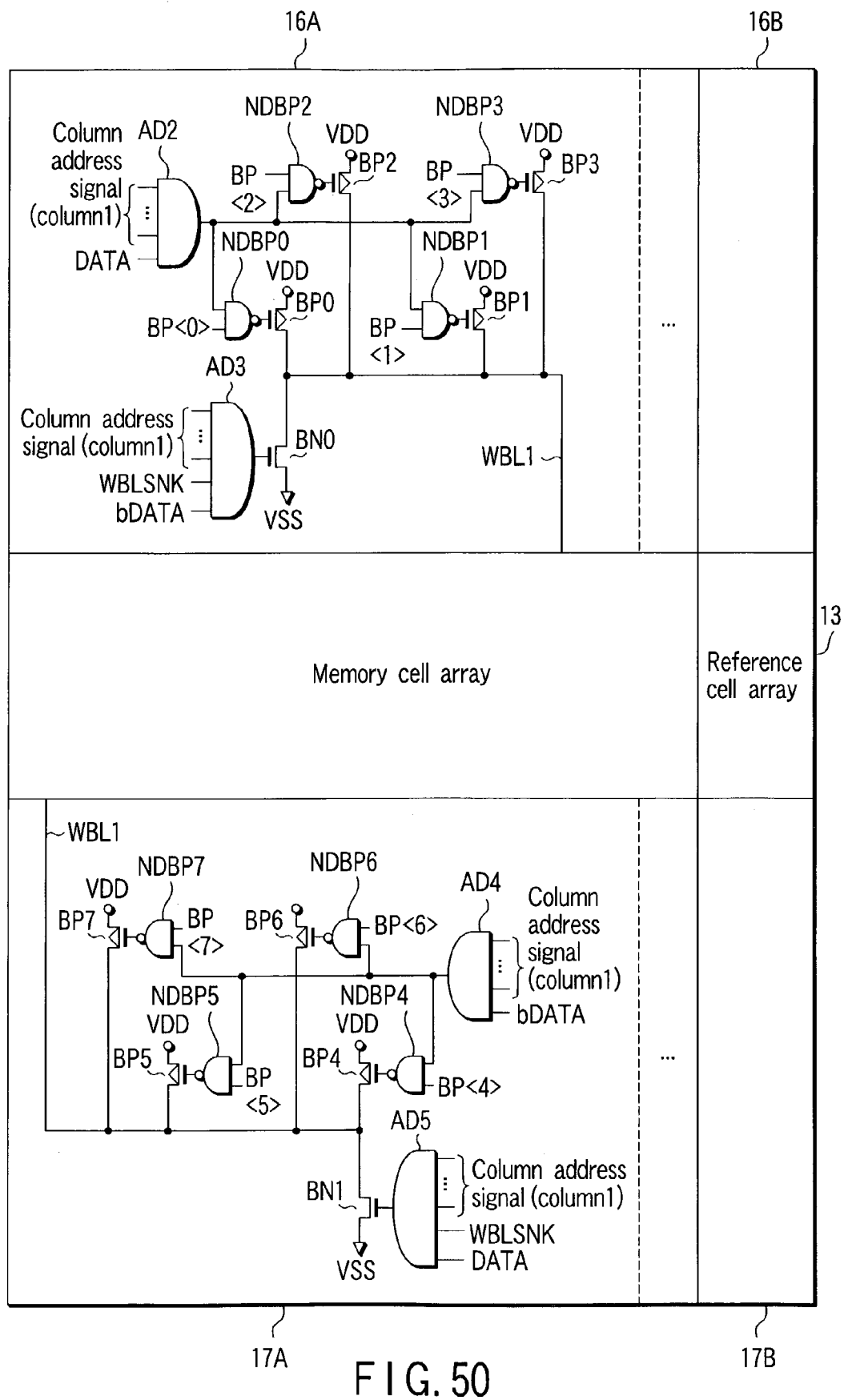
FIG. 50 is a view showing an example of a write bit line driver/sinker according to Circuit Example 2.

FIG. 50 shows a circuit example of the column decoder & write bit line driver/sinker.

The column decoder & write bit line driver/sinker (for one column) 16A is formed from NAND gate circuits NDBP0 to NDBP3, AND gate circuits AD2 and AD3, PMOS transistors BP0 to BP3, and NMOS transistor BN0.

The gate of a PMOS transistor BPi (i=0, 1, 2, 3) is connected to the output terminal of a NAND gate circuit NDBPi, the source is connected to the power supply terminal VDD, and the drain is commonly connected to one end of a write bit line WBLi (i=1, . . . .)

A write word line drive signal (current waveform generation signal) BP<i> is input to one of the two input terminals of the NAND gate circuit NDBPi (i=0, 1, 2, 3). The output signal from the AND gate circuit AD2 is input to the other input terminal. A column address signal (changes for each column i) formed from a plurality of bits and write data DATA are input to the AND gate circuit AD2.

The gate of the NMOS transistor BN0 is connected to the output terminal of the AND gate circuit AD3, the source is connected to the ground terminal VSS, and the drain is connected to one end of the write bit line WBLi (i=1, . . . .) The column address signal (changes for each column i) formed from a plurality of bits, write bit line sink signal WBLSNK, and an inverted signal bDATA of the write data are input to the AND gate circuit AD3.

The column decoder & write bit line driver/sinker (for one column) 17A is formed from NAND gate circuits NDBP4 to NDBP7, AND gate circuits AD4 and AD5, PMOS transistors BP4 to BP7, and NMOS transistor BN1.

The gate of the PMOS transistor BPi (i=4, 5, 6, 7) is connected to the output terminal of the NAND gate circuit NDBPi, the source is connected to the power supply terminal VDD, and the drain is commonly connected to the other end of the write bit line WBLi (i=1, . . . .)

The write word line drive signal (current waveform generation signal) BP<i> is input to one of the two input terminals of the NAND gate circuit NDBPi (i=4, 5, 6, 7). The output signal from the AND gate circuit AD4 is input to the other input terminal. The column address signal (changes for each column i) formed from a plurality of bits and the inverted signal bDATA of the write data are input to the AND gate circuit AD4.

The gate of the NMOS transistor BN1 is connected to the output terminal of the AND gate circuit AD5, the source is connected to the ground terminal VSS, and the drain is connected to the other end of the write bit line WBLi (i=1, . . . .) The column address signal (changes for each column i) formed from a plurality of bits, write bit line sink signal WBLSNK, and write data DATA are input to the AND gate circuit AD5.

In the selected column i, all bits of the column address signal change to "H". For this reason, in the selected column i, when at least one of the write bit line drive signals BP<0> to BP<7> and write bit line sink signal WBLSNK change to "H", a write current having a direction corresponding to the value of the write data DATA flows to the write bit line WBLi.

For example, when the write data DATA is "1" (="H"), at least one of the PMOS transistors BP0 to BP3 and NMOS transistor BN1 are turned on. Hence, the write current flows from the column decoder & write bit line driver/sinker 16A to the column decoder & write bit line driver/sinker 17A.

When the write data DATA is "0" (="L"), at least one of the PMOS transistors BP4 to BP7 and NMOS transistor BN0 are turned on. Hence, the write current flows from the column decoder & write bit line driver/sinker 17A to the column decoder & write bit line driver/sinker 16A.

According to this column decoder & write bit line driver/sinker, when the timings to change at least one of the write bit line drive signals BP<0> to BP<7> and write bit line sink signal WBLSNK to "H" or "L" are controlled, the supply/cutoff timing, magnitude, and temporal change (current waveform) of the write current for the write bit line WBLi in the selected column i can be determined.

When all the write bit line drive signals BP<0> to BP<7> are set to "L", and then, the write bit line sink signal WBLSNK is set to "L", the potential of the write bit line WBLi after the write operation can be completely set to 0V.

To control the magnitude or temporal change (current waveform) of the write current, the following control methods can be used. As the first method, the sizes (channel widths), i.e., the driving capabilities of the plurality of PMOS transistors BP0 to BP7 are set to the same value. Then, the number of PMOS transistors BP0 to BP7 in the ON state is changed using the write bit line drive signals BP<0> to BP<7>.

As the second method, the sizes (channel widths), i.e., the driving capabilities of the plurality of PMOS transistors BP0 to BP7 are set to different values. Then, one of the plurality of PMOS transistors BP0 to BP7 is selectively turned on using the write bit line drive signals BP<0> to BP<7>.

The third method is a combination of the first and second methods. That is, the sizes of the PMOS transistors BP0 to BP7 are set to different values, and the number of PMOS transistors BP0 to BP7 in the ON state is changed, thereby controlling the magnitude or temporal change (current waveform) of the write current.

iv. Write Current Waveform Control Circuit

An example of the write current waveform control circuit which generates the write word line drive signals WP<0> to WP<3>, write word line sink signal WWLSNK, write bit line drive signals BP<0> to BP<7>, and write bit line sink signal WBLSNK will be described next.

Figure 51:
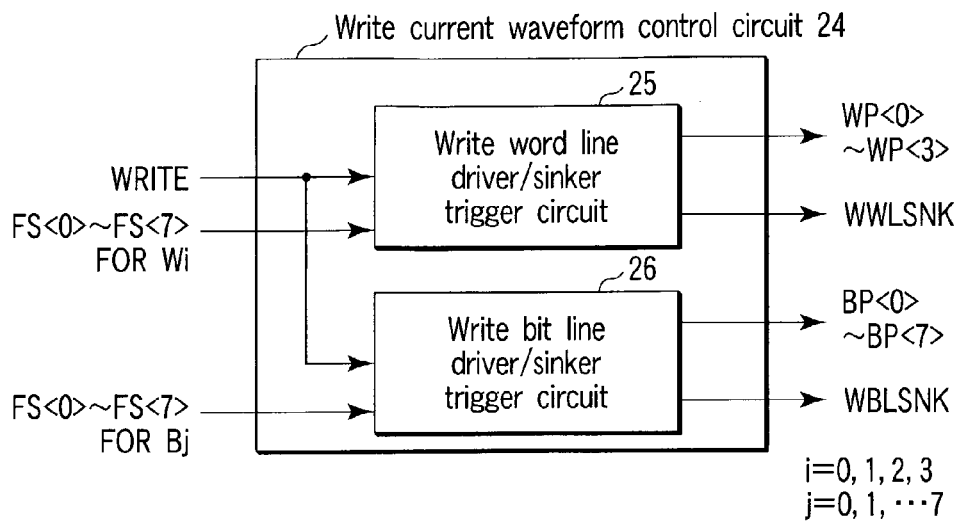
FIG. 51 is a view showing an example of a write current waveform control circuit according to Circuit Example 2.

FIG. 51 shows an example of the write current waveform control circuit.

The write current waveform control circuit 24 is formed from a write word line driver/sinker trigger circuit 25 and write bit line driver/sinker trigger circuit 26.

The write word line driver/sinker trigger circuit 25 generates the write word line drive signals (current waveform generation signals) WP<0> to WP<3> and write word line sink signal WWLSNK on the basis of the write signal WRITE and current waveform control signals FS<0> to FS<7> FOR Wi (i=0, 1, 2, 3).

The write bit line driver/sinker trigger circuit 26 generates the write bit line drive signals (current waveform generation signals) BP<0> to BP<7> and write bit line sink signal WBLSNK on the basis of the write signal WRITE and current waveform control signals FS<0> to FS<7> FOR Bj (j=0, 1, ..., 7).

"FOR Wi" and "FOR Bj" of the current waveform control signals FS<0> to FS<7> FOR Wi and FS<0> to FS<7> FOR Bj mean that the values of the current waveform control signals FS<0> to FS<7> are set for each of a plurality of waveform generation circuits Wi and Bj (to be described later) in the write word/bit line driver/sinker trigger circuits 25 and 26.

The write signal WRITE changes to "H" in the write operation.

The supply/cutoff timing, magnitude, and temporal change (current waveform) of the write current for the write word line WWLi, i.e., the timing to change the write word line drive signals WP<0> to WP<3> and write word line sink signal WWLSNK to "H" or "L" is determined on the basis of the current waveform control signals FS<0> to FS<7> FOR Wi.

The supply/cutoff timing, magnitude, and temporal change (current waveform) of the write current for the write bit line WBLi, i.e., the timing to change the write bit line drive signals BP<0> to BP<7> and write bit line sink signal WBLSNK to "H" or "L" is determined on the basis of the current waveform control signals FS<0> to FS<7> FOR Bj.

The current waveform control signals FS<0> to FS<7> FOR Wi and FS<0> to FS<7> FOR Bj are generated by a setting circuit (to be described later).

v. Write Word Line Driver/Sinker Trigger Circuit

Figure 52:
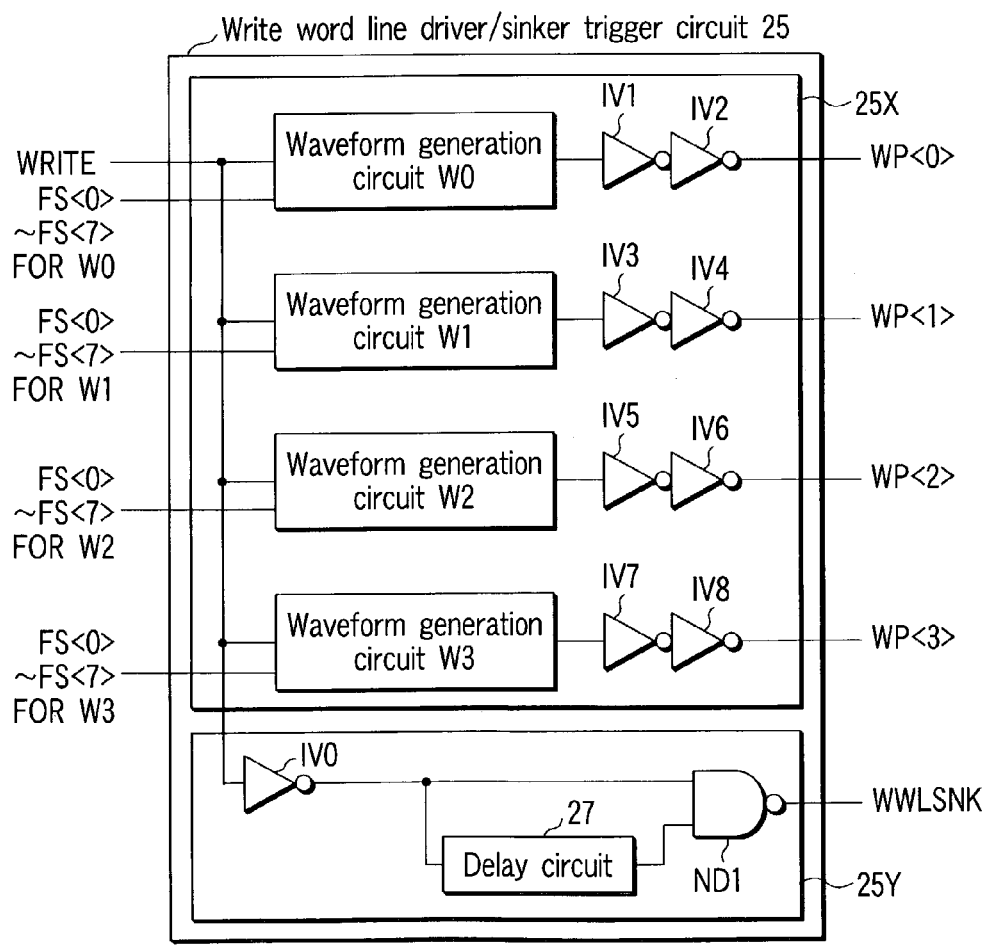
FIG. 52 is a view showing an example of a write word line driver/sinker trigger circuit according to Circuit Example 2.

FIG. 52 shows an example of the write word line driver/sinker trigger circuit.

The write word line driver/sinker trigger circuit 25 is formed from a current supply/cutoff timing determining circuit 25X which determines the current supply/cutoff timing, magnitude, and temporal change (current waveform) of the write current, and a current absorption timing determining circuit 25Y which determines the current absorption timing of the write current.

After the write signal WRITE changes to "H" or "L", the current supply/cutoff timing determining circuit 25X determines the timing to change the write word line drive signals WP<0> to WP<3> to "H" or "L". The current supply/cutoff timing determining circuit 25X is formed from a plurality of (in this example, four) waveform generation circuits W0 to W3 and inverters IV1 to IV8.

The waveform generation circuits W0 to W3 generate the write word line drive signals WP<0> to WP<3>, respectively, on the basis of the write signal WRITE and current waveform control signals FS<0> to FS<7> FOR Wi. The write word line drive signals WP<0> to WP<3> drive the write word line driver shown in FIG. 49. Hence, a synthesized waveform obtained by synthesizing the waveforms of the write word line drive signals WP<0> to WP<3> almost equals the waveform of the write current supplied to the write word line WWLi.

In this example, the four waveform generation circuits W0 to W3 are used. However, as the number of waveform generation circuits increases, the waveform of the write current supplied to the write word line WWLi can finely be controlled, as a matter of course.

The current absorption timing determining circuit 25Y is formed from an inverter IV0, NAND gate circuit ND1, and delay circuit 27.

When the write signal WRITE changes to "H", the current absorption timing determining circuit 25Y almost simultaneously changes the write word line sink signal WWLSNK to "H". After the write signal WRITE changes to "L", and a delay time which is determined by the delay circuit 27 elapses, the current absorption timing determining circuit 25Y changes the write word line sink signal WWLSNK to "L".

When the write signal WRITE is changed to "L", and then the write word line sink signal WWLSNK is changed to "L" after a predetermined interval, the potential of the write word line WWLi can be completely set to 0V after the write operation.

vi. Write Bit Line Driver/Sinker Trigger Circuit

FIG. 53 shows an example of the write bit line driver/sinker trigger circuit.

The write bit line driver/sinker trigger circuit 26 is formed from a current supply/cutoff timing determining circuit 26X which determines the current supply/cutoff timing, magnitude, and temporal change (current waveform) of the write current, and a current absorption timing determining circuit 26Y which determines the current absorption timing of the write current.

After the write signal WRITE changes to "H" or "L", the current supply/cutoff timing determining circuit 26X determines the timing to change the write bit line drive signals BP<0> to BP<7> to "H" or "L".

The current supply/cutoff timing determining circuit 26X is formed from a plurality of (in this example, eight) waveform generation circuits B0 to B7 and inverters IV9 to IV24.

The waveform generation circuits B0 to B7 generate the write bit line drive signals BP<0> to BP<7>, respectively, on the basis of the write signal WRITE and current waveform control signals FS<0> to FS<7> FOR Bj. The write bit line drive signals BP<0> to BP<7> drive the write bit line driver shown in FIG. 50.

When the write data DATA is "1" (="H"), the write current flows from the write bit line driver/sinker 16A to the write bit line driver/sinker 17A. The current waveform almost equals a synthesized waveform obtained by synthesizing the waveforms of the write bit line drive signals BP<0> to BP<3>.

When the write data DATA is "0" (="L"), the write current flows from the write bit line driver/sinker 17A to the write bit line driver/sinker 16A. The current waveform almost equals a synthesized waveform obtained by synthesizing the waveforms of the write bit line drive signals BP<4> to BP<7>.

In this example, the eight waveform generation circuits B0 to B7 are used. However, as the number of waveform generation circuits increases, the waveform of the write current supplied to the write bit line WBLi can finely be controlled, as a matter of course.

Additionally, in this embodiment, the write bit line drive signals BP<0> to BP<3> which drive the write bit line driver/sinker 16A are different from the write bit line drive signals BP<4> to BP<7> which drive the write bit line driver/sinker 17A. However, as will be described later, the write bit line drivers/sinkers 16A and 17A may be commonly driven by the write bit line drive signals BP<0> to BP<3>.

The current absorption timing determining circuit 26Y is formed from the inverter IV0, NAND gate circuit ND2, and delay circuit 28.

When the write signal WRITE changes to "H", the current absorption timing determining circuit 26Y almost simultaneously changes the write bit line sink signal WBLSNK to "H". After the write signal WRITE changes to "L", and a delay time which is determined by the delay circuit 28 elapses, the current absorption timing determining circuit 26Y changes the write bit line sink signal WBLSNK to "L".

When the write signal WRITE is changed to "L", and then the write bit line sink signal WBLSNK is changed to "L" after a predetermined interval, the potential of the write bit line WBLi can be completely set to 0V after the write operation.

vii. Waveform Generation Circuit

An example of each of the waveform generation circuits Wi (i=0, 1, 2, 3) and Bj (j=0, 1, . . . , 7) in the write word/bit line driver/sinker trigger circuits 25 and 26 shown in FIGS. 52 and 53 will be described next.

Figure 54:
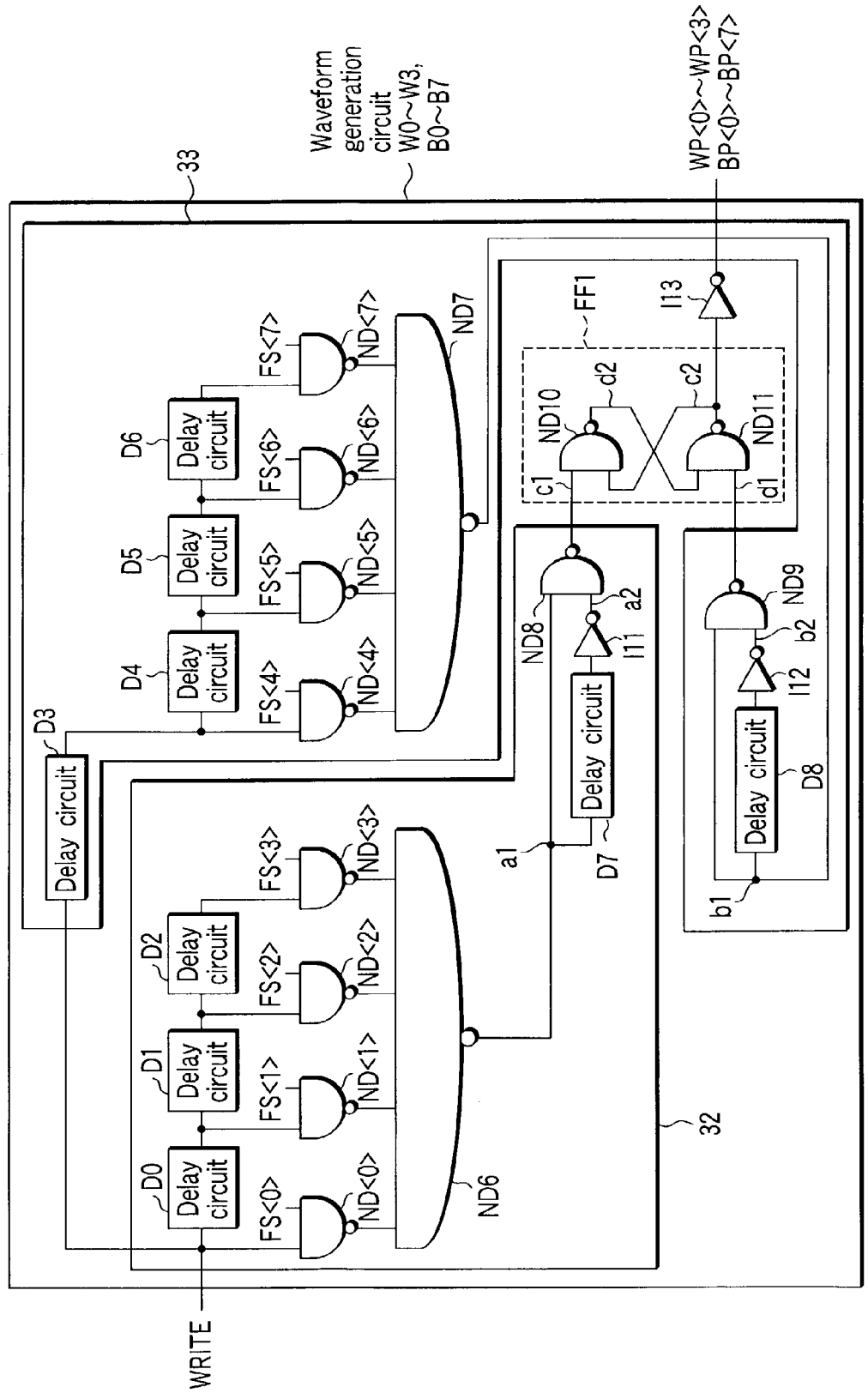
FIG. 54 is a view showing an example of a waveform generation circuit used in Circuit Example 2.

FIG. 54 shows an example of the waveform generation circuit.

Each of the waveform generation circuits W0 to W3 and B0 to B7 has a rise timing determining circuit 32 which determines the rise timing (timing of change from "L" to "H") of a corresponding one of the write word/bit line drive signals WP<0> to WP<3> and BP<0> to BP<7>, and a fall timing determining circuit 33 which determines the fall timing (timing of change from "H" to "L") of a corresponding one of the write word/bit line drive signals WP<0> to WP<3> and BP<0> to BP<7>.

Each of the waveform generation circuits W0 to W3 and B0 to B7 also has a flip-flop circuit FF1 which holds the level ("L" or "H") of a corresponding one of the write word/bit line drive signals WP<0> to WP<3> and BP<0> to BP<7>, and an inverter circuit I13 which outputs the output signal from the flip-flop circuit FF1 as a corresponding one of the write word/bit line drive signals WP<0> to WP<3> and BP<0> to BP<7>.

The rise timing determining circuit 32 is formed from delay circuits D0, D1, and D2 which are connected in series, NAND gate circuits ND<0> to ND<3>, ND6, and ND8, an inverter I11, and a delay circuit D7. The fall timing determining circuit 33 is formed from delay circuits D3, D4, D5, and D6 which are connected in series, NAND gate circuits ND<4> to ND<7>, ND7, and ND9, an inverter I12, and a delay circuit D8.

The flip-flop circuit FF1 is formed from two NAND gate circuits ND10 and ND11.

The delay circuits D0 to D8 may have either identical or different structures. The delay circuits D0 to D8 may also have either the same or different delay amounts. When the structures and delay amounts of the delay circuits D0 to D6 are the same, the waveform of the write current can easily be controlled.

Figure 55:
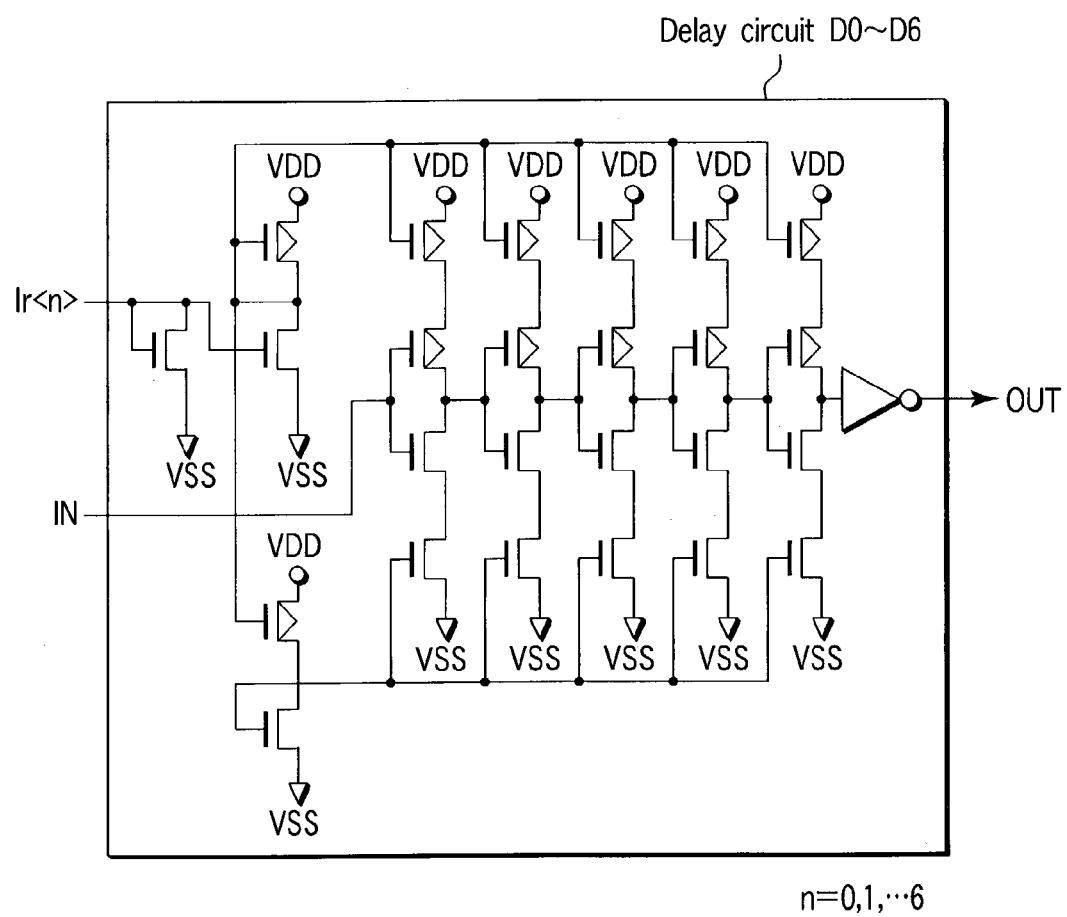
FIG. 55 is a view showing an example of a delay circuit in the waveform generation circuit used in Circuit Example 2.

FIGS. 55 and 56 show a delay circuit using a constant current source as an example of the delay circuits D0 to D6. A constant current source circuit 34 supplies a constant current to the delay circuits D0 to D6. The constant current source circuit 34 is formed from a BGR circuit.

When the delay amount of the delay circuit D3 is larger than the total delay amount of the delay circuits D0 to D2, one of the current waveform control signals FS<0> to FS<3> changes to "H" whereby the rise timings of the write word/bit line drive signals WP<0> to WP<3> and BP<0> to BP<7> are determined. When one of the current waveform control signals FS<4> to FS<7> changes to "H" whereby the fall timings of the write word/bit line drive signals WP<0> to WP<3> and BP<0> to BP<7> are determined.

When all the delay circuits D0 to D7 have the same delay amount, one of the current waveform control signals FS<0> to FS<3> and one of the current waveform control signals FS<4> to FS<7> change to "H" in accordance with the relationship shown in Table 2.

TABLE 2

|  | FS<4> | FS<5> | FS<6> | FS<7> |
|---|---|---|---|---|
| FS<0> | H | H | H | H |
| FS<1> |  | H | H | H |
| FS<2> |  |  | H | H |
| FS<3> |  |  |  | H |

When one of the current waveform control signals FS<0> to FS<3> changes to "H", the rise timings of the write word/bit line drive signals WP<0> to WP<3> and BP<0> to BP<7> are determined. When one of the current waveform control signals FS<4> to FS<7> changes to "H" whereby the fall timings of the write word/bit line drive signals WP<0> to WP<3> and BP<0> to BP<7> are determined.

The operation of the waveform generation circuit will be described in detail.

TABLE 3

| WRITE | a1 | a2 | b1 | b2 | c1 | c2 | d1 | d2 | OUTPUT SIGNAL WP<i> or BP<j> |  |
|---|---|---|---|---|---|---|---|---|---|---|
| L | L | H | L | H | H | H | H | L | L | ① INITIAL STATE |
| H | H | H | L | H | L | L | H | H | H | ② |
| H | H | L | L | H | H | L | H | H | H |  |
| H | H | L | H | H | H | H | L | L | L | ③ |
| H | H | L | H | L | H | H | H | L | L |  |

TABLE 3-continued

| L | L | H | L | H | H | H | H | L | L | ④ INITIAL STATE |
|---|---|---|---|---|---|---|---|---|---|---|

② FS <0> = "H" : NO DELAY
    FS <1> >= "H" : DELAY OF D0
    FS <2> >= "H" : DELAY OF D0 AND D1         ONLY ONE OF FS <0 >, FS <1>, FS<2> and FS <3> is "H"
    FS <3> >= "H" : DELAY OF D0, D1 AND D2
③ FS <4> >= "H" : DELAY OF D3
    FS <5> >= "H" : DELAY OF D3 AND D4
    FS <6> >= "H" : DELAY OF D3, D4 AND D5        ONLY ONE OF FS <4>, FS <5> and FS <6> and FS <7> is "H"
    FS <7> >= "H" : DELAY OF D3, D4, D5 AND D6

In the initial state (state ①), the write signal WRITE is "L", and output signal WP<i> or BP<j> is "L".

After that, the write signal WRITE changes to "H" (state ②). After a delay time determined by the current waveform control signals FS<0> to FS<3> elapses, an output node a1 of the NAND gate circuit ND6 changes to "H". This delay time determines the rise timing of the write word/bit line drive signal WP<i> or BP<j>.

For example, assume that the current waveform control signal FS<0> is "H", and the current waveform control signals FS<1> to FS<3> are "L". In this case, when the write signal WRITE changes to "H", the output node a1 of the NAND gate circuit ND6 immediately changes to "H". Assume that the current waveform control signal FS<1> is "H", and the current waveform control signals FS<0>, FS<2>, and FS<3> are "L". In this case, after the write signal WRITE changes to "H", and the delay time of the delay circuits D0 elapses, the output node a1 of the NAND gate circuit ND6 changes to "H".

When the output node a1 of the NAND gate circuit ND6 changes to "H", an input node c1 of the flip-flop circuit FF1 changes from "H" to "L", and an output node c2 of the flip-flop circuit FF1 changes to "L". Hence, the output signal WP<i> or BP<j> from the waveform generation circuit Wi or Bj changes to "H".

After that, when the delay time of the delay circuit D7 elapses (state ③), an output node a2 of the NAND gate circuit ND8 changes to "L", and the input node c1 of the flip-flop circuit FF1 changes to "H". However, the output signal WP<i> or BP<j> from the waveform generation circuit Wi or Bj maintains "H".

Next, after the write signal WRITE changes to "H", and the delay time determined by the current waveform control signals FS<4> to FS<7> elapses, an output node b1 of the NAND gate circuit ND7 changes to "H" (state ④). This delay time determines the fall timing of the write word/bit line drive signal WP<i> or BP<j>.

For example, assume that the current waveform control signal FS<4> is "H", and the current waveform control signals FS<5> to FS<7> are "L". In this case, after the write signal WRITE changes to "H", and the delay time of the delay circuit D3 elapses, the output node b1 of the NAND gate circuit ND7 changes to "H". Assume that the current waveform control signal FS<5> is "H", and the current waveform control signals FS<4>, FS<6>, and FS<7> are "L". In this case, after the write signal WRITE changes to "H", and the total delay time of the delay circuits D3 and D4 elapses, the output node b1 of the NAND gate circuit ND7 changes to "H".

When the output node b1 of the NAND gate circuit ND7 changes to "H", an input node d1 of the flip-flop circuit FF1 changes from "H" to "L", and the output node c2 of the flip-flop circuit FF1 changes to "H". Hence, the output signal WP<i> or BP<j> from the waveform generation circuit Wi or Bj changes to "L".

After that, when the delay time of the delay circuit D8 elapses (state ⑤), an input node b2 of the NAND gate circuit ND9 changes to "L", and the input node d1 of the flip-flop circuit FF1 changes to "H". However, the output signal WP<i> or BP<j> from the waveform generation circuit Wi or Bj maintains "L".

Finally, when the write signal WRITE changes from "H" to "L" (state ⑥), the values of the input nodes a1, a2, b1, and b2 of the NAND gate circuits ND8 and ND9 change to return to the initial state again.

viii. Current Waveform Example

FIG. 57 shows examples of the write word/bit line drive signals WP<0> to WP<3> and BP<0> to BP<7> generated using the waveform generation circuits with the arrangement shown in FIG. 54 and write word/bit line currents obtained on the basis of the write word/bit line drive signals.

The waveforms shown in FIG. 57 are obtained when the current waveform control signals FS<0> to FS<7> registered in the setting circuit (to be described later) are in the following state, and implement the write principle of the eighth embodiment.

Waveform generation circuit W0: FS<0>="H", FS<7>="H"
Waveform generation circuit W1: FS<0>="H", FS<6>="H"
Waveform generation circuit W2: FS<0>="H", FS<6>="H"
Waveform generation circuit W3: FS<0>="H", FS<4>="H"
Waveform generation circuit B0: FS<0>="H", FS<7>="H"
Waveform generation circuit B1: FS<1>="H", FS<7>="H"
Waveform generation circuit B2: FS<1>="H", FS<7>="H"
Waveform generation circuit B3: FS<3>="H", FS<7>="H"

All the remaining current waveform control signals FS<i> are "L". In addition, since the write data DATA is assumed to be "1" (="H"), the output signals BP<4> to BP<7> from the waveform generation circuits B4 to B7 do not influence the write bit line current. When the write data DATA is assumed to be "0" (="L"), the output signals BP<4> to BP<7> from the waveform generation circuits B4 to B7 are validated instead of the output signals BP<0> to BP<3> from the waveform generation circuits B0 to B3 (FIG. 50).

As is apparent from the waveform chart, the supply/cutoff timing, magnitude, and temporal change (current waveform) of the write word line current are determined by the combination of the "H" and "L" states of the four write word line drive signals WP<0> to WP<3>. Similarly, the supply/cutoff timing, magnitude, and temporal change (current waveform) of the write bit line current are determined by the combination of the "H" and "L" states of the four write bit line drive signals BP<0> to BP<3>.

This can be seen from the fact that the row decoder & write word line driver/sinker has the structure shown in FIG. 49, and the column decoder & write bit line driver/sinker has the structure shown in FIG. 50.

The delay amounts of the delay circuits 27 and 28 shown in FIGS. 52 and 53 and the delay amounts of the delay circuits D0 to D6 shown in FIG. 54 are adjusted such that the timing to change the write word/bit line sink signals WWL-SNK and WBLSNK from "HI" to "L" is set after the timing to change all the write word/bit line drive signals WP<0> to WP<3> and BP<0> to BP<7> to "L".

ix. Setting Circuit

The setting circuit which generates the current waveform control signals FS<0> to FS<7> shown in FIG. 54 will be described next.

Figure 58:
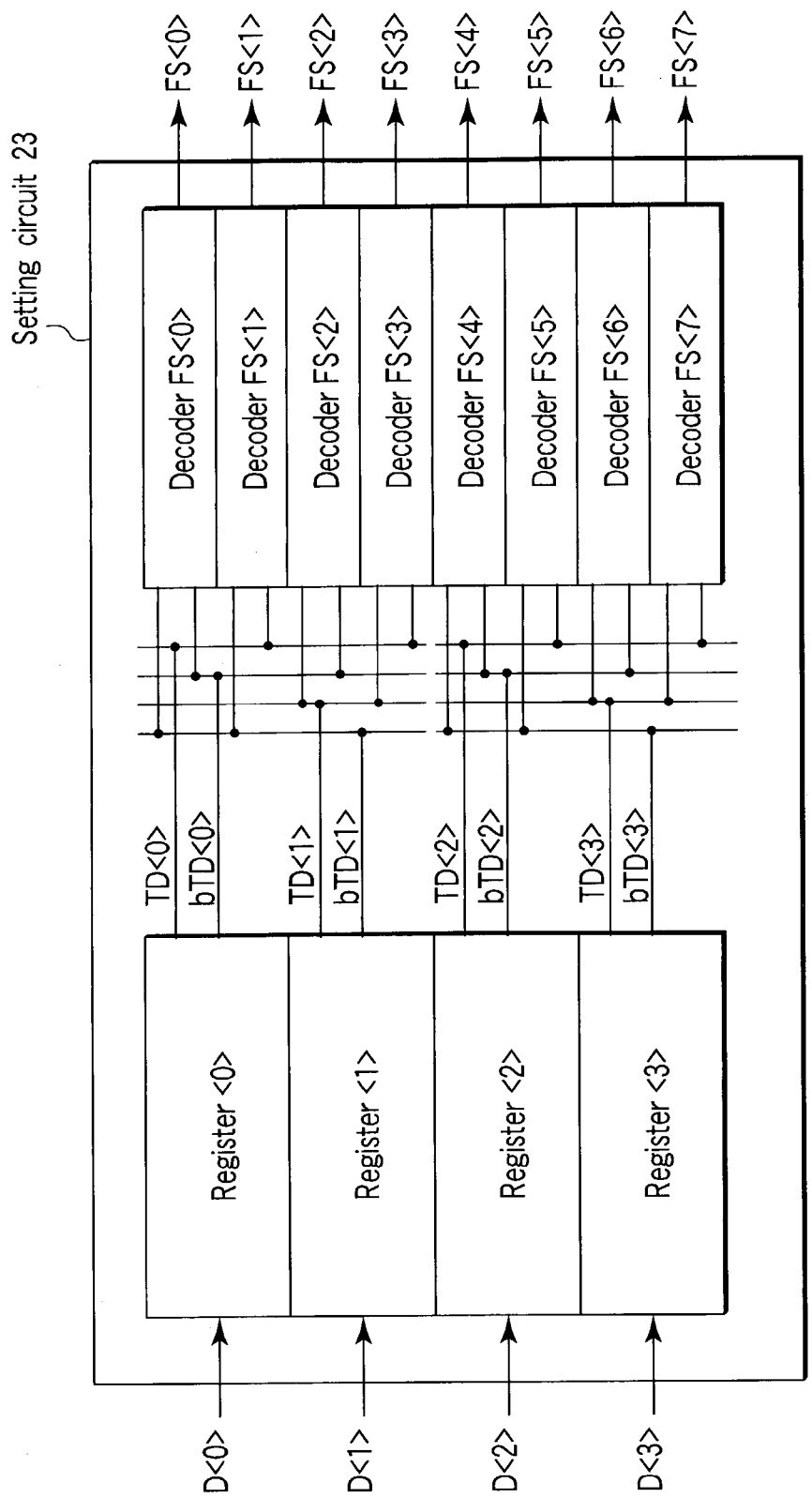
FIG. 58 is a view showing an example of a setting circuit according to Circuit Example 2.

FIG. 58 shows an example of the setting circuit.

The setting circuit 23 is formed from registers <0> to <3> in which setting data that determine the supply/cutoff timings, magnitudes, and temporal changes (current waveforms) of the write currents are programmed and decoders FS<0> to FS<7> which decode output signals TD<0> to TD<3> and bTD<0> to bTD<3> from the registers <0> to <3> and output the current waveform control signals FS<0> to FS<7>, respectively.

One setting circuit 23 shown in FIG. 58 is arranged in correspondence with one waveform generation circuit. In this example, the four waveform generation circuits W0 to W3 are arranged in the write word line driver/sinker trigger circuit, and the eight waveform generation circuits B0 to B7 are arranged in the write bit line driver/sinker trigger circuit. Hence, 12 setting circuits 23 shown in FIG. 58 are arranged in correspondence with these waveform generation circuits.

Setting data which determine the rise timings of the write word/bit line drive signals WP<0> to WP<3> and BP<0> to BP<7> are programmed in the registers <0> and <1>. Four types (one of FS<0> to FS<3> is "H") of rise timings of the write word/bit line drive signals WP<0> to WP<3> and BP<0> to BP<7> are present in correspondence with the 2-bit setting data registered in the registers <0> and <1>.

D<0> and D<1> are setting data which are input from the outside of the magnetic random access memory in the test mode. In the test mode, the rise timings of the write word/bit line drive signals WP<0> to WP<3> and BP<0> to BP<7> can be determined on the basis of these setting data.

Setting data which determine the fall timings of the write word/bit line drive signals WP<0> to WP<3> and BP<0> to BP<7> are programmed in the registers <2> and <3>. Four types (one of FS<4> to FS<7> is "H") of fall timings of the write word/bit line drive signals WP<0> to WP<3> and BP<0> to BP<7> are present in correspondence with the 2-bit setting data registered in the registers <2> and <3>.

D<2> and D<3> are setting data which are input from the outside of the magnetic random access memory in the test mode. In the test mode, the fall timings of the write word/bit line drive signals WP<0> to WP<3> and BP<0> to BP<7> can be determined on the basis of these setting data.

x. Register <j>

A circuit example of the register <j> in the setting circuit 23 shown in FIG. 58 will be described.

Figure 59:
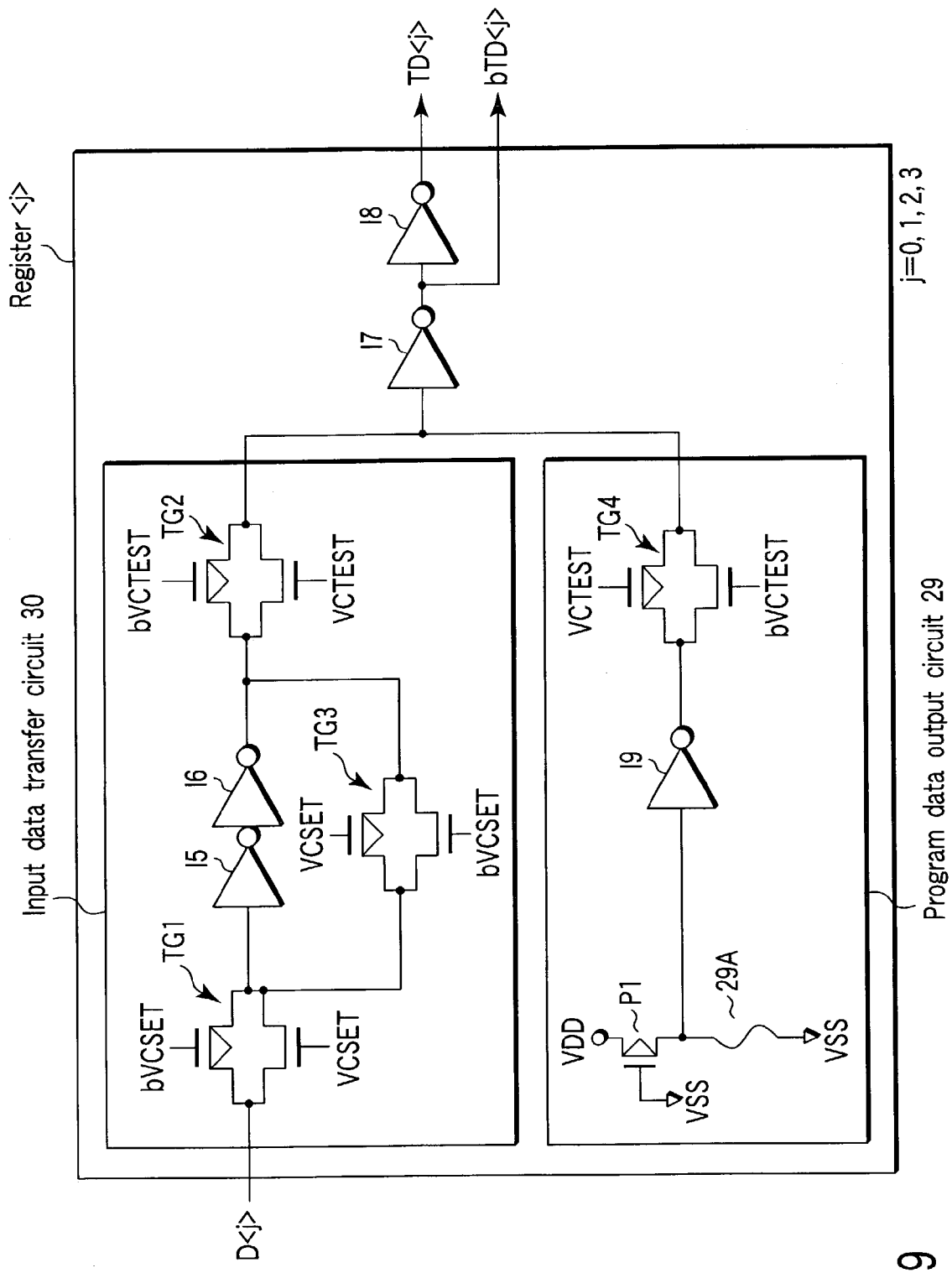
FIG. 59 is a view showing an example of a register in the setting circuit according to Circuit Example 2.

FIG. 59 shows a circuit example of the register.

The register <j> (j=0, 1, 2, 3) is formed from a program data output circuit 29 which outputs programmed setting data as the output signals TD<j> and bTD<j>, and an input data transfer circuit 30 which outputs setting data input from the outside of the magnetic random access memory as the output signals TD<j> and bTD<j>.

The program data output circuit 29 has a laser blow fuse 29A to store setting data. One-bit data is stored in accordance with whether the laser blow fuse 29A is cut. A PMOS transistor P1 and laser blow fuse 29A are connected in series between the power supply terminal VDD and the ground terminal VSS. Since the gate of the PMOS transistor P1 is connected to the ground terminal VSS, the PMOS transistor P1 is always ON.

The connection point between the PMOS transistor P1 and the laser blow fuse 29A is connected to the input terminal of an inverter I7 through an inverter I9 and transfer gate TG4. The output signal from the inverter I7 is bTD<j>, and the output signal from an inverter I8 is TD<j>.

The input data transfer circuit 30 is formed from transfer gates TG1 to TG3 and inverters I5 and I6. The inverters I5 and I6 and transfer gate TG3 constitute a latch circuit.

In the write operation of the normal operation mode, a test signal VCTEST changes to "L", and a test signal bVCTEST changes to "H". For this reason, the transfer gate TG4 is turned on, and the transfer gates TG1 and TG2 are turned off.

Hence, the setting data programmed in the laser blow fuse 29A is output as the output signals TD<j> and bTD<j> through the transfer gate TG4 and inverters I7 to I9.

In the write operation of the test mode, the test signal VCTEST changes to "H", and the test signal bVCTEST changes to "L". For this reason, the transfer gates TG1 and TG2 are turned on, and the transfer gates TG3 and TG4 are turned off.

Hence, the setting data D<j> input from an external terminal (data input terminal, address terminal, or the like) is output as the output signals TD<j> and bTD<j> through the transfer gates TG1 and TG2 and inverters I5 to I8.

In the standby state of the test mode, the test signal VCTEST changes to "L", and the test signal bVCTEST changes to "H". For this reason, the transfer gates TG1 and TG2 are turned off, and the transfer gates TG3 and TG4 are turned on.

Hence, the setting data D<j> input from the external terminal is latched by the latch circuit formed from the transfer gate TG3 and inverters I5 and I6. After that, a write test can be performed on the basis of the setting data latched by the latch circuit.

As the storage element which stores setting data, in addition to the laser blow fuse, an MTJ element (MTJ) which stores data in accordance with the magnetized state, or an MTJ element which stores data on the basis of whether the tunneling barrier is broken may be used (FIG. 45).

xi. Decoder FS<k>

A circuit example of the decoder FS<k> in the setting circuit 23 shown in FIG. 58 will be described.

FIG. 60 shows a circuit example of a decoder.

The decoder FS<k> (j=0, 1, . . . , 7) is formed from a NAND gate circuit ND3 and inverter I10.

Two input signals A and B are input to the NAND gate circuit ND3. The output signal from the NAND gate circuit ND3 is input to the inverter I10. An output signal C from inverter I10 is FS<k>.

Table 4 is the decoding table (the relationship between the input signals and the output signals) of the decoder FS<k>.

TABLE 4

| INPUT | | OUTPUT |
|---|---|---|
| A | B | C |
| bTD<0> | bTD<1> | WS<0> |
| TD<0> | bTD<1> | WS<1> |
| bTD<0> | TD<1> | WS<2> |
| TD<0> | TD<1> | WS<3> |
| bTD<2> | bTD<3> | BS<4> |
| TD<2> | bTD<3> | BS<5> |
| bTD<2> | TD<3> | BS<6> |
| TD<2> | TD<3> | BS<7> | xii. Conclusion

As described above, according to Circuit Example 2 of the magnetic random access memory, the supply/cutoff timing, magnitude, and temporal change (current waveform) of the write current for the write word/bit line can be set for each chip or memory cell array by programming. With this arrangement, for example, the write principles of the first to 10th embodiments can be implemented. The magnetization of the storing layer of an MTJ element can reliably be inverted. The write characteristics can be improved.

In Circuit Example 2, the direction of the current flowing to the write bit line changes in accordance with the value of write data. In Circuit Example 2, the supply/cutoff timing, magnitude, and temporal change (current waveform) of the write current can be individually set for each direction of the write bit line current.

More specifically, when write data is "1" (="H"), the supply/cutoff timing, magnitude, and temporal change (current waveform) of the write bit line current are controlled by the write bit line drive signals BP<0> to BP<3>. When write data is "0" (="L"), the supply/cutoff timing, magnitude, and temporal change (current waveform) of the write bit line current are controlled by the write bit line drive signals BP<4> to BP<7>.

As described above, in Circuit Example 2, the supply/cutoff timing, magnitude, and temporal change (current waveform) of the write current can be individually set in accordance with the direction of the write current flowing to the write bit line in consideration of the characteristics or the like of the MTJ element. Hence, the magnetization of the storing layer of an MTJ element can reliably be inverted, and the write characteristics can be improved.

③ CIRCUIT EXAMPLE 3

Circuit Example 3 is a modification obtained by partially modifying Circuit Example 2. Circuit Example 3 is related to a magnetic random access memory which can set the supply/cutoff timing, magnitude, and temporal change (current waveform) of a write current for a write word/bit line by programming.

As compared to Circuit Example 2, Circuit Example 3 has its characteristic feature in the arrangements of a column decoder & write bit line driver/sinker and write bit line driver/sinker trigger circuit.

More specifically, the circuit shown in FIG. 49 can directly be used as a row decoder & write word line driver/sinker. The circuit shown in FIGS. 51 and 52 can directly be used as a write word line driver/sinker trigger circuit in a write current waveform control circuit.

In addition, the circuit shown in FIGS. 54 to 56 can directly be used as a waveform generation circuit in a write bit line driver/sinker trigger circuit. The circuit shown in FIGS. 58 to 60 can directly be used as a setting circuit.

In Circuit Example 2, an arrangement capable of individually setting the supply/cutoff timing, magnitude, and temporal change (current waveform) of a write current for each direction of the write bit line current has been proposed. To the contrary, Circuit Example 3 proposes an arrangement in which the supply/cutoff timing, magnitude, and temporal change (current waveform) of the write current are set only for each chip or memory cell array and do not change depending on the direction of the write bit line current.

i. Overall Arrangement

FIG. 61 shows the arrangement of main part of a magnetic random access memory according to Circuit Example 3.

A magnetic random access memory (MRAM) 11 may construct one memory chip by itself or one block in a chip having a specific function. A memory cell array (data cell) 12 has a function of actually storing data. A reference cell array 13 has a function of setting a criterion to be used to determine the value of read data in read operation.

A row decoder & driver (row decoder & write word line driver and row decoder & read word line driver) 14 is arranged at one of two X-direction ends of a cell array formed from the memory cell array 12 and reference cell array 13. A write word line sinker 15 is arranged at the other end.

The row decoder & driver 14 has a function of, e.g., selecting one of a plurality of write word lines on the basis of a row address signal and supplying a write current to the selected write word line in the write operation. The write word line sinker 15 has a function of, e.g., absorbing the write current supplied to the selected write word line in the write operation.

The row decoder & driver 14 has a function of, e.g., selecting one of a plurality of read word lines (the read word lines may be integrated with the write word lines) on the basis of a row address signal and supplying a read current to the selected read word line in the read operation. A sense amplifier 20 detects, e.g., the read current and determines read data.

A column decoder & write bit line driver/sinker 16A is arranged at one of two Y-direction ends of the memory cell array 12. A column decoder & write bit line driver/sinker (including a column transfer gate and column decoder) 17A is arranged at the other end.

The column decoders & write bit line drivers/sinkers 16A and 17A have a function of, e.g., selecting one of a plurality of write bit lines (or data lines) on the basis of a column address signal and supplying a write current having a direction corresponding to write data to the selected write bit line in the write operation. The column transfer gate and column decoder have a function of electrically connecting the data line selected by the column address signal to the sense amplifier 20 in the read operation.

A reference cell column decoder & write bit line driver/sinker 16B is arranged at one of two Y-direction ends of the reference cell array 13. A reference cell column decoder & write bit line driver/sinker (including a column transfer gate and column decoder)17B is arranged at the other end.

The reference cell column decoders & write bit line drivers/sinkers 16B and 17B have a function of storing reference data in the reference cell array 13. The column transfer gate and column decoder have a function of reading out the reference data and transferring it to the sense amplifier 20 in the read operation.

An address receiver 18 receives an address signal and transfers, e.g., a row address signal to the row decoder & driver 14 and a column address signal to the column decoders & write bit line drivers/sinkers 16A and 17A. A data input receiver 19 transfers the write data to the column decoders & write bit line drivers/sinkers 16A and 17A. An output driver 21 outputs the read data detected by the sense amplifier 20 from the magnetic random access memory 11.

A control circuit 22 receives a /CE (Chip Enable) signal, /WE (Write Enable) signal, and /OE (Output Enable) signal and controls the operation of the magnetic random access memory 11. For example, in the write operation, the control circuit 22 supplies a write signal WRITE to a write current waveform control circuit 24. Upon receiving the write signal WRITE, the write current waveform control circuit 24 determines the supply/cutoff timings, magnitudes, and temporal changes (current waveforms) of write currents on the basis of, e.g., setting data that is programmed in a setting circuit 23 in advance.

More specifically, in the write operation, the write current waveform control circuit 24 supplies write word line drive signals (current waveform generation signals) WP<0> to WP<3> to the row decoder & driver 14, and a write word line sink signal WWLSNK to the write word line sinker 15.

The write current waveform control circuit 24 also supplies write bit line drive signals (current waveform generation signals) BP<0> to BP<3> and write bit line sink signal WBLSNK to the column decoder & write bit line driver/sinker 16A, and the write bit line drive signals (current waveform generation signals) BP<0> to BP<3> and write bit line sink signal WBLSNK to the column decoder & write bit line driver/sinker 17A.

In the write operation, for example, the row decoder & driver 14 is set in the operative state when at least one of the write word line drive signals WP<0> to WP<3> is "H". Similarly, the write word line sinker 15 and the column decoders & write bit line drivers/sinkers 16A and 17A are set in the operative state, respectively, when the write word line sink signal WWLSNK, at least one of the write bit line drive signals BP<0> to BP<3>, and write bit line sink signal WBLSNK are "H".

With this arrangement, when the timings to change the write word line drive signals WP<0> to WP<3>, write word line sink signal WWLSNK, write bit line drive signals BP<0> to BP<3>, and write bit line sink signal WBLSNK to "H" are controlled by the write current waveform control circuit 24, the supply/cutoff timings of the write currents (application timings of the magnetic fields Hx and Hy), magnitudes, and temporal changes (current waveforms) can be determined, and the write principles of the first to 10th embodiments can be implemented.

As for the absorption timings of the write currents, for example, when the timings to change the sink signals WWLSNK and WBLSNK from "H" to "L" are set after the timings to change the drive signals WP<0> to WP<3> and BP<0> to BP<3> from "H" to "L", the potential of the write word/bit line can be completely set to 0V.

The timings to change the signals WP<0> to WP<3>, WWLSNK, BP<0> to BP<3>, and WBLSNK to "H" are determined on the basis of setting data programmed in the setting circuit 23 in advance. For example, a laser blow fuse, an MTJ element (MTJ), or an antifuse which breaks the tunneling barrier of an MTJ element can be used as a programming element.

In the test mode of the magnetic random access memory, the supply/cutoff timings, magnitudes, and temporal changes (current waveforms) of write currents can be determined on the basis of, e.g., setting data input from a data input/output terminal. The setting data may be input from an address terminal.

ii. Column Decoder & Write Bit Line Driver/Sinker

Figure 62:
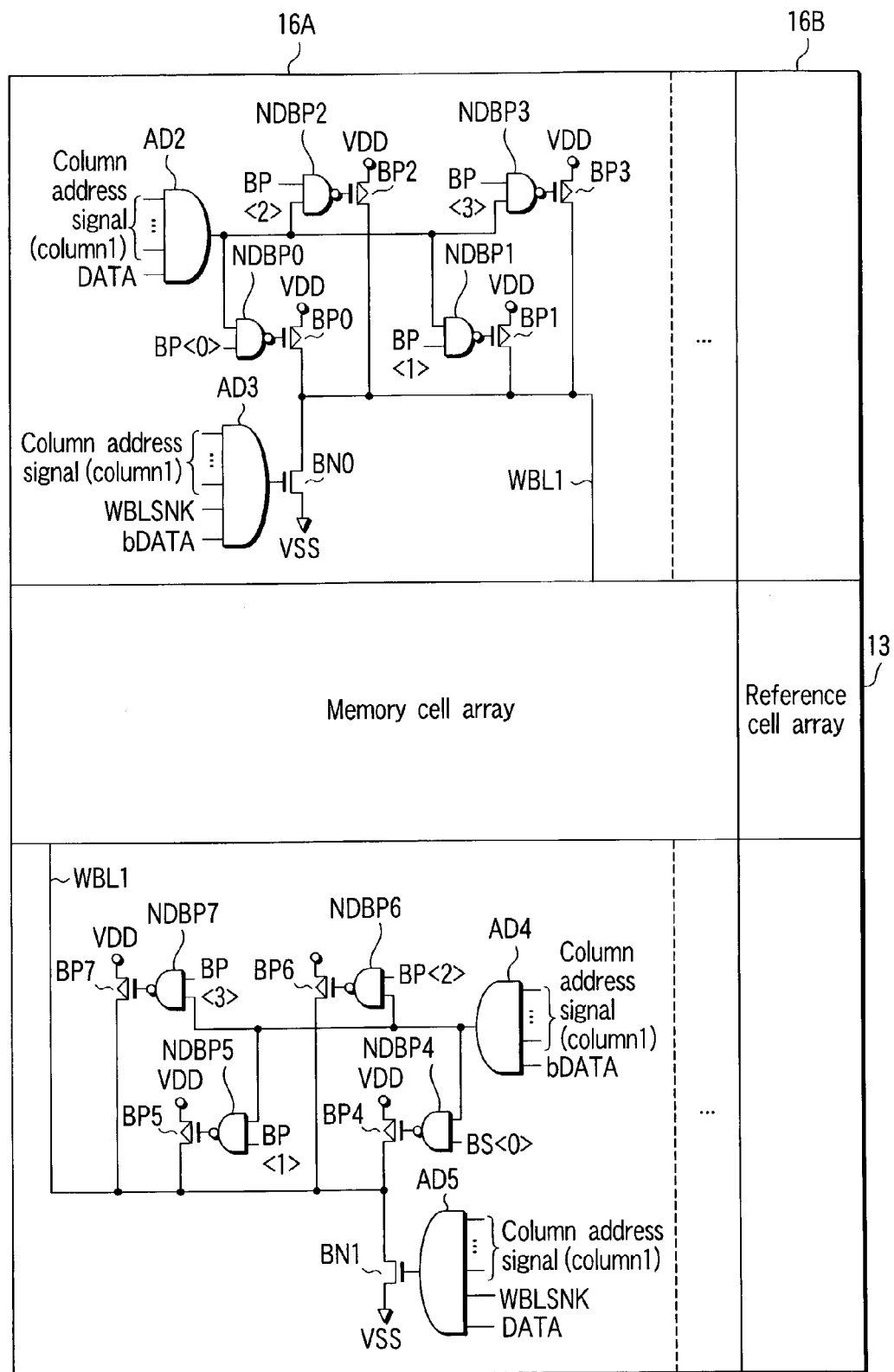
FIG. 62 is a view showing an example of a write bit line driver/sinker according to Circuit Example 3.

FIG. 62 shows a circuit example of the column decoder & write bit line driver/sinker.

As compared to the column decoder & write bit line driver/sinker of Circuit Example 2 (FIG. 50), the column decoder & write bit line driver/sinker of Circuit Example 3 has its characteristic feature in that the write bit line drive signals input to NAND gate circuits NDBP4 to NDBP7 in the column decoder & write bit line driver/sinker (for one column) 17A is BP<0> to BP<3>.

That is, in Circuit Example 3, the write bit line drive signals input to NAND gate circuits NDBP0 to NDBP3 in the column decoder & write bit line driver/sinker 16A are the same as those input to the NAND gate circuits NDBP4 to NDBP7 in the column decoder & write bit line driver/sinker 17A.

The column decoder & write bit line driver/sinker (for one column) 16A is formed from NAND gate circuits NDBP0 to NDBP3, AND gate circuits AD2 and AD3, PMOS transistors BP0 to BP3, and NMOS transistor BN0.

The gate of a PMOS transistor BPi (i=0, 1, 2, 3) is connected to the output terminal of a NAND gate circuit NDBPi, the source is connected to the power supply terminal VDD, and the drain is commonly connected to one end of a write bit line WBLi (i=1, . . . .)

A write word line drive signal (current waveform generation signal) BP<i> (i=0, 1, 2, 3) is input to one of the two input terminals of the NAND gate circuit NDBPi (i=0, 1, 2, 3). The output signal from the AND gate circuit AD2 is input to the other input terminal. A column address signal (changes for each column i) formed from a plurality of bits and write data DATA are input to the AND gate circuit AD2.

The gate of the NMOS transistor BN0 is connected to the output terminal of the AND gate circuit AD3, the source is connected to the ground terminal VSS, and the drain is connected to one end of the write bit line WBLi (i=1,—.) The column address signal (changes for each column i) formed from a plurality of bits, write bit line sink signal WBLSNK, and an inverted signal bDATA of the write data are input to the AND gate circuit AD3.

The column decoder & write bit line driver/sinker (for one column) 17A is formed from NAND gate circuits NDBP4 to NDBP7, AND gate circuits AD4 and AD5, PMOS transistors BP4 to BP7, and NMOS transistor BN1.

The gate of the PMOS transistor BPi (i=4, 5, 6, 7) is connected to the output terminal of the NAND gate circuit NDBPi, the source is connected to the power supply terminal VDD, and the drain is commonly connected to the other end of the write bit line WBLi (i=1, . . . .)

The write word line drive signal (current waveform generation signal) BP<i> (i=0, 1, 2, 3) is input to one of the two input terminals of the NAND gate circuit NDBPi (i=4, 5, 6, 7). The output signal from the AND gate circuit AD4 is input to the other input terminal. The column address signal (changes for each column i) formed from a plurality of bits and the inverted signal bDATA of the write data are input to the AND gate circuit AD4.

The gate of the NMOS transistor BN1 is connected to the output terminal of the AND gate circuit AD5, the source is connected to the ground terminal VSS, and the drain is connected to the other end of the write bit line WBLi (i=1, . . . .) The column address signal (changes for each column i) formed from a plurality of bits, write bit line sink signal WBLSNK, and write data DATA are input to the AND gate circuit AD5.

In the selected column i, all bits of the column address signal change to "H". For this reason, in the selected column i, when at least one of the write bit line drive signals BP<0> to BP<7> and write bit line sink signal WBLSNK change to "H", a write current having a direction corresponding to the value of the write data DATA flows to the write bit line WBLi.

For example, when the write data DATA is "1 (="H")", at least one of the PMOS transistors BP0 to BP3 and NMOS transistor BN1 are turned on. Hence, the write current flows from the column decoder & write bit line driver/sinker 16A to the column decoder & write bit line driver/sinker 17A.

When the write data DATA is "0 (="L")", at least one of the PMOS transistors BP4 to BP7 and NMOS transistor BN0 are turned on. Hence, the write current flows from the column decoder & write bit line driver/sinker 17A to the column decoder & write bit line driver/sinker 16A.

According to this column decoder & write bit line driver/sinker, when the timings to change at least one of the write bit line drive signals BP<0> to BP<3> and write bit line sink signal WBLSNK to "H" or "L" are controlled, the supply/cutoff timing, magnitude, and temporal change (current waveform) of the write current for the write bit line WBLi in the selected column i can be determined.

When all the write bit line drive signals BP<0> to BP<3> are set to "L", and then, the write bit line sink signal WBLSNK is set to "L", the potential of the write bit line WBLi after the write operation can be completely set to 0V.

To control the magnitude or temporal change (current waveform) of the write current, the following control methods can be used. As the first method, the sizes (channel widths), i.e., the driving capabilities of the plurality of PMOS transistors BP0 to BP7 are set to the same value. Then, the number of PMOS transistors BP0 to BP7 in the ON state is changed using the write bit line drive signals BP<0> to BP<3>.

As the second method, the sizes (channel widths), i.e., the driving capabilities of the plurality of PMOS transistors BP0 to BP7 are set to different values. Then, one of the plurality of PMOS transistors BP0 to BP7 is selectively turned on using the write bit line drive signals BP<0> to BP<3>.

The third method is a combination of the first and second methods. That is, the sizes of the PMOS transistors BP0 to BP7 are set to different values, and the number of PMOS transistors BP0 to BP7 in the ON state is changed, thereby controlling the magnitude or temporal change (current waveform) of the write current.

iii. Write Current Waveform Control Circuit

An example of the write current waveform control circuit which generates the write word line drive signals WP<0> to WP<3>, write word line sink signal WWLSNK, write bit line drive signals BP<0> to BP<3>, and write bit line sink signal WBLSNK will be described next.

Figure 63:
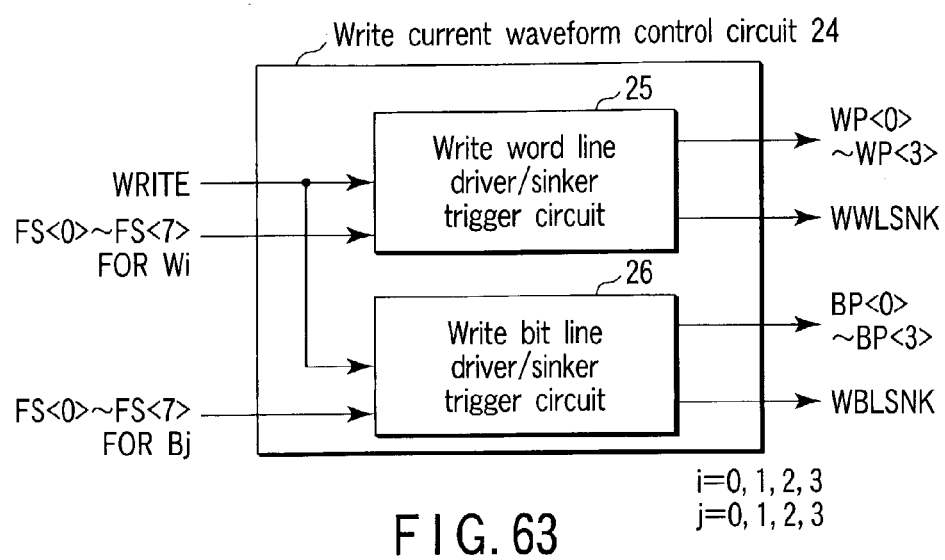
FIG. 63 is a view showing an example of a write bit line driver/sinker trigger circuit according to Circuit Example 3.

FIG. 63 shows an example of the write current waveform control circuit.

The write current waveform control circuit 24 is formed from a write word line driver/sinker trigger circuit 25 and write bit line driver/sinker trigger circuit 26.

The write word line driver/sinker trigger circuit 25 generates the write word line drive signals (current waveform generation signals) WP<0> to WP<3> and write word line sink signal WWLSNK on the basis of the write signal WRITE and current waveform control signals FS<0> to FS<7> FOR Wi (i=0, 1, 2, 3).

The write bit line driver/sinker trigger circuit 26 generates the write bit line drive signals (current waveform generation signals) BP<0> to BP<3> and write bit line sink signal WBLSNK on the basis of the write signal WRITE and current waveform control signals FS<0> to FS<7> FOR Bj (j=0, 1, 2, 3).

"FOR Wi" and "FOR Bj" of the current waveform control signals FS<0> to FS<7> FOR Wi and FS<0> to FS<7> FOR Bj mean that the values of the current waveform control signals FS<0> to FS<7> are set for each of a plurality of waveform generation circuits Wi and Bj (to be described later) in the write word/bit line driver/sinker trigger circuits 25 and 26.

The write signal WRITE changes to "H" in the write operation.

The supply/cutoff timing, magnitude, and temporal change (current waveform) of the write current for the write word line WWLi, i.e., the timing to change the write word line drive signals WP<0> to WP<3> and write word line sink signal WWLSNK to "H" or "L" is determined on the basis of the current waveform control signals FS<0> to FS<7> FOR Wi.

The supply/cutoff timing, magnitude, and temporal change (current waveform) of the write current for the write bit line WBLi, i.e., the timing to change the write bit line drive signals BP<0> to BP<7> and write bit line sink signal WBLSNK to "H" or "L" is determined on the basis of the current waveform control signals FS<0> to FS<7> FOR Bj.

The current waveform control signals FS<0> to FS<7> FOR Wi and FS<0> to FS<7> FOR Bj are generated by a setting circuit shown in FIGS. 58 to 60.

iv. Write Bit Line Driver/Sinker Trigger Circuit

Figure 64:
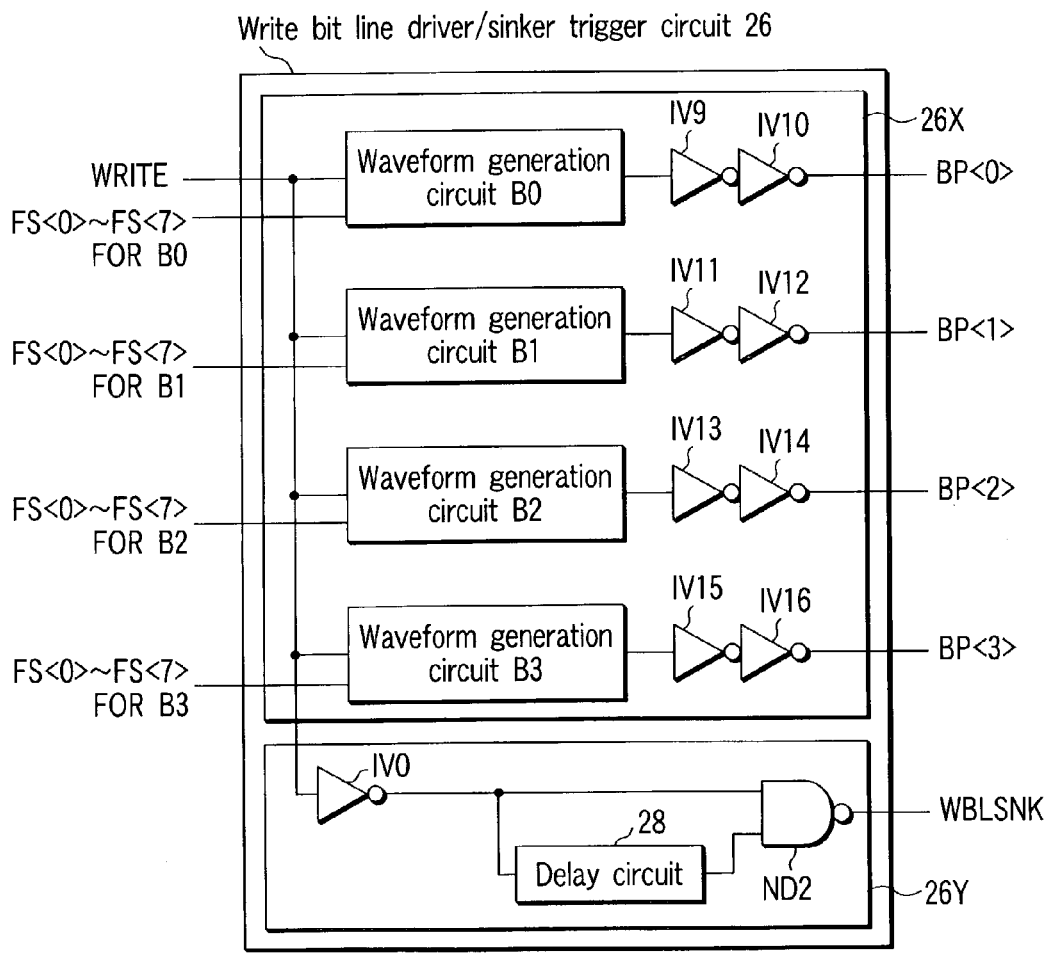
FIG. 64 is a view showing an example of the write bit line driver/sinker trigger circuit according to Circuit Example 3.

FIG. 64 shows an example of the write bit line driver/sinker trigger circuit.

As compared to the write bit line driver/sinker trigger circuit of Circuit Example 2 (FIG. 53), the write bit line driver/sinker trigger circuit of Circuit Example 3 has its characteristic feature in that the number of waveform generation circuits Bi is smaller.

More specifically, in Circuit Example 2, as shown in FIG. 53, the eight waveform generation circuits B0 to B7 are necessary in correspondence with the eight write bit line drive signals BP<0> to BP<7>. In Circuit Example 3, only four waveform generation circuits B0 to B3 suffice in correspondence with the four write bit line drive signals BP<0> to BP<3>.

The write bit line driver/sinker trigger circuit 26 is formed from a current supply/cutoff timing determining circuit 26X which determines the current supply/cutoff timing, magnitude, and temporal change (current waveform) of the write current, and a current absorption timing determining circuit 26Y which determines the current absorption timing of the write current.

After the write signal WRITE changes to "H" or "L", the current supply/cutoff timing determining circuit 26X determines the timing to change the write bit line drive signals BP<0> to BP<3> to "H" or "L". The current supply/cutoff timing determining circuit 26X is formed from a plurality of (in this example, four) waveform generation circuits B0 to B3 and inverters IV9 to IV16.

The waveform generation circuits B0 to B3 generate the write bit line drive signals BP<0> to BP<3>, respectively, on the basis of the write signal WRITE and current waveform control signals FS<0> to FS<7> FOR Bj. The write bit line drive signals BP<0> to BP<3> drive the write bit line driver shown in FIG. 61.

When the write data DATA is "1" (="H"), the write current flows from the write bit line driver/sinker 16A to the write bit line driver/sinker 17A. The current waveform almost equals a synthesized waveform obtained by synthesizing the waveforms of the write bit line drive signals BP<0> to BP<3>.

When the write data DATA is "0" (="L"), the write current flows from the write bit line driver/sinker 17A to the write bit line driver/sinker 16A. The current waveform also almost equals a synthesized waveform obtained by synthesizing the waveforms of the write bit line drive signals BP<0> to BP<3>.

In this example, the four waveform generation circuits B0 to B3 are used. However, as the number of waveform generation circuits increases, the waveform of the write current supplied to the write word line WWLi can finely be controlled, as a matter of course.

The current absorption timing determining circuit 26Y is formed from an inverter IV0, NAND gate circuit ND2, and delay circuit 28.

When the write signal WRITE changes to "H", the current absorption timing determining circuit 26Y almost simultaneously changes the write bit line sink signal WBLSNK to "H". After the write signal WRITE changes to "L", and a delay time which is determined by the delay circuit 28 elapses, the current absorption timing determining circuit 26Y changes the write bit line sink signal WBLSNK to "L".

When the write signal WRITE is changed to "L", and then the write bit line sink signal WBLSNK is changed to "L" after a predetermined interval, the potential of the write bit line WBLi can be completely set to 0V after the write operation.

v. Conclusion

As described above, according to Circuit Example 3 of the magnetic random access memory, the supply/cutoff timing, magnitude, and temporal change (current waveform) of the write current for the write word/bit line can be set for each chip or memory cell array by programming. With this arrangement, for example, the write principles of the first to 10th embodiments can be implemented. The magnetization of the storing layer of an MTJ element can reliably be inverted. The write characteristics can be improved.

In Circuit Example 3, the direction of the current flowing to the write bit line changes in accordance with the value of write data. In Circuit Example 3, the supply/cutoff timing, magnitude, and temporal change (current waveform) of the write current are set for each chip or memory cell array such that they do not change depending on the direction of the write bit line current (the value of write data).

As a result, the number of write bit line drive signals is ½ that of Circuit Example 2. That is, since the number of waveform generation circuits in the write bit line driver/sinker trigger circuit is smaller, the size of the write current waveform control circuit can be reduced, contributing to chip size reduction.

(2) Setting for Each Write Word/Bit Line

A circuit which sets the write principle or the supply/cutoff timings and magnitudes of the write currents for each write word/bit line in the cell array of the magnetic random access memory will be described next.

① CIRCUIT EXAMPLE 1

Circuit Example 1 is related to a magnetic random access memory which has a function capable of setting the supply/cutoff timing, magnitude, and temporal change (current waveform) of a write current for a write word/bit line by programming.

i. Overall Arrangement

FIG. 65 shows the arrangement of main part of a magnetic random access memory according to Circuit Example 1.

A magnetic random access memory (MRAM) 11 may construct one memory chip by itself or one block in a chip having a specific function. A memory cell array (data cell) 12 has a function of actually storing data. A reference cell array 13 has a function of setting a criterion to be used to determine the value of read data in read operation.

A row decoder & driver (row decoder & write word line driver and row decoder & read word line driver) 14-1 is arranged at one of two X-direction ends of a cell array formed from the memory cell array 12 and reference cell array 13. A write word line sinker 15 is arranged at the other end.

The row decoder & driver 14-1 has a function of, e.g., selecting one of a plurality of write word lines on the basis of a row address signal and supplying a write current to the selected write word line in the write operation. The write word line sinker 15 has a function of, e.g., absorbing the write current supplied to the selected write word line in the write operation.

The row decoder & driver 14-1 has a function of, e.g., selecting one of a plurality of read word lines (the read word lines may be integrated with the write word lines) on the basis of a row address signal and supplying a read current to the selected read word line in the read operation. A sense amplifier 20 detects, e.g., the read current and determines read data.

A column decoder & write bit line driver/sinker 16A-1 is arranged at one of two Y-direction ends of the memory cell array 12. A column decoder & write bit line driver/sinker (including a column transfer gate and column decoder) 17A-1 is arranged at the other end.

The column decoders & write bit line drivers/sinkers 16A-1 and 17A-1 have a function of, e.g., selecting one of a plurality of write bit lines (or data lines) on the basis of a column address signal and supplying a write current having a direction corresponding to write data to the selected write bit line in the write operation. The column transfer gate and column decoder have a function of electrically connecting the data line selected by the column address signal to the sense amplifier 20 in the read operation.

A reference cell column decoder & write bit line driver/sinker 16B is arranged at one of two Y-direction ends of the reference cell array 13. A reference cell column decoder & write bit line driver/sinker (including a column transfer gate and column decoder)17B is arranged at the other end.

The reference cell column decoders & write bit line drivers/sinkers 16B and 17B have a function of storing reference data in the reference cell array 13. The column transfer gate and column decoder have a function of reading out the reference data and transferring it to the sense amplifier 20 in the read operation.

An address receiver 18 receives an address signal and transfers, e.g., a row address signal to the row decoder & driver 14-1 and a column address signal to the column decoders & write bit line drivers/sinkers 16A-1 and 17A-1.

A data input receiver 19 transfers the write data to the column decoders & write bit line drivers/sinkers 16A-1 and 17A-1. An output driver 21 outputs the read data detected by the sense amplifier 20 from the magnetic random access memory 11.

A control circuit 22 receives a /CE (Chip Enable) signal, /WE (Write Enable) signal, and /OE (Output Enable) signal and controls the operation of the magnetic random access memory 11. For example, in the write operation, the control circuit 22 supplies a write signal WRITE to write current waveform control circuits/setting circuits 14-2, 16A-2, and 17A-2.

Upon receiving the write signal WRITE, each of the write current waveform control circuits/setting circuits 14-2, 16A-2, and 17A-2 determines the supply/cutoff timings, magnitudes, and temporal changes (current waveforms) of write currents on the basis of, e.g., setting data that is programmed in the setting circuit in advance.

More specifically, in the write operation, the write current waveform control circuit/setting circuit 14-2 supplies write word line drive signals (current waveform generation signals) WP<0> to WP<3> and WS<0> to WS<3> to the row decoder & driver 14-1 and a write word line sink signal WWLSNK to the write word line sinker 15. The write current waveform control circuits/setting circuits 16A-1 and 17A-2 supply write bit line drive signals (current waveform generation signals) BP<0> to BP<7> and BS<0> to BS<7> and write bit line sink signal WBLSNK to the column decoders & write bit line drivers/sinkers 16A-1 and 17A-1.

In the write operation, in Circuit Example 1, the row decoder & driver 14-1 is driven using the write word line drive signals WP<0> to WP<3> and WS<0> to WS<3>. With this operation, the supply/cutoff timing, magnitude, and temporal change (current waveform) of the write current can be controlled for each write word line.

In the write operation, in Circuit Example 1, the write bit line drivers/sinkers 16A-1 and 17A-1 are driven using the write bit line drive signals BP<0> to BP<7> and BS<0> to BS<7>. With this operation, the supply/cutoff timing, magnitude, and temporal change (current waveform) of the write current can be controlled for each write bit line. Additionally, in Circuit Example 1, the supply/cutoff timing, magnitude, and temporal change (current waveform) of the write current can be individually controlled for each direction of the write bit line current.

As for the absorption timings of the write currents, for example, when the timings to change the sink signals WWLSNK and WBLSNK from "H" to "L" are set after the timings to change all the drive signals WP<0> to WP<3>, WS<0> to WS<3>, BP<0> to BP<7>, and BS<0> to BS<7> from "H" to "L", the potential of the write word/bit line can be completely set to 0V.

The values of the write word line drive signals WS<0> to WS<3> and BS<0> to BS<3> are determined on the basis of, e.g., setting data programmed in the setting circuit in advance. For example, a laser blow fuse, an MTJ element (MTJ), or an antifuse which breaks the tunneling barrier of an MTJ element can be used as a programming element.

In the test mode of the magnetic random access memory, the supply/cutoff timings, magnitudes, and temporal changes (current waveforms) of write currents can be determined on the basis of, e.g., setting data input from a data input/output terminal. The setting data may be input from an address terminal.

ii. Row Decoder & Write Word Line Driver/Sinker

FIG. 66 shows a circuit example of the row decoder & write word line driver/sinker.

The row decoder & write word line driver (for one row) 14-1 is formed from an AND gate circuit AD1, NAND gate circuits NDWP0 to NDWP3, and PMOS transistors WP0 to WP3. The gate of a PMOS transistor WPi (i=0, 1, 2, 3) is connected to the output terminal of a NAND gate circuit NDWPi, the source is connected to a power supply terminal VDD, and the drain is connected to one end of a write word line WWLi (i=1, . . . .)

The NAND gate circuit NDWPi has three input terminals. Write word line drive signals (current waveform generation signals) WP<i> and WS<i> are input to two of the three input terminals of the NAND gate circuit NDWPi. The output signal from the AND gate circuit AD1 is input to the remaining input terminal. A row address signal (changes for each row i) formed from a plurality of bits is input to the AND gate circuit AD1.

The write word line sinker (for one row) 15 is formed from an NMOS transistor TN1. The source of the NMOS transistor TN1 is connected to a ground terminal VSS, and the drain is connected to the other end of the write word line WWLi. The write word line sink signal WWLSNK is input to the gate of the NMOS transistor TN1.

In the selected row i, all bits of the row address signal change to "H". For this reason, in the selected row i, a PMOS transistor WPi which receives the output signal from the NAND gate circuit NDWPi for which both the write word line drive signals WP<i> and WS<i> as input signals are "H" is turned on. When the write word line sink signal WWLSNK changes to "H", the NMOS transistor TN1 is turned on.

When at least one of the PMOS transistors WP0 to WP3 and the NMOS transistor TN1 are turned on, for example, the write current flows from the row decoder & write word line driver 14-1 to the write word line sinker 15 through the write word line WWLi.

According to this row decoder & write word line driver/sinker, when the timings to change the write word line drive signals WP<0> to WP<3> and WS<0> to WS<3> and write word line sink signal WWLSNK to "H" or "L" are controlled, the supply/cutoff timing, magnitude, and temporal change (current waveform) of the write current for the write word line WWLi in the selected row i can be determined.

When all the write word line drive signals WP<0> to WP<3> and WS<0> to WS<3> are set to "L", and then, the write word line sink signal WWLSNK is set to "L", the potential of the write word line WWLi after the write operation can be completely set to 0V.

To control the magnitude or temporal change (current waveform) of the write current, the following control methods can be used. As the first method, the sizes (channel widths), i.e., the driving capabilities of the plurality of PMOS transistors WP0 to WP3 are set to the same value. Then, the number of PMOS transistors WP0 to WP3 in the ON state is changed using the write word line drive signals WP<0> to WP<3> and WS<0> to WS<3>.

As the second method, the sizes (channel widths), i.e., the driving capabilities of the plurality of PMOS transistors WP0 to WP3 are set to different values. Then, one of the plurality of PMOS transistors WP0 to WP3 is selectively turned on using the write word line drive signals WP<0> to WP<3> and WS<0> to WS<3>.

The third method is a combination of the first and second methods. That is, the sizes of the PMOS transistors WP0 to WP3 are set to different values, and the number of PMOS transistors WP0 to WP3 in the ON state is changed, thereby controlling the magnitude or temporal change (current waveform) of the write current.

iii. Column Decoder & Write Bit Line Driver/Sinker

Figure 67:
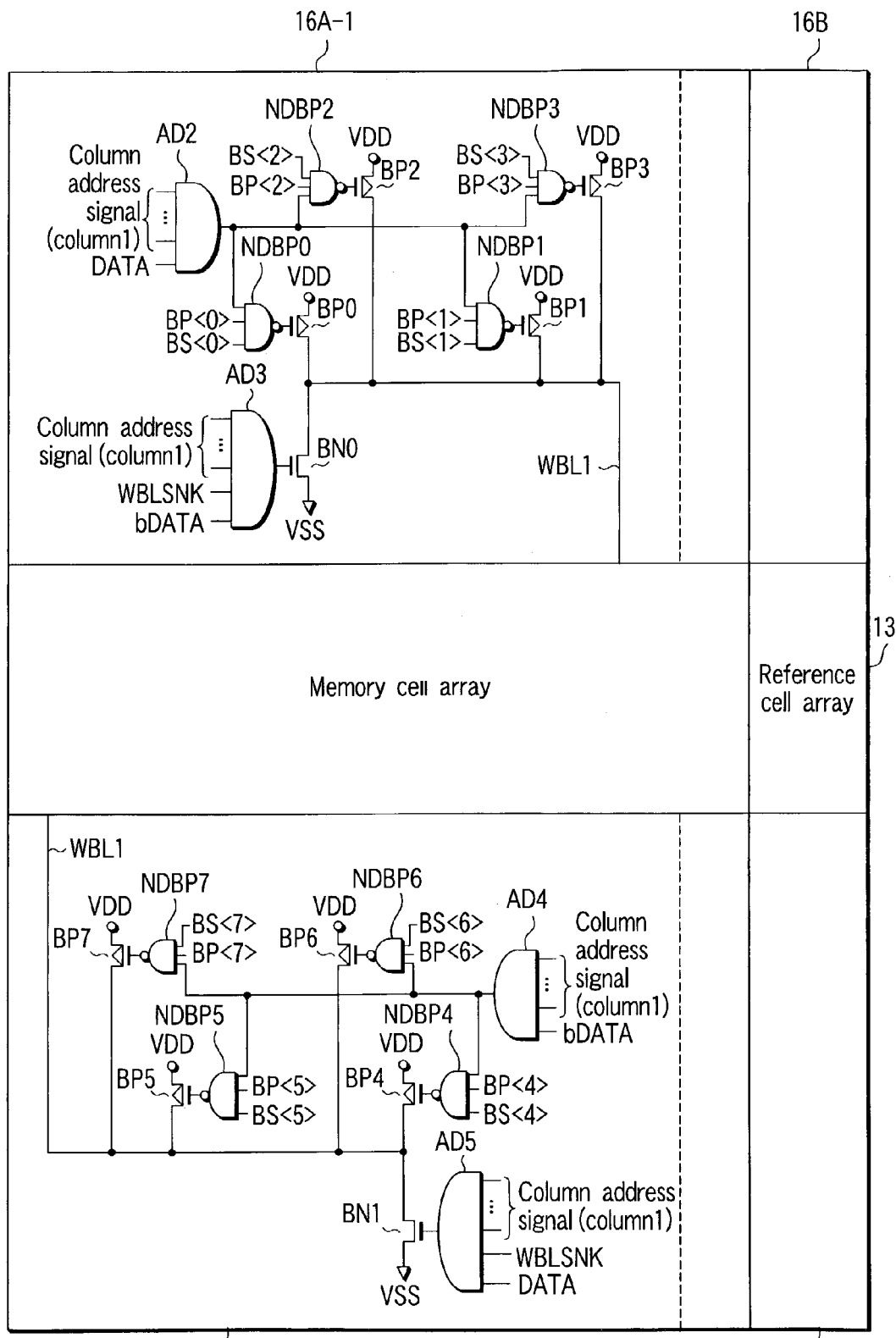
FIG. 67 is a view showing an example of a write bit line driver/sinker according to Circuit Example 1.

FIG. 67 shows a circuit example of the column decoder & write bit line driver/sinker.

The column decoder & write bit line driver/sinker (for one column) 16A-1 is formed from NAND gate circuits NDBP0 to NDBP3, AND gate circuits AD2 and AD3, PMOS transistors BP0 to BP3, and NMOS transistor BN0.

The gate of a PMOS transistor BPi (i=0, 1, 2, 3) is connected to the output terminal of a NAND gate circuit NDBPi, the source is connected to the power supply terminal VDD, and the drain is commonly connected to one end of a write bit line WBLi (i=1, . . . .)

The NAND gate circuit NDBPi (i=0, 1, 2, 3) has three input terminals. Write bit line drive signals (current waveform generation signals) BP<i> and BS<i> are input to two of the three input terminals of the NAND gate circuit NDBPi. The output signal from the AND gate circuit AD2 is input to the remaining input terminal. A column address signal (changes for each row i) formed from a plurality of bits and write data DATA are input to the AND gate circuit AD2.

The gate of the NMOS transistor BN0 is connected to the output terminal of the AND gate circuit AD3, the source is connected to the ground terminal VSS, and the drain is connected to one end of the write bit line WBLi (i=1, . . . .) The column address signal (changes for each column i) formed from a plurality of bits, write bit line sink signal WBLSNK, and an inverted signal bDATA of the write data are input to the AND gate circuit AD3.

The column decoder & write bit line driver/sinker (for one column) 17A-1 is formed from NAND gate circuits NDBP4 to NDBP7, AND gate circuits AD4 and AD5, PMOS transistors BP4 to BP7, and NMOS transistor BN1.

The gate of the PMOS transistor BPi (i=4, 5, 6, 7) is connected to the output terminal of the NAND gate circuit NDBPi, the source is connected to the power supply terminal VDD, and the drain is commonly connected to the other end of the write bit line WBLi (i=1, . . . .)

The NAND gate circuit NDBPi (i=4, 5, 6, 7) has three input terminals. Write bit line drive signals (current waveform generation signals) BP<i> and BS<i> are input to two of the three input terminals of the NAND gate circuit NDBPi. The output signal from the AND gate circuit AD4 is input to the remaining input terminal. A column address signal (changes for each row i) formed from a plurality of bits and the inverted signal bDATA of the write data are input to the AND gate circuit AD4.

The gate of the NMOS transistor BN1 is connected to the output terminal of the AND gate circuit AD5, the source is connected to the ground terminal VSS, and the drain is connected to the other end of the write bit line WBLi (i=1, . . . .) The column address signal (changes for each column i) formed from a plurality of bits, write bit line sink signal WBLSNK, and write data DATA are input to the AND gate circuit AD5.

In the selected column i, all bits of the column address signal change to "H". Additionally, in the selected column i, at least one of the write bit line drive signal pairs BP<i> and BS<i> changes to "H", and the write bit line sink signal WBLSNK changes to "H". For this reason, a write current having a direction corresponding to the value of the write data DATA flows to the write bit line WBLi.

For example, when the write data DATA is "1" (="H"), at least one of the PMOS transistors BP0 to BP3 and NMOS transistor BN1 are turned on. Hence, the write current flows from the column decoder & write bit line driver/sinker 16A to the column decoder & write bit line driver/sinker 17A.

When the write data DATA is "0" (="L"), at least one of the PMOS transistors BP4 to BP7 and NMOS transistor BN0 are turned on. Hence, the write current flows from the column decoder & write bit line driver/sinker 17A to the column decoder & write bit line driver/sinker 16A.

According to this column decoder & write bit line driver/sinker, when the timings to change at least one of the write bit line drive signal pairs BP<i> and BS<i> and write bit line sink signal WBLSNK to "H" or "L" are controlled, the supply/cutoff timing, magnitude, and temporal change (current waveform) of the write current for the write bit line WBLi in the selected column i can be determined.

When all the write bit line drive signals BP<0> to BP<7> and BS<0> to BS<7> are set to "L", and then, the write bit line sink signal WBLSNK is set to "L", the potential of the write bit line WBLi after the write operation can be completely set to 0V.

To control the magnitude or temporal change (current waveform) of the write current, the following control methods can be used. As the first method, the sizes (channel widths), i.e., the driving capabilities of the plurality of PMOS transistors BP0 to BP7 are set to the same value. Then, the number of PMOS transistors BP0 to BP7 in the ON state is changed using the write bit line drive signals BP<0> to BP<7> and BS<0> to BS<7>.

As the second method, the sizes (channel widths), i.e., the driving capabilities of the plurality of PMOS transistors BP0 to BP7 are set to different values. Then, one of the plurality of PMOS transistors BP0 to BP7 is selectively turned on using the write bit line drive signals BP<0> to BP<7> and BS<0> to BS<7>.

The third method is a combination of the first and second methods. That is, the sizes of the PMOS transistors BP0 to BP7 are set to different values, and the number of PMOS transistors BP0 to BP7 in the ON state is changed, thereby controlling the magnitude or temporal change (current waveform) of the write current.

iv. Write Current Waveform Control Circuit/Setting Circuit

An example of the write current waveform control circuit/setting circuit which generates the write word line drive signals WP<0> to WP<3> and WS<0> to WS<3> and write word line sink signal WWLSNK, an example of the write current waveform control circuit/setting circuit which generates the write bit line drive signals BP<0> to BP<3> and BS<0> to BS<3> and write bit line sink signal WBLSNK, an example of the write current waveform control circuit/setting circuit which generates the write bit line drive signals BP<4> to BP<7> and BS<4> to BS<7> and write bit line sink signal WBLSNK will be described next.

FIG. 68 shows an example of the write current waveform control circuit/setting circuit 14-2 in FIG. 65.

FIG. 68 shows the write current waveform control circuit/setting circuit 14-2 corresponding to only one row. Hence, the actual number of each of the elements (write word line driver/sinker trigger circuit 25 and setting circuit 23A) shown in FIG. 68 equals the number of rows.

The write current waveform control circuit/setting circuit 14-2 is formed from the write word line driver/sinker trigger circuit 25 and setting circuit 23A.

The write word line driver/sinker trigger circuit 25 generates the write word line drive signals (current waveform generation signals) WP<0> to WP<3> and write word line sink signal WWLSNK on the basis of the write signal WRITE.

The setting circuit 23A outputs the write word line drive signals (current waveform generation signals) WS<0> to WS<3> on the basis of setting data. The setting data is programmed in advance in a storage element (fuse element, MTJ element, or the like) in the setting circuit 23A on the basis of a program signal PROG, address signal (row i), and input data D<0> to D<3>.

In this example, the setting data can be programmed at any time, e.g., in a wafer state or in a product state after assembly. When the setting data should be programmed after assembly, the setting data can be registered in the setting circuit 23A by inputting the input data D<0> to D<3> from, e.g., a data input pin, address pin, or dedicated pin.

The write signal WRITE changes to "H" in the write operation.

When the write signal WRITE changes to "H", the write word line driver/sinker trigger circuit 25 changes the write word line sink signal WWLSNK to "H" and also sets the write word line drive signals WP<0> to WP<3> to "H" and "L" at, e.g., a predetermined timing.

The setting circuit 23A always outputs the write word line drive signals WS<0> to WS<3> based on the setting data.

The write word line drive signals WP<0> to WP<3> are signals as the base of the current waveform of the write word line current. To the contrary, the write word line drive signals WS<0> to WS<3> have a function of selecting the write word line drive signals WP<0> to WP<3> (signals as the base of the current waveform).

More specifically, as is apparent from the structure of the write word line driver shown in FIG. 66, when a write word line drive signal WS<i> is "H", a current having a waveform almost equal to that of a write word line drive signal WP<i> is supplied to a write word line WWLi.

FIG. 69 shows an example of the write current waveform control circuit/setting circuit 16A-2 in FIG. 65.

FIG. 69 shows the write current waveform control circuit/setting circuit 16A-2 corresponding to only one column. Hence, the actual number of each of the elements (write bit line driver/sinker trigger circuit 26 and setting circuit 23B) shown in FIG. 69 equals the number of columns.

The write current waveform control circuit/setting circuit 16A-2 is formed from the write bit line driver/sinker trigger circuit 26 and setting circuit 23B.

The write bit line driver/sinker trigger circuit 26 generates the write bit line drive signals (current waveform generation signals) BP<0> to BP<3> and write bit line sink signal WBLSNK on the basis of the write signal WRITE.

The setting circuit 23B outputs the write bit line drive signals BS<0> to BS<3> on the basis of setting data. The setting data is programmed in advance in a storage element (fuse element, MTJ element, or the like) in the setting circuit 23B on the basis of the program signal PROG, address signal (column i), and input data D<0> to D<3>.

In this example, the setting data can be programmed at any time, e.g., in a wafer state or in a product state after assembly. When the setting data should be programmed after assembly, the setting data can be registered in the setting circuit 23B by inputting the input data D<0> to D<3> from, e.g., a data input pin, address pin, or dedicated pin.

The write signal WRITE changes to "H" in the write operation.

When the write signal WRITE changes to "H", the write bit line driver/sinker trigger circuit 26 changes the write bit line sink signal WBLSNK to "H" and also sets the write bit line drive signals BP<0> to BP<3> to "H" and "L" at, e.g., a predetermined timing.

The setting circuit 23B always outputs the write bit line drive signals BS<0> to BS<3>.

The write bit line drive signals BP<0> to BP<3> are signals as the base of the current waveform of the write bit line current. To the contrary, the write bit line drive signals BS<0> to BS<3> have a function of selecting the write bit line drive signals BP<0> to BP<3> (signals as the base of the current waveform).

More specifically, as is apparent from the structure of the write bit line driver shown in FIG. 67, when a write bit line drive signal BS<i> is "H", a current having a waveform almost equal to that of a write bit line drive signal BP<i> is supplied to a write bit line WBLi.

FIG. 70 shows an example of the write current waveform control circuit/setting circuit 17A-2 in FIG. 65.

FIG. 70 shows the write current waveform control circuit/setting circuit 17A-2 corresponding to only one column. Hence, the actual number of each of the elements (write bit line driver/sinker trigger circuit 26 and setting circuit 23B) shown in FIG. 70 equals the number of columns.

The write current waveform control circuit/setting circuit 17A-2 is formed from the write bit line driver/sinker trigger circuit 26 and setting circuit 23B.

The write bit line driver/sinker trigger circuit 26 generates the write bit line drive signals (current waveform generation signals) BP<4> to BP<7> and write bit line sink signal WBLSNK on the basis of the write signal WRITE.

The setting circuit 23B outputs the write bit line drive signals BS<4> to BS<7> on the basis of setting data. The setting data is programmed in advance in a storage element (fuse element, MTJ element, or the like) in the setting circuit 23B on the basis of the program signal PROG, address signal (column i), and input data D<4> to D<7>.

In this example, the setting data can be programmed at any time, e.g., in a wafer state or in a product state after assembly. When the setting data should be programmed after assembly, the setting data can be registered in the setting circuit 23B by inputting the input data D<4> to D<7> from, e.g., a data input pin, address pin, or dedicated pin.

The write signal WRITE changes to "H" in the write operation.

When the write signal WRITE changes to "H", the write bit line driver/sinker trigger circuit 26 changes the write bit line sink signal WBLSNK to "H" and also sets the write bit line drive signals BP<4> to BP<7> to "H" and "L" at, e.g., a predetermined timing.

The setting circuit 23B always outputs the write bit line drive signals BS<4> to BS<7>.

The write bit line drive signals BP<4> to BP<7> are signals as the base of the current waveform of the write bit line current. To the contrary, the write bit line drive signals BS<4> to BS<7> have a function of selecting the write bit line drive signals BP<4> to BP<7> (signals as the base of the current waveform).

More specifically, as is apparent from the structure of the write bit line driver shown in FIG. 67, when the write bit line drive signal BS<i> is "H", a current having a waveform almost equal to that of the write bit line drive signal BP<i> is supplied to the write bit line WBLi.

v. Write Word Line Driver/Sinker Trigger Circuit

Figure 71:
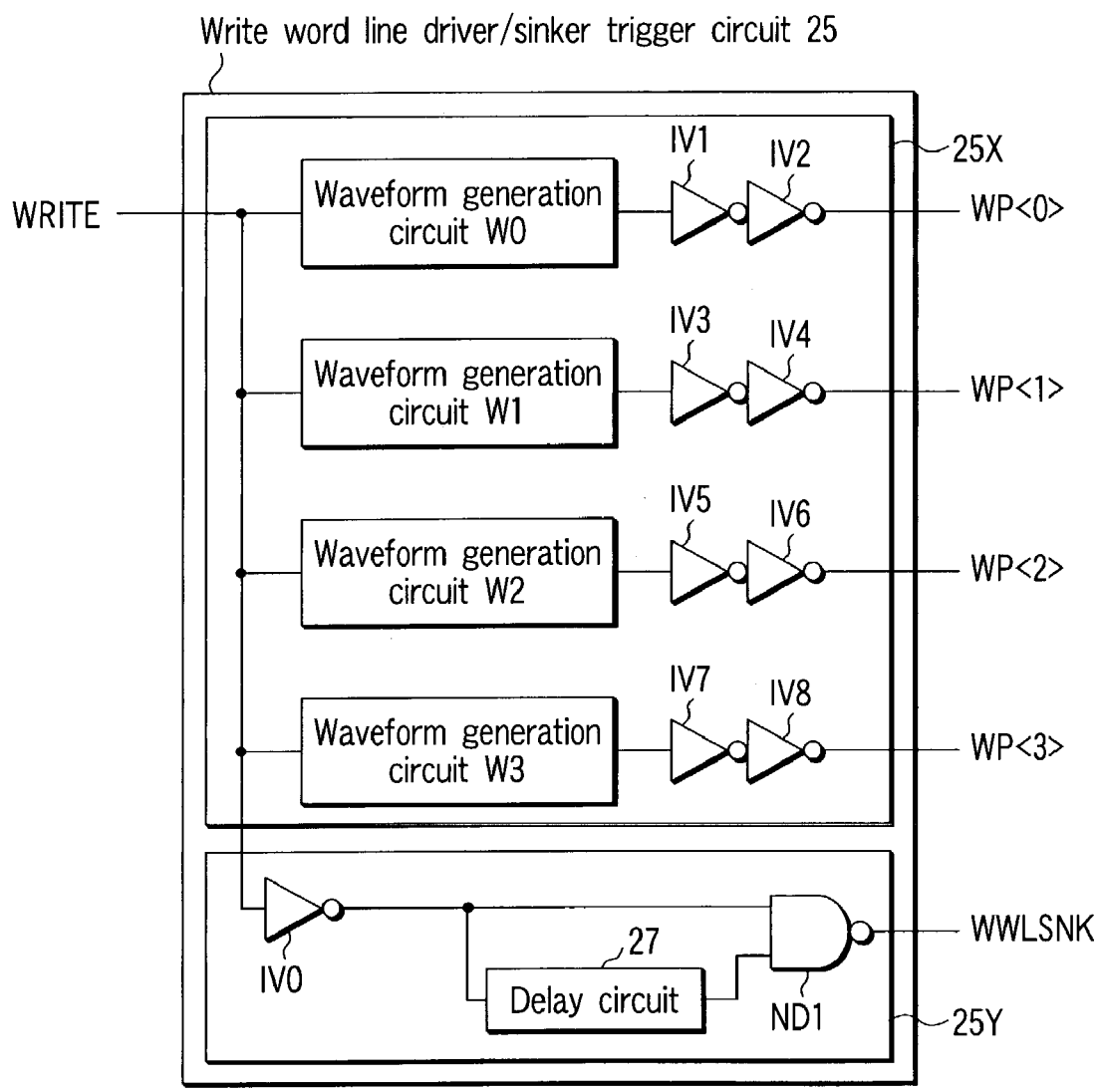
FIG. 71 is a view showing an example of a write word line driver/sinker trigger circuit according to Circuit Example 1.

FIG. 71 shows an example of the write word line driver/sinker trigger circuit.

The write word line driver/sinker trigger circuit 25 is formed from a current supply/cutoff timing determining circuit 25X which generates the write word line drive signals WP<0> to WP<3> serving as a base which determines the current supply/cutoff timing, magnitude, and temporal change (current waveform) of the write current, and a current absorption timing determining circuit 25Y which determines the current absorption timing of the write current.

In accordance with timing to change the write signal WRITE to "H" or "L", the current supply/cutoff timing determining circuit 25X determines the timing to change the write word line drive signals WP<0> to WP<3> to "H" or "L". The current supply/cutoff timing determining circuit 25X is formed from a plurality of (in this example, four) waveform generation circuits W0 to W3 and inverters IV1 to IV8.

The waveform generation circuits W0 to W3 generate the write word line drive signals WP<0> to WP<3>, respectively, on the basis of the write signal WRITE. The waveform generation circuits W0 to W3 have different delay amounts. The delay amount of the waveform generation circuits W0 to W3 may change at a predetermined interval or at random.

With this arrangement, for example, after the write signal WRITE changes to "H", the write word line drive signals WP<0> to WP<3> change to "H" at different timings.

In this example, the four waveform generation circuits W0 to W3 are used. However, as the number of waveform generation circuits increases, the waveform of the write current supplied to the write word line WWLi can finely be controlled, as a matter of course.

The current absorption timing determining circuit 25Y is formed from an inverter IV0, NAND gate circuit ND1, and delay circuit 27.

When the write signal WRITE changes to "H", the current absorption timing determining circuit 25Y almost simultaneously changes the write word line sink signal WWLSNK to "H". After the write signal WRITE changes to "L", and a delay time which is determined by the delay circuit 27 elapses, the current absorption timing determining circuit 25Y changes the write word line sink signal WWLSNK to "L".

When the write signal WRITE is changed to "L", and then the write word line sink signal WWLSNK is changed to "L" after a predetermined interval, the potential of the write word line WWLi can be completely set to 0V after the write operation.

vi. Write Bit Line Driver/Sinker Trigger Circuit

FIG. 72 shows an example of the write bit line driver/sinker trigger circuit shown in FIG. 69.

The write bit line driver/sinker trigger circuit 26 is formed from a current supply/cutoff timing determining circuit 26X which generates the write bit line drive signals BP<0> to BP<3> serving as a base which determines the current supply/cutoff timing, magnitude, and temporal change (current waveform) of the write current, and a current absorption timing determining circuit 26Y which determines the current absorption timing of the write current.

In accordance with the timing to change the write signal WRITE to "H" or "L", the current supply/cutoff timing determining circuit 26X determines the timing to change the write bit line drive signals BP<0> to BP<3> to "H" or "L". The current supply/cutoff timing determining circuit 26X is formed from a plurality of (in this example, four) waveform generation circuits B0 to B3 and inverters IV9 to IV16.

The waveform generation circuits B0 to B3 generate the write bit line drive signals BP<0> to BP<3>, respectively, on the basis of the write signal WRITE. The waveform generation circuits B0 to B3 have different delay amounts. The delay amount of the waveform generation circuits B0 to B3 may change at a predetermined interval or at random.

With this arrangement, for example, after the write signal WRITE changes to "H", the write bit line drive signals BP<0> to BP<3> change to "H" at different timings.

In this example, the four waveform generation circuits B0 to B3 are used. However, as the number of waveform generation circuits increases, the waveform of the write current supplied to the write bit line WBLi can finely be controlled, as a matter of course.

The current absorption timing determining circuit 26Y is formed from the inverter IV0, NAND gate circuit ND2, and delay circuit 28.

When the write signal WRITE changes to "H", the current absorption timing determining circuit 26Y almost simultaneously changes the write bit line sink signal WBLSNK to "H". After the write signal WRITE changes to "L", and a delay time which is determined by the delay circuit 28 elapses, the current absorption timing determining circuit 26Y changes the write bit line sink signal WBLSNK to "L".

When the write signal WRITE is changed to "L", and then the write bit line sink signal WBLSNK is changed to "L" after a predetermined interval, the potential of the write bit line WBLi can be completely set to 0V after the write operation.

FIG. 73 shows an example of the write bit line driver/sinker trigger circuit shown in FIG. 70.

The write bit line driver/sinker trigger circuit 26 is formed from the current supply/cutoff timing determining circuit 26X which generates the write bit line drive signals BP<4> to BP<7> serving as a base which determines the current supply/cutoff timing, magnitude, and temporal change (current waveform) of the write current, and the current absorption timing determining circuit 26Y which determines the current absorption timing of the write current.

In accordance with the timing to change the write signal WRITE to "H" or "L", the current supply/cutoff timing determining circuit 26X determines the timing to change the write bit line drive signals BP<4> to BP<7> to "H" or "L". The current supply/cutoff timing determining circuit 26X is formed from a plurality of (in this example, four) waveform generation circuits B4 to B7 and inverters IV17 to IV24.

The waveform generation circuits B4 to B7 generate the write bit line drive signals BP<4> to BP<7>, respectively, on the basis of the write signal WRITE. The waveform generation circuits B4 to B7 have different delay amounts. The delay amount of the waveform generation circuits B4 to B7 may change at a predetermined interval or at random.

With this arrangement, for example, after the write signal WRITE changes to "H", the write bit line drive signals BP<4> to BP<7> change to "H" at different timings.

In this example, the four waveform generation circuits B4 to B7 are used. However, as the number of waveform generation circuits increases, the waveform of the write current supplied to the write bit line WBLi can finely be controlled, as a matter of course.

The current absorption timing determining circuit 26Y is formed from the inverter IV0, NAND gate circuit ND2, and delay circuit 28.

When the write signal WRITE changes to "H", the current absorption timing determining circuit 26Y almost simultaneously changes the write bit line sink signal WBLSNK to "H". After the write signal WRITE changes to "L", and a delay time which is determined by the delay circuit 28 elapses, the current absorption timing determining circuit 26Y changes the write bit line sink signal WBLSNK to "L".

When the write signal WRITE is changed to "L", and then the write bit line sink signal WBLSNK is changed to "L" after a predetermined interval, the potential of the write bit line WBLi can be completely set to 0V after the write operation.

The write bit line drive signals BP<0> to BP<3> and write bit line sink signal WBLSNK generated by the write bit line driver/sinker trigger circuit 26 shown in FIG. 72 drive the write bit line driver/sinker 16A-1 shown in FIG. 61.

The write bit line drive signals BP<4> to BP<7> and write bit line sink signal WBLSNK generated by the write bit line driver/sinker trigger circuit 26 shown in FIG. 73 drive the write bit line driver/sinker 17A-1 shown in FIG. 67.

In this example, the write bit line drive signals BP<0> to BP<3> which drive the write bit line driver/sinker 16A-1 are different from the write bit line drive signals BP<4> to BP<7> which drive the write bit line driver/sinker 17A-1. However, both the write bit line drivers/sinkers 16A-1 and 17A-1 may be driven by the write bit line drive signals BP<0> to BP<3>.

vii. Setting Circuit

FIG. 74 shows an example of the setting circuit 23A shown in FIG. 68.

The setting circuit 23A has an MTJ element MTJ which stores setting data. In this example, 1-bit data is stored on the basis of the presence/absence of breakdown of the tunneling barrier of the MTJ element MTJ. Note that 1-bit data may be stored in accordance with the magnetized state (parallel or antiparallel) of the MTJ element MTJ.

One terminal of the MTJ element MTJ is connected to the ground point VSS through an NMOS transistor N2. The NMOS transistor N2 is always ON because the power supply potential VDD is applied to the gate of the NMOS transistor N2.

The other terminal of the MTJ element MTJ is connected to the power supply potential VDD through an NMOS transistor N1 and PMOS transistor P1. The PMOS transistor P1 is always ON because the ground potential VSS is applied to the gate of the PMOS transistor P1. A clamp potential Vclamp is applied to the gate of the NMOS transistor N1.

The NMOS transistor N1 whose gate receives the clamp potential Vclamp has a function of preventing any high voltage from being applied to the MTJ element MTJ (preventing breakdown of the MTJ element MTJ) in the normal operation, i.e., when the write word line drive signals WS<0> to WS<3> are output from the setting circuit 23A in the write operation.

A Vclamp generation circuit which generates the clamp potential Vclamp can be formed from the circuit as shown in FIG. 46.

A NAND gate circuit ND4 and PMOS transistor P2 are used when setting data which determines the current waveform or the like of the write current is to be written in the MTJ element MTJ.

More specifically, as described above, in this example, the setting data is stored in the MTJ element MTJ semipermanently on the basis of the presence/absence of breakdown of the tunneling barrier. To break the tunneling barrier of the MTJ element MTJ, the PMOS transistor P2 is turned on to apply a high voltage across the MTJ element MTJ.

The program signal PROG changes to "H" in writing setting data. For example, the program signal PROG can be supplied from the data input pin or address pin after assembly. The program signal PROG may be supplied from a dedicated pin.

When setting data should be written in the setting circuit 23A in the row i, all the bits of the address signal for selecting the row i change to "H".

For this reason, in writing the setting data, the value of the output signal from the NAND gate circuit ND4 changes in accordance with the values of the input data D<0> to D<3> in the setting circuit 23A in the row i.

For example, when the input data D<0> is "1" (="H"), the output signal from the NAND gate circuit ND4 is "L". For this reason, the PMOS transistor P2 is turned on to break the tunneling barrier of the MTJ element MTJ, and "1" is stored in the MTJ element MTJ. In this case, the write word line drive signal WS<0> is "H".

When the input data D<0> is "0" (="L"), the output signal from the NAND gate circuit ND4 is "H". For this reason, the PMOS transistor P2 is turned off. The tunneling barrier of the MTJ element MTJ is not broken, and "0" is stored in the MTJ element MTJ. In this case, the write word line drive signal WS<0> is "L".

In this way, setting data can be written in the setting circuit 23A in accordance with the input data D<0> to D<3>, and the values of the write word line drive signals WS<0> to WS<3> are determined.

Figure 75:
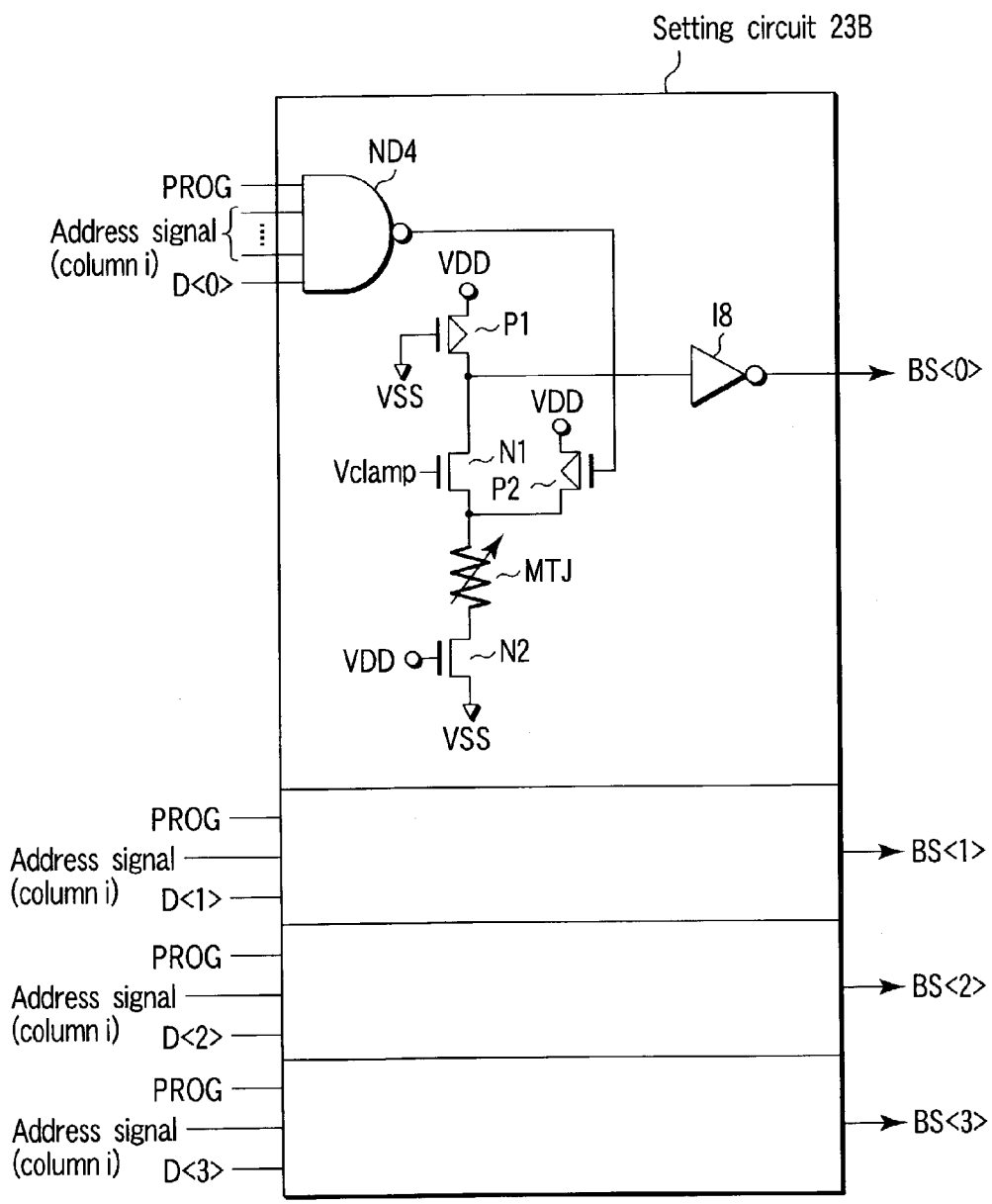
FIG. 75 is a view showing an example of the setting circuit according to Circuit Example 1.

FIG. 75 shows an example of the setting circuit 23B shown in FIG. 69. FIG. 76 shows an example of the setting circuit 23B shown in FIG. 70.

The setting circuits 23B shown in FIGS. 75 and 76 have the same arrangement as that of the setting circuit 23A in FIG. 74 described above. Setting data is stored semipermanently on the basis of the presence/absence of breakdown of the tunneling barrier of the MTJ element MTJ.

The program signal PROG changes to "H" in writing setting data. When setting data should be written in the setting circuit 23B in the column i, all the bits of the address signal for selecting the column i change to "H".

For this reason, in writing the setting data, the value of the output signal from the NAND gate circuit ND4 changes in accordance with the values of the input data D<0> to D<3> in the setting circuit 23B in the column i.

For example, when the input data D<0> is " (="H"), the output signal from the NAND gate circuit ND4 is "L". For this reason, the PMOS transistor P2 is turned on to break the tunneling barrier of the MTJ element MTJ, and "1" is stored in the MTJ element MTJ.

In this case, the write bit line drive signal BS<0> is "H".

When the input data D<0> is "0" (="L"), the output signal from the NAND gate circuit ND4 is "H". For this reason, the PMOS transistor P2 is turned off. The tunneling barrier of the MTJ element MTJ is not broken, and "0" is stored in the MTJ element MTJ.

In this case, the write bit line drive signal BS<0> is "L".

In this way, setting data can be written in the setting circuit 23B in accordance with the input data D<0> to D<3>, and the values of the write bit line drive signals BS<0> to BS<3> in FIG. 75 and the values of the write bit line drive signals BS<4> to BS<7> in FIG. 76 are determined.

The write bit line drive signals BS<0> to BS<3> generated by the setting circuit 23B shown in FIG. 75 drive the write bit line driver/sinker 16A-1 shown in FIG. 67.

The write bit line drive signals BS<4> to BS<7> generated by the setting circuit 23B shown in FIG. 76 drive the write bit line driver/sinker 17A-1 shown in FIG. 67.

In this example, the write bit line drive signals BS<0> to BS<3> which drive the write bit line driver/sinker 16A-1 are different from the write bit line drive signals BS<4> to BS<7> which drive the write bit line driver/sinker 17A-1. However, both the write bit line drivers/sinkers 16A-1 and 17A-1 may be driven by the write bit line drive signals BS<0> to BS<3>.

viii. Current Waveform Example

Figure 77:
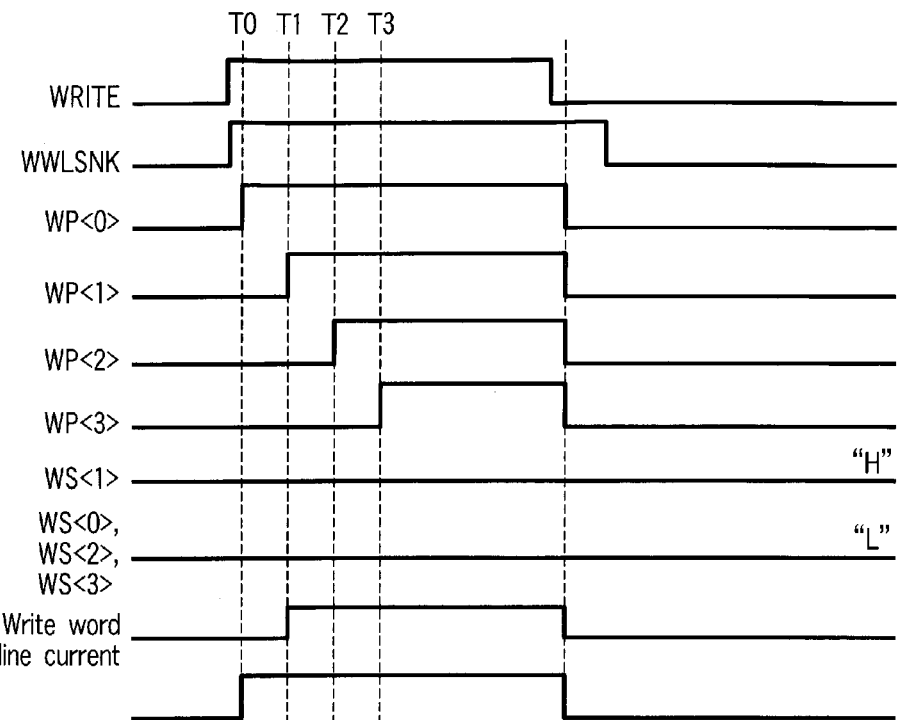
FIG. 77 is a waveform chart showing an example of MRAM operation according to Circuit Example 1.

FIG. 77 shows an example of the current waveform of the write word line current which can be implemented by Circuit Example 1 shown in FIGS. 65 to 76.

The waveform example assumes that the delay circuits W0 to W3 in the write word line driver/sinker trigger circuit 25 shown in FIG. 71 have different delay times, and the setting circuit 23A shown in FIG. 74 outputs WS<0>, WS<2>, WS<3>="L" and WS<1>="H".

In this case, after the write signal WRITE changes from "L" to "H", WP<1>="H" and WS<1>="H" at time T1. As a result, the output signal from the NAND gate circuit NDWP1 in the row decoder & write word line driver 14-1 shown in FIG. 66 is "L", and a write current flows to the write word line WWLi.

In this waveform example, the supply/cutoff timing of the write word line current is controlled.

However, when the waveforms (rise/fall timings and pulse widths) of the write word line drive signals WP<0> to WP<3> can freely be set, as will be described later, the supply/cutoff timing, magnitude, and temporal change (current waveform) of the write word line current can freely be changed in accordance with the values of the write word line drive signals WS<0> to WS<3> based on the setting data.

Figure 78:
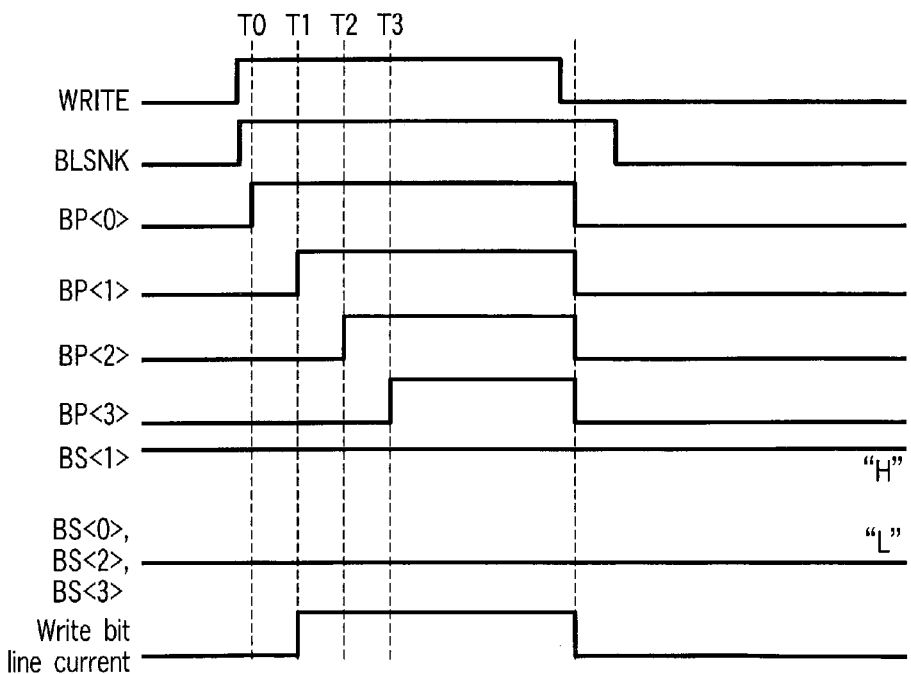
FIG. 78 is a waveform chart showing an example of MRAM operation according to Circuit Example 1.

FIG. 78 shows an example of the current waveform of the write bit line current which can be implemented by Circuit Example 1 shown in FIGS. 65 to 76.

The waveform example assumes that the write data DATA="1" (="H"), the delay circuits B0 to B3 in the write bit line driver/sinker trigger circuit 26 shown in FIG. 72 have different delay times, and the setting circuit 23B shown in FIG. 75 outputs BS<0>, BS<2>, BS<3>="L" and BS<1>="H".

When the write data DATA is "0" (="L"), the write bit line driver/sinker trigger circuit 26 shown in FIG. 73 and the setting circuit 23B shown in FIG. 70 are validated.

In this case, after the write signal WRITE changes from "L" to "H", BP<1>="H" and BS<1>="H" at time T1. As a result, the output signal from the NAND gate circuit NDBP1 in the column decoder & write bit line driver/sinker 16A-1 shown in FIG. 677 is "L", and a write current flows to the write bit line WBLi.

In this waveform example, the supply/cutoff timing of the write bit line current is controlled.

However, when the waveforms (rise/fall timings and pulse widths) of the write bit line drive signals BP<0> to BP<3> can freely be set, as will be described later, the supply/cutoff timing, magnitude, and temporal change (current waveform) of the write bit line current can freely be changed in accordance with the values of the write bit line drive signals BS<0> to BS<3> based on the setting data.

ix. Conclusion

As described above, according to Circuit Example 1 of the magnetic random access memory, the supply/cutoff timing, magnitude, and temporal change (current waveform) of the write current for the write word/bit line can be set for each write word/bit line by programming. With this arrangement, for example, the write principles of the first to 10th embodiments can be implemented. The magnetization of the storing layer of an MTJ element can reliably be inverted. The write characteristics can be improved.

In Circuit Example 1, the direction of the current flowing to the write bit line changes in accordance with the value of write data. In Circuit Example 1, the supply/cutoff timing, magnitude, and temporal change (current waveform) of the write current can be individually set for each direction (depending on write data) of the write bit line current.

More specifically, when write data is "1" (="H"), the supply/cutoff timing, magnitude, and temporal change (current waveform) of the write bit line current are controlled by the write bit line drive signals BP<0> to BP<3>. When write data is "0" (="L"), the supply/cutoff timing, magnitude, and temporal change (current waveform) of the write bit line current are controlled by the write bit line drive signals BP<4> to BP<7>.

As described above, in Circuit Example 1, the shape of the write current can be set for each write word/bit line. In addition, the shape of the write current can be individually set in accordance with the direction of the write current flowing to the write bit line in consideration of the characteristics or the like of the MTJ element. Hence, the magnetization of the storing layer of an MTJ element can reliably be inverted, and the write characteristics can be improved.

② CIRCUIT EXAMPLE 2

Circuit Example 2 is a modification obtained by partially modifying Circuit Example 1. Circuit Example 2 is related to a magnetic random access memory which can set the supply/cutoff timing, magnitude, and temporal change (current waveform) of a write current for a write word/bit line for each write word/bit line by programming.

As compared to Circuit Example 1, Circuit Example 2 has its characteristic feature in the arrangements of a write word line driver/sinker trigger circuit and write bit line driver/sinker trigger circuit.

More specifically, Circuit Example 2 has the same overall arrangement as in Circuit Example 1 shown in FIG. 65. The circuit shown in FIG. 66 can directly be used as a row decoder & write word line driver/sinker. The circuit shown in FIG. 68 can directly be used as the block arrangement of a write current waveform control circuit/setting circuit which determines the current waveform of the write word line current.

The circuit shown in FIG. 67 can directly be used as a column decoder & write bit line driver/sinker. The circuit shown in FIGS. 69 and 70 can directly be used as the block arrangement of a write current waveform control circuit/setting circuit which determines the current waveform of the write bit line current.

The circuit shown in FIGS. 74 to 76 can directly be used as a setting circuit in the write current waveform control circuit/setting circuit.

In Circuit Example 2, to increase the number of patterns of the current waveform of the write word/bit line current, a waveform generation circuit is arranged in the write word/bit line driver/sinker trigger circuit. Write word/bit line drive signals WP<0> to WP<3> and BP<0> to BP<7> are generated by the waveform generation circuit.

i. Write Word Line Driver/Sinker Trigger Circuit

Figure 79:
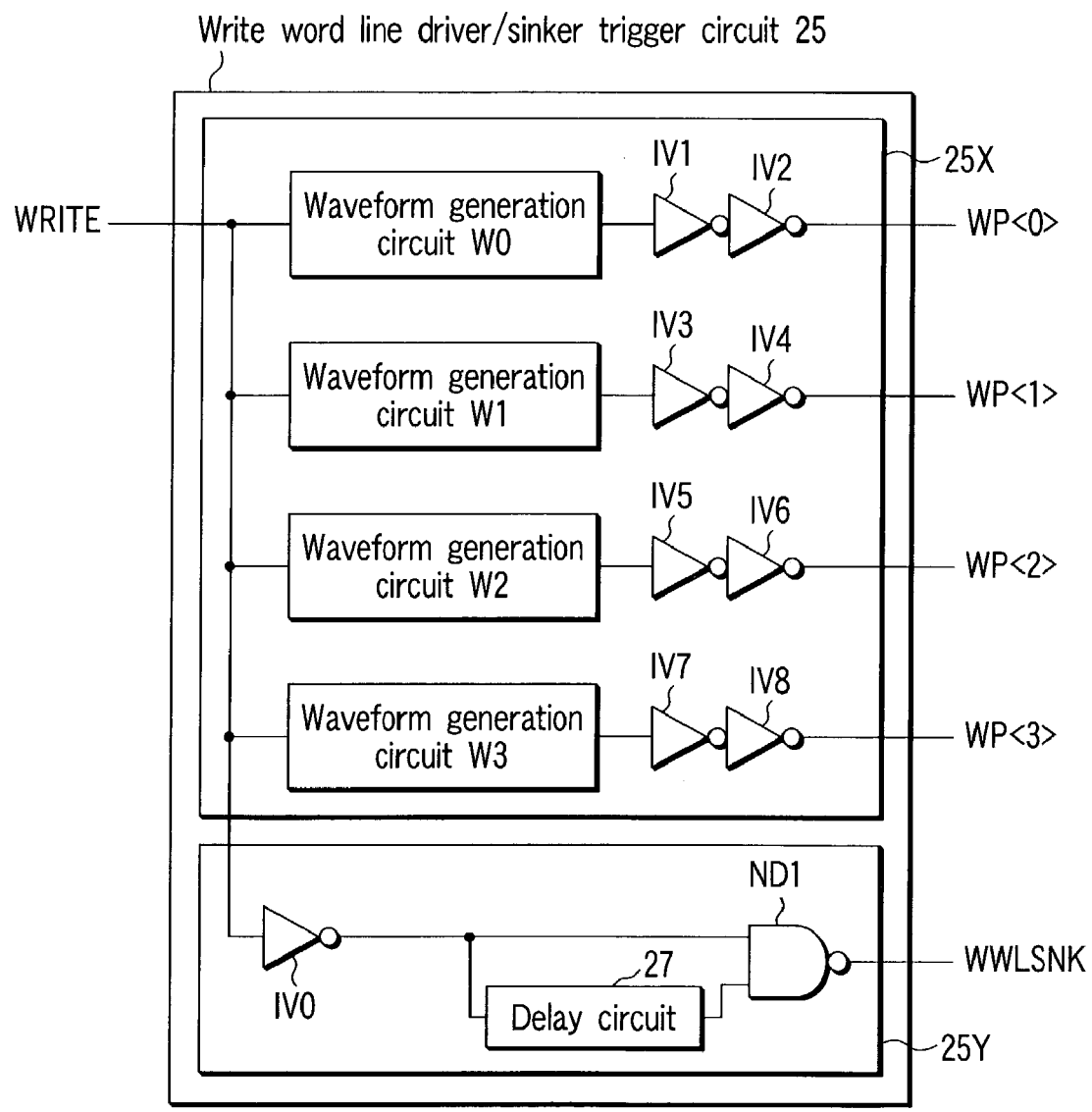
FIG. 79 is a view showing an example of a write word line driver/sinker trigger circuit according to Circuit Example 2.

FIG. 79 shows an example of the write word line driver/sinker trigger circuit.

A write word line driver/sinker trigger circuit 25 is formed from a current supply/cutoff timing determining circuit 25X which generates the write word line drive signals WP<0> to WP<3> serving as a base which determines the current supply/cutoff timing, magnitude, and temporal change (current waveform) of the write current, and a current absorption timing determining circuit 25Y which determines the current absorption timing of the write current.

In accordance with timing to change a write signal WRITE to "H" or "L", the current supply/cutoff timing determining circuit 25X determines the timing to change the write word line drive signals WP<0> to WP<3> to "H" or "L". The current supply/cutoff timing determining circuit 25X is formed from a plurality of (in this example, four) waveform generation circuits W0 to W3 and inverters IV1 to IV8.

The waveform generation circuits W0 to W3 generate the write word line drive signals WP<0> to WP<3>, respectively, on the basis of the write signal WRITE.

Each of the waveform generation circuits W0 to W3 can be formed from the circuit shown in FIG. 54. In this case, since the waveform generation circuits W0 to W3 themselves can select one of a plurality of waveforms, the waveforms of the write word line drive signals WP<0> to WP<3> can be selected from a number of waveform patterns. As a result, the current waveform of the write word line current can freely be set.

Each of the waveform generation circuits W0 to W3 outputs only one specified waveform. However, the waveforms, i.e., the waveforms of the write word line drive signals WP<0> to WP<3> may be different. These waveforms may be selected by write word line drive signals WS<0> to WS<3>.

The circuit example of the waveform generation circuits W0 to W3 in this case will be described later.

In this example, the four waveform generation circuits W0 to W3 are used. However, as the number of waveform generation circuits increases, the waveform of the write current supplied to a write word line WWLi can finely be controlled, as a matter of course.

The current absorption timing determining circuit 25Y is formed from an inverter IV0, NAND gate circuit ND1, and delay circuit 27.

When the write signal WRITE changes to "H", the current absorption timing determining circuit 25Y almost simultaneously changes a write word line sink signal WWLSNK to "H". After the write signal WRITE changes to "L", and a delay time which is determined by the delay circuit 27 elapses, the current absorption timing determining circuit 25Y changes the write word line sink signal WWLSNK to "L".

When the write signal WRITE is changed to "L", and then the write word line sink signal WWLSNK is changed to "L" after a predetermined interval, the potential of the write word line WWLi can be completely set to 0V after the write operation.

ii. Write Bit Line Driver/Sinker Trigger Circuit

FIG. 80 shows an example of the write bit line driver/sinker trigger circuit shown in FIG. 69.

A write bit line driver/sinker trigger circuit 26 is formed from a current supply/cutoff timing determining circuit 26X which generates the write bit line drive signals BP<0> to BP<3> serving as a base which determines the current supply/cutoff timing, magnitude, and temporal change (current waveform) of the write current, and a current absorption timing determining circuit 26Y which determines the current absorption timing of the write current.

In accordance with the timing to change the write signal WRITE to "H" or "L", the current supply/cutoff timing determining circuit 26X determines the timing to change the write bit line drive signals BP<0> to BP<3> to "H" or "L". The current supply/cutoff timing determining circuit 26X is formed from a plurality of (in this example, four) delay circuits B0 to B3 and inverters IV9 to IV16.

The waveform generation circuits B0 to B3 generate the write bit line drive signals BP<0> to BP<3>, respectively, on the basis of the write signal WRITE.

Each of the waveform generation circuits B0 to B3 can be formed from the circuit shown in FIG. 54. In this case, since the waveform generation circuits B0 to B3 themselves can select one of a plurality of waveforms, the waveforms of the write bit line drive signals BP<0> to BP<3> can be selected from a number of waveform patterns. As a result, the current waveform of the write bit line current can freely be set.

Each of the waveform generation circuits B0 to B3 outputs only one specified waveform. However, the waveforms, i.e., the waveforms of the write bit line drive signals BP<0> to BP<3> may be different. These waveforms may be selected by write word bit drive signals BS<0> to BS<3>.

The circuit example of the waveform generation circuits B0 to B3 in this case will be described later.

In this example, the four delay circuits B0 to B3 are used. However, as the number of waveform generation circuits increases, the waveform of the write current supplied to a write bit line WBLi can finely be controlled, as a matter of course.

The current absorption timing determining circuit 26Y is formed from the inverter IV0, NAND gate circuit ND2, and delay circuit 28.

When the write signal WRITE changes to "H", the current absorption timing determining circuit 26Y almost simultaneously changes the write bit line sink signal WBLSNK to "H". After the write signal WRITE changes to "L", and a delay time which is determined by the delay circuit 28 elapses, the current absorption timing determining circuit 26Y changes the write bit line sink signal WBLSNK to "L".

When the write signal WRITE is changed to "L", and then the write bit line sink signal WBLSNK is changed to "L" after a predetermined interval, the potential of the write bit line WBLi can be completely set to 0V after the write operation.

Figure 81:
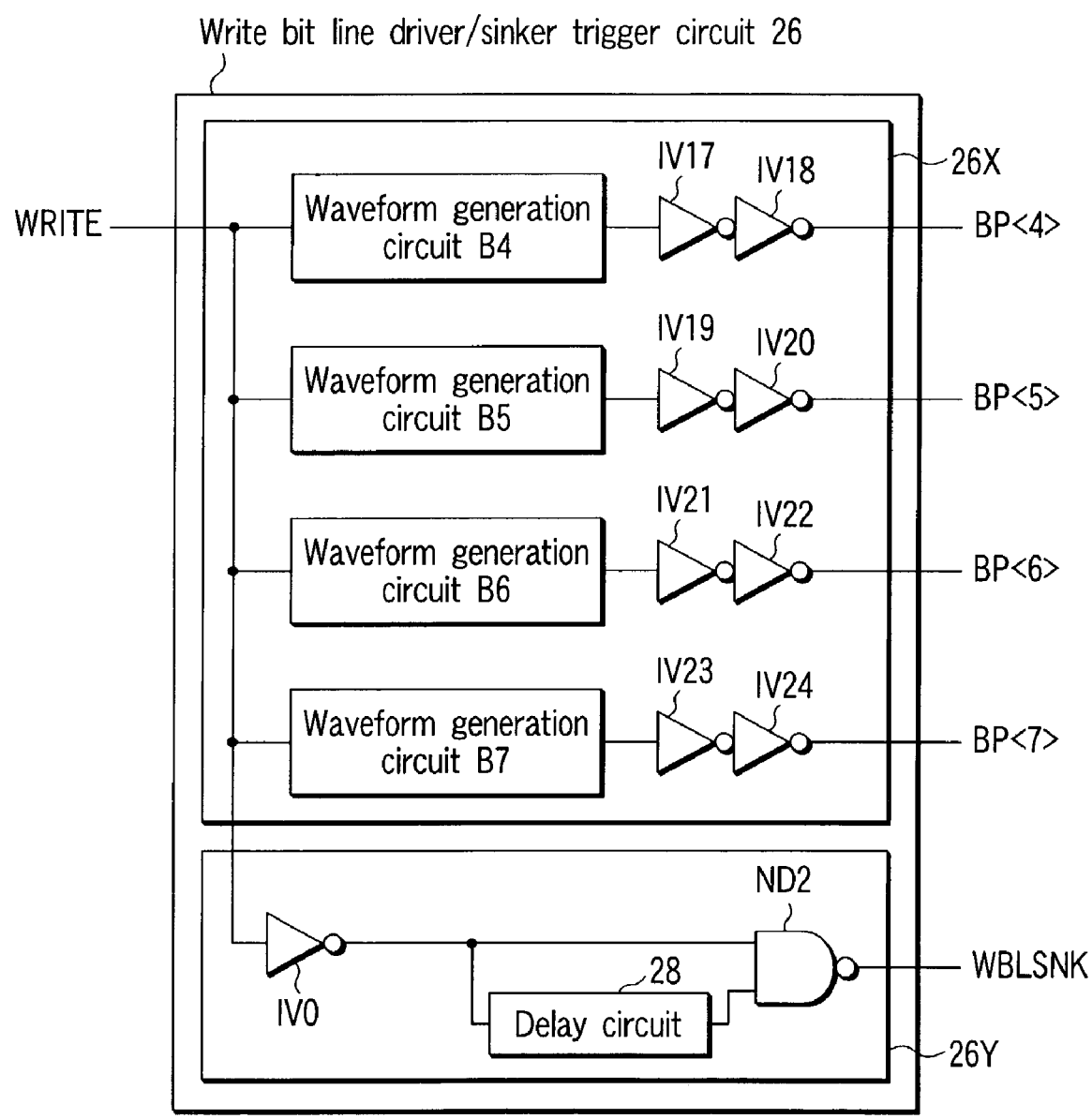
FIG. 81 is a view showing an example of the write bit line driver/sinker trigger circuit according to Circuit Example 2.

FIG. 81 shows an example of the write bit line driver/sinker trigger circuit shown in FIG. 70.

The write bit line driver/sinker trigger circuit 26 is formed from the current supply/cutoff timing determining circuit 26X which generates the write bit line drive signals BP<4> to BP<7> serving as a base which determines the current supply/cutoff timing, magnitude, and temporal change (current waveform) of the write current, and the current absorption timing determining circuit 26Y which determines the current absorption timing of the write current.

In accordance with the timing to change the write signal WRITE to "H" or "L", the current supply/cutoff timing determining circuit 26X determines the timing to change the write bit line drive signals BP<4> to BP<7> to "H" or "L". The current supply/cutoff timing determining circuit 26X is formed from a plurality of (in this example, four) delay circuits B4 to B7 and inverters IV17 to IV24.

The waveform generation circuits B4 to B7 generate the write bit line drive signals BP<4> to BP<7>, respectively, on the basis of the write signal WRITE.

Each of the waveform generation circuits B4 to B7 can be formed from the circuit shown in FIG. 54. In this case, since the waveform generation circuits B4 to B7 themselves can select one of a plurality of waveforms, the waveforms of the write bit line drive signals BP<4> to BP<7> can be selected from a number of waveform patterns. As a result, the current waveform of the write bit line current can freely be set.

Each of the waveform generation circuits B4 to B7 outputs only one specified waveform. However, the waveforms, i.e., the waveforms of the write bit line drive signals BP<4> to BP<7> may be different. These waveforms may be selected by write word bit drive signals BS<4> to BS<7>.

The circuit example of the waveform generation circuits B4 to B7 in this case will be described later.

In this example, the four delay circuits B4 to B7 are used. However, as the number of waveform generation circuits increases, the waveform of the write current supplied to the write bit line WBLi can finely be controlled, as a matter of course.

The current absorption timing determining circuit 26Y is formed from the inverter IV0, NAND gate circuit ND2, and delay circuit 28.

When the write signal WRITE changes to "H", the current absorption timing determining circuit 26Y almost simultaneously changes the write bit line sink signal WBLSNK to "H". After the write signal WRITE changes to "L", and a delay time which is determined by the delay circuit 28 elapses, the current absorption timing determining circuit 26Y changes the write bit line sink signal WBLSNK to "L".

When the write signal WRITE is changed to "L", and then the write bit line sink signal WBLSNK is changed to "L" after a predetermined interval, the potential of the write bit line WBLi can be completely set to 0V after the write operation.

The write bit line drive signals BP<0> to BP<3> and write bit line sink signal WBLSNK generated by the write bit line driver/sinker trigger circuit 26 shown in FIG. 80 drive a write bit line driver/sinker 16A-1 shown in FIG. 67.

The write bit line drive signals BP<4> to BP<7> and write bit line sink signal WBLSNK generated by the write bit line driver/sinker trigger circuit 26 shown in FIG. 81 drive a write bit line driver/sinker 17A-1 shown in FIG. 67.

In this example, the write bit line drive signals BP<0> to BP<3> which drive the write bit line driver/sinker 16A-1 are different from the write bit line drive signals BP<4> to BP<7> which drive the write bit line driver/sinker 17A-1. However, both the write bit line drivers/sinkers 16A-1 and 17A-1 may be driven by the write bit line drive signals BP<0> to BP<3>.

iii. Waveform Generation Circuit

An example of each of waveform generation circuits Wi (i=0, 1, 2, 3) and Bj (j=0, 1, ..., 7) in the write word/bit line driver/sinker trigger circuits 25 and 26 shown in FIGS. 79 to 81 will be described next.

FIGS. 82 to 89 show the waveform generation circuits and their operation waveforms.

Figure 82:
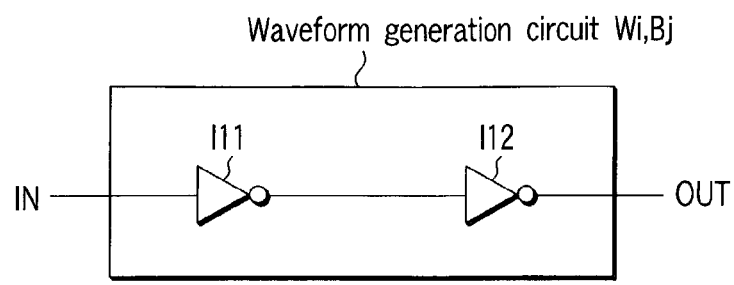
FIG. 82 is a view showing an example of a waveform generation circuit used in Circuit Example 2.
Figure 83:
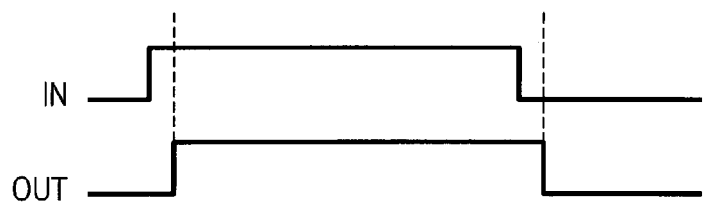
FIG. 83 is a waveform chart showing the operation waveforms of the waveform generation circuit shown in FIG. 82.

A waveform generation circuit shown in FIG. 82 is formed from inverters I11 and I12. This waveform generation circuit simply serves as a delay circuit which delays the write signal WRITE by a predetermined time. FIG. 83 shows the operation waveform of this circuit.

Figure 84:
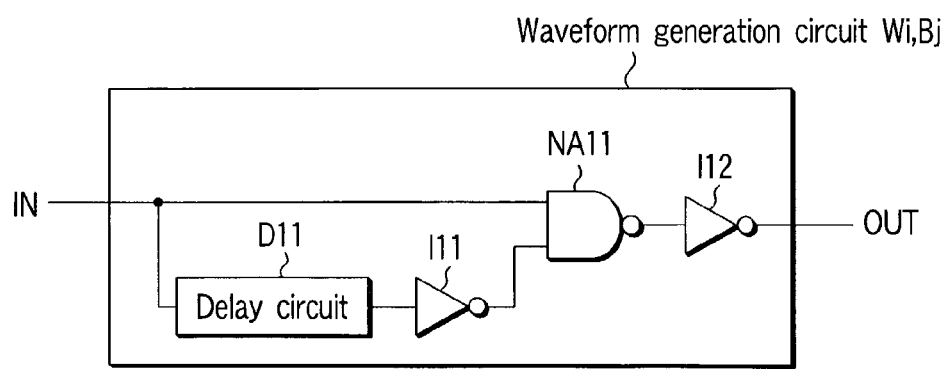
FIG. 84 is a view showing an example of the waveform generation circuit used in Circuit Example 2.

A waveform generation circuit shown in FIG. 84 is formed from the inverters I11 and I12, NAND gate circuit NA11, and delay circuit D11. When an input signal IN, i.e., the write signal WRITE changes to "H", the waveform generation circuit generates a pulse signal having a predetermined pulse width and outputs it as write word/bit line drive signals WP<i> and BP<i>.

Figure 85:
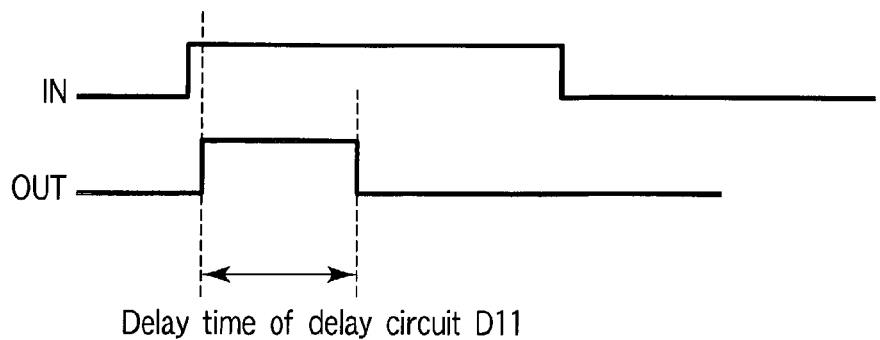
FIG. 85 is a waveform chart showing the operation waveforms of the waveform generation circuit shown in FIG. 84.

The pulse width of the pulse signal is determined by the delay time of the delay circuit D11. FIG. 85 shows the operation waveform of this circuit.

Figure 86:
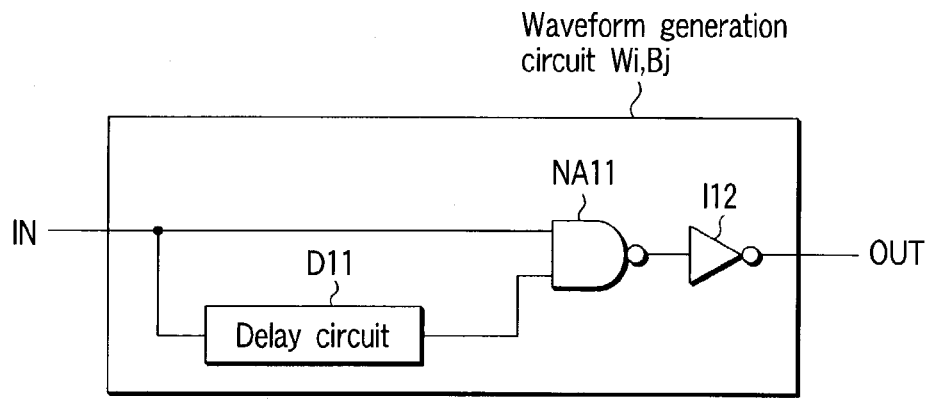
FIG. 86 is a view showing an example of the waveform generation circuit used in Circuit Example 2.

A waveform generation circuit shown in FIG. 86 is formed from the inverter I12, NAND gate circuit NA11, and delay circuit D11. When the input signal IN, i.e., the write signal WRITE changes to "H", the waveform generation circuit generates a pulse signal having a predetermined pulse width and outputs it as the write word/bit line drive signals WP<i> and BP<i>.

Figure 87:
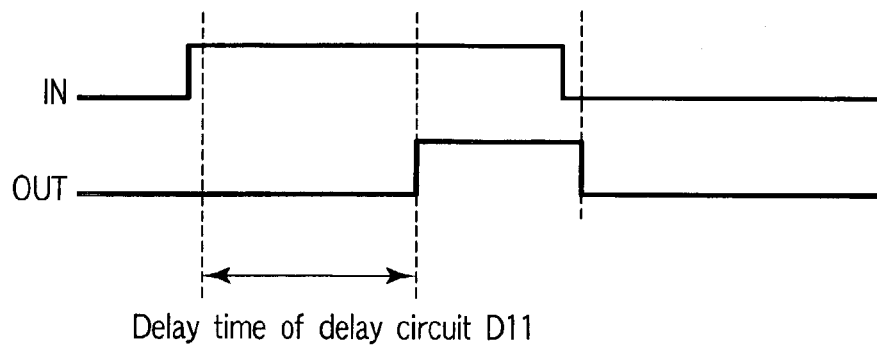
FIG. 87 is a waveform chart showing the operation waveforms of the waveform generation circuit shown in FIG. 86.

The pulse width of the pulse signal is determined by the delay time of the delay circuit D11. FIG. 87 shows the operation waveform of this circuit. This waveform generation circuit can be used as, e.g., a waveform generation circuit Wi or Bj shown in FIGS. 71 to 73. In this case, the waveform charts shown in FIGS. 77 and 78 can be implemented.

Figure 88:
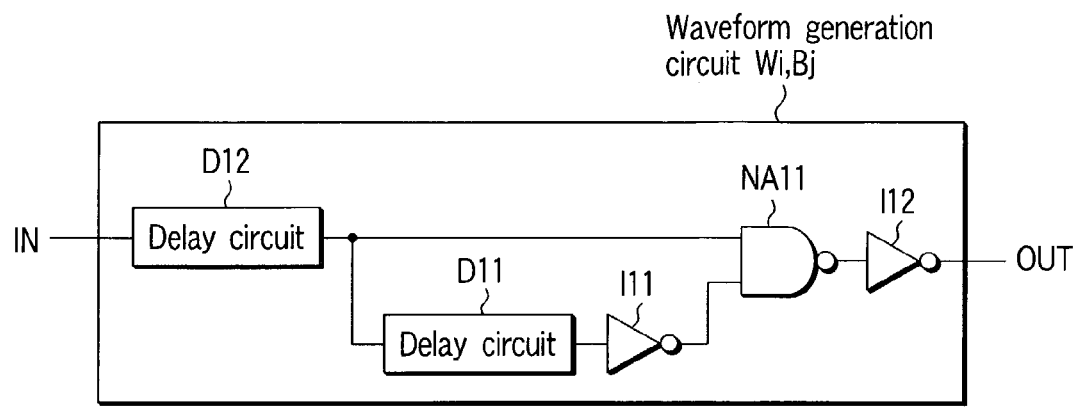
FIG. 88 is a view showing an example of the waveform generation circuit used in Circuit Example 2.

A waveform generation circuit shown in FIG. 88 is formed from the inverters I11 and I12, NAND gate circuit NA11, and delay circuits D11 and D12. When the input signal IN, i.e., the write signal WRITE changes to "H", and a predetermined time elapses, the waveform generation circuit generates a pulse signal having a predetermined pulse width. The pulse signal is output as the write word/bit line drive signals WP<i> and BP<i>.

Figure 89:
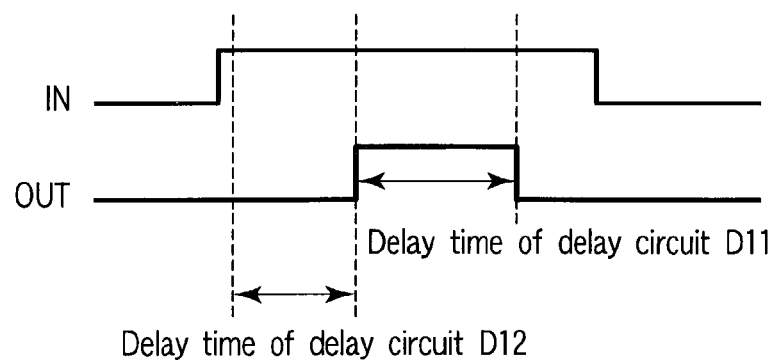
FIG. 89 is a waveform chart showing the operation waveforms of the waveform generation circuit shown in FIG. 88.

The timing to generate the pulse signal, i.e., the timing to change the write word/bit line drive signals WP<i> and BP<i> to "H" is determined by the delay time of the delay circuit D12. The pulse width of the pulse signal is determined by the delay time of the delay circuit D11. FIG. 89 shows the operation waveforms.

As described above, when the write word/bit line driver is formed using the waveform generation circuits Wi and Bj shown in FIG. 82, 84, 86, or 88, the write word/bit line drive signals WP<i> and BP<i> can easily be generated.

iv. Current Waveform Example

FIG. 90 shows an example of the current waveform of the write word line current which can be implemented by Circuit Example 2 (FIGS. 65 to 70, 74 to 76, 79 to 82, 84, 86, and 88).

The waveform example assumes that the waveform generation circuits W0 to W3 in the write word line driver/sinker trigger circuit 25 shown in FIG. 79 respectively output the write word line drive signals WP<0> to WP<3> having waveforms as shown in FIG. 90. For example, the write word line drive signals WP<0> and WP<2> can be implemented by the waveform generation circuit shown in FIG. 84. The write word line drive signal WP<1> can be implemented by the waveform generation circuit shown in FIG. 82. The write word line drive signal WP<3> can be implemented by the waveform generation circuit shown in FIG. 88.

In addition, assume that the setting circuit 23A shown in FIG. 74 stores setting data with which the write word line drive signals WS<0> and WS<2> change to "H", and the write word line drive signals WS<1> and WS<3> change to "L".

In this case, when the write signal WRITE changes from "L" to "H", WP<0>="H", WS<0>="H", WP<2>="H", and WS<2>="H". The output signals from the NAND gate circuits NDWP0 and NDWP2 in a row decoder & write word line driver 14-1 shown in FIG. 66 are "L".

After that, WP<0>="L", WP<2>="H", and WS<2>="H". Hence, only the output signal from the NAND gate circuit NDWP2 in the row decoder & write word line driver 14-1 changes to "L".

With this operation, a write word line current as shown in FIG. 90 can be supplied to the write word line WWLi.

FIG. 91 shows an example of the current waveform of the write bit line current which can be implemented by Circuit Example 2 (FIGS. 65 to 70, 74 to 76, 79 to 82, and 84).

The waveform example assumes that the waveform generation circuits B0 to B3 in the write bit line driver/sinker trigger circuit 26 shown in FIG. 80 respectively output the write bit line drive signals BP<0> to BP<3> having waveforms as shown in FIG. 91. For example, the write bit line drive signals BP<0>, BP<2>, and BP<3> can be implemented by the waveform generation circuit shown in FIG. 88. The write bit line drive signal BP<1> can be implemented by the waveform generation circuit shown in FIG. 82.

In addition, assume that the setting circuit 23B shown in FIG. 75 stores setting data with which the write bit line drive signals BS<0> and BS<2> change to "H", and the write bit line drive signals BS<1> and BS<3> change to "L".

Furthermore, assume that the write data DATA is "1" (="H"). When the write data DATA is "0" (="L"), the write bit line driver/sinker trigger circuit 26 show in FIG. 81 and the setting circuit 23B shown in FIG. 70 are validated.

In this case, when the write signal WRITE changes from "L" to "H", and a predetermined time elapses, BP<2>="H" and BS<2>="H". The output signal from the NAND gate circuit NDBP2 in a column decoder & write bit line driver/sinker 16A-1 shown in FIG. 67 is "L".

After that, BP<0>="H" and BS<0>="H". Since BP<2>="H" and BS<2>="H" are maintained, the output signals from the NAND gate circuits NDBP0 and NDBP2 in the column decoder & write bit line driver/sinker 16A-1 change to "L".

With this operation, a write bit line current as shown in FIG. 91 can be supplied to the write bit line WBLi.

v. Conclusion

As described above, according to Circuit Example 2 of the magnetic random access memory, the supply/cutoff timing, magnitude, and temporal change (current waveform) of the write current for the write word/bit line can be set for each write word/bit line by programming. With this arrangement, for example, the write principles of the first to 10th embodiments can be implemented. The magnetization of the storing layer of an MTJ element can reliably be inverted. The write characteristics can be improved.

In Circuit Example 2, the write word/bit line drive signals WP<0> to WP<3> and BP<0> to BP<7> are generated by the waveform generation circuits in the write word/bit line driver/sinker trigger circuit. For this reason, the current waveform of the write word/bit line current can freely be set.

In Circuit Example 2, the supply/cutoff timing, magnitude, and temporal change (current waveform) of the write current can be individually set for each direction (depending on write data) of the write bit line current, as in Circuit Example 1.

As described above, in Circuit Example 2, the shape of the write current can be set for each write word/bit line. In addition, the shape of the write current can be individually set in accordance with the direction of the write current flowing to the write bit line in consideration of the characteristics or the like of the MTJ element. Hence, the magnetization of the storing layer of an MTJ element can reliably be inverted, and the write characteristics can be improved.

③ CIRCUIT EXAMPLE 3

Circuit Example 3 is a modification obtained by partially modifying Circuit Examples 1 and 2. Circuit Example 3 is related to a magnetic random access memory which can set the supply/cutoff timing, magnitude, and temporal change (current waveform) of a write current for a write word/bit line for each write word/bit line by programming.

As compared to Circuit Examples 1 and 2, Circuit Example 3 has its characteristic feature in the arrangements of a column decoder & write bit line driver/sinker and write bit line driver/sinker trigger circuit.

More specifically, the magnetic random access memory has the same overall arrangement as that shown in FIG. 65. The circuit shown in FIG. 66 can directly be used as a row decoder & write word line driver/sinker.

The circuit shown in FIGS. 68, 71, and 74 can directly be used as a write current waveform control circuit/setting circuit which is used to generate a write word line current. The circuit shown in FIGS. 75 and 76 can directly be used as a setting circuit in the write current waveform control circuit/setting circuit which is used to generate a write bit line current.

In Circuit Example 3, the supply/cutoff timing, magnitude, and temporal change (current waveform) of a write current can be individually set for each direction of the write current, as in Circuit Examples 1 and 2.

In Circuit Example 3, however, write bit line drive signals BP<0> to BP<3> as a base used to determine the write current waveform are supplied to both column decoders & write bit line drivers/sinkers (for one column) 16A-1 and 17A-1, thereby simplifying the circuit.

Even in this case, the waveform of a write bit line current which flows in one direction can be determined using write bit line drive signals BS<0> to BS<3>, and the waveform of a write bit line current which flows in the other direction can be determined using write bit line drive signals BS<4> to BS<7>.

i. Column Decoder & Write Bit Line Driver/Sinker

Figure 92:
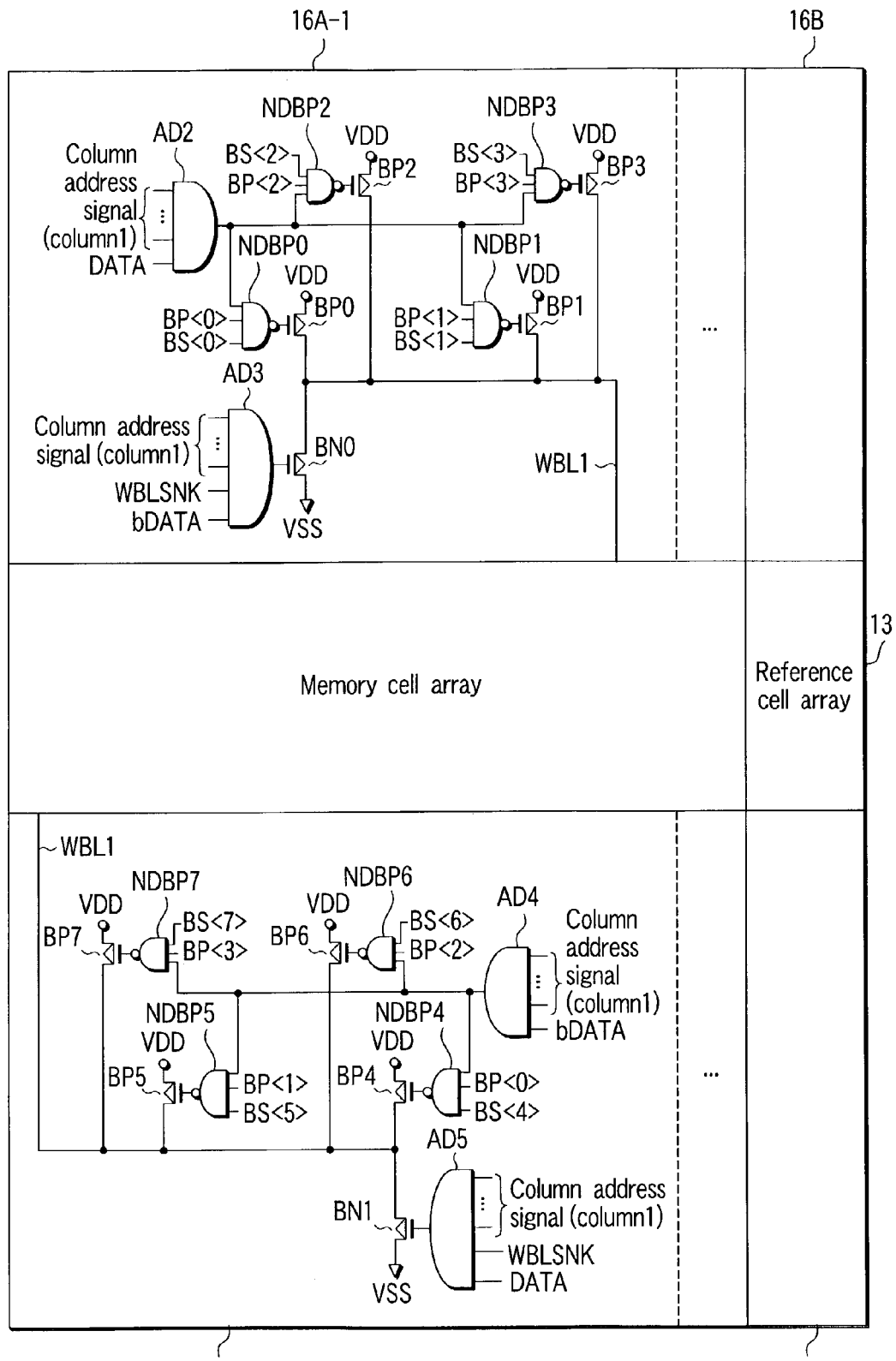
FIG. 92 is a view showing an example of a write bit line driver/sinker according to Circuit Example 3.

FIG. 92 shows a circuit example of the column decoder & write bit line driver/sinker.

The column decoder & write bit line driver/sinker (for one column) 16A-1 is formed from NAND gate circuits NDBP0 to NDBP3, AND gate circuits AD2 and AD3, PMOS transistors BP0 to BP3, and NMOS transistor BN0.

The gate of a PMOS transistor BPi (i=0, 1, 2, 3) is connected to the output terminal of a NAND gate circuit NDBPi, the source is connected to a power supply terminal VDD, and the drain is commonly connected to one end of a write bit line WBLi (i=1, . . . .)

The NAND gate circuit NDBPi (i=0, 1, 2, 3) has three input terminals. Write bit line drive signals (current waveform generation signals) BP<i> and BS<i> are input to two of the three input terminals of the NAND gate circuit NDBPi. The output signal from the AND gate circuit AD2 is input to the remaining input terminal. A column address signal (changes for each row i) formed from a plurality of bits and write data DATA are input to the AND gate circuit AD2.

The gate of the NMOS transistor BN0 is connected to the output terminal of the AND gate circuit AD3, the source is connected to a ground terminal VSS, and the drain is connected to one end of the write bit line WBLi (i=1, . . . .) The column address signal (changes for each column i) formed from a plurality of bits, write bit line sink signal WBLSNK, and an inverted signal bDATA of the write data are input to the AND gate circuit AD3.

The column decoder & write bit line driver/sinker (for one column) 17A-1 is formed from NAND gate circuits NDBP4 to NDBP7, AND gate circuits AD4 and AD5, PMOS transistors BP4 to BP7, and NMOS transistor BN1.

The gate of the PMOS transistor BPi (i=4, 5, 6, 7) is connected to the output terminal of the NAND gate circuit NDBPi, the source is connected to the power supply terminal VDD, and the drain is commonly connected to the other end of the write bit line WBLi (i=1, . . . .)

The NAND gate circuit NDBPi (i=4, 5, 6, 7) has three input terminals. Write bit line drive signals (current waveform generation signals) BP<i'> (i'=0, 1, 2, 3) and BS<i> are input to two of the three input terminals of the NAND gate circuit NDBPi. The output signal from the AND gate circuit AD4 is input to the remaining input terminal. A column address signal (changes for each row i) formed from a plurality of bits and the inverted signal bDATA of the write data are input to the AND gate circuit AD4.

In this example, the write bit line drive signal BP<i'> (i'=0, 1, 2, 3) is input to the NAND gate circuit NDBPi (i=4, 5, 6, 7). That is, both the column decoders & write bit line drivers/sinkers 16A-1 and 17A-1 are controlled by the write bit line drive signal BP<i'>.

The gate of the NMOS transistor BN1 is connected to the output terminal of the AND gate circuit AD5, the source is connected to the ground terminal VSS, and the drain is connected to the other end of the write bit line WBLi (i=1, . . . .) The column address signal (changes for each column i) formed from a plurality of bits, write bit line sink signal WBLSNK, and write data DATA are input to the AND gate circuit AD5.

ii. Write Current Waveform Control Circuit/Setting Circuit

As described above, the circuit shown in FIG. 68 can directly be used as the write current waveform control circuit/setting circuit which generates the write word line drive signals WP<0> to WP<3> and WS<0> to WS<3> and write word line sink signal WWLSNK. An example of the write current waveform control circuit/setting circuit which generates the write bit line drive signals BP<0> to BP<3> and BS<0> to BS<7> and write bit line sink signal WBLSNK will be described here.

Figure 93:
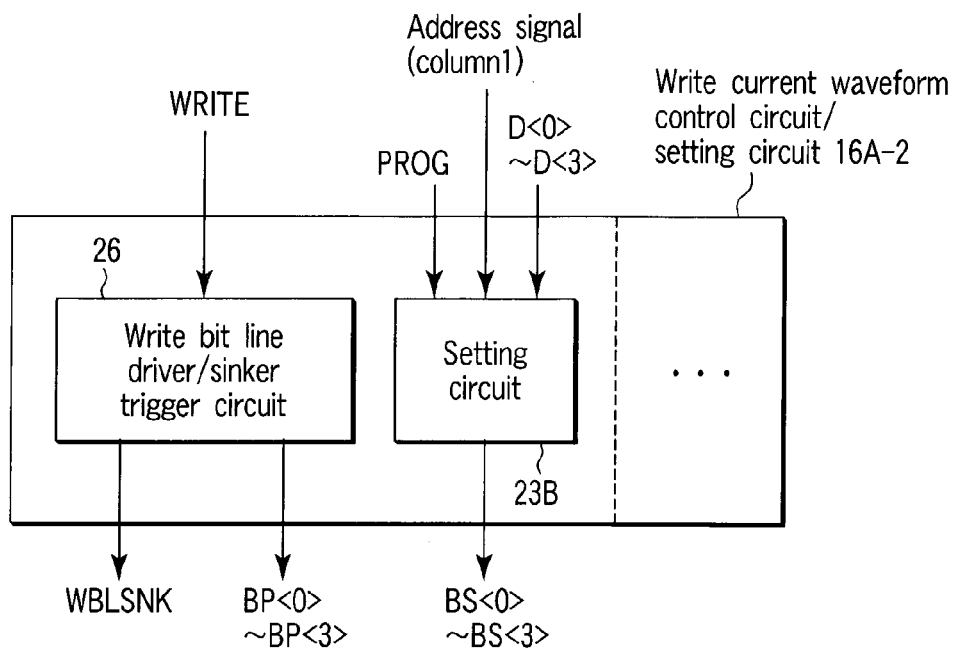
FIG. 93 is a view showing an example of a write current waveform control circuit/setting circuit according to Circuit Example 3.

FIG. 93 shows an example of a write current waveform control circuit/setting circuit 16A-2 in FIG. 65.

FIG. 93 shows the write current waveform control circuit/setting circuit 16A-2 corresponding to only one column. Hence, the actual number of each of the elements (write bit line driver/sinker trigger circuit 26 and setting circuit 23B) shown in FIG. 93 equals the number of columns.

The write current waveform control circuit/setting circuit 16A-2 is formed from the write bit line driver/sinker trigger circuit 26 and setting circuit 23B.

The write bit line driver/sinker trigger circuit 26 generates the write bit line drive signals (current waveform generation signals) BP<0> to BP<3> and write bit line sink signal WBLSNK on the basis of a write signal WRITE.

The setting circuit 23B outputs the write bit line drive signals BS<0> to BS<3> on the basis of setting data. The setting data is programmed in advance in a storage element (fuse element, MTJ element, or the like) in the setting circuit 23B on the basis of a program signal PROG, address signal (column i), and input data D<0> to D<3>.

The setting data can be programmed at any time, e.g., in a wafer state or in a product state after assembly. When the setting data should be programmed after assembly, the setting data can be registered in the setting circuit 23B by inputting the input data D<0> to D<3> from, e.g., a data input pin, address pin, or dedicated pin.

The write signal WRITE changes to "H" in the write operation.

When the write signal WRITE changes to "H", the write bit line driver/sinker trigger circuit 26 changes the write bit line sink signal WBLSNK to "H" and also sets the write bit line drive signals BP<0> to BP<3> to "H" and "L" at, e.g., a predetermined timing.

The setting circuit 23B always outputs the write bit line drive signals BS<0> to BS<3>.

The write bit line drive signals BP<0> to BP<3> are signals as the base of the current waveform of the write bit line current. To the contrary, the write bit line drive signals BS<0> to BS<3> have a function of selecting the write bit line drive signals BP<0> to BP<3> (signals as the base of the current waveform).

More specifically, as is apparent from the structure of the write bit line driver shown in FIG. 92, when a write bit line drive signal BS<i> is "H", a current having a waveform almost equal to that of a write bit line drive signal BP<i> is supplied to the write bit line WBLi.

Figure 94:
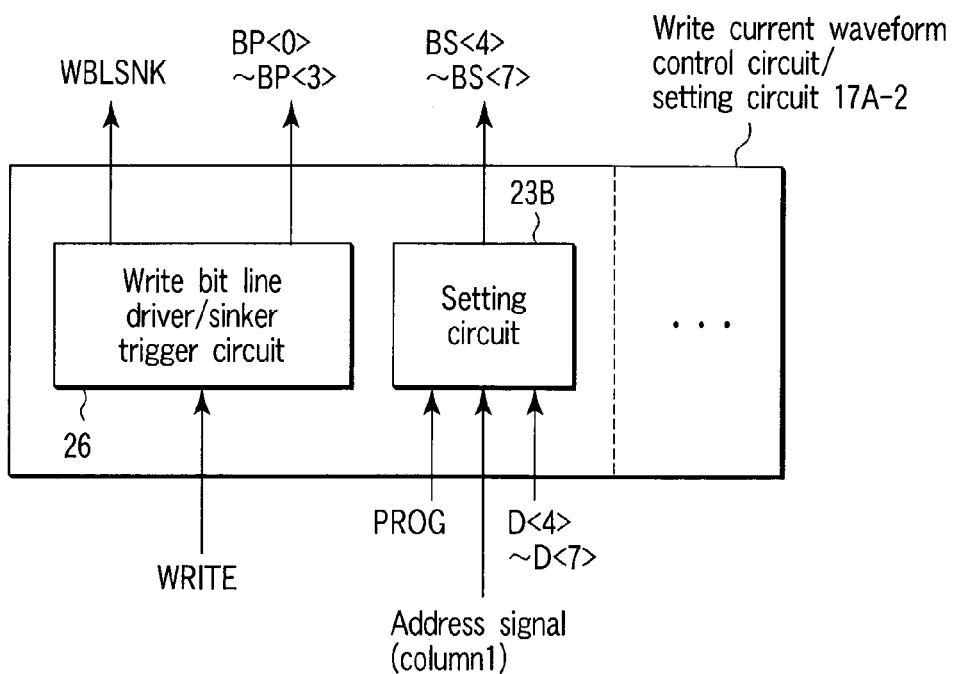
FIG. 94 is a view showing an example of the write current waveform control circuit/setting circuit according to Circuit Example 3.

FIG. 94 shows an example of the write current waveform control circuit/setting circuit 17A-2 in FIG. 65.

FIG. 94 shows the write current waveform control circuit/setting circuit 17A-2 corresponding to only one column. Hence, the actual number of each of the elements (write bit line driver/sinker trigger circuit 26 and setting circuit 23B) shown in FIG. 94 equals the number of columns.

The write current waveform control circuit/setting circuit 17A-2 is formed from the write bit line driver/sinker trigger circuit 26 and setting circuit 23B.

The write bit line driver/sinker trigger circuit 26 generates the write bit line drive signals (current waveform generation signals) BP<0> to BP<3> and write bit line sink signal WBLSNK on the basis of the write signal WRITE.

The setting circuit 23B outputs the write bit line drive signals BS<4> to BS<7> on the basis of setting data. The setting data is programmed in advance in a storage element (fuse element, MTJ element, or the like) in the setting circuit 23B on the basis of the program signal PROG, address signal (column i), and input data D<4> to D<7>.

The setting data can be programmed at any time, e.g., in a wafer state or in a product state after assembly. When the setting data should be programmed after assembly, the setting data can be registered in the setting circuit 23B by inputting the input data D<4> to D<7> from, e.g., a data input pin, address pin, or dedicated pin.

The write signal WRITE changes to "H" in the write operation.

When the write signal WRITE changes to "H", the write bit line driver/sinker trigger circuit 26 changes the write bit line sink signal WBLSNK to "H" and also sets the write bit line drive signals BP<0> to BP<3> to "H" and "L" at, e.g., a predetermined timing.

The setting circuit 23B always outputs the write bit line drive signals BS<4> to BS<7>.

The write bit line drive signals BP<0> to BP<3> are signals as the base of the current waveform of the write bit line current.

Both the write bit line driver/sinker trigger circuit 26 in the write current waveform control circuit/setting circuit 16A-2 shown in FIG. 93 and the write bit line driver/sinker trigger circuit 26 in the write current waveform control circuit/setting circuit 17A-2 shown in FIG. 94 output the write bit line drive signals BP<0> to BP<3>.

That is, the signal as a base to determine the current waveform of the write bit line current is the same independently of the direction (write data) of the write bit line current. Hence, the arrangements of the write current waveform control circuits/setting circuits 16A-2 and 17A-2 can be simplified.

The arrangement of the write bit line driver/sinker trigger circuit 26 in the write current waveform control circuit/setting circuit 16A-2 shown in FIG. 93 is completely the same as that of the write bit line driver/sinker trigger circuit 26 in the write current waveform control circuit/setting circuit 17A-2 shown in FIG. 94. For example, the circuit shown in FIG. 72 can be used as the bit line driver/sinker trigger circuit 26.

Hence, if the layout allows, the write bit line driver/sinker trigger circuit 26 in the write current waveform control circuit/setting circuit 16A-2 shown in FIG. 93 and the write bit line driver/sinker trigger circuit 26 in the write current waveform control circuit/setting circuit 17A-2 shown in FIG. 94 may be integrated.

The write bit line drive signals BS<4> to BS<7> have a function of selecting the write bit line drive signals BP<0> to BP<3> (signals as the base of current waveform) and therefore can implement different current waveforms in accordance with the direction of the write bit line current.

iii. Conclusion

As described above, according to Circuit Example 3 of the magnetic random access memory, the supply/cutoff timing, magnitude, and temporal change (current waveform) of the write current for the write word/bit line can be set for each write word/bit line by programming. With this arrangement, for example, the write principles of the first to 10th embodiments can be implemented. The magnetization of the storing layer of an MTJ element can reliably be inverted. The write characteristics can be improved.

In Circuit Example 3, the supply/cutoff timing, magnitude, and temporal change (current waveform) of the write current can be individually set for each direction (depending on write data) of the write bit line current by the write bit line drive signals BS<0> to BS<7>. In addition, the write bit line drive signals BP<0> to BP<3> are shared independently of the direction of the write bit line current.

Hence, in Circuit Example 3, the arrangement of the write current waveform control circuit/setting circuit can be simplified.

④ CIRCUIT EXAMPLE 4

Circuit Example 4 is a modification obtained by partially modifying Circuit Examples 1 and 2. Circuit Example 3 is related to a magnetic random access memory which can set the supply/cutoff timing, magnitude, and temporal change (current waveform) of a write current for a write word/bit line for each write word/bit line by programming.

As compared to Circuit Examples 1 and 2, Circuit Example 4 has its characteristic feature in the arrangements of a column decoder & write bit line driver/sinker, write bit line driver/sinker trigger circuit, and setting circuit which stores setting data related to a write bit line current.

More specifically, the magnetic random access memory has the same overall arrangement as that shown in FIG. 65. The circuit shown in FIG. 66 can directly be used as a row decoder & write word line driver/sinker. The circuit shown in FIGS. 68, 71, and 74 can directly be used as a write current waveform control circuit/setting circuit which is used to generate a write word line current.

In Circuit Examples 1 and 2, an arrangement capable of individually setting the supply/cutoff timing, magnitude, and temporal change (current waveform) of a write current for each direction of the write bit line current has been proposed. To the contrary, Circuit Example 4 proposes an arrangement in which the supply/cutoff timing, magnitude, and temporal change (current waveform) of the write current can be set for each write word/bit line although they do not change depending on the direction of the write bit line current.

i. Column Decoder & Write Bit Line Driver/Sinker

FIG. 95 shows a circuit example of the column decoder & write bit line driver/sinker.

A column decoder & write bit line driver/sinker (for one column) 16A-1 is formed from NAND gate circuits NDBP0 to NDBP3, AND gate circuits AD2 and AD3, PMOS transistors BP0 to BP3, and NMOS transistor BN0.

The gate of a PMOS transistor BPi (i=0, 1, 2, 3) is connected to the output terminal of a NAND gate circuit NDBPi, the source is connected to a power supply terminal VDD, and the drain is commonly connected to one end of a write bit line WBLi (i=1, . . . .)

The NAND gate circuit NDBPi (i=0, 1, 2, 3) has three input terminals. Write bit line drive signals (current waveform generation signals) BP<i> and BS<i> are input to two of the three input terminals of the NAND gate circuit NDBPi. The output signal from the AND gate circuit AD2 is input to the remaining input terminal. A column address signal (changes for each row i) formed from a plurality of bits and write data DATA are input to the AND gate circuit AD2.

The gate of the NMOS transistor BN0 is connected to the output terminal of the AND gate circuit AD3, the source is connected to a ground terminal VSS, and the drain is connected to one end of the write bit line WBLi (i=1, . . . .) The column address signal (changes for each column i) formed from a plurality of bits, write bit line sink signal WBLSNK, and an inverted signal bDATA of the write data are input to the AND gate circuit AD3.

The column decoder & write bit line driver/sinker (for one column) 17A-1 is formed from NAND gate circuits NDBP4 to NDBP7, AND gate circuits AD4 and AD5, PMOS transistors BP4 to BP7, and NMOS transistor BN1.

The gate of the PMOS transistor BPi (i=4, 5, 6, 7) is connected to the output terminal of the NAND gate circuit NDBPi, the source is connected to the power supply terminal VDD, and the drain is commonly connected to the other end of the write bit line WBLi (i=1, . . . .)

The NAND gate circuit NDBPi (i=4, 5, 6, 7) has three input terminals. Write bit line drive signals (current waveform generation signals) BP<i'> and BS<i'> (i'=0, 1, 2, 3) are input to two of the three input terminals of the NAND gate circuit NDBPi. The output signal from the AND gate circuit AD4 is input to the remaining input terminal. A column address signal (changes for each row i) formed from a plurality of bits and the inverted signal bDATA of the write data are input to the AND gate circuit AD4.

In this example, the write bit line drive signal BP<i'> and BS<i'> (i'=0, 1, 2, 3) is input to the NAND gate circuit NDBPi (i=4, 5, 6, 7). That is, both the column decoders & write bit line drivers/sinkers 16A-1 and 17A-1 are controlled by the write bit line drive signals BP<i'> and BS<i'>.

The gate of the NMOS transistor BN1 is connected to the output terminal of the AND gate circuit AD5, the source is connected to the ground terminal VSS, and the drain is connected to the other end of the write bit line WBLi (i=1, . . . .) The column address signal (changes for each column i) formed from a plurality of bits, write bit line sink signal WBLSNK, and write data DATA are input to the AND gate circuit AD5.

ii. Write Current Waveform Control Circuit/Setting Circuit

As described above, the circuit shown in FIG. 68 can directly be used as the write current waveform control circuit/setting circuit which generates write word line drive signals WP<0> to WP<3> and WS<0> to WS<3> and write word line sink signal WWLSNK. An example of the write current waveform control circuit/setting circuit which generates the write bit line drive signals BP<0> to BP<3> and BS<0> to BS<3> and write bit line sink signal WBLSNK will be described here.

FIG. 96 shows an example of a write current waveform control circuit/setting circuit 16A-2 in FIG. 65.

FIG. 96 shows the write current waveform control circuit/setting circuit 16A-2 corresponding to only one column. Hence, the actual number of each of the elements (write bit line driver/sinker trigger circuit 26 and setting circuit 23B) shown in FIG. 96 equals the number of columns.

The write current waveform control circuit/setting circuit 16A-2 is formed from the write bit line driver/sinker trigger circuit 26 and setting circuit 23B.

The write bit line driver/sinker trigger circuit 26 generates the write bit line drive signals (current waveform generation signals) BP<0> to BP<3> and write bit line sink signal WBLSNK on the basis of a write signal WRITE.

The setting circuit 23B outputs the write bit line drive signals BS<0> to BS<3> on the basis of setting data. The setting data is programmed in advance in a storage element (fuse element, MTJ element, or the like) in the setting circuit 23B on the basis of a program signal PROG, address signal (column i), and input data D<0> to D<3>.

The setting data can be programmed at any time, e.g., in a wafer state or in a product state after assembly. When the setting data should be programmed after assembly, the setting data can be registered in the setting circuit 23B by inputting the input data D<0> to D<3> from, e.g., a data input pin, address pin, or dedicated pin.

The write signal WRITE changes to "H" in the write operation.

When the write signal WRITE changes to "H", the write bit line driver/sinker trigger circuit 26 changes the write bit line sink signal WBLSNK to "H" and also sets the write bit line drive signals BP<0> to BP<3> to "H" and "L" at, e.g., a predetermined timing.

The setting circuit 23B always outputs the write bit line drive signals BS<0> to BS<3>.

The write bit line drive signals BP<0> to BP<3> are signals as the base of the current waveform of the write bit line current. To the contrary, the write bit line drive signals BS<0> to BS<3> have a function of selecting the write bit line drive signals BP<0> to BP<3> (signals as the base of the current waveform).

More specifically, as is apparent from the structure of the write bit line driver shown in FIG. 95, when a write bit line drive signal BS<i> is "H", a current having a waveform almost equal to that of a write bit line drive signal BP<i> is supplied to the write bit line WBLi.

FIG. 97 shows an example of a write current waveform control circuit/setting circuit 17A-2 in FIG. 65.

FIG. 97 shows the write current waveform control circuit/setting circuit 17A-2 corresponding to only one column. Hence, the actual number of each of the elements (write bit line driver/sinker trigger circuit 26 and setting circuit 23B) shown in FIG. 97 equals the number of columns.

The write current waveform control circuit/setting circuit 17A-2 is formed from the write bit line driver/sinker trigger circuit 26 and setting circuit 23B.

The write bit line driver/sinker trigger circuit 26 generates the write bit line drive signals (current waveform generation signals) BP<0> to BP<3> and write bit line sink signal WBLSNK on the basis of the write signal WRITE.

The setting circuit 23B outputs the write bit line drive signals BS<0> to BS<3> on the basis of setting data. The setting data is programmed in advance in a storage element (fuse element, MTJ element, or the like) in the setting circuit 23B on the basis of the program signal PROG, address signal (column i), and input data D<0> to D<3>.

The setting data can be programmed at any time, e.g., in a wafer state or in a product state after assembly. When the setting data should be programmed after assembly, the setting data can be registered in the setting circuit 23B by inputting the input data D<0> to D<3> from, e.g., a data input pin, address pin, or dedicated pin.

The write signal WRITE changes to "H" in the write operation.

When the write signal WRITE changes to "H", the write bit line driver/sinker trigger circuit 26 changes the write bit line sink signal WBLSNK to "H" and also sets the write bit line drive signals BP<0> to BP<3> to "H" and "L" at, e.g., a predetermined timing.

The setting circuit 23B always outputs the write bit line drive signals BS<0> to BS<3>.

The write bit line drive signals BP<0> to BP<3> are signals as the base of the current waveform of the write bit line current. The write bit line drive signals BS<0> to BS<3> have a function of selecting the write bit line drive signals BP<0> to BP<3>.

Both the write current waveform control circuit/setting circuit 16A-2 shown in FIG. 96 and the write current waveform control circuit/setting circuit 17A-2 shown in FIG. 97 output the write bit line drive signals BP<0> to BP<3> and BS<0> to BS<3> and write bit line sink signal WBLSNK. That is, the current waveform of the write bit line current is the same independently of the direction (write data) of the write bit line current.

In addition, the arrangement of the write current waveform control circuit/setting circuit 16A-2 shown in FIG. 96 is completely the same as that of the write current waveform control circuit/setting circuit 17A-2 shown in FIG. 97. For example, the circuit shown in FIG. 72 can be used as the bit line driver/sinker trigger circuit 26, and the circuit shown in FIG. 75 can be used as the setting circuit 23B.

Hence, if the layout allows, the write current waveform control circuit/setting circuit 16A-2 shown in FIG. 96 and the write current waveform control circuit/setting circuit 17A-2 shown in FIG. 97 may be integrated.

iii. Conclusion

As described above, according to Circuit Example 4 of the magnetic random access memory, the supply/cutoff timing, magnitude, and temporal change (current waveform) of the write current for the write word/bit line can be set for each write word/bit line by programming. With this arrangement, for example, the write principles of the first to 10th embodiments can be implemented. The magnetization of the storing layer of an MTJ element can reliably be inverted. The write characteristics can be improved.

In Circuit Example 4, the write bit line drive signals BP<0> to BP<3> and BS<0> to BS<3> are shared independently of the direction (write data) of the write bit line current. For this reason, the arrangement of the write current waveform control circuit/setting circuit can be simplified.

(3) Stacking Memory Cell Arrays

In recent years, to implement highly integrated memory cells (MTJ elements), a number of cell array structures in which a plurality of stages of memory cell arrays are stacked on a semiconductor substrate (chip) have been proposed.

The write principles according to the present invention and circuit schemes which implement them have been described above. They can also be applied to a magnetic random access memory having memory cell arrays stacked in a plurality of stages.

i. Setting for Each Chip or Cell Array

An example in which the current waveform of a write word/bit line current is set for each chip or cell array will be described.

Figure 98:
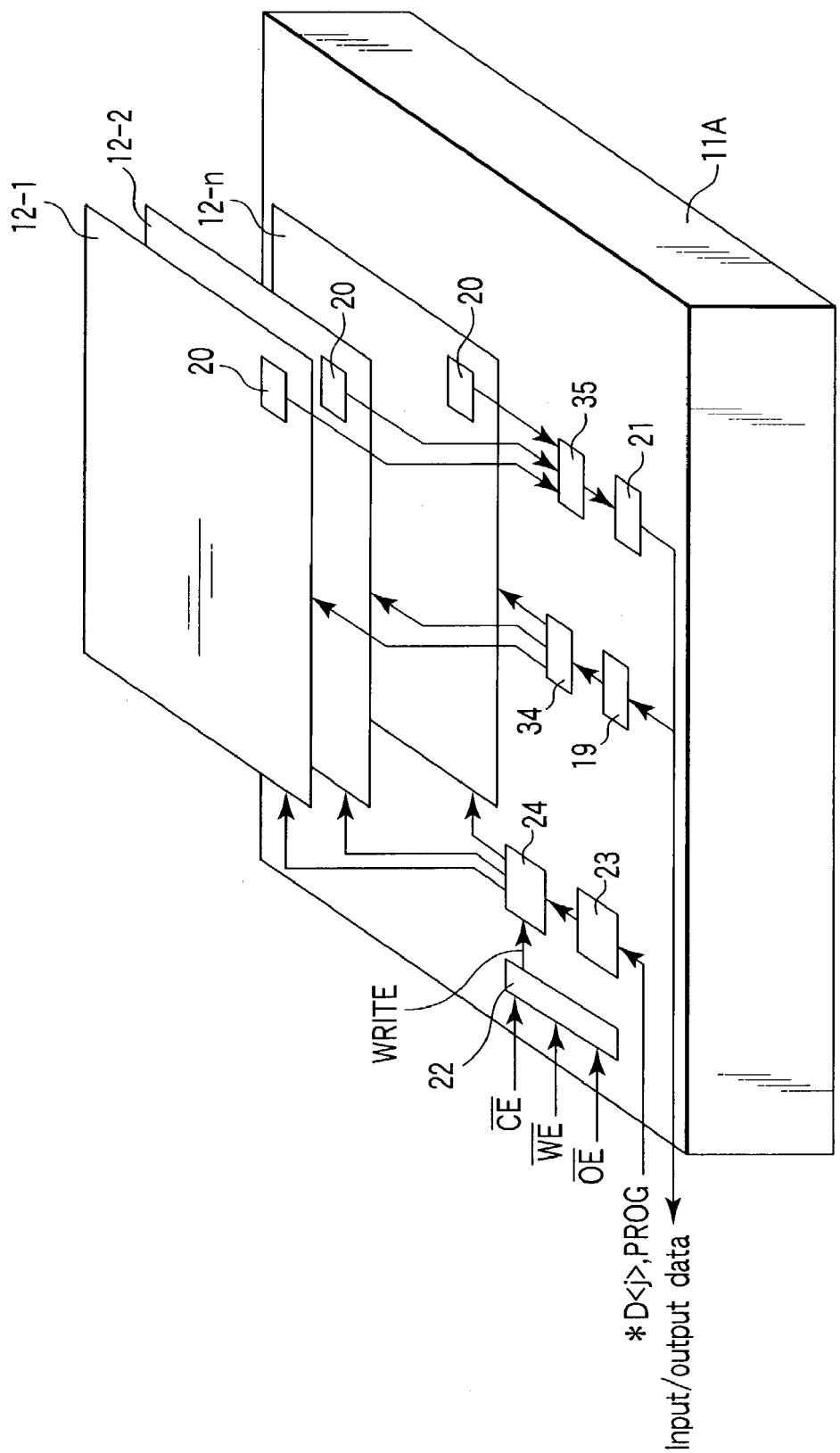
FIG. 98 is a perspective view showing a schematic arrangement in which a circuit scheme according to the present invention is applied to an MRAM having memory cell arrays stacked in a plurality of stages.

FIG. 98 shows the schematic arrangement of a magnetic random access memory having memory cell arrays stacked in a plurality of stages.

This example corresponds to a case wherein above-described Circuit Examples 1 to 3 for "(1) Setting for Each Chip or Cell Array" are applied to the magnetic random access memory having memory cell arrays stacked in a plurality of stages.

Memory cell arrays 12-1, 12-2, . . . , 12-n are stacked in n (n is an integer: n≧2) stages on a semiconductor substrate (magnetic random access memory chip) 11A. Each of the memory cell arrays 12-1, 12-2, . . . , 12-n includes some peripheral circuits, e.g., a row decoder & write word line driver/sinker, column decoder & write bit line driver/sinker, and the like.

Input data is input to a selector 34 through a data input receiver 19. The selector 34 transfers the input data to a selected memory cell array 12-i. A demultiplexer may be used in place of the selector 34.

Output data is transferred from a sense amplifier 20 of a corresponding one of the memory cell arrays 12-1, 12-2, . . . , 12-n to a data output driver 21 through a selector 35. The selector 35 transfers the output data from the sense amplifier 20 of the selected memory cell array 12-i to the data output driver 21. A multiplexer may be used in place of the selector 35.

A setting circuit 23 stores setting data which determines the current waveform of a write word/bit line current. A write current waveform control circuit 24 actually determines the current waveform of the write word/bit line current on the basis of a write signal WRITE from the control circuit 22 and the setting data from the setting circuit 23.

The current waveform may be common to all the memory cell arrays (the current waveform is set for each chip) or may be changed between the memory cell arrays (the current waveform is set for each memory cell array). In the latter case, the setting circuit 23 and write current waveform control circuit 24 are arranged for each memory cell array.

The write current waveform control circuit 24 outputs a write word/bit line drive signal to the memory cell arrays 12-1, 12-2, . . . , 12-n.

ii. Setting for Each Write Word/Bit Line

An example in which the current waveform of a write word/bit line current is set for each write word/bit line will be described.

Figure 99:
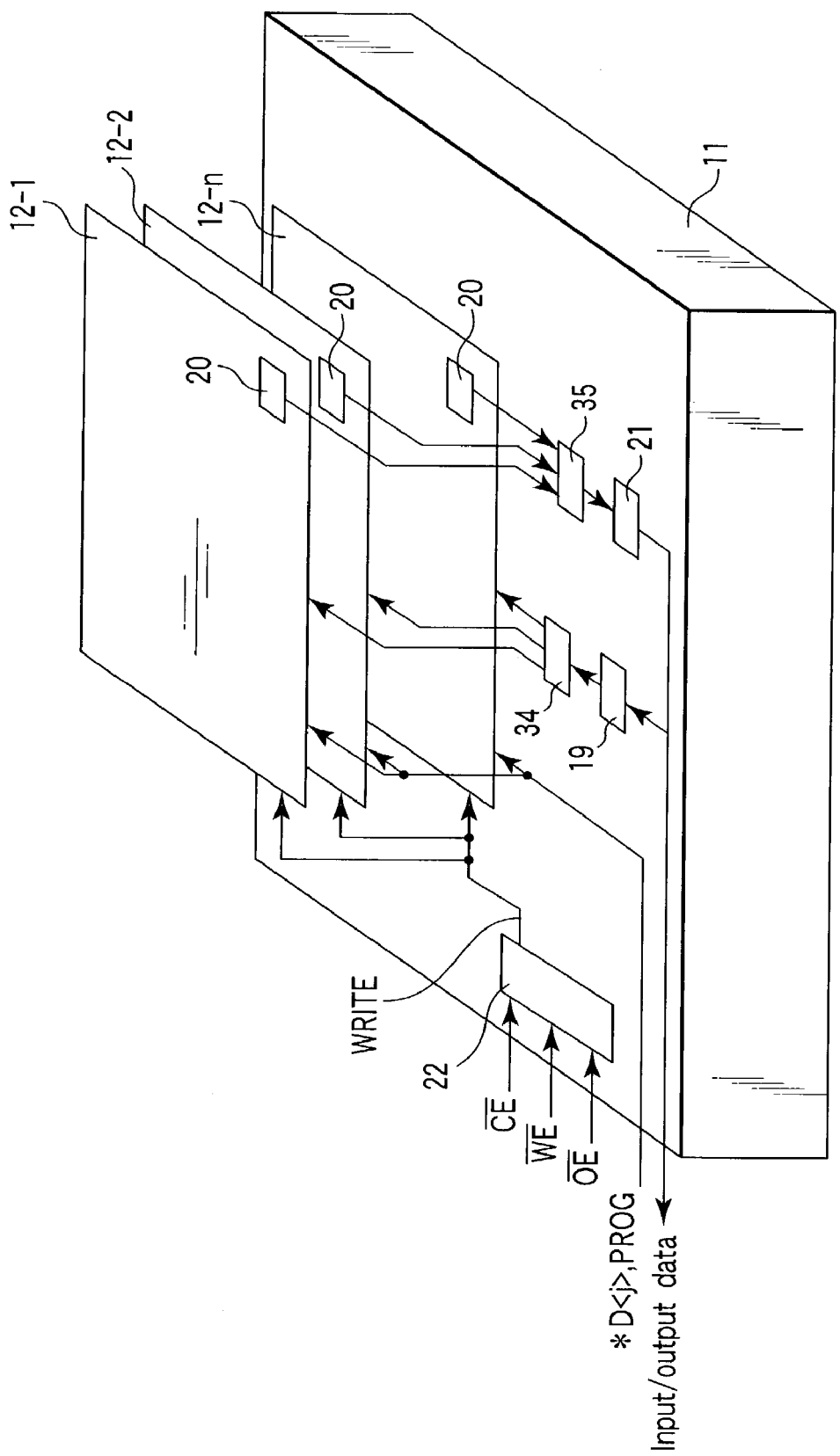
FIG. 99 is a perspective view showing a schematic arrangement in which a circuit scheme according to the present invention is applied to an MRAM having memory cell arrays stacked in a plurality of stages.

FIG. 99 shows the schematic arrangement of a magnetic random access memory having memory cell arrays stacked in a plurality of stages.

This example corresponds to a case wherein above-described Circuit Examples 1 to 4 for "(2) Setting for Each Write Word/Bit Line" are applied to the magnetic random access memory having memory cell arrays stacked in a plurality of stages.

The memory cell arrays 12-1, 12-2, . . . , 12-n are stacked in n (n is an integer: n≧2) stages on the semiconductor substrate (magnetic random access memory chip) 11A. Each of the memory cell arrays 12-1, 12-2, . . . , 12-n includes some peripheral circuits, e.g., a row decoder & write word line driver/sinker, column decoder & write bit line driver/sinker, and the like.

Input data is input to the selector 34 through the data input receiver 19. The selector 34 transfers the input data to the selected memory cell array 12-i. A demultiplexer may be used in place of the selector 34.

Output data is transferred from the sense amplifier 20 of a corresponding one of the memory cell arrays 12-1, 12-2, . . . , 12-n to the data output driver 21 through the selector 35. The selector 35 transfers the output data from the sense amplifier 20 of the selected memory cell array 12-i to the data output driver 21. A multiplexer may be used in place of the selector 35.

The write signal WRITE from the control circuit 22 is supplied to the memory cell arrays 12-1, 12-2, . . . , 12-n. Each of the memory cell arrays 12-1, 12-2, . . . , 12-n has a write current waveform control circuit/setting circuit.

A setting circuit in the write current waveform control circuit/setting circuit stores setting data which determines the current waveform of a write word/bit line current. The write current waveform control circuit/setting circuit actually determines the current waveform of the write word/bit line current on the basis of the write signal WRITE and setting data.

iii. Conclusion

As described above, the write principles according to the present invention and circuit schemes which implement them can also be applied to a magnetic random access memory having memory cell arrays stacked in a plurality of stages.

Hence, even in the magnetic random access memory having the memory cell arrays stacked in the plurality of stages, the supply/cutoff timing, magnitude, and temporal change (current waveform) of the write current for the write word/bit line can be set for each write word/bit line by programming. The magnetization of the storing layer of an MTJ element can reliably be inverted, and the write characteristics can be improved.

(4) Word Line/Bit Line Driver/Sinker for Ninth Embodiment

In the ninth embodiment, the magnitude of a write word line current and that of a write bit line current are changed in an analog manner to change the direction and intensity of a synthesized magnetic field Hx+Hy in an analog manner.

A row decoder & write word line driver/sinker and column decoder & write bit line driver/sinker which implement the ninth embodiment will be described.

① Row Decoder & Write Word Line Driver/Sinker

FIG. 100 shows a circuit example of a row decoder & write word line driver/sinker.

A row decoder & write word line driver (for one row) 14 is formed from a NAND gate circuit TND1, PMOS transistors TP1 and TPa to TPd, NMOS transistor TNa to TNc, and capacitor CP1.

The gate of the PMOS transistor TP1 is connected to the output terminal of the NAND gate circuit TND1, the source is connected to a power supply terminal VDD through the PMOS transistor TPa, and the drain is connected to one end of a write word line WWLi (i=1, . . . .)

A write word line sinker (for one row) 15 is formed from an NMOS transistor TN1. The source of the NMOS transistor TN1 is connected to a ground terminal VSS, and the drain is connected to the other end of the write word line WWLi (i=1, . . . .)

A row address signal (changes for each row i) formed from a plurality of bits and write word line drive signal WWLDRV are input to the NAND gate circuit TND1. A write word line sink signal WWLSNK is input to the gate of the NMOS transistor TN1.

In the selected row i, all bits of the row address signal change to "H". For this reason, in the selected row i, when the write word line drive signal WWLDRV changes to "H", the PMOS transistor TP1 is turned on. When the write word line sink signal WWLSNK changes to "H", the NMOS transistor TN1 is turned on.

When both the PMOS transistor TP1 and the NMOS transistor TN1 are turned on, the write word line current flows from the row decoder & write word line driver 14 to the write word line sinker 15 through the write word line WWLi.

In this example, the magnitude of the write word line current flowing to the write word line WWLi is determined by a gate potential VPGW of the PMOS transistor TPa. VPGW is the potential of one terminal of the capacitor CP1. This potential changes in an analog manner when both a control signal bWWLCTR and a reset signal RESET change to "L".

More specifically, assume that the control signal bWWLCTR changes to "L" when the reset signal RESET is "L". A constant current i1 is supplied to the capacitor CP1 through current mirror circuits Tna and TNb and current mirror circuits TPb and TPc. As a result, the gate potential VPGW of one terminal of the capacitor CP1 gradually increases, and the write word line current gradually decreases.

According to this row decoder & write word line driver/sinker, when the timings to change the write word line drive signal WWLDRV and write word line sink signal WWLSNK to "H" or "L" are controlled, the timing to supply the write current to the write word line WWLi in the selected row i and the timing to cut off the write current flowing to the write word line WWLi can be controlled.

The magnitude of the write current flowing to the write word line WWLi can be changed in an analog manner by controlling the gate potential VPGW of the PMOS transistor TPa. When the change range of the gate potential VPGW is defined, the magnitude of the write current flowing to the write word line WWLi can be changed accurately in proportion to the value of the gate potential VPGW.

When the write word line driver signal WWLDRV is set to "L", and then, the write word line sink signal WWLSNK is set to "L", the potential of the write word line WWLi after the write operation can be completely set to 0V.

Figure 102:
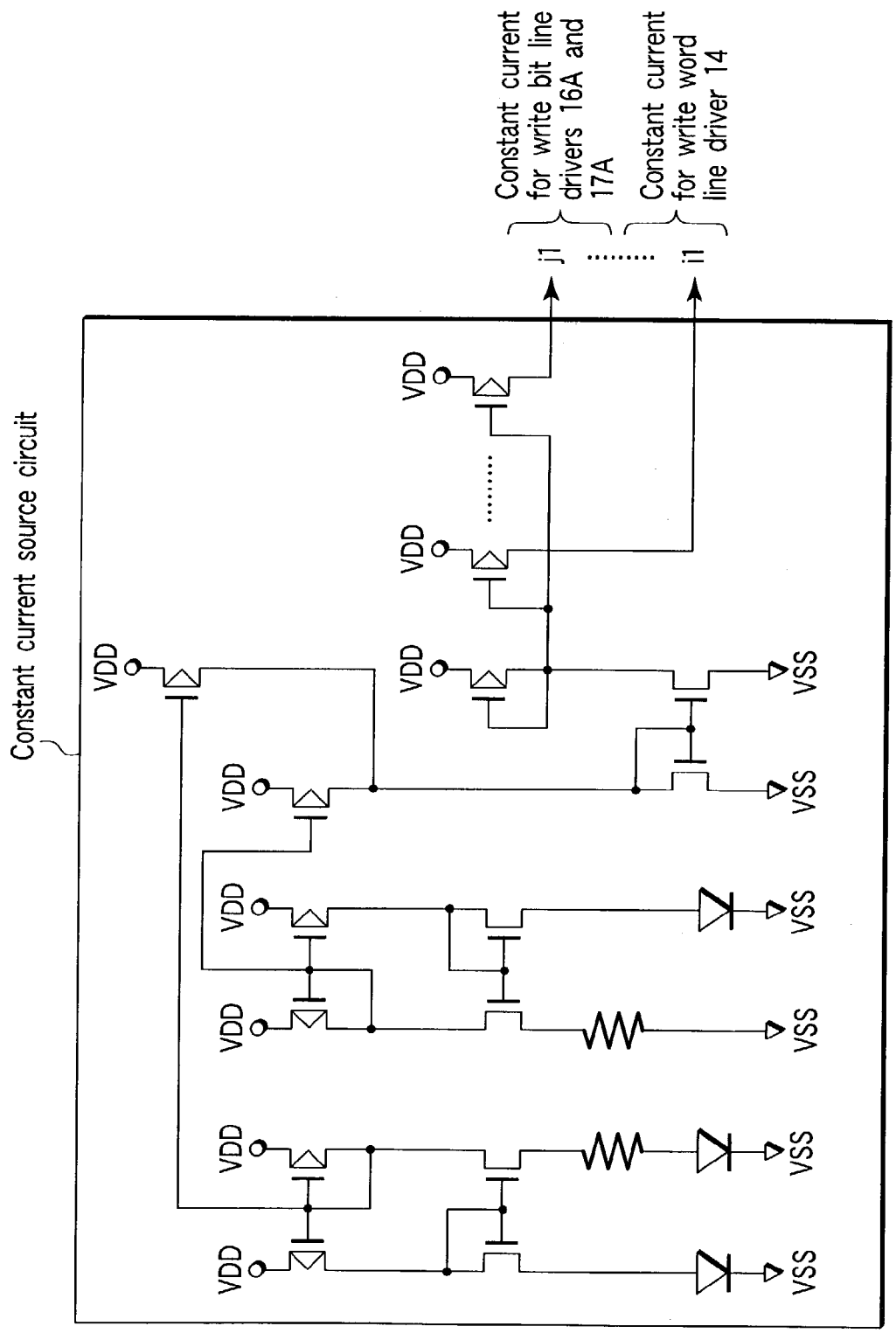
FIG. 102 is a view showing an example of a constant current source circuit.

The constant current i1 is generated by, e.g., a constant current circuit as shown in FIG. 102.

② Column Decoder & Write Bit Line Driver/Sinker

FIG. 101 shows a circuit example of the column decoder & write bit line driver/sinker.

A column decoder & write bit line driver/sinker (for one column) 16A is formed from a NAND gate circuit QND1, AND gate circuit QAD1, PMOS transistors QP1, TPa, and TPb, NMOS transistors QN1, TNa, TNb, and TNd, and capacitor CP2.

The gate of the PMOS transistor QP1 is connected to the output terminal of the NAND gate circuit QND1, the source is connected to the power supply terminal VDD through the PMOS transistor TPa, and the drain is connected to one end of a write bit line WBLi (i=1, . . . .) The gate of the NMOS transistor QN1 is connected to the output terminal of the AND gate circuit QAD1, the source is connected to the ground terminal VSS, and the drain is connected to one end of the write bit line WBLi.

The column decoder & write bit line driver/sinker (for one column) 17A is formed from a NAND gate circuit QND2, AND gate circuit QAD2, PMOS transistors QP2 and TPe, and NMOS transistor QN2.

The gate of the PMOS transistor QP2 is connected to the output terminal of the NAND gate circuit QND2, the source is connected to the power supply terminal VDD through the PMOS transistor TPe, and the drain is connected to the other end of the write bit line WBLi (i=1, . . . .) The gate of the NMOS transistor QN2 is connected to the output terminal of the AND gate circuit QAD2, the source is connected to the ground terminal VSS, and the drain is connected to the other end of the write bit line WBLi.

A column address signal (changes for each column i) formed from a plurality of bits and write bit line drive signal WBLDRV are input to the NAND gate circuits QND1 and QND2. A column address signal (changes for each column i) formed from a plurality of bits and write bit line sink signal WBLSNK are input to the AND gate circuits QAD1 and QAD2.

In addition, write data DATA ("H" or "L") is input to the NAND gate circuit QND1 and AND gate circuit QAD2. An inverted signal bDARA of the write data DATA is input to the NAND gate circuit QND2 and AND gate circuit QAD1.

In a selected column i, all bits of the column address signal change to "H". For this reason, in the selected column i, when the write bit line drive signal WBLDRV and write bit line sink signal WBLSNK change to "H", a write current having a direction corresponding to the value of the write data DATA flows to the write bit line WBLi.

For example, when the write data DATA is "1" (="H"), the PMOS transistor QP1 and NMOS transistor QN2 are turned on. Hence, the write current flows from the column decoder & write bit line driver/sinker 16A to the column decoder & write bit line driver/sinker 17A.

When the write data DATA is "0" (="L"), the PMOS transistor QP2 and NMOS transistor QN1 are turned on. Hence, the write current flows from the column decoder & write bit line driver/sinker 17A to the column decoder & write bit line driver/sinker 16A.

In this example, the magnitude of the write current flowing to the write bit line WBLi is determined by a gate potential VPGB of the PMOS transistors TPa and TPe. VPGB is the potential of one terminal of the capacitor CP2. This potential changes in an analog manner when both a control signal WBLCTR and changes to "H", and the reset signal RESET changes to "L".

More specifically, assume that the control signal WBLCTR changes to "H" when an inverted signal bRESET of the reset signal RESET is "H". A constant current j1 flows to the NMOS transistor TNd through the current mirror circuits TNa and TNb. This current discharges the electric charges of one terminal of the capacitor CP2. As a result, the gate potential VPGB of one terminal of the capacitor CP2 gradually decreases, and the write bit line current gradually increases.

According to this column decoder & write bit line driver/sinker, when the timings to change the write bit line drive signal WBLDRV and write bit line sink signal WBLSNK to "H" or "L" are controlled, the timing to supply the write current to the write bit line WBLi in the selected column i and the timing to cut off the write current flowing to write bit line WBLi can be controlled.

The magnitude of the write current flowing to the write bit line WBLi can be changed in an analog manner by controlling the gate potential VPGW of the PMOS transistors TPa and TPe. When the change range of the gate potential VPGB is defined, the magnitude of the write current flowing to the write bit line WBLi can be changed accurately in proportion to the value of the gate potential VPGB.

When the write bit line drive signal WBLDRV is set to "L", and then, the write bit line sink signal WBLSNK is set to "L", the potential of the write bit line WBLi after the write operation can be completely set to 0V.

The constant current j1 is generated by, e.g., the constant current circuit as shown in FIG. 102.

③ OPERATION WAVEFORM EXAMPLE

FIG. 103 shows operation waveform examples of the write word line driver/sinker shown in FIG. 100 and the write bit line driver/sinker shown in FIG. 101.

When the write word line driver signal WWLDRV and write word line sink signal WWLSNK change to "H", the write word line current flows to the write word line WWLi.

When the reset signal RESET and control signal bWWLCTR change to "L", the capacitor CP1 shown in FIG. 100 is gradually charged. For this reason, the value of the gate potential VPGW gradually increases.

The write word line current also changes in an analog manner in correspondence with the change in gate potential VPGW.

On the other hand, when the write bit line driver signal WBLDRV and write bit line sink signal WBLSNK change to "H", the write bit line current flows to the write bit line WBLi.

When the reset signal RESET changes to "L", and the control signal WBLCTR changes to "H", the electric charges are gradually removed from the capacitor CP2 shown in FIG. 101. For this reason, the value of the gate potential VPGB gradually decreases.

The write bit line current also changes in an analog manner in correspondence with the change in gate potential VPGB.

(5) Word Line/Bit Line Driver/Sinker for 10th Embodiment

In the 10th embodiment, the magnitude of a write word line current and that of a write bit line current are changed in an analog manner, and the direction of a synthesized magnetic field Hx+Hy is changed in an analog manner while keeping a predetermined intensity of the synthesized magnetic field.

A row decoder & write word line driver/sinker and column decoder & write bit line driver/sinker which implement the ninth embodiment will be described.

① Row Decoder & Write Word Line Driver/Sinker

FIG. 104 shows a circuit example of a row decoder & write word line driver/sinker.

A row decoder & write word line driver (for one row) 14 is formed from a NAND gate circuit TND1 and PMOS transistors TP1 and TPa. The gate of the PMOS transistor TP1 is connected to the output terminal of the NAND gate circuit TND1, the source is connected to a power supply terminal VDD through the PMOS transistor TPa, and the drain is connected to one end of a write word line WWLi (i=1, . . . .)

A write word line sinker (for one row) 15 is formed from an NMOS transistor TN1. The source of the NMOS transistor TN1 is connected to a ground terminal VSS, and the drain is connected to the other end of the write word line WWLi (i=1, . . . .)

A row address signal (changes for each row i) formed from a plurality of bits and write word line drive signal WWLDRV are input to the NAND gate circuit TND1. A write word line sink signal WWLSNK is input to the gate of the NMOS transistor TN1.

In the selected row i, all bits of the row address signal change to "H". For this reason, in the selected row i, when the write word line drive signal WWLDRV changes to "H", the PMOS transistor TP1 is turned on. When the write word line sink signal WWLSNK changes to "H", the NMOS transistor TN1 is turned on.

When both the PMOS transistor TP1 and the NMOS transistor TN1 are turned on, the write word line current flows from the row decoder & write word line driver 14 to the write word line sinker 15 through the write word line WWLi.

Figure 106:
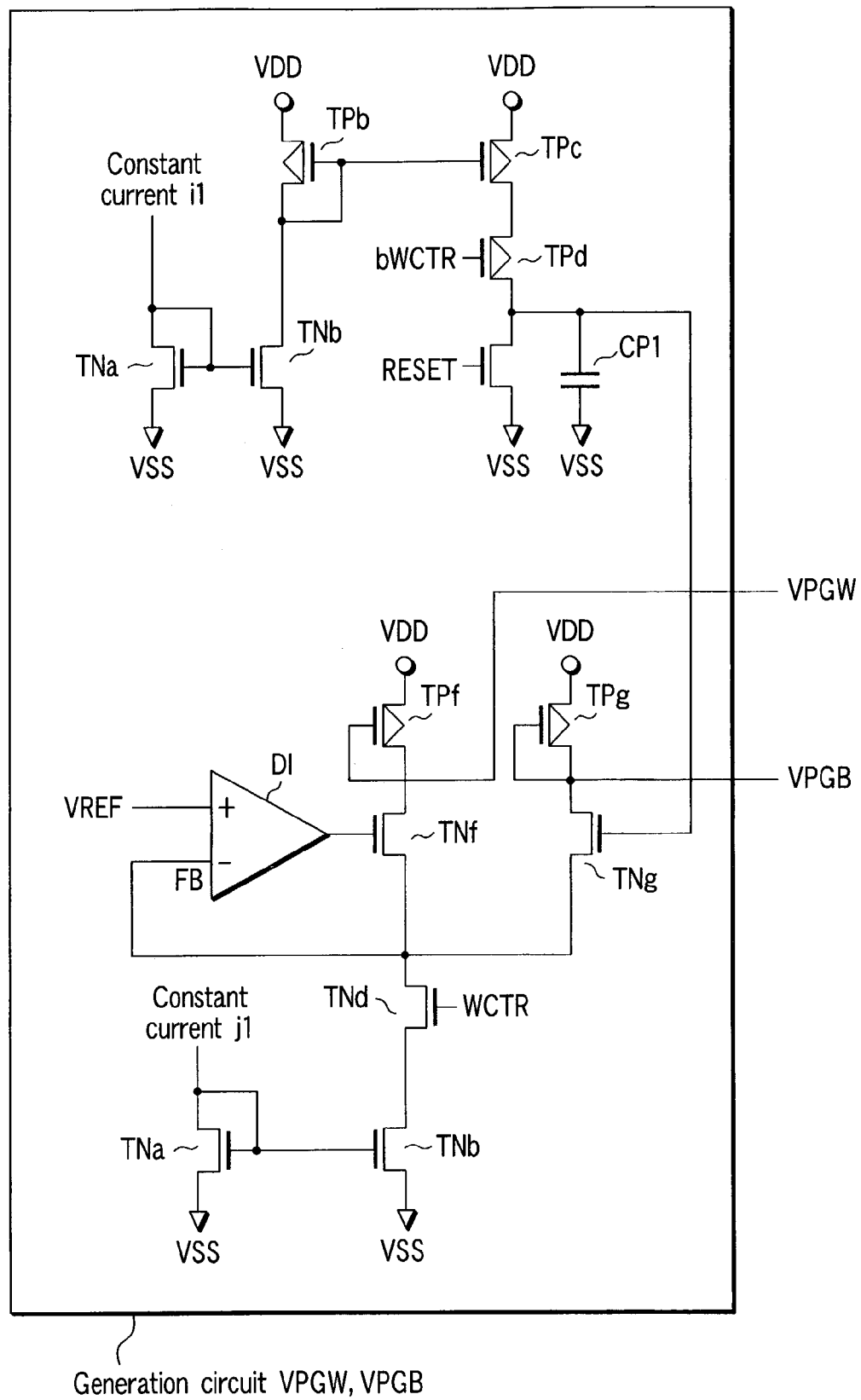
FIG. 106 is a view showing an example of a VPGW/VPGB generation circuit.

In this example, the magnitude of the write word line current flowing to the write word line WWLi is determined by a gate potential VPGW of the PMOS transistor TPa. The potential VPGW is generated by, e.g., a VPGW generation circuit as shown in FIG. 106.

Assume that a control signal bWCTR changes to "L" when a reset signal RESET is "L". A constant current i1 is supplied to the capacitor CP1 through current mirror circuits TNa and TNb and current mirror circuits TPb and TPc. As a result, the gate potential of the NMOS transistor TNg increases.

On the other hand, since a control signal WCRT is "H", a constant current j1 determines the current flowing to the NMOS transistors TNf and TNg. That is, as described above, when a large current flows to the NMOS transistor TNg, and the potential VPGB decreases, the potential of the node FB increases. When the potential of the node FB exceeds the potential VREF increases, the gate potential of the TNf decreases and the potential VPGW increases. As a result, the write word line current gradually decreases.

In this example, the sum of the write word line current and write bit line current is determined by the constant current j1. The constant current i1 determines the value of the write bit line current. That is, the value of the write word line current is obtained by subtracting the value of the write bit line current from the sum of the write word line current and write bit line current.

According to this row decoder & write word line driver/sinker, when the timings to change the write word line drive signal WWLDRV and write word line sink signal WWLSNK to "H" or "L" are controlled, the timing to supply the write current to the write word line WWLi in the selected row i and the timing to cut off the write current flowing to the write word line WWLi can be controlled.

The magnitude of the write current flowing to the write word line WWLi can be changed in an analog manner by controlling the gate potential VPGW of the PMOS transistor TPa. When the change range of the gate potential VPGW is defined, the magnitude of the write current flowing to the write word line WWLi can be changed accurately in proportion to the value of the gate potential VPGW.

When the write word line driver signal WWLDRV is set to "L", and then, the write word line sink signal WWLSNK is set to "L", the potential of the write word line WWLi after the write operation can be completely set to 0V.

Figure 107:
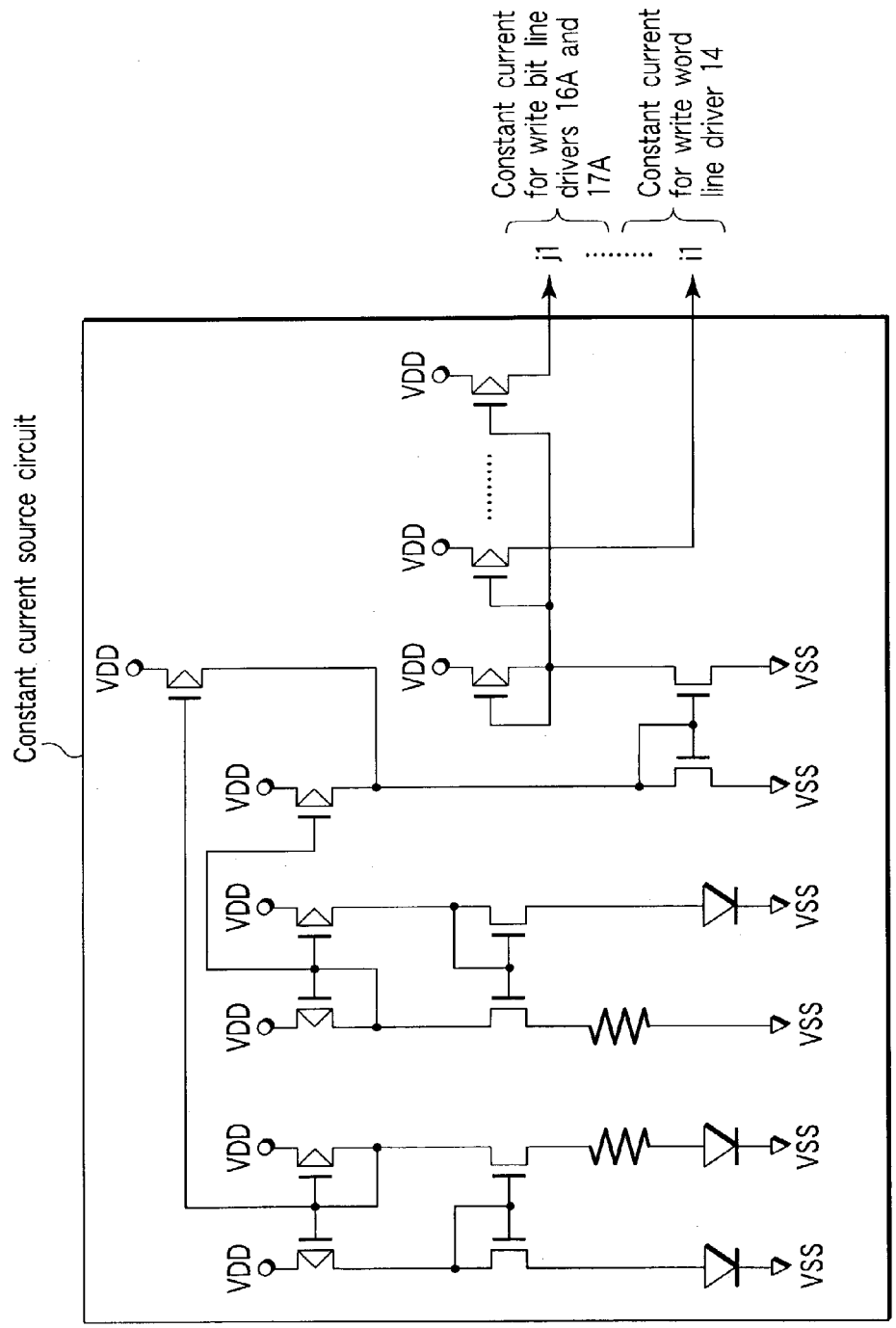
FIG. 107 is a view showing an example of a constant current source circuit.

The constant current i1 is generated by, e.g., a constant current circuit as shown in FIG. 107.

② Column Decoder & Write Bit Line Driver/Sinker

Figure 105:
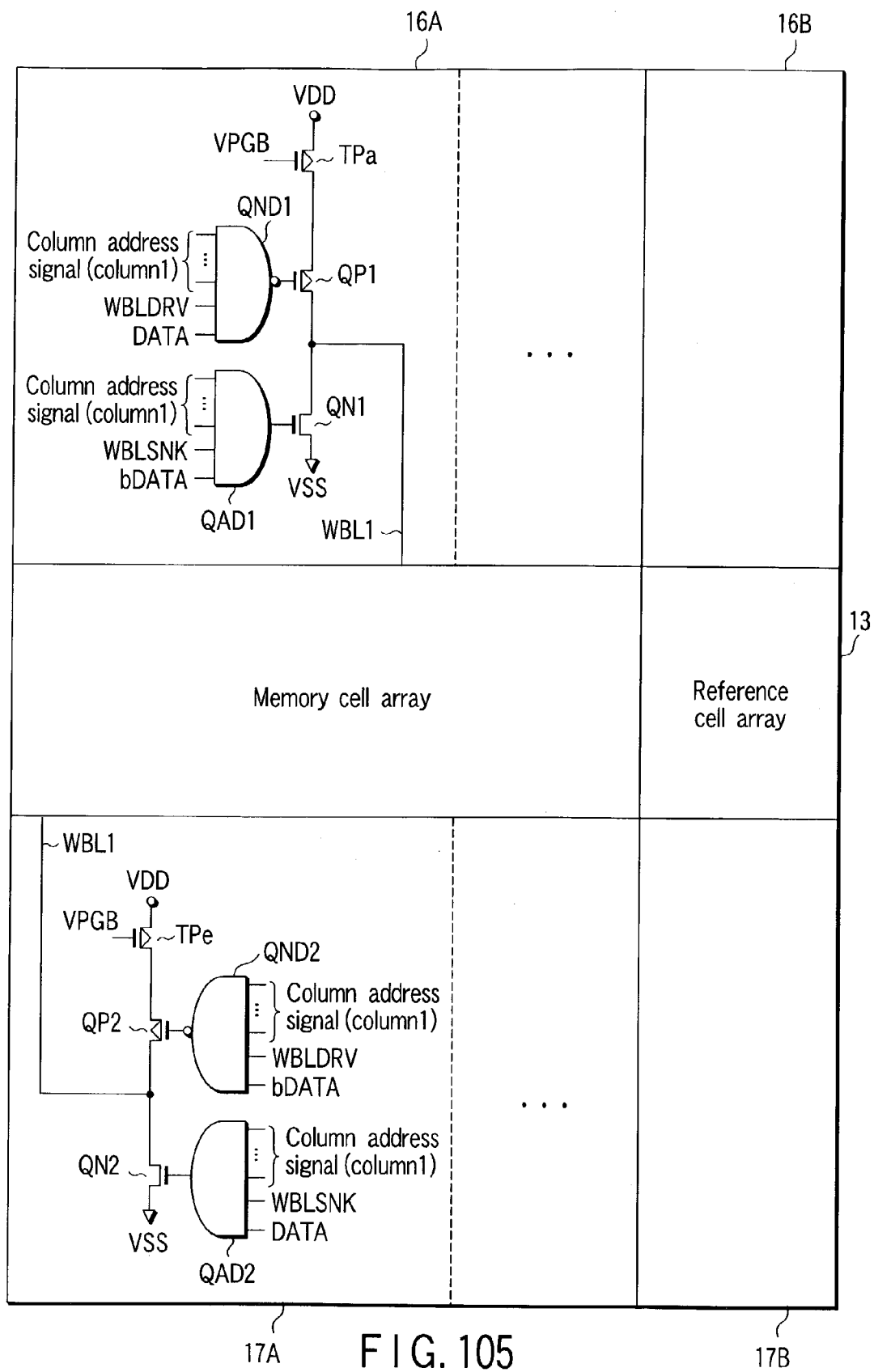
FIG. 105 is a view showing an example of a write bit line driver/sinker applied to the 10th embodiment.

FIG. 105 shows a circuit example of the column decoder & write bit line driver/sinker.

A column decoder & write bit line driver/sinker (for one column) 16A is formed from a NAND gate circuit QND1, AND gate circuit QAD1, PMOS transistors QP1 and TPa, and NMOS transistor QN1.

The gate of the PMOS transistor QP1 is connected to the output terminal of the NAND gate circuit QND1, the source is connected to the power supply terminal VDD through the PMOS transistor TPa, and the drain is connected to one end of a write bit line WBLi (i=1, . . . .) The gate of the NMOS transistor QN1 is connected to the output terminal of the AND gate circuit QAD1, the source is connected to the ground terminal VSS, and the drain is connected to one end of the write bit line WBLi.

The column decoder & write bit line driver/sinker (for one column) 17A is formed from a NAND gate circuit QND2, AND gate circuit QAD2, PMOS transistors QP2 and TPe, and NMOS transistor QN2.

The gate of the PMOS transistor QP2 is connected to the output terminal of the NAND gate circuit QND2, the source is connected to the power supply terminal VDD through the PMOS transistor TPe, and the drain is connected to the other end of the write bit line WBLi (i=1, . . . .) The gate of the NMOS transistor QN2 is connected to the output terminal of the AND gate circuit QAD2, the source is connected to the ground terminal VSS, and the drain is connected to the other end of the write bit line WBLi.

A column address signal (changes for each column i) formed from a plurality of bits and write bit line drive signal WBLDRV are input to the NAND gate circuits QND1 and QND2. A column address signal (changes for each column i) formed from a plurality of bits and write bit line sink signal WBLSNK are input to the AND gate circuits QAD1 and QAD2.

In addition, write data DATA ("H" or "L") is input to the NAND gate circuit QND1 and AND gate circuit QAD2. An inverted signal bDARA of the write data DATA is input to the NAND gate circuit QND2 and AND gate circuit QAD1.

In a selected column i, all bits of the column address signal change to "H". For this reason, in the selected column i, when the write bit line drive signal WBLDRV and write bit line sink signal WBLSNK change to "H", a write current having a direction corresponding to the value of the write data DATA flows to the write bit line WBLi.

For example, when the write data DATA is "1" (="H"), the PMOS transistor QP1 and NMOS transistor QN2 are turned on. Hence, the write current flows from the column decoder & write bit line driver/sinker 16A to the column decoder & write bit line driver/sinker 17A.

When the write data DATA is "0" (="L"), the PMOS transistor QP2 and NMOS transistor QN1 are turned on. Hence, the write current flows from the column decoder & write bit line driver/sinker 17A to the column decoder & write bit line driver/sinker 16A.

In this example, the magnitude of the write bit line current flowing to the write bit line WBLi is determined by a gate potential VPGB of the PMOS transistors TPa and TPe. The potential VPGB is generated by, e.g., a VPGB generation circuit shown in FIG. 106.

According to this column decoder & write bit line driver/sinker, when the timings to change the write bit line drive signal WBLDRV and write bit line sink signal WBLSNK to "H" or "L" are controlled, the timing to supply the write current to the write bit line WBLi in the selected column i and the timing to cut off the write current flowing to write bit line WBLi can be controlled.

The magnitude of the write current flowing to the write bit line WBLi can be changed in an analog manner by controlling the gate potential VPGW of the PMOS transistors TPa and TPe. When the change range of the gate potential VPGB is defined, the magnitude of the write current flowing to the write bit line WBLi can be changed accurately in proportion to the value of the gate potential VPGB.

When the write bit line drive signal WBLDRV is set to "L", and then, the write bit line sink signal WBLSNK is set to "L", the potential of the write bit line WBLi after the write operation can be completely set to 0V.

The constant current j1 is generated by, e.g., the constant current circuit as shown in FIG. 107.

③ OPERATION WAVEFORM EXAMPLE

FIG. 108 shows operation waveform examples of the write word line driver/sinker shown in FIG. 104 and the write bit line driver/sinker shown in FIG. 105.

When the write word line driver signal WWLDRV and write word line sink signal WWLSNK change to "H", the write word line current flows to the write word line WWLi.

When the reset signal RESET and control signal bWCTR change to "L", the value of the potential VPGB shown in FIG. 105 decreases, and the value of the potential VPGW show in FIG. 104 increases. The write word line current also changes in an analog manner in correspondence with the change in gate potential VPGW. In this example, the value of the write word line current is a value obtained by subtracting the value of the write bit line current from the sum of the write word line current and write bit line current.

On the other hand, when the write bit line driver signal WBLDRV and write bit line sink signal WBLSNK change to "H", the write bit line current flows to the write bit line WBLi.

When the reset signal RESET changes to "L", and the control signal WCTR changes to "H", the value of the potential VPGB shown in FIG. 105 decreases. The write bit line current also changes in an analog manner in correspondence with the change in gate potential VPGB.

3. Others

The write principles according to the present invention and the circuit schemes that implement them can be applied to any magnetic random access memory independently of the cell array structure type.

For example, the write principles according to the present invention and the circuit schemes that implement them can be applied to even a magnetic random access memory having a cross-point cell array structure as shown in FIG. 111 or a magnetic random access memory having a cell array structure in which a read select switch (MOS transistor) is connected to one or a plurality of MTJ elements.

The write principles according to the present invention and the circuit schemes that implement them can also be applied to a magnetic random access memory which is not of a cross-point type and has no read select switch, a magnetic random access memory having read bit lines and write bit lines separated from each other, or a magnetic random access memory which stores a plurality of bits in one MTJ element.

As has been described above, according to the magnetic random access memory of the present invention, when the timing to supply a write current to the write word/bit line current or a temporal change (pulse shape) of the current value of the write current is controlled, the magnetization of the storing layer of an MTJ element can reliably be inverted, and the write characteristics can be improved.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A writing method of a magnetic random access memory, comprising:
    causing a first magnetic field having a constant value parallel to a hard-axis to act on a magnetoresistive element having an easy-axis and the hard-axis; and
    causing a second magnetic field which is weaker than the first magnetic field and parallel to the hard-axis and a third magnetic field parallel to the easy-axis to simultaneously act on the magnetoresistive element with the third magnetic field parallel to the easy axis increasing in field strength from one level to another level.

2. A method according to claim 1, wherein the first and second magnetic fields continuously act on the magnetoresistive element.

3. A method according to claim 1, wherein a change from the first magnetic field to the second magnetic field is done to change an intensity of the magnetic field in an analog manner.

4. A method according to claim 1, wherein a change from the first magnetic field to the second magnetic field is done to change an intensity of the magnetic field in a digital manner.

5. A method according to claim 1, wherein the first and second magnetic fields are generated by a first write current which flows in a direction parallel to the easy-axis, and the third magnetic field is generated by a second write current which flows in a direction parallel to the hard-axis.

6. A method according to claim 5, wherein the first and second magnetic fields are obtained by temporally changing a current value of the first write current.

7. A method according to claim 1, wherein a direction of the third magnetic field is determined by a value of write data for the magnetoresistive element.

8. A writing method of a magnetic random access memory, comprising:
    causing a first magnetic field parallel to a hard-axis and a second magnetic field parallel to an easy-axis to simultaneously act on a magnetoresistive element having the easy-axis and hard-axis; and
    causing a third magnetic field which is stronger than the second magnetic field and parallel to the easy-axis to act on the magnetoresistive element.

9. A method according to claim 8, wherein the second and third magnetic fields continuously act on the magnetoresistive element.

10. A method according to claim 8, wherein a change from the second magnetic field to the third magnetic field is done to change an intensity of the magnetic field in an analog manner.

11. A method according to claim 8, wherein a change from the second magnetic field to the third magnetic field is done to change an intensity of the magnetic field in a digital manner.

12. A method according to claim 8, wherein the first magnetic field is generated by a first write current which flows in a direction parallel to the easy-axis, and the second and third magnetic fields are generated by a second write current which flows in a direction parallel to the hard-axis.

13. A method according to claim 12, wherein the second and third magnetic fields are obtained by temporally changing a current value of the second write current.

14. A method according to claim 8, wherein directions of the second and third magnetic fields are determined by a value of write data for the magnetoresistive element.

15. A writing method of a magnetic random access memory, comprising:
    causing a first magnetic field having a constant value parallel to a hard-axis to act on a magnetoresistive element having an easy-axis and the hard-axis;
    causing a second magnetic field parallel to the hard-axis and a third magnetic field parallel to the easy-axis to simultaneously act on the magnetoresistive element with the third magnetic field parallel to the easy axis increasing in field strength from one level to another level; and
    causing a fourth magnetic field parallel to the easy-axis to act on the magnetoresistive element.

16. A method according to claim 15, wherein the first and second magnetic fields have the same intensity and continuously act on the magnetoresistive element.

17. A method according to claim 15, wherein the third and fourth magnetic fields have the same intensity and continuously act on the magnetoresistive element.

18. A method according to claim 15, wherein the second magnetic field is weaker than the first magnetic field, and the first and second magnetic fields continuously act on the magnetoresistive element.

19. A method according to claim 18, wherein a change from the first magnetic field to the second magnetic field is done to change an intensity of the magnetic field in an analog manner.

20. A method according to claim 18, wherein a change from the first magnetic field to the second magnetic field is done to change an intensity of the magnetic field in a digital manner.

21. A method according to claim 15, wherein the fourth magnetic field is stronger than the third magnetic field, and the third and fourth magnetic fields continuously act on the magnetoresistive element.

22. A method according to claim 21, wherein a change from the third magnetic field to the fourth magnetic field is done to change an intensity of the magnetic field in an analog manner.

23. A method according to claim 21, wherein a change from the third magnetic field to the fourth magnetic field is done to change an intensity of the magnetic field in a digital manner.

24. A method according to claim 15, wherein the first and second magnetic fields are generated by a first write current which flows in a direction parallel to the easy-axis, and the third and fourth magnetic fields are generated by a second write current which flows in a direction parallel to the hard-axis.

25. A method according to claim 15, wherein directions of the third and fourth magnetic fields are determined by a value of write data for the magnetoresistive element.

26. A writing method of a magnetic random access memory, comprising:
   causing a first magnetic field parallel to a hard-axis and a second magnetic field parallel to an easy-axis to simultaneously act on a magnetoresistive element having the easy-axis and hard-axis;
   causing a third magnetic field parallel to the hard-axis and a fourth magnetic field which is stronger than the second magnetic field and parallel to the easy-axis to simultaneously act on the magnetoresistive element; and
   causing a fifth magnetic field which is weaker than the third magnetic field and parallel to the hard-axis and a sixth magnetic field parallel to the easy-axis to simultaneously act on the magnetoresistive element.

27. A method according to claim 26, wherein the first and third magnetic fields have the same intensity.

28. A method according to claim 26, wherein the third magnetic field is weaker than the first magnetic field.

29. A method according to claim 28, wherein a change from the first magnetic field to the third magnetic field and a change from the third magnetic field to the fifth magnetic field are done to change an intensity of the magnetic field in an analog manner.

30. A method according to claim 28, wherein a change from the first magnetic field to the third magnetic field and a change from the third magnetic field to the fifth magnetic field are done to change an intensity of the magnetic field in a digital manner.

31. A method according to claim 26, wherein the first, third, and fifth magnetic fields continuously act on the magnetoresistive element.

32. A method according to claim 26, wherein the fourth and sixth magnetic fields have the same intensity.

33. A method according to claim 26, wherein the sixth magnetic field is stronger than the fourth magnetic field.

34. A method according to claim 33, wherein a change from the second magnetic field to the fourth magnetic field and a change from the fourth magnetic field to the sixth magnetic field are done to change an intensity of the magnetic field in an analog manner.

35. A method according to claim 33, wherein a change from the second magnetic field to the fourth magnetic field and a change from the fourth magnetic field to the sixth magnetic field are done to change an intensity of the magnetic field in a digital manner.

36. A method according to claim 26, wherein the second, fourth, and sixth magnetic fields continuously act on the magnetoresistive element.

37. A method according to claim 26, wherein the first, third, and fifth magnetic fields are generated by a first write current which flows in a direction parallel to the easy-axis, and the second, fourth, and sixth magnetic fields are generated by a second write current which flows in a direction parallel to the hard-axis.

38. A method according to claim 26, wherein directions of the, second, fourth, and sixth magnetic fields are determined by a value of write data for the magnetoresistive element.

39. A writing method of a magnetic random access memory, comprising:
   applying a first current having a constant value to a first wiring running along a direction parallel to an easy magnetization axis; and
   simultaneously applying a second current being weaker than the first current to the first wiring and a third current to a second wiring running along a direction parallel to a hard magnetization axis with the third current increasing in strength from one level to another level,
   wherein a magnetic tunnel junction cell is arranged between the first wiring and the second wiring.

40. A writing method of a magnetic random access memory, comprising:
   simultaneously applying a first current to a first wiring running along a direction parallel to an easy magnetization axis and a second current to a second wiring running along a direction parallel to a hard magnetization axis; and
   applying a third current being stronger than the second current to the second wiring, wherein a magnetic tunnel junction cell is arranged between the first wiring and the second wiring.

41. A writing method of a magnetic random access memory, comprising:
   applying a first current having a constant value to a first wiring running along a direction parallel to an easy magnetization axis;
   simultaneously applying a second current to the first wiring and a third current to a second wiring running along a direction parallel to a hard magnetization axis with the third current increasing in strength from one level to another level; and
   applying a fourth current to the second wiring,
   wherein a magnetic tunnel junction cell is arranged between the first wiring and the second wiring.

42. A writing method of a magnetic random access memory, comprising:
   simultaneously applying a first current to a first wiring running along a direction parallel to an easy magnetization axis and a second current to a second wiring running along a direction parallel to a hard magnetization axis;
   simultaneously applying a third current to the first wiring and a fourth current being stronger than the second current to the second wiring; and
   simultaneously applying a fifth current being weaker than the third current to the first wiring and a sixth current to the second wiring,
   wherein a magnetic tunnel junction cell is arranged between the first wiring and the second wiring.

43. A writing method of a magnetic random access memory comprising:
   a) causing a first magnetic field having a first constant value and parallel to a hard-axis to act on a magnetoresistive element having an easy-axis and the hard-axis, while gradually increasing a second magnetic field that is parallel to the easy-axis, in a first period; and
   b) keeping the second magnetic field at a second constant value while gradually decreasing the first magnetic field, in a second period consecutive to the first period.

44. A method according to claim 43, wherein the second magnetic field increases from "0" to the first constant value at a constant rate in the first period.

45. A method according to claim 43, wherein the first magnetic field decreases from the second constant value to "0" at a constant rate in the second period.

46. A method according to claim 43, wherein the first constant value and the second constant value are equal to each other.

47. A writing method of a magnetic random access memory comprising:

gradually decreasing a first magnetic field that is parallel to a hard-axis of a magnetoresistive element from a constant value to "0", while gradually increasing a second magnetic field that is parallel to an easy-axis of the magnetoresistive element from "0" to the constant value, in a writing period.

48. A method according to claim 47, wherein a synthetic magnetic field of the first and second magnetic fields is constant.

49. A method according to claim 47, wherein the first magnetic field and the second magnetic field are expressed by $\alpha \cos t$ and $\beta \sin t$, respectively, where $\alpha$ and $\beta$ are constants, and t denotes a point of time.

* * * * *